United States Patent
Tanigaki et al.

(10) Patent No.: US 10,802,401 B2
(45) Date of Patent: *Oct. 13, 2020

(54) NEGATIVE-TYPE PHOTOSENSITIVE RESIN COMPOSITION, CURED FILM, ELEMENT AND DISPLAY APPARATUS THAT INCLUDE CURED FILM, PRODUCTION METHOD FOR THE SAME

(71) Applicant: TORAY INDUSTRIES, INC., Tokyo (JP)

(72) Inventors: Yugo Tanigaki, Otsu (JP); Satoshi Kamemoto, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 155 days.

This patent is subject to a terminal disclaimer.

(21) Appl. No.: 15/759,429

(22) PCT Filed: Sep. 26, 2016

(86) PCT No.: PCT/JP2016/078282
§ 371 (c)(1),
(2) Date: Mar. 12, 2018

(87) PCT Pub. No.: WO2017/057281
PCT Pub. Date: Apr. 6, 2017

(65) Prior Publication Data
US 2018/0259852 A1 Sep. 13, 2018

(30) Foreign Application Priority Data
Sep. 30, 2015 (JP) ................................. 2015-193002

(51) Int. Cl.
*G03F 7/027* (2006.01)
*G03F 7/028* (2006.01)
(Continued)

(52) U.S. Cl.
CPC .......... *G03F 7/0387* (2013.01); *C08F 265/06* (2013.01); *C08F 283/04* (2013.01);
(Continued)

(58) Field of Classification Search
CPC .... C08F 283/04; C08F 283/12; C08F 265/06; C08F 285/00; C08F 222/1006;
(Continued)

(56) References Cited

U.S. PATENT DOCUMENTS 9,625,706 B2 * 4/2017 Kinoshita ................. G02F 1/17
10,303,054 B2 * 5/2019 Kim ....................... G03F 7/0042
(Continued)

FOREIGN PATENT DOCUMENTS

CN 104937452 A 9/2015
EP 1630605 A1 3/2006
(Continued)

OTHER PUBLICATIONS

International Search Report, issued in PCT/JP2016/078282, PCT/ISA/210, dated Dec. 20, 2016.
(Continued)

*Primary Examiner* — Martin J Angebranndt
(74) *Attorney, Agent, or Firm* — Birch, Stewart, Kolasch & Birch, LLP

(57) ABSTRACT

To provide an alkaline developable negative-type photosensitive resin composition from which a cured film that has a high-resolution and low-taper pattern shape and that are excellent in heat resistance and light blocking property can be obtained. A negative-type photosensitive resin composition is characterized by containing an (A1) first resin, a (A2) second resin, a (C) photopolymerization initiator, and a (D) coloring agent, wherein the (A1) first resin is an (A1-1) polyimide and/or an (A1-2) polybenzo-oxazole, and wherein the (A2) second resin is one or more species selected from
(Continued)

a (A2-1) polyimide precursor, a (A2-2) polybenzo-oxazole precursor, a (A2-3) polysiloxane, a (A2-4) cardo based resin, and an (A2-5) acrylic resin, and wherein a content ratio of the (A1) first resin in a total of 100 mass % of the (A1) first resin and the (A2) second resin is within the range of 25 to 90 mass %.

5 Claims, 5 Drawing Sheets

(51) Int. Cl.
| | |
|---|---|
| G03F 7/037 | (2006.01) |
| G03F 7/033 | (2006.01) |
| H01L 51/56 | (2006.01) |
| H01L 51/54 | (2006.01) |
| C08F 265/06 | (2006.01) |
| C08F 283/12 | (2006.01) |
| C08F 283/04 | (2006.01) |
| C08G 73/22 | (2006.01) |
| C08G 73/10 | (2006.01) |
| C09D 179/08 | (2006.01) |
| C08F 222/10 | (2006.01) |
| G03F 7/038 | (2006.01) |
| C08F 285/00 | (2006.01) |
| G03F 7/032 | (2006.01) |
| C08L 51/00 | (2006.01) |
| G03F 7/004 | (2006.01) |
| C09K 11/06 | (2006.01) |
| G03F 7/105 | (2006.01) |
| H01L 51/50 | (2006.01) |
| G03F 7/075 | (2006.01) |
| G03F 7/20 | (2006.01) |
| H01L 51/52 | (2006.01) |
| H01L 27/32 | (2006.01) |

(52) U.S. Cl.
CPC .......... *C08F 283/12* (2013.01); *C08F 285/00* (2013.01); *C08G 73/106* (2013.01); *C08G 73/1017* (2013.01); *C08G 73/1039* (2013.01); *C08G 73/1042* (2013.01); *C08G 73/1067* (2013.01); *C08G 73/1071* (2013.01); *C08G 73/22* (2013.01); *C08L 51/003* (2013.01); *C09D 179/08* (2013.01); *C09K 11/06* (2013.01); *G03F 7/0046* (2013.01); *G03F 7/028* (2013.01); *G03F 7/032* (2013.01); *G03F 7/033* (2013.01); *G03F 7/037* (2013.01); *G03F 7/0381* (2013.01); *G03F 7/0382* (2013.01); *G03F 7/0757* (2013.01); *G03F 7/105* (2013.01); *G03F 7/2014* (2013.01); *G03F 7/2037* (2013.01); *H01L 51/50* (2013.01); *C09K 2211/1007* (2013.01); *C09K 2211/1029* (2013.01); *C09K 2211/185* (2013.01); *H01L 27/3246* (2013.01); *H01L 27/3258* (2013.01); *H01L 51/5218* (2013.01); *H01L 51/5284* (2013.01); *H01L 2251/5338* (2013.01)

(58) Field of Classification Search
CPC .. C08F 220/32; C08F 220/325; G03F 7/0757; G03F 7/2014; G03F 7/2037; G03F 7/0381; G03F 7/033; G03F 7/0046; G03F 7/0382; G03F 7/037; G03F 7/105; G03F 7/032; G03F 7/0387; G03F 7/028; H01L 51/50; H01L 51/003; H01L 27/3258; H01L 27/3246; H01L 2251/5338; H01L 2251/5218; H01L 2251/5284; C08G 73/1067; C08G 73/1039; C08G 73/1071; C08G 73/106; C08G 73/1017; C08G 73/1042; C08G 73/22; C09D 179/08; C09K 11/06; C09K 2211/185; C09K 2211/1007; C09K 2211/1029; C08L 79/08
See application file for complete search history.

(56) References Cited

U.S. PATENT DOCUMENTS

| | | | |
|---|---|---|---|
| 10,324,376 B2* | 6/2019 | Kamemoto | G03F 7/031 |
| 2006/0159839 A1 | 7/2006 | Suwa | |
| 2014/0353557 A1* | 12/2014 | Yu | G02B 5/003 |
| | | | 252/586 |
| 2015/0293282 A1* | 10/2015 | Takishita | G03F 7/0007 |
| | | | 359/359 |
| 2016/0377765 A1* | 12/2016 | Kang | G03F 7/0387 |
| | | | 430/286.1 |
| 2018/0356729 A1* | 12/2018 | Tanigaki | G03F 7/027 |
| 2019/0258164 A1* | 8/2019 | Tanigaki | G03F 7/0757 |
| 2019/0302617 A1* | 10/2019 | Matsuki | G03F 7/105 |

FOREIGN PATENT DOCUMENTS

| | | |
|---|---|---|
| EP | 2 940 495 A1 | 11/2015 |
| JP | 2000-292783 A | 10/2000 |
| JP | 2004-152590 A | 5/2004 |
| JP | 2005-75965 A | 3/2005 |
| JP | 2006-154775 A | 6/2006 |
| JP | 2006-286225 A | 10/2006 |
| JP | 2008-106250 A | 5/2008 |
| JP | 2013-232314 A | 11/2013 |
| JP | 2013-250473 A | 12/2013 |
| JP | 2014-122926 A | 7/2014 |
| JP | 2014-170080 A | 9/2014 |
| JP | 2015-1655 A | 1/2015 |
| JP | 2015-069181 A | 4/2015 |
| KR | 10-2007-0121542 A | 12/2007 |
| WO | WO 2004/109403 A1 | 5/2004 |
| WO | WO 2006/046736 A1 | 5/2006 |
| WO | WO 2007/145249 A1 | 12/2007 |
| WO | WO 2013/111481 A1 | 8/2013 |
| WO | WO 2015/046332 A1 | 4/2015 |

OTHER PUBLICATIONS

Written Opinion of the International Searching Authority, issued in PCT/JP2016/078282, PCT/ISA/237, dated Dec. 20, 2016.

\* cited by examiner

NEGATIVE-TYPE PHOTOSENSITIVE RESIN COMPOSITION, CURED FILM, ELEMENT AND DISPLAY APPARATUS THAT INCLUDE CURED FILM, PRODUCTION METHOD FOR THE SAME

TECHNICAL FIELD

The present invention relates to a negative-type photosensitive resin composition and a cured film, an element, and a display apparatus that use the same and to production methods for the cured film and the display apparatus.

BACKGROUND ART

Recent years have seen, in display apparatuses, such as smartphone, tablet PCs, and televisions, which include thin-type displays, development of many products that employ organic electroluminescence (hereinafter, "EL") displays.

Generally, an organic EL display includes transparent electrodes of indium tin oxide (hereinafter, "ITO") on a light extraction side of the light-emitting elements and includes metal electrodes of an alloy of magnesium and silver, or the like, on a not light extraction side of the light-emitting elements. Furthermore, in order to separate the pixels of the light-emitting elements from each other, an insulation layer called pixel-separating layer is formed between the layers of the transparent electrodes and the metal electrodes. The transparent electrodes and the metal electrodes are generally formed as films by sputtering. In order to prevent break of transparent electrodes or metal electrodes that have been formed as films, the pixel-separating layer is required to have a low-taper pattern shape.

The organic EL display is a self-luminous element that emits light by using energy based on recombination of electrons injected from a cathode and positive holes injected from an anode. Therefore, when there exists a substance that inhibits movement of electrons or positive holes, a substance that forms an energy level that inhibits recombination of electrons and positive holes, etc., there occur effects such as decrease in the light emission efficiency of light-emitting elements, deactivation of a light-emitting material, etc., leading to decreases in the service life of the light-emitting elements. Because the pixel-separating layer is formed at a position adjacent to the light-emitting elements, degassing and outflow of ion components from the pixel-separating layer can be causes of reduced service life of organic EL displays. Therefore, the pixel-separating layer is required to have high heat resistance.

Furthermore, because the organic EL display is a self-luminous element, incidence of external light, such as sun light outdoors, reduces visibility and contrast due to reflection of the external light. Therefore, a technology that reduces external light reflection is required. A method in which a polarizing plate, a quarter wavelength plate, reflection preventing layer, etc. is formed on the light extraction side of the light-emitting elements in order to reduce such external light reflection is known (refer to, e.g., Patent Document 1). However, for example, in the case where a polarizing plate is formed, the polarizing plate can reduce the external light reflection but the polarizing plate will also block part of light output from the light-emitting elements, decreasing the luminance of the organic EL display (refer to, e.g., Patent Document 2). Therefore, a technology that reduces the external light reflection without using a polarizing plate or the like is required.

As a technology for cutting off external light, a black matrix for use for a color filter in a liquid crystal display can be cited. This is a technique that uses a pixel-separating layer that has a light blocking property to absorb incident external light, so that external light reflection is reduced. However, in general, as a photosensitive material for use as a black matrix, an acrylic resin is used, and is poor in heat resistance. Materials that use polyamic acid are also known (refer to, e.g., Patent Document 3); however, these are non-photosensitive and therefore need to be pattern processed with a photoresist or the like, which results in a complicated step. Furthermore, when a photosensitive resin composition is given a light blocking property, ultraviolet ray or the like at the time of pattern exposure will be blocked; therefore, a negative-type photosensitive composition is generally used. However, in a negative-type photosensitive mechanism, a rectangular or reversely tapered pattern shape tends to be formed, so that a low-taper pattern shape is difficult to obtain. Therefore, a photosensitive resin composition having a light blocking property which makes it possible to obtain a low-taper pattern shape and makes it possible to obtain a cured film with high heat resistance has been demanded.

As a photosensitive resin composition that has a light blocking property, a negative-type photosensitive resin composition that contains polyimide is known (refer to, e.g., Patent Document 4). Furthermore, a negative-type photosensitive resin composition that uses a cardo based resin is also known (refer to, e.g., Patent Document 5).

PRIOR ART DOCUMENTS

Patent Documents

Patent Document 1: Japanese Unexamined Patent Publication (Kokai) No. 2000-292783
Patent Document 2: Japanese Unexamined Patent Publication (Kokai) No. 2006-286225
Patent Document 3: Japanese Unexamined Patent Publication (Kokai) No. 2008-106250
Patent Document 4: International Publication WO 2013/111481
Patent Document 5: Japanese Unexamined Patent Publication (Kokai) No. 2015-069181

SUMMARY OF THE INVENTION

Problems to be Solved by the Invention

However, the photosensitive resin compositions having light blocking property which have been known are all insufficient in property for use as a material that forms pixel-separating layers of organic EL displays. Concretely, they are insufficient in pattern shape, resolution, heat resistance, or light blocking property.

Therefore, an object of the present invention is to provide a negative-type photosensitive resin composition that makes it possible to obtain a high-resolution and low-taper pattern shape, makes it possible to obtain a cured film excellent in heat resistance and light blocking property, and makes alkaline development possible.

Means for Solving the Problems

The negative-type photosensitive resin composition of the present invention is a negative-type photosensitive resin composition containing an (A1) first resin, a (A2) second resin, a (C) photopolymerization initiator, and a (D) coloring agent, wherein the (A1) first resin is an (A1-1) polyimide and/or an (A1-2) polybenzo-oxazole, and wherein the (A2) second resin is one or more species selected from a (A2-1) polyimide precursor, a (A2-2) polybenzo-oxazole precursor, a (A2-3) polysiloxane, a (A2-4) cardo based resin, and an (A2-5) acrylic resin, and wherein a content ratio of the (A1) first resin in a total of 100 mass % of the (A1) first resin and the (A2) second resin is within the range of 25 to 90 mass %.

Advantageous Effects of the Invention

The negative-type photosensitive resin composition of the present invention makes it possible to obtain high-resolution and low-taper pattern shape and makes it possible to obtain a cured film excellent in heat resistance and light blocking property.

DESCRIPTION OF PREFERRED EMBODIMENTS

Figure 1:
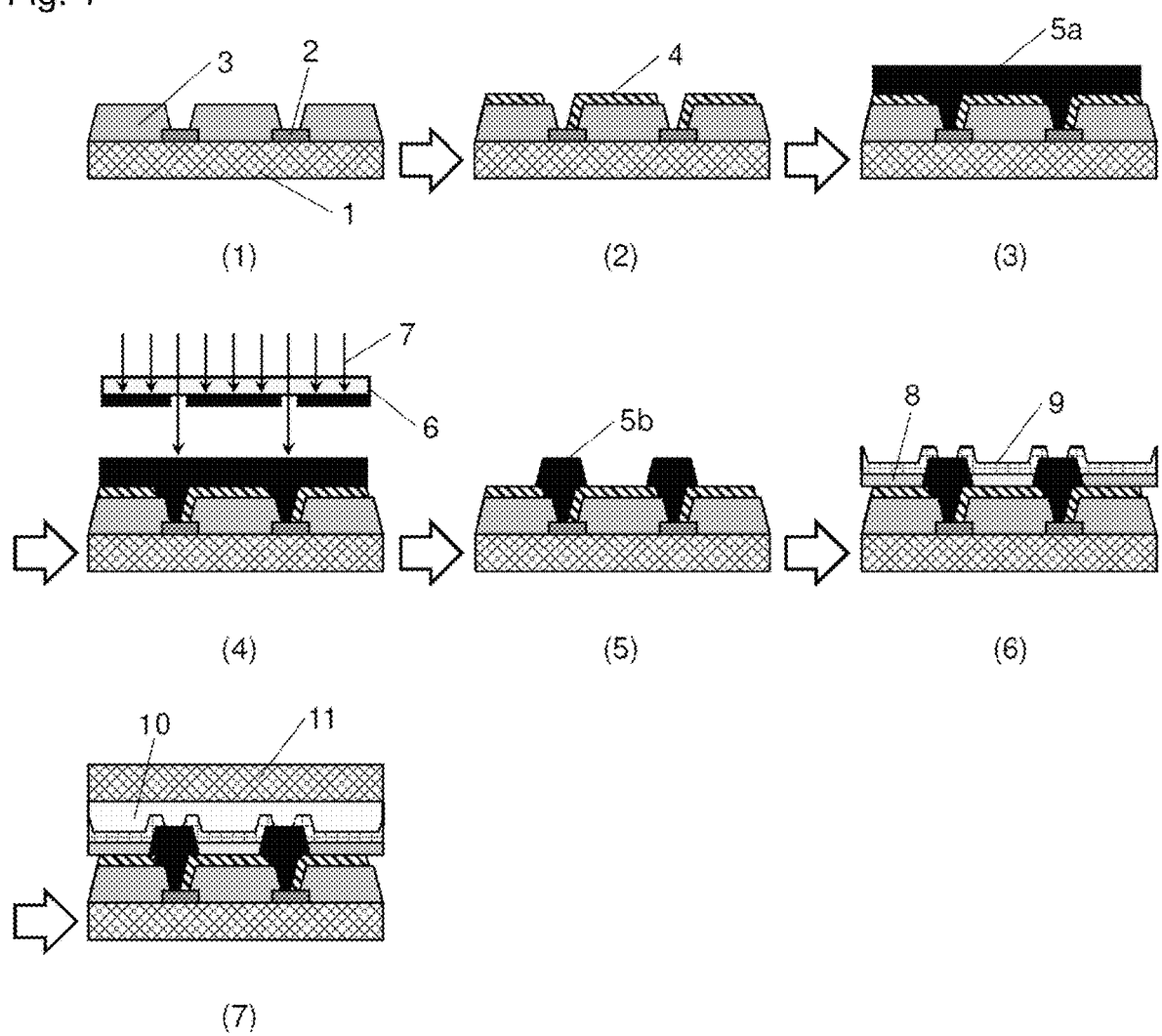
FIGS. 1(1) to (7) are processing diagrams exemplifying a production process of an organic EL display that uses a cured film of a negative-type photosensitive resin composition of the present invention.

The negative-type photosensitive resin composition of the present invention is a negative-type photosensitive resin composition that contains a (A1) first resin, a (A2) second resin, a (C) photopolymerization initiator, and a (D) coloring agent, wherein the (A1) first resin is a (A1-1) polyimide and/or a (A1-2) polybenzo-oxazole, and wherein the (A2) second resin is one or more species selected from a (A2-1) polyimide precursor, a (A2-2) polybenzo-oxazole precursor, a (A2-3) polysiloxane, a (A2-4) cardo based resin, and an (A2-5) acrylic resin, and wherein a content ratio of the (A1) first resin in a total of 100 mass % of the (A1) first resin and the (A2) second resin is within the range of 25 to 90 mass %.

<(A1) First Resin and (A2) Second Resin>

The negative-type photosensitive resin composition of the present invention contains as the (A1) first resin the (A1-1) polyimide and/or the (A1-2) polybenzo-oxazole. As the (A2) second resin, one or more species selected from the (A2-1) polyimide precursor, the (A2-2) polybenzo-oxazole precursor, the (A2-3) polysiloxane, the (A2-4) cardo based resin, and the (A2-5) acrylic resin is contained.

In the present invention, the (A1-1) polyimide, the (A1-2) polybenzo-oxazole, the (A2-1) polyimide precursor, the (A2-2) polybenzo-oxazole precursor, the (A2-3) polysiloxane, the (A2-4) cardo based resin, and the (A2-5) acrylic resin may be a single resin or copolymers thereof.

<(A1-1) Polyimide and (A2-1) Polyimide Precursor>

As the (A2-1) polyimide precursor, for example, products obtained by reacting a tetracarboxylic acid, a corresponding tetracarboxylic dianhydride or tetracarboxylic diester dichloride, etc., and a diamine, a corresponding diisocyanate compound or trimethylsilylated diamine, etc., are cited, and include a tetracarboxylic acid and/or its derivative residue and a diamine and/or its derivative residue. As the (A2-1) polyimide precursor, for example, polyamic acids, polyamic acid esters, polyamic acid amides, or polyisoimides can be cited.

As the (A1-1) polyimide, for example, products obtained by cyclodehydrating a polyamic acid, a polyamic acid ester, a polyamic acid amide, or a polyisoimide mentioned above by a reaction with heat, an acid, a base, etc. can be cited. The (A1-1) polyimide has a tetracarboxylic acid and/or its derivative residue and a diamine and/or its derivative residue.

The (A2-1) polyimide precursor is a thermosetting resin and, when thermally cured and cyclodehydrated at a high temperature, forms a high-heat resistant imide bond, providing a (A1-1) polyimide. Therefore, as the (A1-1) polyimide having a high-heat resistant imide bond is contained in the resin composition, the heat resistance of the cured film obtained can be conspicuously improved. Therefore, the (A2-1) polyimide precursor is suitable for the case where the cured film is put to uses in which high heat resistance is required, and the like. Furthermore, since the (A2-1) polyimide precursor is a resin that improves in heat resistance after being cyclodehydrated, the (A2-1) polyimide precursor is suitable for the case where the (A2-1) polyimide precursor is put to uses in which it is desired that properties of the precursor structure prior to the cyclodehydration and heat resistance of the cured film be both achieved favorably, and the like.

Furthermore, the (A1-1) polyimide and the (A2-1) polyimide precursor have imide bonds and/or amide bonds as bonds that have polarity. Therefore, in the case where, as the (D) coloring agent described below, a (D1) pigment is particularly contained, these bonds having polarity strongly interacts with the (D1) pigment, so that the dispersion stability of the (D1) pigment can be improved.

As for the (A1-1) polyimide for use in the present invention, it is preferable that a structural unit represented by the following general formula (1) be contained, from the viewpoint of heat resistance improvement of the cured film.

[CHEM. 1]

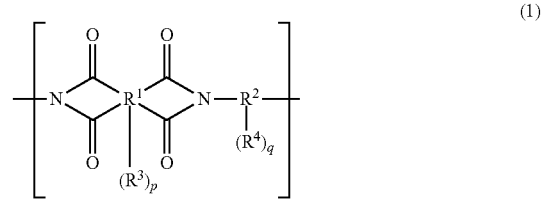

(1)

In general formula (1), $R^1$ represents an organic group having a valence of 4 to 10 and $R^2$ represents an organic group having a valence of 2 to 10. $R^3$ and $R^4$ each independently represent a phenolic hydroxyl group, a sulfonic group, a mercapto group, or a substituent represented by general formula (5) or general formula (6). p represents an integer of 0 to 6 and q represents an integer of 0 to 8.

In general formula (1), $R^1$ represents a tetracarboxylic acid and/or its derivative residue and $R^2$ represents a diamine and/or its derivative residue. As the tetracarboxylic acid derivative, tetracarboxylic dianhydrides, tetracarboxylic dichlorides, or tetracarboxylic acid active diesters can be cited. As the diamine derivative, diisocyanate compounds or trimethylsilylated diamines can be cited.

In general formula (1), it is preferable that $R^1$ be an organic group having a valence of 4 to 10 which has one or more species selected from an aliphatic structure having a carbon number of 2 to 20, an alicyclic structure having a carbon number of 4 to 20, and an aromatic structure having a carbon number of 6 to 30, and it is more preferable that $R^1$ be an organic group having a valence of 4 to 10 which has one or more species selected from an aliphatic structure having a carbon number of 4 to 15, an alicyclic structure having a carbon number of 4 to 15, and an aromatic structure having a carbon number of 6 to 25. Furthermore, it is preferable that $R^2$ be an organic group having a valence of 2 to 10 which has one or more species selected from an aliphatic structure having a carbon number of 2 to 20, an alicyclic structure having a carbon number of 4 to 20, and an aromatic structure having a carbon number of 6 to 30, and it is more preferable that $R^2$ be an organic group having a valence of 2 to 10 which has one or more species selected from an aliphatic structure having a carbon number of 4 to 15, an alicyclic structure having a carbon number of 4 to 15, and an aromatic structure having a carbon number of 6 to 25. It is preferable that q be 1 to 8. The aliphatic structure, the alicyclic structure, and the aromatic structure mentioned above may have a heteroatom and may be either an unsubstituted product or a substitution product.

[CHEM. 2]

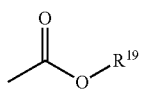

(5)

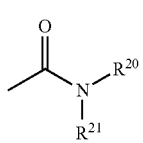

(6)

In general formulas (5) and (6), $R^{19}$ to $R^{21}$ each independently represents hydrogen, an alkyl group having a carbon number of 1 to 10, an acyl group having a carbon number of 2 to 6, or an aryl group having a carbon number of 6 to 15. In general formulas (5) and (6), it is preferable that $R^{19}$ to $R^{21}$ each independently be hydrogen, an alkyl group having a carbon number of 1 to 6, an acyl group having a carbon number of 2 to 4, or an aryl group having a carbon number of 6 to 10. The alkyl group, the acyl group, and the aryl group may be either an unsubstituted product or a substitution product.

As the aliphatic structure of $R^1$ and $R^2$ in general formula (1), for example, an ethane structure, an n-butane structure, an n-pentane structure, an n-hexane structure, an n-decane structure, a 3,3-dimethyl pentane structure, a di-n-butyl ether structure, a di-n-butyl ketone structure, and a di-n-butyl sulfone structure can be cited. Furthermore, as a substituent group thereof, for example, halogen atoms or alkoxy groups can be cited. As $R^1$ and $R^2$ in the case where the aliphatic structure is a substitution product, for example, a 3,3-bis(trifluoromethyl)pentane structure or a 3-methoxy pentane structure can be cited.

As the alicyclic structure of $R^1$ and $R^2$ in general formula (1), for example, a cyclobutane structure, a cyclopentane structure, a cyclohexane structure, an ethylcyclohexane structure, a tetrahydrofuran structure, a bicyclohexyl structure, a 2,2-dicyclohexyl propane structure, a dicyclohexyl ether structure, a dicyclohexyl ketone structure, or a dicyclohexyl sulfone structure can be cited. Furthermore, as a substituent thereof, for example, halogen atoms or alkoxy groups can be cited. As $R^1$ and $R^2$ in the case where the alicyclic structure is a substitution product, for example, a 1,1-dicyclohexyl-1,1-bis(trifluoromethyl)methane structure or a 1,1-dicyclohexyl-1-methoxymethane structure can be cited.

As the aromatic structure of $R^1$ and $R^2$ in general formula (1), for example, a benzene structure, an ethyl benzene structure, a naphthalene structure, a 1,2,3,4-tetrahydronaphthalene structure, a fluorene structure, a biphenyl structure, a terphenyl structure, a 2,2-diphenylpropane structure, a diphenyl ether structure, a diphenyl ketone structure, a diphenyl sulfone structure, or a 9,9-diphenylfluorene structure can be cited. Furthermore, as a substituent thereof, for example, halogen atoms or alkoxy groups can be cited. As $R^1$ and $R^2$ in the case where the aromatic structure is a substitution product, for example, a 1,1-diphenyl-1,1-bis(trifluoromethyl)methane structure or a 1,1-diphenyl-1-methoxymethane structure can be cited.

As for the (A1-1) polyimide, it is preferable that a structural unit represented by general formula (1) be contained as a main component, and it is preferable that the content ratio of the structural unit represented by the general formula (1) in the structural unit originating from the entire carboxylic acids and their derivatives in the (A1-1) polyimide be within the range of 50 to 100 mol %, and it is more preferable that the content ratio thereof be within the range of 60 to 100 mol %, and it is even more preferable that the content ratio thereof be within the range of 70 to 100 mol %. When the content ratio thereof is within the range mentioned above, the heat resistance of the cured film can be improved.

As for the (A2-1) polyimide precursor for use in the present invention, it is preferable that a structural unit represented by the following general formula (3) be contained, from the viewpoint of heat resistance improvement of the cured film and post-development resolution improvement.

[CHEM. 3]

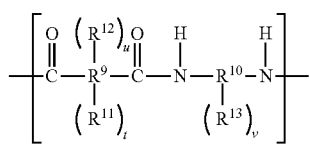

(3)

In general formula (3), $R^9$ represents an organic group having a valence of 4 to 10 and $R^{10}$ represents an organic group having a valence of 2 to 10. $R^{11}$ represents a substituent represented by general formula (5) or general formula (6) mentioned above, $R^{12}$ represents a phenolic hydroxyl group, a sulfonic group, or a mercapto group, $R^{13}$ represents a phenolic hydroxyl group, a sulfonic group, a mercapto group, or a substituent represented by general formula (5) or general formula (6) mentioned above. t represents an integer of 2 to 8, u represents an integer of 0 to 6, and v represents an integer of 0 to 8, and $2 \leq t+u \leq 8$.

In general formula (3), $R^9$ represents a tetracarboxylic acid and/or its derivative residue and $R^{10}$ represents a diamine and/or its derivative residue. As the tetracarboxylic acid derivative, tetracarboxylic dianhydrides, tetracarboxylic dichlorides, or tetracarboxylic acid active diesters can be cited. As the diamine derivative, diisocyanate compounds or trimethylsilylated diamines can be cited.

In general formula (3), it is preferable that $R^9$ be an organic group having a valence of 4 to 10 which has one or more species selected from an aliphatic structure having a carbon number of 2 to 20, an alicyclic structure having a carbon number of 4 to 20, and an aromatic structure having a carbon number of 6 to 30 and it is more preferable that $R^9$ be an organic group having a valence of 4 to 10 which has one or more species selected from an aliphatic structure having a carbon number of 4 to 15, an alicyclic structure having a carbon number of 4 to 15, and an aromatic structure having a carbon number of 6 to 25. Furthermore, it is preferable that $R^{10}$ be an organic group having a valence of 2 to 10 which has one or more species selected from an aliphatic structure having a carbon number of 2 to 20, an alicyclic structure having a carbon number of 4 to 20, and an aromatic structure having a carbon number of 6 to 30 and it is more preferable that $R^{10}$ be an organic group having a valence of 2 to 10 which has one or more species selected from an aliphatic structure having a carbon number of 4 to 15, an alicyclic structure having a carbon number of 4 to 15, and an aromatic structure having a carbon number of 6 to 25. It is preferable that v be 1 to 8. The aliphatic structure, the alicyclic structure, and the aromatic structure mentioned above may have heteroatoms and may be either an unsubstituted product or a substitution product.

As the aliphatic structure of $R^9$ and $R^{10}$ in general formula (3), for example, an ethane structure, an n-butane structure, an n-pentane structure, an n-hexane structure, an n-decane structure, a 3,3-dimethyl pentane structure, a di-n-butyl ether structure, a di-n-butyl ketone structure, and a di-n-butyl sulfone structure can be cited. Furthermore, as its substituent, for example, halogen atoms or alkoxy groups can be cited. As $R^9$ and $R^{10}$ in the case where the aliphatic structure is a substitution product, for example, a 3,3-bis(trifluoromethyl)pentane structure or a 3-methoxy pentane structure can be cited.

As the alicyclic structure of $R^9$ and $R^{10}$ in general formula (3), for example, a cyclobutane structure, a cyclopentane structure, a cyclohexane structure, an ethylcyclohexane structure, a tetrahydrofuran structure, a bicyclohexyl structure, a 2,2-dicyclohexyl propane structure, a dicyclohexyl ether structure, a dicyclohexyl ketone structure, a dicyclohexyl sulfone structure can be cited. Furthermore, as the substituent thereof, for example, halogen atoms or alkoxy groups can be cited. As $R^9$ and $R^{10}$ in the case where the alicyclic structure is a substitution product, for example, a 1,1-dicyclohexyl-1,1-bis(trifluoromethyl)methane structure or a 1,1-dicyclohexyl-1-methoxymethane structure can be cited.

As the aromatic structure of $R^9$ and $R^{10}$ in general formula (3), for example, a benzene structure, an ethyl benzene structure, a naphthalene structure, a 1,2,3,4-tetrahydronaphthalene structure, a fluorene structure, a biphenyl structure, a terphenyl structure, a 2,2-diphenylpropane structure, a diphenyl ether structure, a diphenyl ketone structure, a diphenyl sulfone structure, or a 9,9-diphenylfluorene structure can be cited. Furthermore, as the substituent thereof, for example, halogen atoms or alkoxy groups can be cited. As $R^9$ and $R^{10}$ in the case where the aromatic structure is a substitution product, for example, a 1,1-diphenyl-1,1-bis(trifluoromethyl)methane structure or a 1,1-diphenyl-1-methoxymethane structure can be cited.

As for the (A2-1) polyimide precursor, it is preferable that a structural unit represented by general formula (3) be contained as a main component, and it is preferable that the content ratio of the structural unit represented by the general formula (3) in a structural unit originating from the entire carboxylic acids and their derivatives in the (A2-1) polyimide precursor be within the range of 50 to 100 mol %, and it is more preferable that the content ratio thereof be within the range of 60 to 100 mol %, and it is more preferable that the content ratio thereof be within the range of 70 to 100 mol %. When the content ratio thereof is within the range mentioned above, the resolution can be improved.

<(A1-2) Polybenzo-Oxazole and (A2-2) Polybenzo-Oxazole Precursor>

As the (A2-2) polybenzo-oxazole precursor, for example, products obtained by reacting a dicarboxylic acid, a corresponding dicarboxylic dichloride or dicarboxylic acid active diester, etc. with a bisaminophenol compound or the like as a diamine can be cited. The (A2-2) polybenzo-oxazole precursor has a dicarboxylic acid and/or its derivative residue and a bisaminophenol compound and/or its derivative residue. As the (A2-2) polybenzo-oxazole precursor, for example, polyhydroxy amides can be cited.

As the (A1-2) polybenzo-oxazole, for example, products obtained by cyclodehydrating a dicarboxylic acid and a bisaminophenol compound as a diamine by a reaction with a polyphosphoric acid and products obtained by cyclodehydrating the aforementioned polyhydroxy amide with heat or by a reaction with a phosphoric anhydride, a base, a carbodiimide compound, etc. can be cited. The (A1-2) polybenzo-oxazole has a dicarboxylic acid and/or its derivative residue and a bisaminophenol compound and/or its derivative residue.

The (A2-2) polybenzo-oxazole precursor is a thermosetting resin and, when thermally cured and cyclodehydrated at a high temperature, forms a high-heat resistance and rigid benzo-oxazole ring, providing a (A1-2) polybenzo-oxazole. Therefore, because the (A1-2) polybenzo-oxazole that has a high-heat resistance and rigid benzo-oxazole ring is contained in the resin composition, the heat resistance of the cured film can be conspicuously improved. Therefore, the (A2-2) polybenzo-oxazole precursor is suitable for the case where the cured film is put to uses in which high heat resistance is required, and the like. Furthermore, since the (A2-2) polybenzo-oxazole precursor is a resin that improves in heat resistance after being cyclodehydrated, the (A2-2) polybenzo-oxazole precursor is suitable for the case where the (A2-2) polybenzo-oxazole precursor is put to uses in which it is desired that properties of the precursor structure prior to the cyclodehydration and heat resistance of the cured film be both achieved favorably, and the like.

Furthermore, the (A1-2) polybenzo-oxazole and the (A2-2) polybenzo-oxazole precursor have oxazole bonds and/or amide bonds as bonds that have polarity. Therefore, in the case where, as the (D) coloring agent described below, a (D1) pigment is particularly contained, these bonds having polarity strongly interacts with the (D1) pigment, so that the dispersion stability of the (D1) pigment can be improved.

As for the (A1-2) polybenzo-oxazole for use in the present invention, it is preferable that a structural unit represented by the following general formula (2) be contained, from the viewpoint of heat resistance improvement of the cured film.

[CHEM. 4]

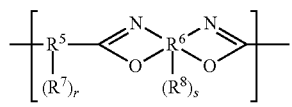

In general formula (2), $R^5$ represents an organic group having a valence of 2 to 10 and $R^6$ represents an organic group having a valence of 4 to 10 which has an aromatic structure. $R^7$ and $R^8$ each independently represent a phenolic hydroxyl group, a sulfonic group, a mercapto group, or a substituent represented by general formula (5) or general formula (6). r represents an integer of 0 to 8 and s represents an integer of 0 to 6.

In general formula (2), $R^5$ represents a dicarboxylic acid and/or its derivative residue and $R^6$ represents a bisaminophenol compound and/or its derivative residue. As the dicarboxylic acid derivative, dicarboxylic anhydrides, dicarboxylic acid chlorides, dicarboxylic acid active esters, tricarboxylic anhydrides, tricarboxylic acid chlorides, tricarboxylic acid active esters, and diformyl compounds can be cited.

In general formula (2), it is preferable that $R^5$ be an organic group having a valence of 2 to 10 which has one or more species selected from an aliphatic structure having a carbon number of 2 to 20, an alicyclic structure having a carbon number of 4 to 20, and an aromatic structure having a carbon number of 6 to 30, and it is more preferable that $R^5$ be an organic group having a valence of 2 to 10 which has one or more species selected from an aliphatic structure having a carbon number of 4 to 15, an alicyclic structure having a carbon number of 4 to 15, and an aromatic structure having a carbon number of 6 to 25. Furthermore, it is preferable that $R^6$ be an organic group having a valence of 4 to 10 which has an aromatic structure having a carbon number of 6 to 30 and it is more preferable that $R^6$ be an organic group having a valence of 4 to 10 which has an aromatic structure having a carbon number of 6 to 25. It is preferable that s be 1 to 8. The aliphatic structure, the alicyclic structure, and the aromatic structure mentioned above may have heteroatoms and may be either an unsubstituted product or a substitution product.

As the aliphatic structure of $R^5$ in general formula (2), for example, an ethane structure, an n-butane structure, an n-pentane structure, an n-hexane structure, an n-decane structure, a 3,3-dimethyl pentane structure, a di-n-butyl ether structure, a di-n-butyl ketone structure, and a di-n-butyl sulfone structure can be cited. Furthermore, as the substituent thereof, for example, halogen atoms or alkoxy groups can be cited. As $R^5$ in the case where the aliphatic structure is a substitution product, for example, a 3,3-bis(trifluoromethyl)pentane structure or a 3-methoxy pentane structure can be cited.

As the alicyclic structure of $R^5$ in general formula (2), for example, a cyclobutane structure, a cyclopentane structure, a cyclohexane structure, an ethylcyclohexane structure, a tetrahydrofuran structure, a bicyclohexyl structure, a 2,2-dicyclohexyl propane structure, a dicyclohexyl ether structure, a dicyclohexyl ketone structure, or a dicyclohexyl sulfone structure can be cited. Furthermore, as the substituent thereof, for example, halogen atoms or alkoxy groups can be cited. As $R^5$ in the case where the alicyclic structure is a substitution product, for example, a 1,1-dicyclohexyl-1,1-bis(trifluoromethyl)methane structure or a 1,1-dicyclohexyl-1-methoxymethane structure can be cited.

As the aromatic structure of $R^5$ and $R^6$ in general formula (1), for example, a benzene structure, an ethyl benzene structure, a naphthalene structure, a 1,2,3,4-tetrahydronaphthalene structure, a fluorene structure, a biphenyl structure, a terphenyl structure, a 2,2-diphenylpropane structure, a diphenyl ether structure, a diphenyl ketone structure, a diphenyl sulfone structure, or a 9,9-diphenylfluorene structure can be cited. Furthermore, as the substituent thereof for example, halogen atoms or alkoxy groups can be cited. As $R^5$ and $R^6$ in the case where the aromatic structure is a substitution product, for example, a 1,1-diphenyl-1,1-bis(trifluoromethyl)methane structure or a 1,1-diphenyl-1-methoxymethane structure can be cited.

As for the (A1-2) polybenzo-oxazole, it is preferable that a structural unit represented by general formula (2) be contained as a main component, and it is preferable that the content ratio of the structural unit represented by general formula (2) in a structural unit originating from the entire amines and their derivatives in the (A1-2) polybenzo-oxazole be within the range of 50 to 100 mol %, and it is more preferable that the content ratio thereof be within the range of 60 to 100 mol %, and it is even more preferable that the content ratio thereof be within the range of 70 to 100 mol %. When the content ratio thereof is within the range mentioned above, the heat resistance of the cured film can be improved.

As the (A2-2) polybenzo-oxazole precursor for use in the present invention, it is preferable that a structural unit represented by the following general formula (4) be contained, from the viewpoint of heat resistance improvement of the cured film and post-development resolution improvement.

[CHEM. 5]

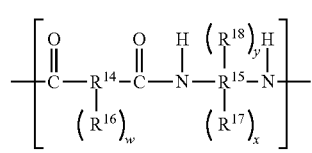

In general formula (4), $R^{14}$ represents an organic group having a valence of 2 to 10 and $R^{15}$ represents an organic group having a valence of 4 to 10 which has an aromatic structure. $R^{16}$ represents a phenolic hydroxyl group, a sulfonic group, a mercapto group, or a substituent represented by general formula (5) or general formula (6), $R^{17}$ represents a phenolic hydroxyl group, and $R^{18}$ represents a sulfonic group, a mercapto group, or a substituent represented by general formula (5) or general formula (6). w represents an integer of 0 to 8, x represents an integer of 2 to 8, y represents an integer of 0 to 6, and 2≤x+y≤8.

In general formula (4), $R^{14}$ represents a dicarboxylic acid and/or its derivative residue and $R^{15}$ represents a bisaminophenol compound and/or its derivative residue. As the dicarboxylic acid derivative, dicarboxylic anhydrides, dicarboxylic acid chlorides, dicarboxylic acid active esters, tricarboxylic anhydrides, tricarboxylic acid chlorides, tricarboxylic acid active ester, and diformyl compounds can be cited.

In general formula (4), it is preferable that $R^{14}$ be an organic group having a valence of 2 to 10 which has one or more species selected from an aliphatic structure having a carbon number of 2 to 20, an alicyclic structure having a carbon number of 4 to 20, and an aromatic structure having a carbon number of 6 to 30 and it is more preferable that $R^{14}$ be an organic group having a valence of 2 to 10 which has one or more species selected form an aliphatic structure having a carbon number of 4 to 15, an alicyclic structure having a carbon number of 4 to 15, and an aromatic structure having a carbon number of 6 to 25. Furthermore, it is preferable that $R^{15}$ be an organic group having a valence of 4 to 10 which has an aromatic structure having a carbon number of 6 to 30 and it is more preferable that $R^{15}$ be an organic group having a valence of 4 to 10 having an aromatic structure having a carbon number of 6 to 25. The aliphatic structure, the alicyclic structure, and the aromatic structure mentioned above may have heteroatoms and may be either an unsubstituted product or a substitution product.

As the aliphatic structure of $R^{14}$ in general formula (4), for example, an ethane structure, an n-butane structure, an n-pentane structure, an n-hexane structure, an n-decane structure, a 3,3-dimethyl pentane structure, a di-n-butyl ether structure, a di-n-butyl ketone structure, or a di-n-butyl sulfone structure can be cited. Furthermore, as the substituent thereof, for example, halogen atoms or alkoxy groups can be cited. As $R^{14}$ in the case where the aliphatic structure is a substitution product, for example, a 3,3-bis(trifluoromethyl)pentane structure or a 3-methoxy pentane structure can be cited.

As the alicyclic structure of $R^{14}$ in general formula (4), for example, a cyclobutane structure, a cyclopentane structure, a cyclohexane structure, an ethylcyclohexane structure, a tetrahydrofuran structure, a bicyclohexyl structure, a 2,2-dicyclohexyl propane structure, a dicyclohexyl ether structure, a dicyclohexyl ketone structure, or a dicyclohexyl sulfone structure can be cited. Furthermore, as the substituent thereof, for example, halogen atoms or alkoxy groups can be cited. As $R^{14}$ in the case where the alicyclic structure is a substitution product, for example, a 1,1-dicyclohexyl-1,1-bis(trifluoromethyl)methane structure or a 1,1-dicyclohexyl-1-methoxymethane structure can be cited.

As the aromatic structure of $R^{14}$ and $R^{15}$ in general formula (4), for example, a benzene structure, an ethyl benzene structure, a naphthalene structure, a 1,2,3,4-tetrahydronaphthalene structure, a fluorene structure, a biphenyl structure, a terphenyl structure, a 2,2-diphenylpropane structure, a diphenyl ether structure, a diphenyl ketone structure, a diphenyl sulfone structure, or a 9,9-diphenylfluorene structure can be cited. Furthermore, as the substituent thereof, for example, halogen atoms or alkoxy groups can be cited. As $R^{14}$ and $R^{15}$ in the case where the aromatic structure is a substitution product, for example, a 1,1-diphenyl-1,1-bis(trifluoromethyl)methane structure or a 1,1-diphenyl-1-methoxymethane structure can be cited.

As for the (A2-2) polybenzo-oxazole precursor, it is preferable that a structural unit represented by general formula (4) be contained as a main component, and it is preferable that the content ratio of the structural unit represented by general formula (4) in a structural unit originating from the entire amines and their derivatives in the (A2-2) polybenzo-oxazole precursor be within the range of 50 to 100 mol %, and it is more preferable that the content ratio thereof be within the range of 60 to 100 mol %, and it is even more preferable that the content ratio thereof be within the range of 70 to 100 mol %. When the content ratio thereof is within the range mentioned above, the resolution can be improved.

<Tetracarboxylic Acid, Dicarboxylic Acid, and Their Derivatives>

As the tetracarboxylic acid, for example, aromatic tetracarboxylic acids, alicyclic tetracarboxylic acids, or aliphatic tetracarboxylic acids can be cited. These tetracarboxylic acids may have heteroatoms other than the oxygen atoms in the carboxy groups.

As the aromatic tetracarboxylic acids and their derivatives, for example, 1,2,4,5-benzene tetracarboxylic acid (pyromellitic acid), 3,3',4,4'-biphenyl tetracarboxylic acid, 2,3,3',4'-biphenyl tetracarboxylic acid, 2,2',3,3'-biphenyl tetracarboxylic acid, 1,2,5,6-naphthalene tetracarboxylic acid, 1,4,5,8-naphthalene tetracarboxylic acid, 2,3,6,7-naphthalene tetracarboxylic acid, 3,3',4,4'-benzophenone tetracarboxylic acid, 2,2',3,3'-benzophenone tetracarboxylic acid, bis(3,4-dicarboxyphenyl)methane, bis(2,3-dicarboxyphenyl)methane, 1,1-bis(3,4-dicarboxyphenyl)ethane, 1,1-bis(2,3-dicarboxyphenyl)ethane, 2,2-bis(3,4-dicarboxyphenyl)propane, 2,2-bis(2,3-dicarboxyphenyl)propane, 2,2'-bis[4-(3,4-dicarboxy phenoxy)phenyl]propane, 2,2-bis(3,4-dicarboxyphenyl)hexafluoropropane, 2,2-bis(2,3-dicarboxyphenyl)hexafluoropropane, bis(3,4-dicarboxyphenyl)sulfone, bis(3,4-dicarboxyphenyl)ether, 2,3,5,6-pyridine tetracarboxylic acid, or compounds having a structure indicated below, such as 3,4,9,10-perylene tetracarboxylic acid or N,N'-bis[5,5'-hexafluoropropane-2,2-diyl-bis(2-hydroxyphenyl)]bis(3,4-dicarboxybenzoic acid amide), or their tetracarboxylic dianhydrides, tetracarboxylic dichloride, or tetracarboxylic acid active diesters can be cited.

[CHEM. 6]

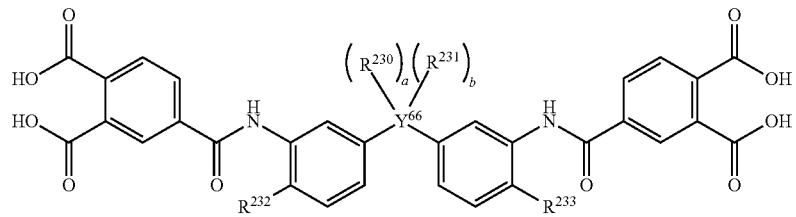

$Y^{66}$ represents a direct bond, an oxygen atom, or an alkylene chain having a carbon number of 1 to 4. When $Y^{66}$ is a direct bond or an oxygen atom, a and b are 0. When $Y^{66}$ is an alkylene chain having a carbon number of 1 to 4, $R^{230}$, and $R^{231}$ each independently represent hydrogen, an alkyl group having a carbon number of 1 to 4, or an alkyl group having a carbon number of 1 to 4 which has 1 to 8 fluorine atoms. $R^{232}$ and $R^{233}$ each independently represent hydrogen, an alkyl group having a carbon number of 1 to 4, or a hydroxy group. a and b each independently represent an integer of 0 to 4. The alkylene chain and the alkyl group mentioned above may be either an unsubstituted product or a substitution product.

As the alicyclic tetracarboxylic acids and their derivatives, for example, bicyclo[2.2.2]octane-7-ene-2,3,5,6-tetracarboxylic acid, 1,2,4,5-cyclohexane tetracarboxylic acid, 1,2,3,4-cyclopentane tetracarboxylic acid, 1,2,3,4-cyclobutane tetracarboxylic acid, 2,3,4,5-tetrahydrofuran tetracarboxylic acid, their tetracarboxylic dianhydrides and tetracarboxylic dichlorides, their tetracarboxylic acid active diesters can be cited.

As the aliphatic tetracarboxylic acids and their derivatives, for example, butane-1,2,3,4-tetracarboxylic acid, their tetracarboxylic dianhydrides and tetracarboxylic dichlorides, or their tetracarboxylic acid active diesters can be cited.

As the dicarboxylic acid and its derivative in the (A1-2) polybenzo-oxazole and the (A2-2) polybenzo-oxazole precursor, it is permissible to use a tricarboxylic acid and/or its derivative.

As the dicarboxylic acid and the tricarboxylic acid, for example, aromatic dicarboxylic acids, aromatic tricarboxylic acids, alicyclic dicarboxylic acids, alicyclic tricarboxylic acids, aliphatic dicarboxylic acids, or aliphatic tricarboxylic acids can be cited. These dicarboxylic acids and the tricarboxylic acids may have heteroatoms other than oxygen atom, other than the oxygen atom in the carboxy group.

As the aromatic dicarboxylic acids and their derivatives, for example, phthalic acid, isophthalic acid, terephthalic acid, 4,4'-dicarboxy biphenyl, 2,2'-bis(trifluoromethyl)-4,4'-dicarboxy biphenyl, 4,4'-benzophenone dicarboxylic acid, 2,2-bis(4-carboxyphenyl)hexafluoropropane, 2,2-bis(3-carboxyphenyl)hexafluoropropane, 4,4'-dicarboxy diphenyl ether, their dicarboxylic anhydrides, dicarboxylic acid chlorides, and dicarboxylic acid active esters, or their diformyl compounds can be cited.

As the aromatic tricarboxylic acids and their derivatives, for example, 1,2,4-benzene tricarboxylic acid, 1,3,5-benzene tricarboxylic acid, 2,4,5-benzophenone tricarboxylic acid, 2,4,4'-biphenyl tricarboxylic acid, 3,3',4'-tricarboxy diphenyl ether, their tricarboxylic anhydrides, tricarboxylic acid chlorides, and tricarboxylic acid active esters, or their diformyl monocarboxylic acids can be cited.

As the alicyclic dicarboxylic acids and their derivatives, for example, 1,4-cyclohexane dicarboxylic acid, 1,2-cyclohexane dicarboxylic acid, their dicarboxylic anhydrides, dicarboxylic acid chlorides, and dicarboxylic acid active esters, or their diformyl compounds can be cited.

As the alicyclic tricarboxylic acids and their derivatives, for example, 1,2,4-cyclohexane tricarboxylic acid, 1,3,5-cyclohexane tricarboxylic acid, their tricarboxylic anhydrides, tricarboxylic acid chlorides, and tricarboxylic acid active esters, or their diformyl monocarboxylic acids can be cited.

As the aliphatic dicarboxylic acids and their derivatives, for example, hexane-1,6-dicarboxylic acid, succinic acid, their dicarboxylic anhydrides, dicarboxylic acid chlorides, and dicarboxylic acid active esters, or their diformyl compounds can be cited.

As the aliphatic tricarboxylic acids and their derivatives, for example, hexane-1,3,6-tricarboxylic acid, propane-1,2,3-tricarboxylic acid, their tricarboxylic anhydrides, tricarboxylic acid chlorides, and tricarboxylic acid active esters, or their diformyl monocarboxylic acids can be cited.

<Diamines and Their Derivatives>

As the diamines and their derivatives, for example, aromatic diamines, bisaminophenol compounds, alicyclic diamines, alicyclic dihydroxy diamines, aliphatic diamines, or aliphatic dihydroxy diamines can be cited. These diamines and their derivatives may have heteroatoms other than the nitrogen atoms and oxygen atoms that the amino groups and their derivatives have.

As the aromatic diamines, the bisaminophenol compounds, and their derivatives, for example, m-phenylene diamine, p-phenylene diamine, 1,4-bis(4-aminophenoxy) benzene, 4,4'-diaminobiphenyl, bis(4-aminophenoxy) biphenyl, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-bis(trifluoromethyl)-4,4'-diaminobiphenyl, 3,3'-diamino-4,4'-biphenol, 1,5-naphthalene diamine, 2,6-naphthalene diamine, 9,9-bis(3-amino-4-hydroxyphenyl) fluorene, 3,4'-diaminodiphenylmethane, 4,4'-diaminodiphenylmethane, bis(3-amino-4-hydroxyphenyl) methane, 1,1-bis(3-amino-4-hydroxyphenyl)ethane, 2,2-bis(3-amino-4-hydroxyphenyl)propane, 2,2-bis(4-aminophenyl)hexafluoropropane, 2,2-bis(3-amino-4-hydroxyphenyl)hexafluoropropane, 3,4'-diaminodiphenyl sulfone, 4,4'-diaminodiphenyl sulfone, bis(4-aminophenoxy phenyl)sulfone, bis(3-aminophenoxy phenyl)sulfone, bis(3-amino-4-hydroxyphenyl)sulfone, 3,4'-diaminodiphenyl sulfide, 4,4'-diaminodiphenyl sulfide, 3,4'-diaminodiphenyl ether, 4,4'-diaminodiphenyl ether, bis[4-(4-aminophenoxy) phenyl]ether, bis(3-amino-4-hydroxyphenyl)ether, 3-sulfone acid-4,4'-diaminodiphenyl ether, compound having a structure indicated below, such as dimercapto phenylene diamine or N,N'-bis[5,5'-hexafluoropropane-2,2-diyl-bis(2-hydroxyphenyl)]bis(3-aminobenzoic acid amide), or the diisocyanate compounds or trimethylsilylated diamines thereof can be cited.

[CHEM. 7]

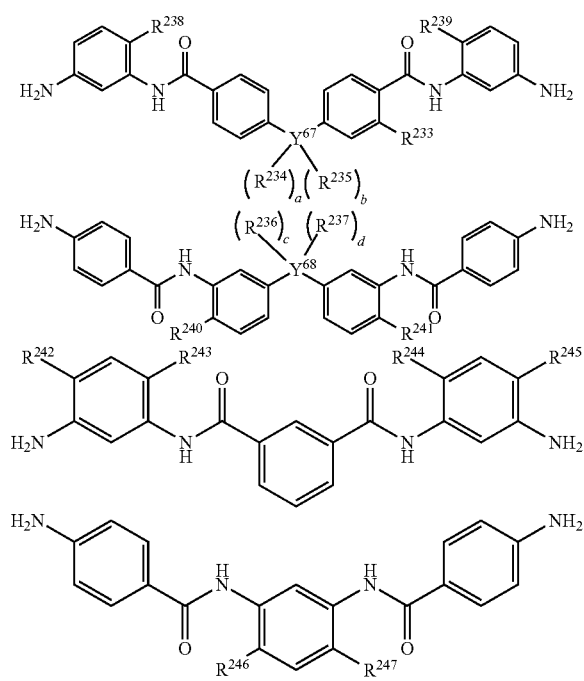

-continued

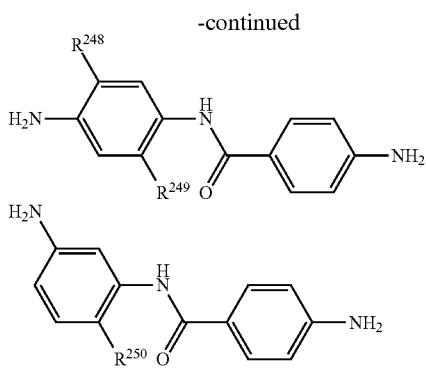

$Y^{67}$ and $Y^{68}$ each independently represent a direct bond, an oxygen atom, or an alkylene chain having a carbon number of 1 to 4. In the case where $Y^6$ and $Y^{68}$ are a direct bond or an oxygen atom, a, b, c, and d are 0. In the case where $Y^{67}$ and $Y^{68}$ are an alkylene chain having a carbon number of 1 to 4, $R^{234}$ to $R^{237}$ each independently represent hydrogen, an alkyl group having a carbon number of 1 to 4, or an alkyl group having a carbon number of 1 to 4 which has 1 to 8 fluorine atoms. $R^{238}$ to $R^{250}$ each independently represent hydrogen, an alkyl group having a carbon number of 1 to 4, or a hydroxy group. a, b, c, and d each independently represent an integer of 0 to 4. The alkylene chain and the alkyl group mentioned above may be either an unsubstituted product or a substitution product.

As the alicyclic diamines, the alicyclic dihydroxy diamines, and their derivatives, for example, compounds obtained by partially substituting the hydrogen atoms of the aromatic rings of the aromatic diamine and the bisaminophenol compound mentioned above with at least one alkyl group having a carbon number of 1 to 10, at least one fluoroalkyl group, or at least one halogen atom, 1,2-cyclohexane diamine, 1,4-cyclohexane diamine, bis(4-aminocyclohexyl)methane, 3,6-dihydroxy-1,2-cyclohexane diamine, 2,5-dihydroxy-1,4-cyclohexane diamine, bis(3-hydroxy-4-aminocyclohexyl)methane, or their diisocyanate compounds or trimethylsilylated diamines can be cited.

The aliphaticdiamines, the aliphatic dihydroxydiamines, and their derivatives, for example, 1,6-hexamethylene diamine, 2,5-dihydroxy-1,6-hexamethylene diamine, or their diisocyanate compounds or trimethylsilylated diamines can be cited.

<Structural Unit Having Fluorine Atom>

It is preferable that one or more species selected from the (A1-1) polyimide, the (A1-2) polybenzo-oxazole, the (A2-1) polyimide precursor, and the (A2-2) polybenzo-oxazole precursor contain a structural unit that has a fluorine atom. As one or more species selected from the (A1-1) polyimide, the (A1-2) polybenzo-oxazole, the (A2-1) polyimide precursor, and the (A2-2) polybenzo-oxazole precursor contain a structural unit that has a fluorine atom, the transparency improves, so that the sensitivity at the time of exposure can be improved. Furthermore, the membrane surface can be provided with water repellency, infiltration from the membrane surface at the time of alkaline development can be inhibited. The exposure mentioned herein means irradiation with active actinic rays (radiant rays); for example, visible light rays, ultraviolet ray, electron rays, X rays, etc. can be cited. From the viewpoint of being a generally-used light source, for example, a super high-pressure mercury lamp light source capable of radiating visible light rays or ultraviolet rays is preferable, and irradiation with j rays (313 nm wavelength), i rays (365 nm wavelength), h rays (405 nm wavelength), or g rays (436 nm wavelength) is more preferable. Hereinafter, exposure refers to irradiation with active actinic rays (radiant rays).

Furthermore, generally, in the case where the (A1-1) polyimide, the (A1-2) polybenzo-oxazole, the (A2-1) polyimide precursor and/or the (A2-2) polybenzo-oxazole precursor is used, the solvent described below that is used to dissolve these resins needs to be a high-polarity solvent such as N-methyl-2-pyrrolidone, dimethyl sulfoxide, N,N-dimethylformamide, or γ-butyrolactone. However, in the case where, as the (D) coloring agent described below, a (D1) pigment is particularly contained, these high-polarity solvents strongly interact with the (D1) pigment, so that, in some cases, the advantageous effect of dispersion stability improvement achieved by the (A1) first resin, the (A2) second resin, or a (E) dispersing agent described later becomes insufficient.

As one or more species selected from the (A1-1) polyimide, the (A1-2) polybenzo-oxazole, the (A2-1) polyimide precursor, and the (A2-2) polybenzo-oxazole precursor contains a structural unit that has a fluorine atom, the solubility with respect to the solvent can be improved. Therefore, it becomes possible to carry out the dissolution of these resins with a reduced content of the high-polarity solvent mentioned above or without using any high-polarity solvent, so that the dispersion stability of the (D1) pigment can be improved.

As the structural unit having a fluorine atom which the (A1-1) polyimide and/or the (A2-1) polyimide precursor contains, a structural unit originating from a tetracarboxylic acid having a fluorine atom and/or its derivative or a structural unit originating from a diamine having a fluorine atom and/or its derivative can be cited.

As the structural unit having a fluorine atom which the (A1-2) polybenzo-oxazole and/or the (A2-2) polybenzo-oxazole precursor contains, a structural unit originating from a dicarboxylic acid having a fluorine atom and/or its derivative or structural unit originating from a bisaminophenol compound having a fluorine atom and/or its derivative can be cited.

As the tetracarboxylic acids having a fluorine atom and their derivatives, for example, 2,2-bis(3,4-dicarboxyphenyl) hexafluoropropane, 2,2-bis(2,3-dicarboxyphenyl)hexafluoropropane, N,N'-bis[5,5'-hexafluoropropane-2,2-diyl-bis(2-hydroxyphenyl)]bis(3,4-dicarboxybenzoic acid amide), or their tetracarboxylic dianhydrides, tetracarboxylic dichlorides, or tetracarboxylic acid active diesters can be cited.

As the dicarboxylic acids having a fluorine atom and their derivatives, for example, 2,2'-bis(trifluoromethyl)-4,4'-dicarboxy biphenyl, 2,2-bis(4-carboxyphenyl)hexafluoropropane, 2,2-bis(3-carboxyphenyl)hexafluoropropane, or their dicarboxylic anhydrides, dicarboxylic acid chlorides, dicarboxylic acid active esters, or diformyl compounds can be cited.

As the diamines or bisaminophenol compounds having a fluorine atom or their derivatives, for example, 2,2'-bis (trifluoromethyl)-4,4'-diaminobiphenyl, 2,2-bis(4-aminophenyl)hexafluoropropane, 2,2-bis(3-amino-4-hydroxyphenyl)hexafluoropropane, N,N'-bis[5,5'-hexafluoropropane-2, 2-diyl-bis(2-hydroxyphenyl)]bis(3-aminobenzoic acid amide), or their diisocyanate compounds or trimethylsilylated diamines can be cited.

It is preferable that the content ratio of the structural unit originating from one or more species selected from a tetracarboxylic acid having a fluorine atom, a tetracarboxylic acid derivative having a fluorine atom, a dicarboxylic acid having a fluorine atom, and dicarboxylic acid derivative having a fluorine atom in the structural unit originating from the entire carboxylic acids and their derivatives in a resin of one or more species selected from the (A1-1) polyimide, the (A1-2) polybenzo-oxazole, the (A2-1) polyimide precursor, and the (A2-2) polybenzo-oxazole precursor be within the range of 30 to 100 mol %. It is more preferable that the content ratio of the structural unit having a fluorine atom be 50 mol % or greater, and it is even more preferable that the content ratio thereof be 70 mol % or greater. Furthermore, it is preferable that the content ratio of the structural unit having a fluorine atom be 100 mol % or less. When the content ratio thereof is within the range mentioned above, the sensitivity at the time of exposure can be improved.

It is preferable that the content ratio of the structural unit originating from one or more species selected from a diamine having a fluorine atom, a diamine derivative having a fluorine atom, a bisaminophenol compound having a fluorine atom, and a bisaminophenol compound derivative having a fluorine atom in the structural unit originating from the entire amines and their derivatives in a resin of one or more species selected from the (A1-1) polyimide, the (A1-2) polybenzo-oxazole, the (A2-1) polyimide precursor, and the (A2-2) polybenzo-oxazole precursor be within the range of 30 to 100 mol %. It is more preferable that the content ratio of the structural unit having a fluorine atom be 50 mol % or greater, and it is even more preferable that the content ratio thereof be 70 mol % or greater. Furthermore, it is preferable that the content ratio of the structural unit having a fluorine atom be 100 mol % or less. When the content ratio thereof is within the range mentioned above, the sensitivity at the time of exposure can be improved.

<Structural Unit Originating from One or More Species Selected from Tetracarboxylic Acid Having Fluorine Atom, Tetracarboxylic Acid Derivative Having Fluorine Atom, Dicarboxylic Acid Having Fluorine Atom, and Dicarboxylic Acid Derivative Having Fluorine Atom>

It is preferable that the (A1-1) polyimide and/or the (A2-1) polyimide precursor contain a structural unit represented general formula (16) and/or a structural unit represented by general formula (17) as a structural unit originating from a tetracarboxylic acid having a fluorine atom and its derivative.

As for the (A1-1) polyimide and/or the (A2-1) polyimide precursor, it is more preferable that $R^1$ in general formula (1) or $R^9$ in general formula (3) contain a structural unit represented by general formula (16) and/or a structural unit represented general formula (17).

In general formulas (16) and (17), $R^{40}$, $R^{41}$, $R^{44}$, and $R^{45}$ each independently represent a substituent represented by general formula (5) mentioned above or general formula (6) mentioned above, and $R^{42}$, $R^{43}$, $R^{46}$, and $R^{47}$ each independently represent an alkyl group having a carbon number of 1 to 10, a cycloalkyl group having a carbon number of 4 to 10, an aryl group having a carbon number of 6 to 15, a phenolic hydroxyl group, a sulfonic group, or a mercapto group. $X^9$ to $X^{12}$ each independently represent a direct bond, an oxygen atom, or a bond represented by general formula (20). In the case where $X^9$ to $X^{12}$ are direct bonds, $Y^9$ to $Y^{12}$ each independently represent a direct bond, an alkylene chain having a carbon number of 1 to 10, a cycloalkylene chain having a carbon number of 4 to 10, or an arylene chain having a carbon number of 6 to 15. In the case where $X^9$ and to $X^{12}$ are oxygen atoms or bonds represented by general formula (20), $Y^9$ to $Y^{12}$ each independently represent an alkylene chain having a carbon number of 1 to 10, a cycloalkylene chain having a carbon number of 4 to 10, or an arylene chain having a carbon number of 6 to 15. a to d each independently represents an integer of 0 to 4, $0 \le a+c \le 4$, and $0 \le b+d \le 4$. Furthermore, e to h each independently represent an integer of 0 to 3, $0 \le e+g \le 3$, and $0 \le f+h \le 3$. In general formulas (16) and (17), it is preferable that $R^{42}$, $R^{43}$, $R^{46}$, and $R^{47}$ each independently be an alkyl group having a carbon number of 1 to 6, a cycloalkyl group having a carbon number of 4 to 7, an aryl group having a carbon number of 6 to 10, a phenolic hydroxyl group, a sulfonic group, or a mercapto group. It is preferable that $Y^9$ to $Y^{12}$ each independently be a direct bond, an alkylene chain having a carbon number of 1 to 6, a cycloalkylene chain having a carbon number of 4 to 7, or an arylene chain having a carbon number of 6 to 10. The alkyl group, the cycloalkyl group, the aryl group, the alkylene chain, the cycloalkylene chain, and the arylene chain mentioned above may be either an unsubstituted product or a substitution product.

[CHEM. 9]

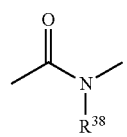

(20)

In general formula (20), $R^{38}$ represents hydrogen, an alkyl group having a carbon number of 1 to 10, an acyl group having a carbon number of 2 to 6, or an aryl group having a carbon number of 6 to 15. In general formula (20), it is preferable that $R^{38}$ be hydrogen, an alkyl group having a carbon number of 1 to 6, an acyl group having a carbon number of 2 to 4, or an aryl group having a carbon number of 6 to 10. The alkyl group, the acyl group, and the aryl group mentioned above may be either an unsubstituted product or a substitution product.

It is preferable that the (A1-2) polybenzo-oxazole and/or the (A2-2) polybenzo-oxazole precursor contain a structural unit represented by general formula (18) and/or a structural unit represented by general formula (19) as a structural unit originating from a dicarboxylic acid having a fluorine atom and its derivative.

As for the (A1-2) polybenzo-oxazole and/or the (A2-2) polybenzo-oxazole precursor, it is more preferable that $R^5$ in general formula (2) or $R^{14}$ in general formula (4) contain a

[CHEM. 8]

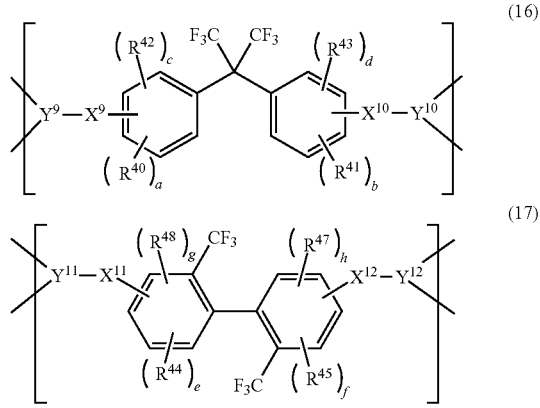

structural unit represented by general formula (18) and/or a structural unit represented by general formula (19).

[CHEM. 10]

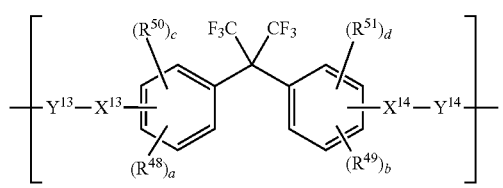

(18)

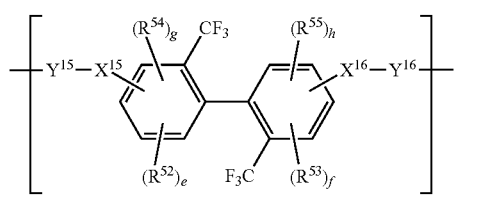

(19)

In general formulas (18) and (19), $R^{48}$, $R^{49}$, $R^{52}$, and $R^{53}$ each independently represent a substituent represented by general formula (5) mentioned above or general formula (6) mentioned above, and $R^{50}$, $R^{51}$, $R^{54}$, and $R^{55}$ each independently represent an alkyl group having a carbon number of 1 to 10, a cycloalkyl group having a carbon number of 4 to 10, an aryl group having a carbon number of 6 to 15, a phenolic hydroxyl group, a sulfonic group, or a mercapto group. $X^{13}$ to $X^{16}$ each independently represent a direct bond, an oxygen atom, or a bond represented by general formula (20). In the case where $X^{13}$ to $X^{16}$ are direct bonds, $Y^{13}$ to $Y^{16}$ each independently represent a direct bond, an alkylene chain having a carbon number of 1 to 10, a cycloalkylene chain having a carbon number of 4 to 10, or an arylene chain having a carbon number of 6 to 15. In the case where $X^{13}$ to $X^{16}$ are oxygen atoms or bonds represented by general formula (20), $Y^{13}$ to $Y^{16}$ each independently represent an alkylene chain having a carbon number of 1 to 10, a cycloalkylene chain having a carbon number of 4 to 10, or an arylene chain having a carbon number of 6 to 15. a to d each independently represent an integer of 0 to 4, $0 \le a+c \le 4$, and $0 \le b+d \le 4$. Furthermore, e to h each independently represent an integer of 0 to 3, $0 \le e+g \le 3$, and $0 \le f+h \le 3$. In general formulas (18) and (19), it is preferable that $R^{50}$, $R^{51}$, $R^{54}$, and $R^{55}$ each independently be an alkyl group having a carbon number of 1 to 6, a cycloalkyl group having a carbon number of 4 to 7, an aryl group having a carbon number of 6 to 10, a phenolic hydroxyl group, a sulfonic group, or a mercapto group. It is preferable that $Y^{13}$ to $Y^{16}$ each independently be a direct bond, an alkylene chain having a carbon number of 1 to 6, a cycloalkylene chain having a carbon number of 4 to 7, or an arylene chain having a carbon number of 6 to 10. The alkyl group, the cycloalkyl group, the aryl group, the alkylene chain, the cycloalkylene chain, and the arylene chain may be either an unsubstituted product or a substitution product.

<Structural Unit Originating from One or More Species Selected from Diamine Having Fluorine Atom, Diamine Derivative Having Fluorine Atom, Bisaminophenol Compound Having Fluorine Atom, and Bisaminophenol Compound Derivative Having Fluorine Atom>

It is preferable that the (A1-1) polyimide and/or the (A2-1) polyimide precursor contain a structural unit represented by general formula (12) and/or a structural unit represented general formula (13) as a structural unit originating from a diamine having a fluorine atom and its derivative.

As for the (A1-1) polyimide and/or the (A2-1) polyimide precursor, it is more preferable that $R^2$ in general formula (1) or $R^{10}$ in general formula (3) contain a structural unit represented by general formula (12) and/or a structural unit represented by general formula (13).

[CHEM. 11]

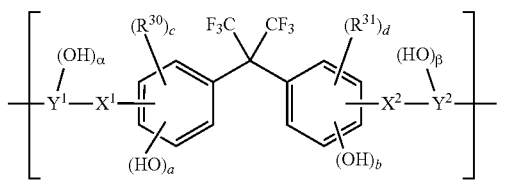

(12)

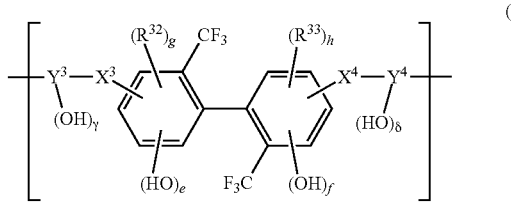

(13)

In general formulas (12) and (13), $R^{30}$ to $R^{33}$ each independently represent an alkyl group having a carbon number of 1 to 10, a cycloalkyl group having a carbon number of 4 to 10, an aryl group having a carbon number of 6 to 15, a sulfonic group, a carboxy group, or a mercapto group. $X^1$ to $X^4$ each independently represent a direct bond, an oxygen atom, or a bond represented by general formula (20) mentioned above. In the case where $X^1$ to $X^4$ are direct bonds, $Y^1$ to $Y^4$ each independently represent a direct bond, an alkylene chain having a carbon number of 1 to 10, a cycloalkylene chain having a carbon number of 4 to 10, or an arylene chain having a carbon number of 6 to 15. In the case where $X^1$ to $X^4$ are oxygen atoms or bonds represented by general formula (20) mentioned above, $Y^1$ to $Y^4$ each independently represent an alkylene chain having a carbon number of 1 to 10, a cycloalkylene chain having a carbon number of 4 to 10, or an arylene chain having a carbon number of 6 to 15. a to d each independently represent an integer of 0 to 4, $0 \le a+c \le 4$, and $0 \le b+d \le 4$. Furthermore, e to h each independently represent an integer of 0 to 3, $0 \le e+g \le 3$, and $0 \le f+h \le 3$. α to δ each independently represent an integer of 0 to 4. In the case where $Y^1$ to $Y^4$ are direct bonds, α to δ are 0. In general formulas (12) and (13), it is preferable that $R^{30}$ to $R^{33}$ each independently be an alkyl group having a carbon number of 1 to 6, a cycloalkyl group having a carbon number of 4 to 7, an aryl group having a carbon number of 6 to 10, a sulfonic group, a carboxy group, or a mercapto group. It is preferable that $Y^1$ to $Y^4$ each independently be a direct bond, an alkylene chain having a carbon number of 1 to 6, a cycloalkylene chain having a carbon number of 4 to 7, or an arylene chain having a carbon number of 6 to 10. It is preferable that a and b each independently be 1 to 4, and it is preferable that e and f each independently be 1 to 3. The alkyl group, the cycloalkyl group, the aryl group, the alkylene chain, the cycloalkylene chain, and the arylene chain mentioned above may be either an unsubstituted product or a substitution product.

It is preferable that the (A1-2) polybenzo-oxazole and/or the (A2-2) polybenzo-oxazole precursor contain a structural unit represented by general formula (14) and/or a structural unit represented by general formula (15) as structural unit originating from a bisaminophenol compound having a fluorine atom and its derivative.

As for the (A1-2) polybenzo-oxazole and/or the (A2-2) polybenzo-oxazole precursor, it is more preferable that $R^6$ in general formula (2) or $R^{15}$ in general formula (4) contain a structural unit represented by general formula (14) and/or a structural unit represented by general formula (15).

[CHEM. 12]

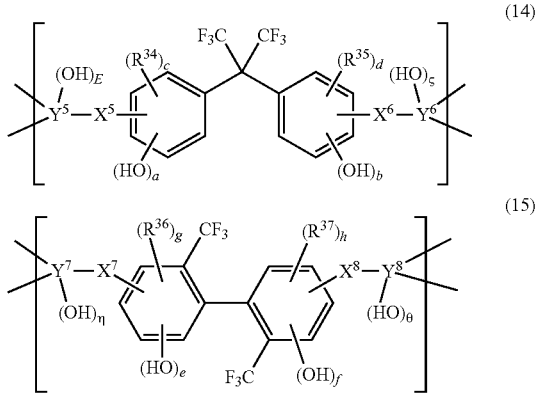

In general formulas (14) and (15), $R^{34}$ to $R^{37}$ each independently represent an alkyl group having a carbon number of 1 to 10, a cycloalkyl group having a carbon number of 4 to 10, an aryl group having a carbon number of 6 to 15, a sulfonic group, a carboxy group, or a mercapto group. $X^5$ to $X^8$ each independently represent a direct bond, an oxygen atom, or a bond represented by general formula (20) mentioned above. In the case where $X^5$ to $X^8$ are direct bonds, $Y^5$ to $Y^8$ each independently represent a direct bond, an alkylene chain having a carbon number of 1 to 10, a cycloalkylene chain having a carbon number of 4 to 10, or an arylene chain having a carbon number of 6 to 15. In the case where $X^5$ to $X^8$ are oxygen atoms or bonds represented by general formula (20) mentioned above, $Y^5$ to $Y^8$ each independently represent an alkylene chain having a carbon number of 1 to 10, a cycloalkylene chain having a carbon number of 4 to 10, or an arylene chain having a carbon number of 6 to 15. a to d each independently represent an integer of 0 to 4, 0≤a+c≤4, and 0≤b+d≤4. Furthermore, e to h each independently represent an integer of 0 to 3, 0≤e+g≤3, and 0≤f+h≤3. ε to θ each independently represent an integer of 0 to 4. In the case where $Y^5$ to $Y^8$ are direct bonds, ε to θ are 0. In general formulas (14) and (15), it is preferable that $R^{34}$ to $R^{37}$ each independently be an alkyl group having a carbon number of 1 to 6, a cycloalkyl group having a carbon number of 4 to 7, an aryl group having a carbon number of 6 to 10, a sulfonic group, a carboxy group, or a mercapto group. It is preferable that $Y^5$ to $Y^8$ each independently be a direct bond, an alkylene chain having a carbon number of 1 to 6, a cycloalkylene chain having a carbon number of 4 to 7, or an arylene chain having a carbon number of 6 to 10. It is preferable that a and b each independently be 1 to 4, and it is preferable that e and f each independently be 1 to 4. The alkyl group, the cycloalkyl group, the aryl group, the alkylene chain, the cycloalkylene chain, and the arylene chain mentioned above may be either an unsubstituted product or a substitution product.

<Structural Unit Originating from Aromatic and Alicyclic Aliphatic Carboxylic Acids and Their Derivatives>

It is preferable that the (A1-1) polyimide and/or the (A2-1) polyimide precursor contain a structural unit originating from an aromatic tetracarboxylic acid and/or its derivative. As the (A1-1) polyimide and/or the (A2-1) polyimide precursor contains a structural unit originating from an aromatic carboxylic acid and/or its derivative, the heat resistance of the aromatic group can improve the heat resistance of the cured film. As the aromatic carboxylic acid and its derivative, an aromatic tetracarboxylic acid and/or its derivative is preferable.

It is preferable that the content ratio of the structural unit originating from an aromatic tetracarboxylic acid and/or its derivative in a structural unit originating from the entire carboxylic acids and their derivatives in the (A1-1) polyimide be within the range of 50 to 100 mol %, and it is more preferable that the content ratio thereof be within the range of 60 to 100 mol %, and it is even more preferable that the content ratio thereof be within the range of 70 to 100 mol %. When the content ratio thereof is within the range mentioned above, the heat resistance of the cured film can be improved.

It is preferable that the content ratio of the structural unit originating from an aromatic tetracarboxylic acid and/or its derivative in a structural unit originating from the entire carboxylic acids and their derivatives in the (A2-1) polyimide precursor be within the range of 50 to 100 mol %, and it is more preferable that the content ratio thereof be within the range of 60 to 100 mol %, and it is even more preferable that the content ratio thereof be within the range of 70 to 100 mol %. When the content ratio thereof is within the range mentioned above, the heat resistance of the cured film can be improved.

The (A1-1) polyimide and/or the (A2-1) polyimide precursor may contain a structural unit originating from an alicyclic carboxylic acid or an aliphatic carboxylic acid and/or their derivatives. As the alicyclic carboxylic acid or the aliphatic carboxylic acid and their derivatives, an alicyclic tetracarboxylic acid or an aliphatic tetracarboxylic acid and/or their derivatives are preferable.

It is preferable that the (A1-2) polybenzo-oxazole and/or the (A2-2) polybenzo-oxazole precursor contain a structural unit originating from an aromatic carboxylic acid and/or its derivative. As the (A1-2) polybenzo-oxazole and/or the (A2-2) polybenzo-oxazole precursor contains an structural unit originating from an aromatic carboxylic acid and/or its derivative, the heat resistance of the aromatic group can improve the heat resistance of the cured film. As the aromatic carboxylic acid and its derivative, an aromatic dicarboxylic acid or an aromatic tricarboxylic acid and/or their derivatives are preferable, and an aromatic dicarboxylic acid and/or its derivative are more preferable.

It is preferable that the content ratio of the structural unit originating from an aromatic carboxylic acid and/or its derivative in a structural unit originating from the entire carboxylic acids and their derivatives in the (A1-2) polybenzo-oxazole be within the range of 50 to 100 mol %, and it is more preferable that the content ratio thereof be within the range of 60 to 100 mol %, and it is even more preferable that the content ratio thereof be within the range of 70 to 100 mol %. When the content ratio thereof is within the range mentioned above, the heat resistance of the cured film can be improved.

It is preferable that the content ratio of the structural unit originating from an aromatic carboxylic acid and/or its derivative in a structural unit originating from the entire carboxylic acids and their derivatives in the (A2-2) polybenzo-oxazole precursor be within the range of 50 to 100 mol %, and it is more preferable that the content ratio thereof be within the range of 60 to 100 mol %, and it is even more preferable that the content ratio thereof be within the range of 70 to 100 mol %. When the content ratio thereof is within the range mentioned above, the heat resistance of the cured film can be improved.

The (A1-2) polybenzo-oxazole and/or the (A2-2) polybenzo-oxazole precursor may contain a structural unit originating from an alicyclic carboxylic acid or an aliphatic carboxylic acid and/or their derivatives. As the alicyclic carboxylic acid or the aliphatic carboxylic acid and their derivatives, an alicyclic dicarboxylic acid, an aliphatic dicarboxylic acid, an alicyclic tricarboxylic acid, an aliphatic tricarboxylic acid, and/or their derivatives are preferable, and an alicyclic dicarboxylic acid, an aliphatic dicarboxylic acid and/or their derivatives are more preferable.

<Structural Unit Originating from Aromatic, Alicyclic, and Aliphatic Amines and their Derivatives>

It is preferable that one or more species selected from the (A1-1) polyimide, the (A1-2) polybenzo-oxazole, the (A2-1) polyimide precursor, and the (A2-2) polybenzo-oxazole precursor contain a structural unit originating from an aromatic amine and/or its derivative. As one or more species selected from the (A1-1) polyimide, the (A1-2) polybenzo-oxazole, the (A2-1) polyimide precursor, and the (A2-2) polybenzo-oxazole precursor contain an structural unit originating from an aromatic amine and/or its derivative, the heat resistance of the aromatic group will improve the heat resistance of the cured film. As the aromatic amine and its derivative, an aromatic diamine, a bisaminophenol compound, an aromatic triamine, or a Tris-aminophenol compound, and/or their derivatives are preferable, and an aromatic diamine, a bisaminophenol compound and/or their derivatives are more preferable.

It is preferable that the content ratio of the structural unit originating from an aromatic amine and/or its derivative in a structural unit originating from the entire amines and their derivatives in a resin of one or more species selected from the (A1-1) polyimide, the (A1-2) polybenzo-oxazole, the (A2-1) polyimide precursor, and the (A2-2) polybenzo-oxazole precursor be within the range of 50 to 100 mol %, and it is more preferable that the content ratio thereof be within the range of 60 to 100 mol %, and it is even more preferable that the content ratio thereof be within the range of 70 to 100 mol %. When the content ratio thereof is within the range mentioned above the heat resistance of the cured film can be improved.

One or more species selected from the (A1-1) polyimide, the (A1-2) polybenzo-oxazole, the (A2-1) polyimide precursor, and the (A2-2) polybenzo-oxazole precursor may contain a structural unit originating from an alicyclic amine or an aliphatic amine and/or their derivatives. As the alicyclic amine or the aliphatic amine and their derivatives, an alicyclic diamine, an alicyclic dihydroxy diamine, an aliphatic diamine, an aliphatic dihydroxy diamine and/or their derivatives are preferable.

<Structural Unit Originating from Diamine Having Silyl Group or Siloxane Bond and its Derivative>

It is preferable that one or more species selected from the (A1-1) polyimide, the (A1-2) polybenzo-oxazole, the (A2-1) polyimide precursor, and the (A2-2) polybenzo-oxazole precursor contain a structural unit originating from a diamine having a silyl group or a siloxane bond and/or its derivative. As one or more species selected from the (A1-1) polyimide, the (A1-2) polybenzo-oxazole, the (A2-1) polyimide precursor, and the (A2-2) polybenzo-oxazole precursor contains a structural unit originating from a diamine having a silyl group or a siloxane bond and/or its derivative, the interaction at an interface between the cured film of the resin composition and a base substrate increases, so that the adhesion with the base substrate and the chemical resistance of the cured film can be improved.

As the diamine having a silyl group or a siloxane bond and its derivative, for example, 1,3-bis(3-aminopropyl)tetramethyl disiloxane or 1,9-bis(4-aminophenyl)octamethyl pentasiloxane can be cited.

It is preferable that the content ratio of the structural unit originating from the diamine having a silyl group or a siloxane bond and/or its derivative in a structural unit originating from the entire amines and their derivatives in a resin of one or more species selected from the (A1-1) polyimide, the (A1-2) polybenzo-oxazole, the (A2-1) polyimide precursor, and the (A2-2) polybenzo-oxazole precursor be 0.1 mol % or greater, and it is more preferable that the content ratio thereof be 0.5 mol % or greater, and it is even more preferable that the content ratio thereof be 1 mol % or greater. When the content ratio thereof is in the within the range mentioned above, the adhesion of the base substrate and the chemical resistance of the cured film can be improved. On the other hand, it is preferable that the content ratio thereof be 30 mol % or less, and it is more preferable that the content ratio thereof be 20 mol % or less, and it is even more preferable that the content ratio thereof be 10 mol % or less. When the content ratio thereof is within the range mentioned above, the heat resistance of the cured film can be improved.

<Structural Unit Originating from Amine Having Oxyalkylene Structure and its Derivative>

It is preferable that one or more species selected from the (A1-1) polyimide, the (A1-2) polybenzo-oxazole, the (A2-1) polyimide precursor, and the (A2-2) polybenzo-oxazole precursor contain a structural unit originating from an amine having an oxyalkylene structure and/or its derivative. As one or more species selected from the (A1-1) polyimide, the (A1-2) polybenzo-oxazole, the (A2-1) polyimide precursor, and the (A2-2) polybenzo-oxazole precursor contains a structural unit originating from an amine having an oxyalkylene structure and/or its derivative, a cured film having a low-taper pattern shape can be obtained and the mechanical characteristic of the cured film can be improved.

As the amine having an oxyalkylene structure and its derivative, a diamine having an oxyalkylene structure or a triamine having an oxyalkylene structure and/or their derivatives are preferable.

It is preferable that one or more species selected from the (A1-1) polyimide, the (A2-1) polyimide precursor, the (A1-2) polybenzo-oxazole, and the (A2-2) polybenzo-oxazole precursor contain a structural unit represented by general formula (21) as a structural unit originating from a diamine having an oxyalkylene structure and its derivative.

As for the (A1-1) polyimide and/or the (A2-1) polyimide precursor, it is more preferable that $R^2$ in general formula (1) or $R^{10}$ in general formula (3) contain a structural unit represented by general formula (21).

[CHEM. 13]

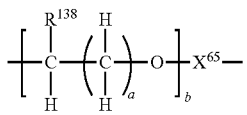
(21)

In general formula (21), $X^{65}$ represents a direct bond or an alkylene chain having a carbon number of 1 to 10. $R^{138}$ represents hydrogen, an alkyl group having a carbon number of 1 to 10, a cycloalkyl group having a carbon number of 4 to 10, or an aryl group having a carbon number of 6 to 15. a and b each independently represent an integer of 1 to 10. In general formula (21), it is preferable that $X^{65}$ be a direct bond or an alkylene chain having a carbon number of 1 to 6. It is preferable that $R^{138}$ be hydrogen, an alkyl group having a carbon number of 1 to 6, a cycloalkyl group having a carbon number of 4 to 7, or an aryl group having a carbon number of 6 to 10. It is preferable that a be an integer of 1 to 6. The alkylene chain, the alkyl group, the cycloalkyl group, and the aryl group mentioned above may be either an unsubstituted product or a substitution product.

It is preferable that the triamine having an oxyalkylene structure and its derivative be a compound represented by general formula (22).

[CHEM. 14]

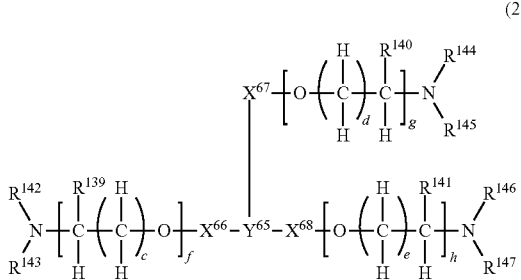
(22)

In general formula (22), $X^{66}$ to $X^{68}$ each independently represent a direct bond or an alkylene chain having a carbon number of 1 to 10, and $Y^{65}$ represents a methine group, an alkane-1,1,1-triyl group having a carbon number of 1 to 10, a cycloalkane-triyl group having a carbon number of 4 to 10, or an arene-triyl group having a carbon number of 6 to 15. $R^{139}$ to $R^{147}$ each independently represent hydrogen or an alkyl group having a carbon number of 1 to 10. c, d, e, f, g and h each independently represent an integer of 1 to 10. In general formula (22), it is preferable that $X^{66}$ to $X^{68}$ each independently be a direct bond or an alkylene chain having a carbon number of 1 to 6. Furthermore, it is preferable that $Y^{65}$ be a methine group, an alkane-1,1,1-triyl group having a carbon number of 1 to 6, a cycloalkane-triyl group having a carbon number of 4 to 7, an arene-triyl group having a carbon number of 6 to 10. Furthermore, it is preferable that $R^{139}$ to $R^{147}$ each independently be hydrogen or an alkyl group having a carbon number of 1 to 6. Furthermore, it is preferable that c, d and e each independently be an integer of 1 to 6. The alkyl group, the alkylene chain, the alkane-1,1,1-triyl group, the cycloalkane-triyl group, or the arene-triyl group mentioned above may be either an unsubstituted product or a substitution product.

As the diamine having an oxyalkylene structure and its derivative, for example, "JEFFAMINE" (registered trademark) D-230, D-400 of the same, D-2000 of the same, D-4000 of the same, HK-511 of the same, ED-600 of the same, ED-900 of the same, ED-2003 of the same, EDR-148 of the same, EDR-176 of the same, SD-231 of the same, SD-401 of the same, SD-2001 of the same, THF-100 of the same, THF-140 of the same, THF-170 of the same, XTJ-582 of the same, XTJ-578 of the same, XTJ-542 of the same, XTJ-548 of the same, or XTJ-559 of the same, or "ELASTAMINE" (registered trademark) RP-405, RP-409 of the same, RP-2005 of the same, RP-2009 of the same, RT-1000 of the same, RE-600 of the same, RE-900 of the same, RE-2000 of the same, HE-150 of the same, HE-180 of the same, HE-1700 of the same, HT-1700 of the same, RE1-1000 of the same, RE1-2005 of the same, RE1-2007 of the same, RP3-400 of the same, or RP3-5000 of the same (all of which are made by HUNTSMAN company) can be cited.

As the triamine having an oxyalkylene structure and its derivative, for example, "JEFFAMINE" (registered trademark) T-403, T-3000 of the same, T-5000 of the same, and ST-404 of the same (all of which are made by HUNTSMAN company) can be cited.

It is preferable that content ratio of a structural unit originating from an amine having an oxyalkylene structure and/or its derivative in a structural unit originating from the entire amines and their derivatives in a resin of one or more species selected from the (A1-1) polyimide, the (A1-2) polybenzo-oxazole, the (A2-1) polyimide precursor, and the (A2-2) polybenzo-oxazole precursor be 1 mol % or greater, and it is more preferable that the content ratio thereof be 5 mol % or greater, and it is even more preferable that the content ratio thereof be 10 mol % or greater. When the content ratio thereof is within the range mentioned above, a cured film having a low-taper pattern shape can be obtained and the mechanical characteristic of the cured film can be improved. On the other hand, it is preferable that the content ratio thereof be 60 mol % or less, and it is more preferable that the content ratio thereof be 50 mol % or less, and it is even more preferable that the content ratio thereof be 40 mol % or less. When the content ratio thereof is within the range mentioned above, the heat resistance of the cured film can be improved.

<End-Capping Agent>

One or more species selected from the (A1-1) polyimide, the (A1-2) polybenzo-oxazole, the (A2-1) polyimide precursor, and the (A2-2) polybenzo-oxazole precursor may each have an end of the resin sealed by an end-capping agent such as a monoamine, a dicarboxylic anhydride, a monocarboxylic acid, a monocarboxylic acid chloride, or a monocarboxylic acid active ester. As the resin end is sealed by an end-capping agent, it is possible to improve the storage stability of a coating liquid having a resin composition that contains one or more species selected from the (A1-1) polyimide, the (A1-2) polybenzo-oxazole, the (A2-1) polyimide precursor, and the (A2-2) polybenzo-oxazole precursor.

As the monoamine for use as an end-capping agent, for example, 5-amino-8-hydroxy quinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxy pyrimidine, 2-aminophenol, 3-aminophenol, 4-aminophenol, 2-aminothiophenol, 3-aminothiophenol, or 4-aminothiophenol can be cited.

As the dicarboxylic anhydride for use as an end-capping agent, for example, phthalic anhydride, maleic anhydride, succinic anhydride, 5-norbornene-2,3-dicarboxylic anhydride, cyclohexane dicarboxylic anhydride, or 3-hydroxy phthalic anhydride can be cited.

As the monocarboxylic acid and the monocarboxylic acid chloride for use as an end-capping agent, for example, benzoic acid, 3-carboxy phenol, 4-carboxy phenol, 3-carboxy thiophenol, 4-carboxy thiophenol, 1-hydroxy-7-carboxy naphthalene, 1-hydroxy-6-carboxy naphthalene, 1-hydroxy-5-carboxy naphthalene, 1-mercapto-7-carboxy naphthalene, 1-mercapto-6-carboxy naphthalene, 1-mercapto-5-carboxy naphthalene, 3-carboxy benzene sulfonic aid, 4-carboxy benzene sulfonic aid, and their monocarboxylic acid chlorides, or monocarboxylic acid chlorides of terephthalic acid, phthalic acid, maleic acid, cyclohexane dicarboxylic acid, 1,5-dicarboxy naphthalene, 1,6-dicarboxy naphthalene, 1,7-dicarboxy naphthalene, 2,6-dicarboxy naphthalene can be cited.

As the monocarboxylic acid active ester for use as an end-capping agent, for example, monocarboxylic acid active ester compounds obtained by reaction of the aforementioned acid chlorides with N-hydroxybenzotriazole or N-hydroxy-5-norbornene-2,3-dicarboxy imide can be cited.

It is preferable that the content ratio of the structural unit originating from the end-capping agent in a structural unit originating from the entire amines, the entire carboxylic acids, and their derivatives in a resin of one or more species selected from the (A1-1) polyimide, the (A1-2) polybenzo-oxazole, the (A2-1) polyimide precursor, and the (A2-2) polybenzo-oxazole precursor be 1 mol % or greater, and it is more preferable that the content ratio thereof be 3 mol % or greater, and it is even more preferable that the content ratio thereof be 5 mol % or greater. When the content ratio thereof is within the range mentioned above, the storage stability of a coating liquid having the resin composition can be improved. On the other hand, it is preferable that the content ratio thereof be 30 mol % or less, and it is more preferable that the content ratio thereof be 25 mol % or less, and it is even more preferable that the content ratio thereof be 20 mol % or less. When the content ratio thereof is within the range mentioned above, the post-development resolution can be improved.

The content ratio of the structural unit originating from various carboxylic acids or amines and their derivatives in the (A1-1) polyimide, the (A1-2) polybenzo-oxazole, the (A2-1) polyimide precursor, and/or the (A2-2) polybenzo-oxazole precursor can be determined by a combination of $^1$H—NMR, $^{13}$C—NMR, $^{15}$N—NMR, IR, TOF—MS, a chemical element analysis method, ash content measurement, etc.

<Physical Properties of (A1-1) Polyimide, (A1-2) Polybenzo-Oxazole, (A2-1) Polyimide Precursor, and/or (A2-2) Polybenzo-Oxazole Precursor>

It is preferable that, in a resin of one or more species selected from the (A1-1) polyimide, the (A1-2) polybenzo-oxazole, the (A2-1) polyimide precursor, and the (A2-2) polybenzo-oxazole precursor, the number of repetitions n of the structural unit be 5 or greater, and it is more preferable that the number n be 10 or greater, and it is even more preferable that the number n be 15 or greater. When the number of repetitions n is within the range mentioned above, the post-development resolution can be improved. On the other hand, it is preferable that the number of repetitions n be 1,000 or less, and it is more preferable that the number n be 500 or less, and it is even more preferable that the number n be 100 or less. When the number of repetitions n is within the range mentioned above, the leveling property at the time of coating application and the pattern workability with an alkaline developer can be improved.

It is preferable that the weight-average molecular weight (hereinafter, "Mw") of one or more species selected from the (A1-1) polyimide, the (A1-2) polybenzo-oxazole, the (A2-1) polyimide precursor, and the (A2-2) polybenzo-oxazole precursor, in terms of polystyrene measured by gel permeation chromatography (hereinafter, "GPC"), be 1,000 or greater, and it is more preferable that the Mw be 3,000 or greater, and it is even more preferable that the Mw be 5,000 or greater. When the Mw thereof is within the range mentioned above, the post-development resolution can be improved. On the other hand, it is preferable that the Mw thereof be 500,000 or less, and it is more preferable that the Mw be 300,000 or less, and it is even more preferable that the Mw be 100,000 or less. When the Mw thereof is within the range mentioned above, the leveling property at the time of coating application and the pattern workability with an alkaline developer can be improved.

Furthermore, it is preferable that the number-average molecular weight (hereinafter, "Mn"), in terms of polystyrene measured by GPC, be 1,000 or greater, and it is more preferable that the Mn be 3,000 or greater, and it is even more preferable that the Mn be 5,000 or greater. When the Mn thereof is within the range mentioned above, the post-development resolution can be improved. On the other hand, it is preferable that the Mn thereof be 500,000 or less, and it is more preferable that the Mn be 300,000 or less, and it is even more preferable that the Mn be 100,000 or less. When the Mn thereof is within the range mentioned above, the leveling property at the time of coating application and the pattern workability with an alkaline developer can be improved.

The Mw and Mn of the (A1-1) polyimide, the (A1-2) polybenzo-oxazole, the (A2-1) polyimide precursor, and the (A2-2) polybenzo-oxazole precursor can be easily measured as values in terms of polystyrene by GPC, a light scattering method, an X-ray small angle scattering method, etc. The number of repetitions n of the structural unit in the (A1-1) polyimide, the (A1-2) polybenzo-oxazole, the (A2-1) polyimide precursor, and the (A2-2) polybenzo-oxazole precursor can be determined as n=Mw/M where M is the molecular weight of the structural unit and Mw is the weight-average molecular weight of the resin.

It is preferable that the alkali dissolution speed of one or more species selected from the (A1-1) polyimide, the (A1-2) polybenzo-oxazole, the (A2-1) polyimide precursor, and the (A2-2) polybenzo-oxazole precursor be 50 nm/min or greater, and it is more preferable that the alkali dissolution speed thereof be 70 nm/min or greater, and it is even more preferable that the alkali dissolution speed be 100 nm/min or greater. When the alkali dissolution speed thereof is within the range mentioned above, the post-development resolution can be improved. On the other hand, it is preferable that the alkali dissolution speed be 12,000 nm/min or less, and it is more preferable that the alkali dissolution speed be 10,000 nm/min or less, and it is even more preferable that the alkali dissolution speed be 8,000 nm/min or less. When the alkali dissolution speed is within the range mentioned above, the film reduction at the time of alkaline development can be inhibited.

The alkali dissolution speed mentioned herein refers to a film thickness reduction value obtained by applying a solution obtained by dissolving the resin in γ-butyrolactone onto an Si wafer, performing prebake at 120° C. for 4 minutes to form a pre-baked film having a film thickness of 10 μm±0.5 μm, developing the pre-baked film with a 2.38 mass % tetramethylammonium hydroxide aqueous solution at 23±1° C. for 60 seconds, and then rinsing the film with water for 30 seconds.

<Synthesis Method for (A1-1) Polyimide, (A1-2) Polybenzo-Oxazole, (A2-1) Polyimide Precursor, and (A2-2) Polybenzo-Oxazole Precursor>

The (A1-1) polyimide and the (A2-1) polyimide precursor can be synthesized by a known method. For example, a method in which tetracarboxylic dianhydride and a diamine (partially replaced with a monoamine that is an end-capping agent) are reacted in a polar solvent, such as N-methyl-2-pyrrolidone at 80 to 200° C. or a method in which tetracarboxylic dianhydride (partially replaced with dicarboxylic anhydride, a monocarboxylic acid, a monocarboxylic acid chloride, or a monocarboxylic acid active ester that is an end-capping agent) and a diamine are reacted at 80 to 200° C., etc. can be cited. Furthermore, a method in which a (A2-1) polyimide precursor is synthesized by performing a method similar to the foregoing ones at 0 to 80° C., or the like, and the obtained (A2-1) polyimide precursor is completely imidized by a known imidization reaction method, a method in which the imidization reaction is stopped halfway so that imide bonds are partly introduced, a method in which the completely imidized (A1-1) polyimide and the (A2-1) polyimide precursor are mixed so that imide bonds are partly introduced, etc. can be cited.

The (A1-2) polybenzo-oxazole and the (A2-2) polybenzo-oxazole precursor can be synthesized by a known method. For example, a method in which a dicarboxylic acid active diester and a bisaminophenol compound (partly replaced with a monoamine that is an end-capping agent) are reacted in a polar solvent, such as N-methyl-2-pyrrolidone, at 80 to 250° C., a method in which a dicarboxylic acid active diester (partly replaced with a dicarboxylic anhydride, a monocarboxylic acid, a monocarboxylic acid chloride, or a monocarboxylic acid active ester that is an end-capping agent) and a bisaminophenol compound are reacted at 80 to 250° C., etc. can be cited. Furthermore, a method in which a (A2-2) polybenzo-oxazole precursor is synthesized by performing a method similar to the foregoing one at 0 to 80° C., or the like, and the obtained (A2-2) polybenzo-oxazole precursor is completely converted into oxazole by using a known oxazole-converting reaction method, a method in which the oxazole-converting reaction is stopped halfway so that an oxazole structure is partly introduced, a method in which a completely oxazole-converted (A1-2) polybenzo-oxazole and a (A2-2) polybenzo-oxazole precursor are mixed so that an oxazole structure is partly introduced, etc. can be cited.

It is preferable that one or more species selected from the (A1-1) polyimide, the (A1-2) polybenzo-oxazole, the (A2-1) polyimide precursor, the (A2-2) polybenzo-oxazole precursor, be those obtained by, after end of polymerization reaction, carrying out precipitation in a poor solvent, such as methanol or water, with respect to the one or more species selected from the (A1-1) polyimide, the (A1-2) polybenzo-oxazole, the (A2-1) polyimide precursor, and the (A2-2) polybenzo-oxazole precursor, and then washing and drying the precipitate. By performing a re-precipitation process, a low-molecular weight component or the like can be removed, so that the mechanical characteristic of the cured film will considerably improve.

A concrete method for synthesizing a (A1-1) polyimide, a (A1-2) polybenzo-oxazole, a (A2-1) polyimide precursor, and/or a (A2-2) polybenzo-oxazole precursor will be described. First, a diamine or the like or a bisaminophenol compound or the like are dissolved in a reaction solvent. Into this solution, a substantially equimolar amount of a carboxylic anhydride or the like is gradually added. Using a mechanical stirrer, the mixture solution is agitated for preferably 0.5 to 50 hours and more preferably 2 to 24 hours at a temperature of preferably 0 to 200° C. and more preferably 40 to 150° C. In the case where an end-capping agent is used, addition of the carboxylic anhydride or the like is followed by agitation at a predetermined temperature for a predetermined time, which is followed by gradual addition of the end-capping agent and agitation.

It suffices that the reaction solvent for use in the polymerization reaction can dissolve diamines or bisaminophenol compounds and carboxylic anhydrides that are raw materials, and it is preferable that the reaction solvent be a polar solvent. As the reaction solvent, for example, amides, such as N,N-dimethylformamide, N,N-dimethylacetamide, or N-methyl-2-pyrrolidone, cyclic esters, such as γ-butyrolactone, γ-valerolactone, δ-valerolactone, γ-caprolactone, ε-caprolactone, or α-methyl-γ-butyrolactone, carbonates, such as ethylene carbonate or propylene carbonate, glycols, such as triethylene glycol, phenols, such as m-cresol or p-cresol, and other solvents, such as acetophenone, 1,3-dimethyl-2-imidazolidinone, sulfolane, or dimethyl sulfoxide, can be cited. It is preferable that the amount of the reaction solvent be 100 mass parts or greater in the case where the total amount of the diamine or the like or the bisaminophenol compound or the like and the carboxylic anhydride or the like is assumed to be 100 mass parts, and it is more preferable that the amount of the reaction solvent be 150 mass parts or greater. Furthermore, it is preferable that the amount of the reaction solvent be 1900 mass parts or less, and it is more preferable that the amount of the reaction solvent be 950 mass parts or less.

The imide ring closure ratio (imide conversion ratio) of the (A1-1) polyimide or the (A2-1) polyimide precursor can be easily determined, for example, by the following method. First, an infrared absorption spectrum of the resin is measured, and the presence of absorption peaks (near 1780 cm$^{-1}$ and near 1377 cm$^{-1}$) of imide bonds resulting from the polyimide structure is checked. Next, the resin is thermoset at 350° C. for 1 hour, and then the infrared absorption spectrum thereof is measured. By comparing the peak strengths near 1780 cm$^{-1}$ or near 1377 cm$^{-1}$ before and after the thermosetting, the imide bond content in the resin prior to the thermosetting can be calculated and therefore the imide conversion ratio can be determined.

The oxazole ring closure ratio (oxazole conversion ratio) of the (A1-2) polybenzo-oxazole or the (A2-2) polybenzo-oxazole precursor can be easily determined by, for example, the following method. First, an infrared absorption spectrum of the resin is measured, and the presence of absorption peaks (near 1574 cm$^{-1}$ and near 1557 cm$^{-1}$) of oxazole bonds resulting from a polybenzo-oxazole structure is checked. Next, the resin is thermoset at 350° C. for 1 hour, and then the infrared absorption spectrum is measured. By comparing the peak strengths near 1574 cm$^{-1}$ or near 1557 cm$^{-1}$ before and after the thermosetting, the oxazole bond content in the resin prior to the thermosetting can be calculated and therefore the oxazole conversion ratio can be determined.

<(A2-3) Polysiloxane>

As the (A2-3) polysiloxane for use in the present invention, for example, polysiloxanes obtained by hydrolyzing and dehydrocondensing one or more species selected from trifunctional organosilanes, tetrafunctional organosilanes, difunctional organosilanes, and monofunctional organosilanes can be cited.

The (A2-3) polysiloxane is a thermosetting resin. By thermosetting and dehydrocondensing the (A2-3) polysiloxane at high temperature, high-heat resistance siloxane bonds (Si—O) are formed. Therefore, by containing in the resin composition the (A2-3) polysiloxane that has high-heat resistance siloxane bonds, the heat resistance of the cured film obtained can be improved. Furthermore, since the (A2-3) polysiloxane is a resin that improves in heat resistance after dehydrocondensation, the (A2-3) polysiloxane is suitable for the cases where the (A2-3) polysiloxane is put to uses in which both the property prior to dehydrocondensation and the heat resistance of the cured film are desired to be favorably achieved, and the like.

Furthermore, the (A2-3) polysiloxane has silanol groups as a reactive group. Therefore, in the case where, as the (D) coloring agent described below, a (D1) pigment is particularly contained, silanol groups can interact with and/or bind to surfaces of the (D1) pigment and, at the same time, can interact with and/or bind to surface modifying groups of the (D1) pigment. Therefore, the dispersion stability of the (D1) pigment can be improved.

<Trifunctional Organosilane Unit, Tetrafunctional Organosilane Unit, Difunctional Organosilane Unit, and Monofunctional Organosilane Unit>

It is preferable that the (A2-3) polysiloxane for use in the present invention contain a trifunctional organosilane unit and/or a tetrafunctional organosilane unit, from the viewpoint of heat resistance improvement of the cured film and post-development resolution improvement. It is preferable that the trifunctional organosilane be an organosilane unit represented by general formula (7). It is preferable that the tetrafunctional organosilane unit be an organosilane unit represented by general formula (8).

The (A2-3) polysiloxane for use in the present invention may contain a difunctional organosilane unit, from the viewpoint of reduced taper of the pattern shape and improvement of mechanical characteristics of the cured film. It is preferable that the difunctional organosilane be an organosilane unit represented by general formula (9).

The (A2-3) polysiloxane for use in the present invention may contain a monofunctional organosilane unit from the viewpoint of improvement of storage stability of the coating liquid of the resin composition. It is preferable that the monofunctional organosilane unit be an organosilane unit represented by general formula (10).

[CHEM. 15]

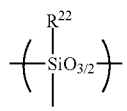

(7)

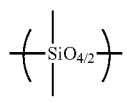

(8)

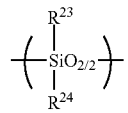

(9)

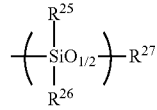

(10)

In general formulas (7) to (10), $R^{22}$ to $R^{27}$ each independently represent hydrogen, an alkyl group, a cycloalkyl group, an alkenyl group, or an aryl group. In general formulas (7) to (10), it is preferable that $R^{22}$ to $R^{27}$ each independently be hydrogen, an alkyl group having a carbon number of 1 to 10, a cycloalkyl group having a carbon number of 4 to 10, an alkenyl group having a carbon number of 2 to 10, or an aryl group having a carbon number of 6 to 15, and it is more preferable that $R^{22}$ to $R^{27}$ each independently be hydrogen, an alkyl group having a carbon number of 1 to 6, a cycloalkyl group having a carbon number of 4 to 7, an alkenyl group having a carbon number of 2 to 8, or an aryl group having a carbon number of 6 to 10. The alkyl group, the cycloalkyl group, the alkenyl group, and the aryl group mentioned above may have a heteroatom and may be either an unsubstituted product or a substitution product.

As the organosilane that has an organosilane unit represented by general formula (7), for example, trifunctional organosilanes, such as methyltrimethoxysilane, methyltriethoxysilane, methyltri-n-propoxysilane, ethyltrimethoxysilane, n-propyltrimethoxysilane, isopropyltrimethoxysilane, n-hexyltrimethoxysilane, n-decyltrimethoxysilane, cyclopentyltrimethoxysilane, cyclohexyltrimethoxysilane, 3-glycidoxypropyltrimethoxysilane, 2-(3,4-epoxycyclohexyl)ethyltrimethoxysilane, 3-[(3-ethyl-3-oxetanyl)methoxy] propyltrimethoxysilane, 3-aminopropyltrimethoxysilane, N-(2-aminoethyl)-3-aminopropyltrimethoxysilane, N-phenyl-3-aminopropyltrimethoxysilane, N-(vinyl benzyl)-2-aminoethyl-3-aminopropyltrimethoxysilane hydrochlorate salt, 3-(4-aminophenyl)propyltrimethoxysilane, 1-[4-(3-trimethoxysilylpropyl)phenyl]urea, 1-(3-trimethoxysilyl-propyl)urea, 3-triethoxysilyl-N-(1,3-dimethylbutylidene) propylamine, 3-mercapto propyltrimethoxysilane, 3-isocyanate propyltriethoxysilane, 1,3,5-tris(3-trimethoxysilylpropyl)isocyanuric acid, N-t-butyl-2-(3-trimethoxysilylpropyl) succinimide, or N-t-butyl-2-(3-triethoxysilylpropyl) succinimide, can be cited.

It is preferable that the content ratio of the organosilane unit represented by general formula (7) in the (A2-3) polysiloxane be within the range of 50 to 100 mol % in terms of Si atom molar ratio, and it is more preferable that the content ratio thereof be within the range of 60 to 100 mol %, and it is even more prefer that the content ratio thereof be within the range of 70 to 100 mol %. When the content ratio thereof is within the range mentioned above, the heat resistance of the cured film will improve.

As the organosilane having an organosilane unit represented by general formula (8), for example, tetrafunctional organosilanes, such as tetramethoxysilane, tetraethoxysilane, tetra-n-propoxysilane, tetraisopropoxysilane, tetra-n-butoxysilane, or tetraacetoxysilane, and silicate compounds, such as Methyl Silicate 51 (made by FUSO CHEMICAL CO., LTD.), M Silicate 51, Silicate 40 or Silicate 45 (which are all made by TAMA CHEMICALS CO., LTD.), or Methyl Silicate 51, Methyl Silicate 53A, Ethyl Silicate 40, or Ethyl Silicate 48 (which are all made by COLCOAT CO., LTD.) can be cited. From the viewpoint of heat resistance improvement of the cured film and post-development resolution improvement, tetramethoxysilane, tetraethoxysilane, tetra-n-propoxysilane, Methyl Silicate 51 (made by FUSO CHEMICAL CO., LTD.), M Silicate 51 (made by TAMA CHEMICALS CO., LTD.), or Methyl Silicate 51 (made by COLCOAT CO., LTD.) are preferable.

It is preferable that content ratio of the organosilane unit represented by the general formula (8) in the (A2-3) polysiloxane be within the range of 0 to 40 mol % in terms of Si atom molar ratio, and it is more preferable that the content ratio thereof be within the range of 0 to 30 mol %, and it is even more prefer that the content ratio thereof be within the range of 0 to 20 mol %. When the content ratio thereof is within the range mentioned above, the heat resistance of the cured film and the post-development resolution can be improved.

As the organosilane that has an organosilane unit represented by general formula (9), for example, difunctional organosilanes, such as dimethyldimethoxysilane, dimethyldiethoxysilane, dimethyldiacetoxysilane, diethyldimethoxysilane, diethyldiethoxysilane, di-n-propyldimethoxysilane, di-n-butyldimethoxysilane, dicyclopentyldimethoxysilane, cyclohexylmethyldimethoxysilane, 3-glycidoxypropylmethyldimethoxysilane, N-(2-aminoethyl)-3-aminopropylmethyldimethoxysilane, 3-mercapto propylmethyldimethoxysilane, or 3-isocyanate propylmethyldiethoxysilane, and difunctional organosilane oligomers, such as 1,1,3,3-tetramethyl-1,3-dimethoxydisiloxane, 1,1,3,3-tetramethyl-1,3-diethoxydisiloxane, 1,1,3,3-tetraethyl-1,3-dimethoxydisiloxane, 1,1,3,3-tetraethyl-1,3-diethoxydisiloxane, or DMS-S12, DMS-S15, PDS-1615, or PDS-9931 (which are all made by Gelest), can be cited. From the viewpoint of reduced taper of the pattern shape and improve of the mechanical characteristics of the cured film, dimethyldimethoxysilane, dimethyldiethoxysilane, dimethyldiacetoxysilane, diethyldimethoxysilane, diethyldiethoxysilane, diphenyldimethoxysilane, diphenyldiethoxysilane, 1,1,3,3-tetramethyl-1,3-dimethoxydisiloxane, 1,1,3,3-tetramethyl-1,3-diethoxydisiloxane, 1,1,3,3-tetraethyl-1,3-dimethoxydisiloxane, or 1,1,3,3-tetraethyl-1,3-diethoxydisiloxane are preferable.

It is preferable that the content ratio of the organosilane unit represented by general formula (9) in the (A2-3) polysiloxane be within the range of 0 to 60 mol % in terms of Si atom molar ratio, and it is more preferable that the content ratio thereof be within the range of 0 to 50 mol %, and it is even more preferable that the content ratio thereof be within the range of 0 to 40 mol %. When the content ratio thereof is within the range mentioned above, the heat resistance of the cured film and the post-development resolution can be improved.

As the organosilane having an organosilane unit represented by general formula (10), for example, monofunctional organosilanes, such as trimethylmethoxysilane, trimethylethoxysilane, triethylmethoxysilane, triethylethoxysilane, tri-n-propylmethoxysilane, tri-n-propylethoxysilane, tri-n-butylmethoxysilane, tri-n-butylethoxysilane, (3-glycidoxypropyl)dimethylmethoxysilane, or (3-glycidoxypropyl)dimethylethoxysilane, can be cited.

It is preferable that content ratio of the organosilane unit represented by general formula (10) in the (A2-3) polysiloxane be within the range of 0 to 20 mol % in terms of Si atom molar ratio, and it is more preferable that the content ratio thereof be within the range of 0 to 10 mol %, and it is even more preferable that the content ratio thereof be within the range of 0 to 5 mol %. When the content ratio thereof is within the range mentioned above, the heat resistance of the cured film can be improved.

It is preferable that the (A2-3) polysiloxane for use in the present invention be a (A2-3) polysiloxane obtained by hydrolyzing and dehydrocondensing one or more species selected from organosilanes represented by general formula (7a), organosilanes represented by general formula (8a), organosilanes represented by general formula (9a), and organosilanes represented by general formula (10a).

[CHEM. 16]

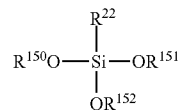

(7a)

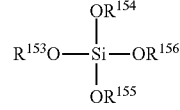

(8a)

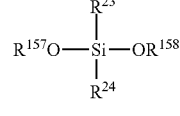

(9a)

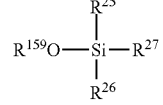

(10a)

In general formulas (7a) to (10a), $R^{22}$ to $R^{27}$ each independently represent hydrogen, an alkyl group, a cycloalkyl group, an alkenyl group, or an aryl group, and R to R each independently represent hydrogen, an alkyl group, an acyl group, or an aryl group. In general formulas (7a) to (10a), it is preferable that $R^{22}$ to $R^{27}$ each independently be hydrogen, an alkyl group having a carbon number of 1 to 10, a cycloalkyl group having a carbon number of 4 to 10, an alkenyl group having a carbon number of 2 to 10, or an aryl group having a carbon number of 6 to 15, and it is more preferable that $R^{22}$ to $R^{27}$ each independently be hydrogen, an alkyl group having a carbon number of 1 to 6, a cycloalkyl group having a carbon number of 4 to 7, an alkenyl group having a carbon number of 2 to 8, or an aryl group having a carbon number of 6 to 10. Furthermore, it is preferable that $R^{150}$ to $R^{159}$ each independently be hydrogen, an alkyl group having a carbon number of 1 to 6, an acyl group having a carbon number of 2 to 6, or an aryl group having a carbon number of 6 to 15, and it is more preferable that $R^{50}$ to $R^{159}$ each independently be hydrogen, an alkyl group having a carbon number of 1 to 4, an acyl group having a carbon number of 2 to 4, or an aryl group having a carbon number of 6 to 10. The alkyl group, the cycloalkyl group, the alkenyl group, the aryl group, and the acyl group may have a heteroatom, and may be either an unsubstituted product or a substitution product.

In (A2-3) polysiloxane, the organosilane unit represented by general formula (7), the organosilane unit represented by general formula (8), the organosilane unit represented by general formula (9), and the organosilane unit represented by general formula (10) may be in either a regular sequence or an irregular sequence. As the regular sequence, for example, alternating copolymerization, periodic copolymerization, block copolymerization, graft copolymerization, etc. can be cited. As the irregular sequence, for example, random copolymerization and the like can be cited.

Furthermore, in the (A2-3) polysiloxane, the organosilane unit represented by general formula (7), the organosilane unit represented by general formula (8), the organosilane unit represented by general formula (9), and the organosilane unit represented by general formula (10) may be in either in a two-dimensional sequence or a three-dimensional sequence. As the two-dimensional sequence, for example, a straight chain type can be cited. As the three-dimensional sequence, for example, a ladder type, a cage type, a network type, etc. can be cited.

<Organosilane Unit Having Fluorine Atom>

It is preferable that the (A2-3) polysiloxane for use in the present invention contain an organosilane unit that has a fluorine atom. It is preferable that such a (A2-3) polysiloxane be one obtained using an organosilane having a fluorine atom as an organosilane having an organosilane unit represented by general formula (7), general formula (9), or general formula (10). As the (A2-3) polysiloxane contains an organosilane unit having a fluorine atom, transparency improves, so that the sensitivity at the time of exposure can be improved. Furthermore, the membrane surface can be provided with water repellency, so that infiltration through the membrane surface at the time of alkaline development can be inhibited.

It is preferable that the (A2-3) polysiloxane contain as an organosilane unit having a fluorine atom one or more species of organosilane units selected from general formula (11a), general formula (11b), and general formula (11c).

[CHEM. 17]

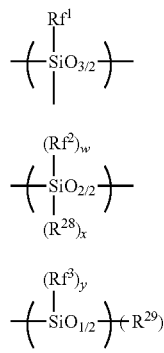

In general formulas (11a) to (11c), $Rf^1$ to $Rf^3$ each independently represent an alkyl group having a carbon number of 1 to 10, a cycloalkyl group having a carbon number of 4 to 10, or an aryl group having a carbon number of 6 to 15 each of which has 1 to 20 fluorine atoms. $R^{28}$ and $R^{29}$ each independently represent hydrogen, an alkyl group, a cycloalkyl group, an alkenyl group, or an aryl group. w represents an integer of 1 to 2, x represents an integer of 0 to 1, and w+x=2. y represents an integer of 1 to 3, z represents an integer of 0 to 2, and y+z=3. In general formulas (11a) to (11c), it is preferable that $Rf^1$ to $Rf^3$ each independently be an alkyl group having a carbon number of 1 to 6, a cycloalkyl group having a carbon number of 4 to 7, or an aryl group having a carbon number of 6 to 10 each of which has 1 to 12 fluorine atoms. Furthermore, it is preferable that $R^{28}$ and $R^{29}$ each independently be hydrogen, an alkyl group having a carbon number of 1 to 10, a cycloalkyl group having a carbon number of 4 to 10, an alkenyl group having a carbon number of 2 to 10, or an aryl group having a carbon number of 6 to 15, and it is more preferable that $R^{28}$ and $R^{29}$ each independently be hydrogen, an alkyl group having a carbon number of 1 to 6, a cycloalkyl group having a carbon number of 4 to 7, an alkenyl group having a carbon number of 2 to 8, or an aryl group having a carbon number of 6 to 10. The alkyl group, the cycloalkyl group, the alkenyl group, and the aryl group mentioned above may have a heteroatom and may be either an unsubstituted product or a substitution product.

As organosilane having an organosilane unit that is represented by general formula (11a), general formula (11b), or general formula (11c) and that has a fluorine atom, for example, trifunctional organosilanes, such as trifluoromethyltrimethoxysilane, trifluoromethyltriethoxysilane, 3,3,3-trifluoropropyltrimethoxysilane, trifluoromethoxypropyltrimethoxysilane, 3,3,3-trifluoropropyloxypropyltrimethoxysilane, 6,6,6,5,5,4,4,3,3-nonafluoro-n-hexyltrimethoxysilane, 1,2,3,4,5-pentafluorophenyltrimethoxysilane, or 3-(1,2,3,4,5-pentafluorophenyl)propyltrimethoxysilane, difunctional organosilanes, such as 3,3,3-trifluoropropylmethyldimethoxysilane, 3,3,3-trifluoropropylmethyldiethoxysilane, trifluoromethoxypropylmethyldimethoxysilane, 1,2,3,4,5-pentafluorophenyl methyldimethoxysilane, or 3-(1,2,3,4,5-pentafluorophenyl)propylmethyldimethoxysilane, monofunctional organosilanes, such as 3,3,3-trifluoropropyldimethylmethoxysilane, trifluoromethoxypropyldimethylmethoxysilane, or 1,2,3,4,5-pentafluorophenyl dimethylmethoxysilane, difunctional organosilane oligomers, such as FS1265-300CS, FS1265-1000CS, or FS1265-10000CS (which are all made by Dow Corning Toray Co., Ltd.), can be cited. From the viewpoint of heat resistance improvement of the cured film, trifunctional organosilanes, such as trifluoromethyltrimethoxysilane, trifluoromethyltriethoxysilane, 3,3,3-trifluoropropyltrimethoxysilane, 1,2,3,4,5-pentafluorophenyltrimethoxysilane, or 3-(1,2,3,4,5-pentafluorophenyl)propyltrimethoxysilane, or difunctional organosilanes, such as 3,3,3-trifluoropropylmethyldimethoxysilane, 3,3,3-trifluoropropylmethyldiethoxysilane, or 1,2,3,4,5-pentafluorophenyl methyldimethoxysilane, are preferable.

It is preferable that the content ratio of the organosilane unit having a fluorine atom in the (A2-3) polysiloxane be 5 mol % or greater in terms of Si atom molar ratio, and it is more preferable that the content ratio thereof be 10 mol % or greater, and it is even more preferable that the content ratio thereof be 15 mol % or greater. When the content ratio thereof is within the range mentioned above, the sensitivity at the time of exposure can be improved. On the other hand, it is preferable that the content ratio thereof be 60 mol % or less, and it is more preferable that the content ratio thereof be 50 mol % or less, and it is even more preferable that the content ratio thereof be 40 mol % or less. When the content ratio thereof is within the range mentioned above, mechanical characteristics of the cured film can be improved. Particularly, it is preferable that the molar ratio of Si atoms originating from an organosilane unit that is represented by general formula (11a), general formula (11b), or general formula (11c) and that has a fluorine atom be within the foregoing range.

<Organosilane Unit Having Aromatic Group>

It is preferable that the (A2-3) polysiloxane for use in the present invention contain an organosilane unit that has an aromatic group. It is preferable that such a (A2-3) polysiloxane be one obtained by using an organosilane having an aromatic group as an organosilane having an organosilane unit represented by general formula (7), general formula (9), or general formula (10). As the (A2-3) polysiloxane contains an organosilane unit having an aromatic group, the heat resistance of the aromatic group will improve the heat resistance of the cured film.

Furthermore, in the case where, as the (D) coloring agent described below, a (D1) pigment is particularly contained, as the (A2-3) polysiloxane contains an organosilane unit having an aromatic group, the steric hindrance of the aromatic group will improve the dispersion stability of the (D1) pigment.

Furthermore, in the case where the (D1) pigment is an (D1-2) organic pigment, an aromatic group in the (A2-3) polysiloxane interacts with an aromatic group of the (D1-2) organic pigment, so that the dispersion stability of the (D1-2) organic pigment can be improved.

As the organosilane that is represented by general formula (7), general formula (9), or general formula (10) and that has an organosilane unit having an aromatic group, for example, trifunctional organosilanes, such as phenyltrimethoxysilane, phenyltriethoxysilane, 4-tolyltrimethoxysilane, 4-hydroxyphenyltrimethoxysilane, 4-methoxyphenyltrimethoxysilane, 4-t-butylphenyltrimethoxysilane, 1-naphthyltrimethoxysilane, 2-naphthyltrimethoxysilane, 4-styryltrimethoxysilane, 2-phenylethyltrimethoxysilane, 4-hydroxy benzyltrimethoxysilane, 1-(4-hydroxyphenyl)ethyltrimethoxysilane, 2-(4-hydroxyphenyl)ethyltrimethoxysilane, or 4-hydroxy-5-(4-hydroxyphenyl carbonyloxy)pentyltrimethoxysilane, or difunctional organosilanes, such as diphenyldimethoxysilane or diphenyldiethoxysilane, can be cited. From the viewpoint of heat resistance improvement of the cured film, phenyltrimethoxysilane, 4-tolyltrimethoxysilane, 4-hydroxyphenyltrimethoxysilane, 4-methoxyphenyltrimethoxysilane, 1-naphthyltrimethoxysilane, 2-naphthyltrimethoxysilane, 4-styryltrimethoxysilane, 2-phenylethyltrimethoxysilane, 4-hydroxy benzyltrimethoxysilane, diphenyldimethoxysilane, or diphenyldiethoxysilane is preferable, and phenyltrimethoxysilane, 1-naphthyltrimethoxysilane, 2-naphthyltrimethoxysilane, diphenyldimethoxysilane, or diphenyldiethoxysilane is more preferable, and 1-naphthyltrimethoxysilane, 2-naphthyltrimethoxysilane, diphenyldimethoxysilane, or diphenyldiethoxysilane is even more preferable.

It is preferable that the content ratio of the organosilane unit having an aromatic group in the (A2-3) polysiloxane be 5 mol % or greater in terms of Si atom molar ratio, and it is more preferable that the content ratio thereof be 10 mol % or greater, and it is even more preferable that the content ratio thereof be 15 mol % or greater. When the content ratio thereof is within the range mentioned above, the heat resistance of the cured film can be improved. On the other hand, it is preferable that the content ratio thereof be 80 mol % or less, and it is more preferable that the content ratio thereof be 75 mol % or less, and it is even more preferable that the content ratio thereof be 70 mol % or less. When the content ratio thereof is within the range mentioned above, the pattern workability with an alkaline developer can be improved. Particularly, it is preferable that the molar ratio of Si atoms originating from the organosilane unit that is represented by general formula (7), general formula (9), or general formula (10) and that has an aromatic group be within the range mentioned above.

Of the organosilanes represented by general formula (7), general formula (9), or general formula (10) and having aromatic groups, from the viewpoint of improvement of the pattern workability with an alkaline developer and improvement of the post-development resolution, phenyltrimethoxysilane, 4-tolyltrimethoxysilane, 4-hydroxyphenyltrimethoxysilane, 4-methoxyphenyltrimethoxysilane, 1-naphthyltrimethoxysilane, 2-naphthyltrimethoxysilane, 4-styryltrimethoxysilane, 2-phenylethyltrimethoxysilane, 4-hydroxy benzyltrimethoxysilane, diphenyldimethoxysilane, or diphenyldiethoxysilane is preferable, and phenyltrimethoxysilane, 1-naphthyltrimethoxysilane, 2-naphthyltrimethoxysilane, diphenyldimethoxysilane, or diphenyldiethoxysilane is more preferable, and 1-naphthyltrimethoxysilane or 2-naphthyltrimethoxysilane is even more preferable.

<Organosilane Unit Having Ethylenic Unsaturated Double Bond Group>

It is preferable that the (A2-3) polysiloxane for use in the present invention contain an organosilane unit that has an ethylenic unsaturated double bond group. It is preferable that such a (A2-3) polysiloxane be one obtained by using an organosilane having an ethylenic unsaturated double bond group as the organosilane having an organosilane unit represented by general formula (7), general formula (9), or general formula (10). As the (A2-3) polysiloxane contains an organosilane unit having an ethylenic unsaturated double bond group, the UV curing at the time of exposure is facilitated and sensitivity can be improved.

As the organosilane that is represented by general formula (7), general formula (9), or general formula (10) and that has an organosilane unit having an ethylenic unsaturated double bond group, for example, trifunctional organosilane, such as vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, or 4-styryltrimethoxysilane, and difunctional organosilanes, such as 3-methacryloxypropylmethyldimethoxysilane, 3-methacryloxypropylmethyldiethoxysilane, 3-acryloxypropylmethyldimethoxysilane, 3-acryloxypropylmethyldiethoxysilane methyl vinyldimethoxysilane, or divinyldiethoxysilane, can be cited.

From the viewpoint of improvement of the sensitivity at the time of exposure, vinyltrimethoxysilane, 3-methacryloxypropyltrimethoxysilane, 3-methacryloxypropylmethyldimethoxysilane, 3-acryloxypropyltrimethoxysilane, 3-acryloxypropylmethyldimethoxysilane, or 4-styryltrimethoxysilane is preferable.

In the case where an organosilane that is represented by general formula (7), general formula (9), or general formula (10) and that has an organosilane unit having an ethylenic unsaturated double bond group, it is preferable that the double-bond equivalent of the (A2-3) polysiloxane be 150 g/mol or greater, and it is more preferable that the double-bond equivalent thereof be 200 g/mol or greater, and it is even more prefer that the double-bond equivalent thereof be 250 g/mol or greater. When the double-bond equivalent is within the range mentioned above, the adhesion with the base substrate can be improved. On the other hand, it is preferable that the double-bond equivalent be 10,000 g/mol or less, and it is more preferable that the double-bond equivalent be 5,000 g/mol or less, and it is even more preferable that the double-bond equivalent be 2,000 g/mol or less. When the double-bond equivalent is within the range mentioned above, the sensitivity at the time of exposure can be improved. Particularly, it is preferable that the double-bond equivalent originating from the organosilane unit that is represented by general formula (7), general formula (9), or general formula (10) and that has an ethylenic unsaturated double bond group in the (A2-3) polysiloxane be within the range mentioned above.

The double-bond equivalent mentioned herein refers to the resin weight per 1 mol of the ethylenic unsaturated double bond group and the unit thereof is g/mol. From the value of the double-bond equivalent, the number of ethylenic unsaturated double bond groups in the resin can be determined. The double-bond equivalent can be calculated from the iodine value.

The iodine value mentioned herein refers to a value of weight of iodine converted from the amount of halogen that reacts with 100 g of the resin and the unit thereof is gI/100 g. The iodine value can be determined by reacting 100 g of the resin with iodine monochloride, then trapping unreacted iodine in a potassium iodide aqueous solution, and titrating the unreacted iodine with a thiosodium sulfate aqueous solution.

<Organosilane Unit Having Acidic Group>

It is preferable that the (A2-3) polysiloxane for use in the present invention contain an organosilane unit that has an acidic group. It is preferable that such a (A2-3) polysiloxane be one obtained by using an organosilane that has an acidic group as the organosilane that has an organosilane unit represented by general formula (7), general formula (9), or general formula (10). As the (A2-3) polysiloxane contains an organosilane unit having an acidic group, the pattern workability with an alkaline developer and the post-development resolution can be improved.

It is preferable that the acidic group be a group that exhibits an acidity below pH 6. As the group that exhibits an acidity below pH 6, for example, a carboxy group, a carboxylic anhydride group, a sulfonic group, a phenolic hydroxyl group, a hydroxy imide group, or a silanol group can be cited. From the view point of improvement of the pattern workability with an alkaline developer and improvement of the post-development resolution, a carboxy group, a carboxylic anhydride group, a phenolic hydroxyl group, or a hydroxy imide group is preferable, and a carboxy group or a carboxylic anhydride group is more preferable.

As the organosilane that is represented by general formula (7), general formula (9), or general formula (10) and that has an organosilane unit having an acidic group, for example, trifunctional organosilanes, such as 2-(3-trimethoxysilylpropyl)-4-(N-t-butyl)amino-4-oxobutanic acid, 3-(3-trimethoxysilylpropyl)-4-(N-t-butyl)amino-4-oxobutanic acid, 3-trimethoxysilylpropylsuccinic acid, 3-triethoxysilylpropylsuccinic acid, 3-trimethoxysilylpropionic acid, 4-trimethoxysilylbutyric acid, 5-trimethoxysilylvaleric acid, 3-trimethoxysilylpropylsuccinic anhydride, 3-triethoxysilylpropylsuccinic anhydride, 4-(3-trimethoxysilylpropyl)cyclohexane-1,2-dicarboxylic anhydride, 4-(3-trimethoxysilylpropyl)phthalic anhydride, 4-hydroxyphenyltrimethoxysilane, 4-hydroxy benzyltrimethoxysilane, 1-(4-hydroxyphenyl)ethyltrimethoxysilane, 2-(4-hydroxyphenyl)ethyltrimethoxysilane, or 4-hydroxy-5-(4-hydroxyphenyl carbonyloxy) pentyltrimethoxysilane, difunctional organosilanes, such as 3-methyldimethoxysilylpropylsuccinic acid, 3-methyldimethoxysilylpropionic acid, or 3-methyldimethoxysilylpropylsuccinic anhydride, and monofunctional organosilanes, such as 3-dimethylmethoxysilylpropylsuccinic acid, 3-dimethylmethoxysilylpropionic acid or 3-dimethylmethoxysilylpropylsuccinic anhydride, can be cited. From the viewpoint of improvement of the pattern workability with an alkaline developer and improvement of the post-development resolution, trifunctional organosilanes, such as 2-(3-trimethoxysilylpropyl)-4-(N-t-butyl)amino-4-oxobutanic aid, 3-(3-trimethoxysilylpropyl)-4-(N-t-butyl)amino-4-oxobutanic aid, 3-trimethoxysilylpropylsuccinic acid, 3-triethoxysilylpropylsuccinic acid, 3-trimethoxysilylpropionic acid, 4-trimethoxysilylbutyric acid, 5-trimethoxysilylvaleric acid, 3-trimethoxysilylpropylsuccinic anhydride, 3-triethoxysilylpropylsuccinic anhydride, 4-(3-trimethoxysilylpropyl)cyclohexane-1,2-dicarboxylic anhydride, or 4-(3-trimethoxysilylpropyl)phthalic anhydride, are preferable.

In the case where an organosilane that is represented by general formula (7), general formula (9), or general formula (10) and that has an organosilane unit having an acidic group, it is preferable that the acid equivalent of (A2-3) polysiloxane be 280 g/mol or greater, and it is more preferable that the acid equivalent thereof be 300 g/mol or greater, and it is even more preferable that the acid equivalent thereof be 400 g/mol or greater. When the acid equivalent thereof is within the range mentioned above, the film reduction at the time of alkaline development can be inhibited. On the other hand, it is preferable that the acid equivalent thereof be 1,400 g/mol or less, and it is more preferable that the acid equivalent thereof be 1,100 g/mol or less, and it is even more preferable that the acid equivalent thereof be 950 g/mol or less. When the acid equivalent thereof is within the range mentioned above, the pattern workability with an alkaline developer and the post-development resolution can be improved. Particularly, it is preferable that the acid equivalent originating from the organosilane unit that is represented by general formula (7), general formula (9), or general formula (10) and that has an acidic group in the (A2-3) polysiloxane be within the range mentioned above. Furthermore, from the viewpoint of improvement of the pattern workability with an alkaline developer and improvement of the post-development resolution, it is more preferable that the acid equivalent be a carboxylic acid equivalent.

The acid equivalent mentioned herein refers to the weight of the resin per 1 mol of the acidic group and the unit thereof is g/mol. From the value of the acid equivalent, the number of acidic groups in the resin can be determined. The acid equivalent can be calculated from the acid value.

The acid value mentioned herein refers to the weight of potassium hydroxide that reacts with 1 g of the resin and the unit thereof is mgKOH/g. This can be determined by titrating 1 g of the resin with a potassium hydroxide aqueous solution.

The content ratio of the various organosilane units in the (A2-3) polysiloxane can be determined by a combination of $^1$H-NMR, 13C-NMR, 29Si-NMR, IR, TOF-MS, a chemical element analysis method, ash content measurement, etc.

<Physical Properties of (A2-3) Polysiloxane>

It is preferable that the Mw of the (A2-3) polysiloxane for use in the present invention, in terms of polystyrene measured by GPC, be 500 or greater, and it is more preferable that the Mw thereof be 700 or greater, and it is even more preferable that the Mw be 1,000 or greater. When the Mw is within the range mentioned above, the post-development resolution can be improved. On the other hand, it is preferable that the Mw be 100,000 or less, and it is more preferable that the Mw be 50,000 or less, and it is even more preferable that the Mw be 20,000 or less. When the Mw is within the range mentioned above, the leveling property at the time of coating application and the pattern workability with an alkaline developer can be improved.

<Synthesis Method for (A2-3) Polysiloxane>

The (A2-3) polysiloxane can be synthesized by a known method. For example, a method in which an organosilane is hydrolyzed in a reaction solvent to cause dehydrocondensation, or the like can be cited. As the method for hydrolyzing and therefore dehydrocondensing an organosilane, for example, a method in which a reaction solvent and water and, as needed, a catalyst are added to a mixture that contains an organosilane, and heating and agitating it for 0.5 to 100 hours at 50 to 150° C. and, preferably, 90 to 130° C., or the like can be cited. Note that during heating and agitation, hydrolysis secondary products (alcohols such as methanol) and a condensation byproduct (water) may be distilled away by distillation as needed.

As the reaction solvent for use for the hydrolysis and dehydrocondensation of an organosilane, for example, ones similar to solvents described later can be cited. It is preferable that the amount of the reaction solvent added be 10 to 1,000 mass parts in the case where the organosilane is assumed to be 100 mass parts. It is preferable that the amount of water added be 0.5 to 2 mol with respect to 1 mol of hydrolyzable groups.

It is preferable that the catalyst added as needed be an acid catalyst or a base catalyst. As the acid catalyst, for example, hydrochloric acid, nitric acid, sulfuric acid, hydrofluoric acid, phosphoric acid, acetic acid, trifluoroacetic acid, formic acid, polyvalent carboxylic acids, the anhydrides of these, or ion exchange resins can be cited. As the base catalyst, for example, triethylamine, tri-n-propylamine, tri-n-butylamine, tri-n-pentylamine, tri-n-hexylamine, tri-n-heptylamine, tri-n-octylamine, diethylamine, triethanol amine, diethanol amine, sodium hydroxide, potassium hydroxide, alkoxysilanes having amino groups, or ion exchange resins can be cited. It is preferable that the amount of the catalyst added be 0.01 to 10 mass parts in the case where the organosilane is assumed to be 100 mass parts.

From the viewpoint of the storage stability of the resin composition that contains the (A2-3) polysiloxane, it is preferable that the (A2-3) polysiloxane not contain the aforementioned catalyst. Therefore, the catalyst may be removed afterwards. As the method for removing the catalyst, a process by water washing or ion exchange resin is preferable from the viewpoint of ease of operation and removal characteristic. The water washing herein refers to a method in which a solution of the (A2-3) polysiloxane obtained is diluted with an appropriate hydrophobic solvent and then washed with water several times and the obtained organic layer is concentrated by an evaporator or the like. Furthermore, the process by ion exchange resin refers to a method in which a solution of the (A2-3) polysiloxane obtained is brought into contact with an appropriate ion exchange resin.

<(A2-4) Cardo Based Resin>

As the (A2-4) cardo based resin for use in the present invention, for example, (I) cardo based resins obtained by reacting a phenol compound, a carboxylic anhydride, and an epoxy compound, (II) cardo based resins obtained by reacting a carboxylic acid compound and an epoxy compound, or (III) cardo based resins obtained by reacting an epoxy compound, a carboxylic acid compound, and a carboxylic anhydride can be cited.

The (A2-4) cardo based resin is a thermosetting resin, has a structure in which a main chain and a bulky side chain are connected by one atom, and has as a bulky side chain a cyclic structure, such as a fluorene ring, that is high heat resistant and rigid. Therefore, by causing the resin composition to contain the (A2-4) cardo based resin having a cyclic structure, such as a fluorene ring or the like, that is high heat resistant and rigid, the heat resistance of the cured film obtained can be improved. Therefore, the (A2-4) cardo based resin is suitable for the cases where the cured film is put to uses in which heat resistance is required, or the like.

It is preferable that the (A2-4) cardo based resin for use in the present invention have an ethylenic unsaturated double bond group. The (A2-4) cardo based resin is a resin that allows an ethylenic unsaturated double bond group to be easily introduced into a side chain branching from a main chain of the resin. In the case where the (A2-4) cardo based resin has an ethylenic unsaturated double bond group, the (A2-4) cardo based resin is a photo-curable resin and, when UV cured at the time of exposure, forms a three-dimensional crosslink structure of carbon-carbon bonds. Therefore, by causing the resin composition to contain the (A2-4) cardo based resin whose side chain has an ethylenic unsaturated double bond group, the sensitivity at the time of exposure can be improved.

Furthermore, because the three-dimensional crosslink structure formed has an alicyclic structure or an aliphatic structure as a main component, the temperature increase of the softening point of the resin is inhibited, so that a low-taper pattern shape can be obtained and mechanical characteristics of the cured film obtained can be improved. Hence, the (A2-4) cardo based resin is suitable for the cases where the cured film is put to uses in which mechanical characteristic is required, and the like.

It is preferable, from the viewpoint of heat resistance improvement of the cured film, that the (A2-4) cardo based resin for use in the present invention contain one or more species selected from structural unit represented by general formula (47), structural units represented by general formula (48), structural units represented by general formula (49), and structural units represented by general formula (50). Furthermore, it is preferable, from the viewpoint of improvement of the sensitivity at the time of exposure and improve of the mechanical characteristic of the cured film, that the (A2-4) cardo based resin for use in the present invention contain an ethylenic unsaturated double bond group at one or more locations of a main chain, a side chain, and an end.

[CHEM. 18]

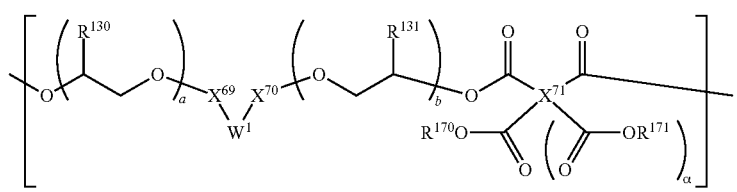

(47)

-continued

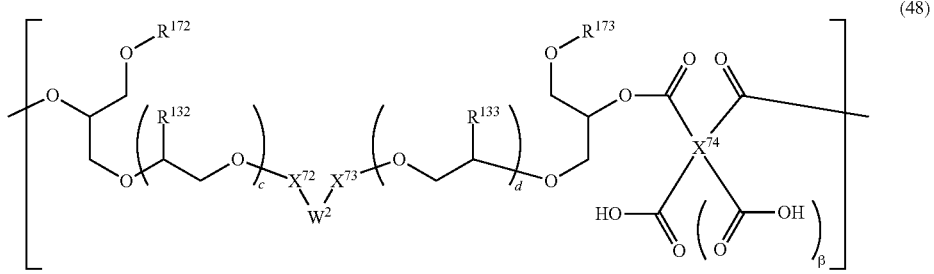

(48)

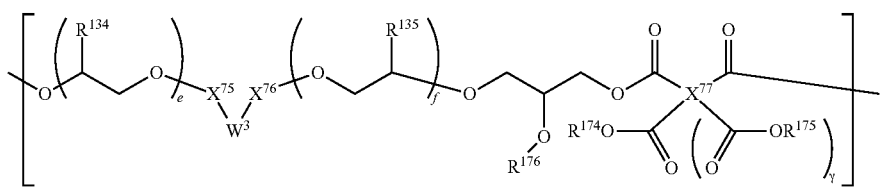

(49)

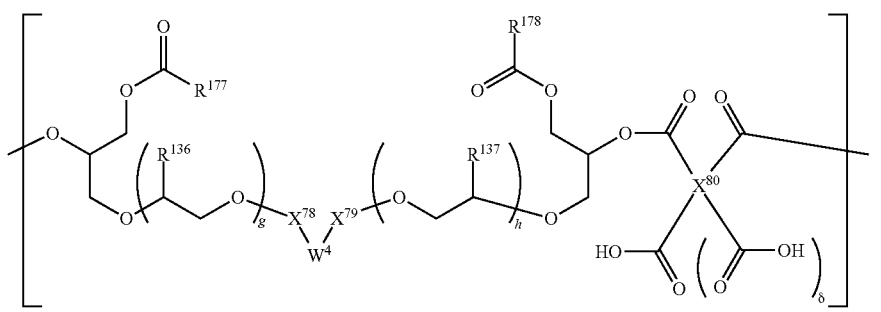

(50)

In general formulas (47) to (50), $X^9$, $X^{70}$, $X^{72}$, $X^{73}$, $X^{75}$, $X^{76}$, $X^{78}$, and $X^{79}$ each independently represent a monocyclic or condensed polycyclic hydrocarbon ring. $X^{71}$, $X^{74}$, $X^{77}$, and $X^{80}$ each independently represent an organic group of a carboxylic acid and/or its derivative residue which has a valence of 2 to 10. $W^1$ to $W^4$ each independently represent an organic group that has two or more aromatic groups. $R^{130}$ to $R^{137}$ each independently represent hydrogen or an alkyl group having a carbon number of 1 to 6, and $R^{170}$ to $R^{175}$, $R^{177}$, and $R^{178}$ each independently represent hydrogen or an organic group having an ethylenic unsaturated double bond group. $R^{176}$ represents hydrogen or an alkyl group having a carbon number of 1 to 10. a, b, c, d, e, f, g, and h each independently represent an integer of 0 to 10, and α, β, γ, and δ each independently represent an integer of 0 or 1. In general formulas (47) to (50), it is preferable that $X^{69}$, $X^{70}$, $X^{72}$, $X^{73}$, $X^{75}$, $X^{76}$, $X^{78}$, and $X^{79}$ each independently be a monocyclic or condensed polycyclic hydrocarbon ring having a carbon number of 6 to 15 and a valence of 4 to 10, and it is more preferable that $X^{69}$, $X^{70}$, $X^{72}$, $X^{73}$, $X^{75}$, $X^{76}$, $X^{78}$, and $X^{79}$ each independently be a monocyclic or condensed polycyclic hydrocarbon ring having a carbon number of 6 to 10 and a valence of 4 to 10. Furthermore, it is preferable that $X^{71}$, $X^{74}$, $X^{77}$, and $X^{80}$ each independently be an organic group having a valence of 2 to 10 which has one or more species selected from an aliphatic structure having a carbon number of 2 to 20, an alicyclic structure having a carbon number of 4 to 20, and an aromatic structure having a carbon number of 6 to 30, it is more preferable that $X^{71}$, $X^{74}$, $X^{77}$, and $X^{80}$ each independently be an organic group having a valence of 4 to 10 which has one or more species selected from an aliphatic structure having a carbon number of 4 to 15, an alicyclic structure having a carbon number of 4 to 15, and an aromatic structure having a carbon number of 6 to 25. Furthermore, it is preferable that $W^1$ to $W^4$ each independently be a substituent represented by one of general formulas (51) to (56). Furthermore, it is preferable that $R^{130}$ to $R^{137}$ each independently be hydrogen or an alkyl group having a carbon number of 1 to 4, and it is preferable that $R^{170}$ to $R^{175}$, $R^{177}$, and $R^{178}$ be each independently a substituent represented by general formula (57) Furthermore, it is preferable that $R^{176}$ be hydrogen or an alkyl group having a carbon number of 1 to 6. The alkyl group, the aliphatic structure, the alicyclic structure, the aromatic structure, the monocyclic or condensed polycyclic aromatic hydrocarbon ring, and the organic group having an ethylenic unsaturated double bond group mentioned above may have a heteroatom and may be either an unsubstituted product or a substitution product.

[CHEM. 19]

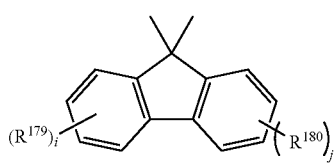

(51)

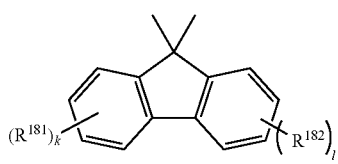

(52)

(53)

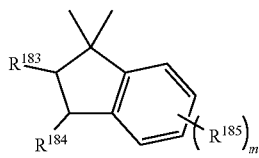

(54)

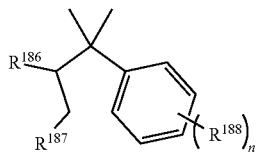

(55)

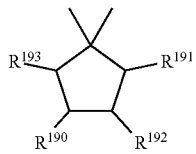

(56)

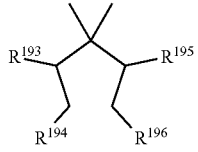

In general formulas (51) to (56), $R^{179}$ to $R^{182}$, $R^{185}$, and $R^{188}$ each independently represent an alkyl group having a carbon number of 1 to 10. $R^{183}$, $R^{184}$, $R^{186}$, $R^{187}$, $R^{189}$, $R^{191}$, and $R^{193}$ to $R^{196}$ each independently represent hydrogen, an alkyl group having a carbon number of 1 to 10, a cycloalkyl group having a carbon number of 4 to 10, or an aryl group having a carbon number of 6 to 15. $R^{190}$ and $R^{192}$ each independently represent hydrogen, an alkyl group having a carbon number of 1 to 10, a cycloalkyl group having a carbon number of 4 to 10, or an aryl group having a carbon number of 6 to 15, and $R^{190}$ and $R^{192}$ may form a ring. As the ring formed by $R^{190}$ and $R^{192}$, for example, a benzene ring or a cyclohexane ring can be cited. At least one of $R^{183}$ and $R^{184}$ is an aryl group having a carbon number of 6 to 15. At least one of $R^{186}$ and $R^{187}$ is an aryl group having a carbon number of 6 to 15. At least one of R and $R^{190}$ is an aryl group having a carbon number of 6 to 15, at least one of $R^{191}$ and $R^{192}$ is an aryl group having a carbon number of 6 to 15, and $R^{190}$ and $R^{192}$ may form a ring. At least one of $R^{193}$ and $R^{194}$ is an aryl group having a carbon number of 6 to 15, and at least one of $R^{195}$ and $R^{196}$ is an aryl group having a carbon number of 6 to 15. i, j, k, 1, m, and n each independently represent an integer of 0 to 4. In general formulas (51) to (56), it is preferable that $R^{179}$ to $R^{182}$, $R^{185}$, and $R^{188}$ each independently be an alkyl group having a carbon number of 1 to 6. Furthermore, it is preferable that $R^{183}$, $R^{84}$, R, $R^{87}$, $R^{189}$, $R^9$, and $R^{93}$ to $R^{196}$ each independently be hydrogen, an alkyl group having a carbon number of 1 to 6, a cycloalkyl group having a carbon number of 4 to 7, or an aryl group having a carbon number of 6 to 10. It is preferable that $R^{190}$ and $R^{192}$ each independently be hydrogen, an alkyl group having a carbon number of 1 to 6, a cycloalkyl group having a carbon number of 4 to 7, or an aryl group having a carbon number of 6 to 10, and it is preferable that the ring formed by $R^{190}$ and $R^{192}$ be a benzene ring. The alkyl group, the cycloalkyl group, and the aryl group mentioned above may be either an unsubstituted product or a substitution product.

[CHEM. 20]

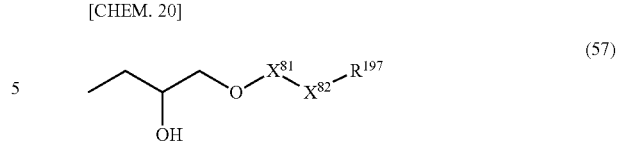

(57)

In general formula (57), $X^{81}$ represents a direct bond, an alkylene chain having a carbon number of 1 to 10, a cycloalkylene chain having a carbon number of 4 to 10, or an arylene chain having a carbon number of 6 to 15, and $X^{82}$ represents a direct bond or an arylene chain having a carbon number of 6 to 15. $R^{197}$ represents a vinyl group, an aryl group, or a (meth)acrylic group. In general formula (57), it is preferable that $X^{81}$ be a direct bond, an alkylene chain having a carbon number of 1 to 6, a cycloalkylene chain having a carbon number of 4 to 7, or an arylene chain having a carbon number of 6 to 10. Furthermore, it is preferable that $X^{82}$ be a direct bond or an arylene chain having a carbon number of 6 to 10. The alkylene chain, the cycloalkylene chain, the arylene chain, the vinyl group, the aryl group, and the (meth)acrylic group mentioned above may be either an unsubstituted product or a substitution product.

As the monocyclic or condensed polycyclic hydrocarbon ring of $X^{69}$, $X^{70}$, $X^{72}$, $X^{73}$, $X^{75}$, $X^{76}$, $X^{78}$, and $X^{79}$ in general formulas (47) to (50), for example, a benzene ring, a toluene ring, a naphthalene ring, a biphenyl ring, or a cyclohexane ring can be cited.

As the aliphatic structure of $X^{71}$, $X^{74}$, $X^{77}$, and $X^{80}$ in general formulas (47) to (50), for example, an ethane structure, an n-butane structure, an n-pentane structure, an n-hexane structure, an n-decane structure, a 3,3-dimethyl pentane structure, a di-n-butyl ether structure, a di-n-butyl ketone structure, or a di-n-butyl sulfone structure can be cited. Furthermore, as substituents thereof, for example, halogen atoms or alkoxy groups can be cited. In the case where the aliphatic structure is a substitution product, for example, a 3,3-bis(trifluoromethyl)pentane structure or a 3-methoxy pentane structure can be cited as $X^{71}$, $X^{74}$, $X^{77}$, and $X^{80}$.

As the alicyclic structure of $X^{71}$, $X^{74}$, $X^{77}$, and $X^{80}$ in general formulas (47) to (50), for example, a cyclobutane structure, a cyclopentane structure, a cyclohexane structure, an ethylcyclohexane structure, a tetrahydrofuran structure, a bicyclohexyl structure, a 2,2-dicyclohexyl propane structure, a dicyclohexyl ether structure, a dicyclohexyl ketone structure, or a dicyclohexyl sulfone structure can be cited. Furthermore, as substituents thereof, for example, halogen atoms or alkoxy groups can be cited. In the case where the alicyclic structure is a substitution product, for example, 1,1-dicyclohexyl-1,1-bis(trifluoromethyl)methane structure or 1, 1-dicyclohexyl-1-methoxymethane structure can be cited as $X^{71}$, $X^{74}$, $X^{77}$, and $X^{80}$.

As the aromatic structure of $X^{71}$, $X^{74}$, $X^{77}$, and $X^{80}$ in general formulas (47) to (50), for example, a benzene structure, an ethyl benzene structure, a naphthalene structure, a 1,2,3,4-tetrahydronaphthalene structure, a fluorene structure, a biphenyl structure, a terphenyl structure, a 2,2-diphenylpropane structure, a diphenyl ether structure, a diphenyl ketone structure, a diphenyl sulfone structure, or a 9,9-diphenylfluorene structure can be cited. Furthermore, as substituents thereof, for example, halogen atoms or alkoxy groups can be cited. In the case where the aromatic structure is a substitution product, for example, a 1,1-diphenyl-1,1- bis(trifluoromethyl)methane structure or a 1, 1-diphenyl-1-methoxymethane structure can be cited as $X^{71}$, $X^{74}$, $X^{77}$, and $X^{80}$ <Synthesis Method for (A2-4) Card Based Resin>

It is preferable that the (A2-4) cardo based resin for use in the present invention be one or more species of (A2-4) cardo based resins of (I) to (IV) below.

As the (A2-4) cardo based resin of (I), a (A2-4) cardo based resin obtained by ring-opening addition reaction of a resin obtained by reacting a compound having two or more aromatic groups in the molecule and hydroxy groups which is represented by general formula (58) and a multifunctional active carboxylic acid derivative (one or more species selected from tetracarboxylic dianhydrides, dicarboxylic dichlorides, and dicarboxylic acid active diesters), with an unsaturated compound having an ethylenic unsaturated double bond group and an epoxy group which is represented by general formula (60) can be cited. As the multifunctional active carboxylic acid derivative, a tetracarboxylic dianhydride is preferable. In addition to the multifunctional active carboxylic acid derivative, a tricarboxylic anhydride, a dicarboxylic anhydride, a monocarboxylic acid chloride, or a monocarboxylic acid active ester may be used as an end-capping agent among reaction components.

As the (A2-4) cardo based resin of (II), a (A2-4) cardo based resin obtained by reacting a resin obtained by ring-opening addition reaction of a compound having two or more aromatic groups in the molecule and hydroxy groups which is represented by general formula (58) and an unsaturated compound having an ethylenic unsaturated double bond group and an epoxy group which is represented by general formula (60), with a multifunctional active carboxylic acid derivative (one or more species selected from tetracarboxylic dianhydrides, dicarboxylic dichlorides, and dicarboxylic acid active diesters) can be cited. As the multifunctional active carboxylic acid derivative, a tetracarboxylic dianhydride is preferable. In addition to the multifunctional active carboxylic acid derivative, a tricarboxylic anhydride, a dicarboxylic anhydride, a monocarboxylic acid chloride, or a monocarboxylic acid active ester may be used as an end-capping agent among reaction components.

As the (A2-4) cardo based resin of (III), a (A2-4) cardo based resin obtained by ring-opening addition reaction of a resin obtained by ring-opening addition reaction of a compound having two or more aromatic groups in the molecules and an epoxy group which is represented by general formula (59) and a multifunctional carboxylic acid (one or more species selected from tetracarboxylic acids, tricarboxylic acids, and dicarboxylic acids), with an unsaturated compound having an ethylenic unsaturated double bond group and an epoxy group which is represented by general formula (60) can be cited. As the multifunctional carboxylic acid, a tetracarboxylic acid or a tricarboxylic acid is preferable. In addition to the multifunctional carboxylic acid, a monocarboxylic acid may be used as an end-capping agent among reaction components.

As the (A2-4) cardo based resin of (IV), a (A2-4) cardo based resin obtained by reacting a resin obtained by ring-opening addition reaction of a compound having two or more aromatic groups in the molecules and an epoxy group which is represented by general formula (59) and an unsaturated carboxylic acid having an ethylenic unsaturated double bond group, with a multifunctional active carboxylic acid derivative (one or more species selected from tetracarboxylic dianhydrides, dicarboxylic dichlorides, and dicarboxylic acid active diesters) can be cited. As the multifunctional active carboxylic acid derivative, a tetracarboxylic dianhydride is preferable. In addition to the multifunctional active carboxylic acid derivative, a tricarboxylic anhydride, a dicarboxylic anhydride, a monocarboxylic acid chloride, or a monocarboxylic acid active ester may be used as an end-capping agent among reaction components.

[CHEM. 21]

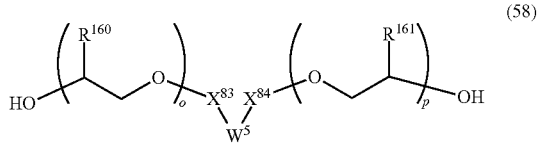

(58)

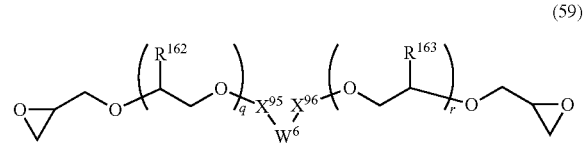

(59)

In general formulas (58) and (59), $X^{83}$ to $X^{86}$ each independently represent a monocyclic or condensed polycyclic aromatic hydrocarbon ring, and $W^5$ and $W^6$ each independently represent an organic group having two or more aromatic groups. $R^{160}$ to $R^{163}$ each independently represent hydrogen or an alkyl group having a carbon number of 1 to 6. o, p, q, and r each independently represent an integer of 0 to 10. In general formulas (58) and (59), it is preferable that $X^{83}$ to $X^{86}$ each independently be a monocyclic or condensed polycyclic aromatic hydrocarbon ring having a carbon number of 6 to 15 and a valence of 4 to 10, and it is more preferable that $X^{83}$ to $X^{86}$ each independently be a monocyclic or condensed polycyclic aromatic hydrocarbon ring having a carbon number of 6 to 10 and a valence of 4 to 10. Furthermore, it is preferable that $W^5$ and $W^6$ each independently be a substituent represented by general formulas (51) to (56) mentioned above. Furthermore, it is preferable that $R^{160}$ to $R^{163}$ each independently be hydrogen or an alkyl group having a carbon number of 1 to 4. The alkyl group or the monocyclic or condensed polycyclic aromatic hydrocarbon ring may have a heteroatom and may be either an unsubstituted product or a substitution product.

[CHEM. 22]

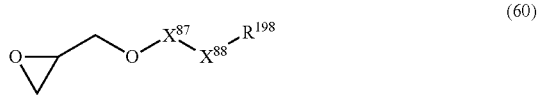

(60)

In general formula (60), $X^{87}$ represents a direct bond, an alkylene chain having a carbon number of 1 to 10, a cycloalkylene chain having a carbon number of 4 to 10, or an arylene chain having a carbon number of 6 to 15, and $X^{88}$ represents a direct bond or an arylene chain having a carbon number of 6 to 15. $R^{198}$ represents a vinyl group, an aryl group, or a (meth)acrylic group. In general formula (60), it is preferable that $X^{87}$ be a direct bond, an alkylene chain having a carbon number of 1 to 6, a cycloalkylene chain having a carbon number of 4 to 7, or an arylene chain having a carbon number of 6 to 10. Furthermore, it is preferable that $X^{88}$ be a direct bond or an arylene chain having a carbon number of 6 to 10. The alkylene chain, the cycloalkylene chain, the arylene chain, the vinyl group, the aryl group, and the (meth)acrylic group mentioned above may have a heteroatom and may be either an unsubstituted product or a substitution product.

As the compound having two or more aromatic groups in the molecule and a hydroxy group which is represented by general formula (58), for example, 9,9-bis[4-(2-hydroxyethoxy)phenyl]fluorene, 9,9-bis[4-(3-hydroxypropoxy)phenyl]fluorene, 9,9-bis[4-(2-hydroxyethoxy)-3-methylphenyl]fluorene, 9,9-bis[4-(2-hydroxyethoxy)-3,5-dimethylphenyl]fluorene, 9,9-bis(4-hydroxyphenyl)fluorene, 9,9-bis(4-hydroxy-3-methylphenyl)fluorene, 9,9-bis(4-hydroxy-3,5-dimethylphenyl)fluorene, 1,1-bis[4-(2-hydroxyethoxy)phenyl]-1,1-diphenylmethane, 1,1-bis[4-(3-hydroxypropoxy)phenyl]-1,1-diphenylmethane, 1,1-bis(4-hydroxyphenyl)-1,1-diphenylmethane, 1,1-bis[4-(2-hydroxyethoxy)phenyl]-3-phenyl-2,3-dihydroindene, 1,1-bis[4-(3-hydroxypropoxy)phenyl]-3-phenyl-2,3-dihydroindene, 1,1-bis(4-hydroxyphenyl)-3-phenyl-2,3-dihydroindene, 1,1-bis[4-(2-hydroxyethoxy)phenyl]-1,3-diphenylpropane, 1,1-bis[4-(3-hydroxypropoxy)phenyl]-1,3-diphenylpropane, 1,1-bis(4-hydroxyphenyl)-1,3-diphenylpropane, 1,1-bis[4-(2-hydroxyethoxy)phenyl]-2,4-diphenylcyclopentane, 1,1-bis[4-(3-hydroxypropoxy)phenyl]-2,4-diphenylcyclopentane, 1,1-bis(4-hydroxyphenyl)-2,4-diphenylcyclopentane, 2,2-bis[4-(2-hydroxyethoxy)phenyl]-2,3-dihydroindene, 2,2-bis[4-(3-hydroxypropoxy)phenyl]-2,3-dihydroindene, 2,2-bis(4-hydroxyphenyl)-2,3-dihydroindene, 3,3-bis[4-(2-hydroxyethoxy)phenyl]-2,5-diphenyl pentane, 3,3-bis[4-(3-hydroxypropoxy)phenyl]-2,5-diphenyl pentane, or 3,3-bis(4-hydroxyphenyl)-2,5-diphenyl pentane can be cited.

As the compound having two or more aromatic groups in the molecule and an epoxy group which is represented by general formula (59), for example, 9,9-bis[4-(2-glycidoxyethoxy)phenyl]fluorene, 9,9-bis[4-(3-glycidoxypropoxy)phenyl]fluorene, 9,9-bis[4-(2-glycidoxyethoxy)-3-methylphenyl]fluorene, 9,9-bis[4-(2-glycidoxyethoxy)-3,5-dimethylphenyl]fluorene, 9,9-bis(4-glycidoxyphenyl)fluorene, 9,9-bis(4-glycidoxy-3-methylphenyl)fluorene, 9,9-bis(4-glycidoxy-3,5-dimethylphenyl)fluorene, 1,1-bis[4-(2-glycidoxyethoxy)phenyl]-1,1-diphenylmethane, 1,1-bis[4-(3-glycidoxypropoxy)phenyl]-1,1-diphenylmethane, 1,1-bis(4-glycidoxyphenyl)-1,1-diphenylmethane, 1,1-bis[4-(2-glycidoxyethoxy)phenyl]-3-phenyl-2,3-dihydroindene, 1,1-bis[4-(3-glycidoxypropoxy)phenyl]-3-phenyl-2,3-dihydroindene, 1,1-bis(4-glycidoxyphenyl)-3-phenyl-2,3-dihydroindene, 1,1-bis[4-(2-glycidoxyethoxy)phenyl]-1,3-diphenylpropane, 1,1-bis[4-(3-glycidoxypropoxy)phenyl]-1,3-diphenylpropane, 1,1-bis(4-glycidoxyphenyl)-1,3-diphenylpropane, 1,1-bis[4-(2-glycidoxyethoxy)phenyl]-2,4-diphenylcyclopentane, 1,1-bis[4-(3-glycidoxypropoxy)phenyl]-2,4-diphenylcyclopentane, 1,1-bis(4-glycidoxyphenyl)-2,4-diphenylcyclopentane, 2,2-bis[4-(2-glycidoxyethoxy)phenyl]-2,3-dihydroindene, 2,2-bis[4-(3-glycidoxypropoxy)phenyl]-2,3-dihydroindene, 2,2-bis(4-glycidoxyphenyl)-2,3-dihydroindene, 3,3-bis[4-(2-glycidoxyethoxy)phenyl]-2,5-diphenyl pentane, 3,3-bis[4-(3-glycidoxypropoxy)phenyl]-2,5-diphenyl pentane, 3,3-bis(4-glycidoxyphenyl)-2,5-diphenyl pentane, or "OGSOL" (registered trademark) PG, PG-100 of the same, EG of the same, EG-200 of the same, EG-210 of the same (which are all made Osaka Gas Chemicals Co., Ltd.) can be cited.

As the unsaturated compound having an ethylenic unsaturated double bond group and an epoxy group which is represented by general formula (60), for example, glycidyl (meth)acrylate, (α-ethyl)glycidyl (meth)acrylate, (α-n-propyl)glycidyl (meth)acrylate, (α-n-butyl)glycidyl (meth)acrylate, (3,4-epoxy)n-butyl (meth)acrylate, (3,4-epoxy)heptyl (meth)acrylate, (α-ethyl-6,7-epoxy)heptyl (meth)acrylate, glycidyl 2-vinylacetate, glycidyl 2-vinylcyclohexane carboxylate, glycidyl 3-vinylcyclohexane carboxylate, glycidyl 4-vinylcyclohexane carboxylate, glycidyl 2-vinyl benzoate, glycidyl 3-vinyl benzoate, glycidyl 4-vinyl benzoate, allyl glycidyl ether, vinyl glycidyl ether, 2-vinylbenzyl glycidyl ether, 3-vinylbenzyl glycidyl ether, 4-vinylbenzyl glycidyl ether, α-methyl-2-vinylbenzyl glycidyl ether, α-methyl-3-vinylbenzyl glycidyl ether, α-methyl-4-vinylbenzyl glycidyl ether, 2,3-bis(glycidyloxymethyl)styrene, 2,4-bis(glycidyloxymethyl)styrene, 2,5-bis(glycidyloxymethyl)styrene, 2,6-bis(glycidyloxymethyl)styrene, 2,3,4-tris(glycidyloxymethyl)styrene, 2,3,5-tris(glycidyloxymethyl)styrene, 2,3,6-tris(glycidyloxymethyl)styrene, 3,4,5-tris(glycidyloxymethyl)styrene, or 2,4,6-tris(glycidyloxymethylstyrene) can be cited.

As the unsaturated carboxylic acid having an ethylenic unsaturated double bond group, for example, (meth)acrylic acid, itaconic acid, maleic acid, fumaric acid, mono(2-acryloyloxyethyl) succinate, mono(2-acryloxyethyl) phthalate, mono(2-acryloxyethyl) tetrahydrophthalate, 2-vinyl acetic acid, 2-vinylcyclohexane carboxylic acid, 3-vinylcyclohexane carboxylic acid, 4-vinylcyclohexane carboxylic acid, 2-vinyl benzoic acid, 3-vinyl benzoic acid, 4-vinyl benzoic acid, 4-hydroxyphenyl (meth)acrylate, or 2-hydroxyphenyl (meth)acrylate can be cited.

As the tetracarboxylic acid, the tetracarboxylic dianhydride, the tricarboxylic acid, the tricarboxylic anhydride, the dicarboxylic acid, the dicarboxylic anhydride, the dicarboxylic dichloride, the dicarboxylic acid active diester, the monocarboxylic acid, the monocarboxylic acid chloride, or the monocarboxylic acid active ester, compounds included in the tetracarboxylic acids and/or their derivatives, tricarboxylic acids and/or their derivatives, dicarboxylic acids and/or their derivatives, monocarboxylic acids, monocarboxylic acid chlorides, or monocarboxylic acid active esters mentioned above can be cited.

As the catalyst for use in the ring-opening addition reaction of a compound having two or more aromatic groups in the molecule and an epoxy group which is represented by general formula (59), an unsaturated compound having an ethylenic unsaturated double bond group and an epoxy group which is represented by general formula (60), or an unsaturated carboxylic acid having an ethylenic unsaturated double bond group, for example, amine based catalysts, such as triethylamine, dimethylaniline, tetramethylethylenediamine, 2,4,6-tris(dimethylaminomethyl)phenol, dimethylbenzylamine, or tri-n-octyl-7-amine, quaternary ammonium salts, such as tetramethylammonium chloride, tetramethylammonium bromide, or tetramethylammonium fluoride, alkyl ureas, such as tetramethylurea, alkyl guanidines, such as tetramethylguanidine, tin based catalysts, such as tin(II) bis(2-ethylhexanoate) or di-n-butyl tin(IV) dilaurate, titanium based catalysts, such as titanium(IV) tetrakis(2-ethylhexanoate), phosphorus based catalysts, such as triphenyl phosphine or triphenyl phosphine oxide, chromium based catalysts, such as chromium(III) tris(acetylacetonate), chromium(III) chloride, chromium(III) octenoate, or chromium(III) naphthenate, or cobalt based catalysts, such as cobalt(II) octenoate, can be cited.

<Structural Unit Originating from One or More Species Selected from Tetracarboxylic Acids Having Fluorine Atoms, Tetracarboxylic Dianhydrides Having Fluorine Atoms, Tricarboxylic Acids Having Fluorine Atoms, and Dicarboxylic Acids Having Fluorine Atoms>

It is preferable that the (A2-4) cardo based resin for use in the present invention contain a structural unit originating from one or more species selected from tetracarboxylic acids having fluorine atoms, tetracarboxylic dianhydrides having fluorine atoms, tricarboxylic acids having fluorine atoms, and dicarboxylic acids having fluorine atoms. As the (A2-4) cardo based resin contains a structural unit originating from one or more species selected from tetracarboxylic acids having fluorine atoms, tetracarboxylic dianhydrides having fluorine atoms, tricarboxylic acids having fluorine atoms, and dicarboxylic acids having fluorine atoms, the transparency improves, so that the sensitivity at the time of exposure can be improved. Furthermore, the membrane surface can be provided with water repellency, so that the infiltration through the membrane surface at the time of alkaline development can be inhibited.

As the tetracarboxylic acids having fluorine atoms, the tetracarboxylic dianhydrides having fluorine atoms, the tricarboxylic acids having fluorine atoms, the dicarboxylic acids having fluorine atoms, compounds included in the tetracarboxylic acids having fluorine atoms, tetracarboxylic acid derivatives having fluorine atoms, dicarboxylic acids having fluorine atoms, or dicarboxylic acid derivatives having fluorine atoms mentioned above can be cited.

It is preferable that the content ratio of the structural unit originating from one or more species selected from tetracarboxylic acids having fluorine atom, tetracarboxylic dianhydrides having fluorine atoms, tricarboxylic acids having fluorine atoms, dicarboxylic acids having fluorine atoms in a structure unit originating from the entire tetracarboxylic acids, the entire dicarboxylic acids, and their derivatives in the (A2-4) cardo based resin be within the range of 30 to 100 mol %, and it is more preferable that the content ratio thereof be within the range of 50 to 100 mol %, and it is even more preferable that the content ratio thereof be within the range of 70 to 100 mol %. When the content ratio thereof is within the range mentioned above, the sensitivity at the time of exposure can be improved.

<Structural Unit Originating from One or More Species Selected from Tetracarboxylic Acids Having Aromatic Groups, Tetracarboxylic Dianhydrides Having Aromatic Groups, Tricarboxylic Acids Having Aromatic Groups, and Dicarboxylic Acids Having Aromatic Groups>

It is preferable that the (A2-4) cardo based resin for use in the present invention contain a structural unit originating from one or more species selected from tetracarboxylic acids having aromatic groups, tetracarboxylic dianhydrides having aromatic groups, tricarboxylic acids having aromatic groups, and dicarboxylic acids having aromatic groups. As the (A2-4) cardo based resin contains a structural unit originating from one or more species selected from tetracarboxylic acids having aromatic groups, tetracarboxylic dianhydrides having aromatic groups, tricarboxylic acids having aromatic groups, and dicarboxylic acids having aromatic groups, the heat resistance of the aromatic groups will improve the heat resistance of the cured film.

Furthermore, in the case where, as the (D) coloring agent described below, a (D1) pigment is particularly contained, as the (A2-4) cardo based resin contains a structural unit originating from a copolymerization component having an aromatic group, the steric hindrance of the aromatic group will improve the dispersion stability of the (D1) pigment.

Furthermore, in the case where the (D1) pigment is a (D1-2) organic pigment, an aromatic group in the (A2-4) cardo based resin interacts with an aromatic group in the (D1-2) organic pigment, so that the dispersion stability of the (D1-2) organic pigment can be improved.

As the tetracarboxylic acids having aromatic groups, the tetracarboxylic dianhydrides having aromatic groups, the tricarboxylic acids having aromatic groups, or the dicarboxylic acids having aromatic groups, compounds included in aromatic tetracarboxylic acids and/or their derivatives, aromatic tricarboxylic acids and/or their derivatives, or aromatic dicarboxylic acids and/or their derivatives can be cited.

It is preferable that the content ratio of the structural unit originating from one or more species selected from tetracarboxylic acids having aromatic groups, tetracarboxylic dianhydrides having aromatic groups, tricarboxylic acids having aromatic groups, and dicarboxylic acids having aromatic groups in a structural unit originating from the entire tetracarboxylic acids, the entire dicarboxylic acids, and their derivatives in the (A2-4) cardo based resin be within the range of 10 to 100 mol %, and it is more preferable that the content ratio thereof be within the range of 20 to 100 mol %, and it is even more preferable that the content ratio thereof be within the range of 30 to 100 mol %. When the content ratio thereof is within the range mentioned above, the heat resistance of the cured film can be improved.

<Structural Unit Originating from One or More Species Selected from Tetracarboxylic Acids Having Alicyclic Groups, Tetracarboxylic Dianhydrides Having Alicyclic Groups, Tricarboxylic Acids Having Alicyclic Groups, and Dicarboxylic Acids Having Alicyclic Groups>

It is preferable that the (A2-4) cardo based resin for use in the present invention contain a structural unit originating from one or more species selected from tetracarboxylic acids having alicyclic groups, tetracarboxylic dianhydrides having alicyclic groups, tricarboxylic acids having alicyclic groups, and dicarboxylic acids having alicyclic groups. As the (A2-4) cardo based resin contains a structural unit originating from one or more species selected from tetracarboxylic acids having alicyclic groups, tetracarboxylic dianhydrides having alicyclic groups, tricarboxylic acids having alicyclic groups, and dicarboxylic acids having alicyclic groups, the heat resistance and transparency of the alicyclic group will improve the heat resistance and transparency of the cured film.

As the tetracarboxylic acids having alicyclic groups, the tetracarboxylic dianhydrides having alicyclic groups, tricarboxylic acids having alicyclic groups, or the dicarboxylic acids having alicyclic groups, the alicyclic tetracarboxylic acids and/or their derivatives, compounds included in the alicyclic tricarboxylic acids and/or their derivatives, or the alicyclic dicarboxylic acids and/or their derivatives mentioned above can be cited.

It is preferable that the content ratio of the structural unit originating from one or more species selected from tetracarboxylic acids having alicyclic groups, tetracarboxylic dianhydrides having alicyclic groups, tricarboxylic acids having alicyclic groups, and dicarboxylic acids having alicyclic groups in the structural unit originating from the entire tetracarboxylic acid, the entire dicarboxylic acid, and their derivatives in the (A2-4) cardo based resin be 5 mol % or greater, and it is more preferable that the content ratio thereof be 10 mol % or greater, and it is even more preferable that the content ratio thereof be 15 mol % or greater. When the content ratio thereof is within the range mentioned above, the heat resistance and transparency of the cured film can be improved. On the other hand, it is preferable that the content ratio thereof be 90 mol % or less, and it is more preferable that the content ratio thereof be 85 mol % or less, and it is even more preferable that the content ratio thereof be 75 mol % or less. When the content ratio thereof is within the range mentioned above, mechanical characteristics of the cured film can be improved.

<Acidic groups Originating from Tetracarboxylic Acids, Tetracarboxylic Dianhydrides, Tricarboxylic Acids, Tricarboxylic Anhydrides, or Dicarboxylic Dianhydrides>

It is preferable that the (A2-4) cardo based resin for use in the present invention contain a structural unit originating from a tetracarboxylic acid, a tetracarboxylic dianhydride, a tricarboxylic acid, a tricarboxylic anhydride, or a dicarboxylic dianhydride and that the (A2-4) cardo based resin have an acidic group. As the (A2-4) cardo based resin has an acidic group, the pattern workability with an alkaline developer and the post-development resolution can be improved.

It is preferable that the acidic group be a group that exhibits an acidity below pH 6. As the group that exhibit an acidity below pH 6, for example, a carboxy group, a carboxylic anhydride group, a sulfonic group, a phenolic hydroxyl group, or a hydroxy imide group can be cited. From the view point of improvement of the pattern workability with an alkaline developer and improvement of the post-development resolution, a carboxy group, a carboxylic anhydride group, or a phenolic hydroxyl group is preferable, and a carboxy group or a carboxylic anhydride group is more preferable.

As the tetracarboxylic acids, the tetracarboxylic dianhydrides, the tricarboxylic acids, the tricarboxylic anhydride, or the dicarboxylic dianhydrides, the aforementioned compounds can be cited.

It is preferable that the acid equivalent of the (A2-4) cardo based resin for use in the present invention be 280 g/mol or greater, and it is more preferable that the acid equivalent thereof be 300 g/mol or greater, and it is even more preferable that the acid equivalent thereof be 400 g/mol or greater. When the acid equivalent thereof is within the range mentioned above, the film reduction at the time of alkaline development can be inhibited. On the other hand, it is prefer that the acid equivalent thereof be 1,400 g/mol or less, and it is more preferable that the acid equivalent thereof be 1,100 g/mol or less, and it is even more preferable that the acid equivalent thereof be 950 g/mol or less. When the acid equivalent is within the range mentioned above, the pattern workability with an alkaline developer and the post-development resolution can be improved. Furthermore, from the viewpoint of improvement of the pattern workability with an alkaline developer and improvement of the post-development resolution, it is more preferable that the acid equivalent be carboxylic acid equivalent.

The content ratio of the structural unit originating from various monomer components in the (A2-4) cardo based resin can be determined by a combination of $^1$H-NMR, $^{13}$C-NMR, $^{29}$Si-NMR, IR, TOF-MS, a chemical element analysis method, and ash content measurement.

<Physical Properties of (A2-4) Cardo Based Resin>

It is preferable that the double-bond equivalent of the (A2-4) cardo based resin for use in the present invention be 150 g/mol or greater, and it is more preferable that the double-bond equivalent thereof be 200 g/mol or greater, and it is even more preferable that the double-bond equivalent thereof be 250 g/mol or greater. When the double-bond equivalent thereof be within the range mentioned above, the adhesion with a base substrate can be improved. On the other hand, it is preferable that the double-bond equivalent be 10,000 g/mol or less, and it is more preferable that the double-bond equivalent be 5,000 g/mol or less, and it is even more preferable that the double-bond equivalent be 2,000 g/mol or less. When the double-bond equivalent is within the range mentioned above, the sensitivity at the time of exposure can be improved.

It is preferable that the Mw of the (A2-4) cardo based resin for use in the present invention in terms of polystyrene measured by GPC be 500 or greater, and it is more preferable that the Mw thereof be 1,000 or greater, and it is even more preferable that the Mw thereof be 1,500 or greater. When the Mw thereof is within the range mentioned above, the post-development resolution can be improved. On the other hand, it is preferable that the Mw thereof be 100,000 or less, and it is more preferable that the Mw thereof be 50,000 or less, and it is even more preferable that the Mw thereof be 20,000 or less. When the Mw thereof is within the range mentioned above, the leveling property at the time of coating application and the pattern workability with an alkaline developer can be improved.

<(A2-5) Acrylic Resin>

It is preferable that the (A2-5) acrylic resin for use in the present invention have ethylenic unsaturated double bond groups. The (A2-5) acrylic resin is a resin that allows an ethylenic unsaturated double bond group to be easily introduced into a side chain branching from a main chain of the resin. In the case where the (A2-5) acrylic resin has an ethylenic unsaturated double bond group, the (A2-5) acrylic resin is a photo-curable resin and, when UV cured at the time of exposure, forms a three-dimensional crosslink structure of carbon-carbon bonds. Therefore, by causing the resin composition to contain the (A2-5) acrylic resin whose side chain has an ethylenic unsaturated double bond group, the sensitivity at the time of exposure can be improved. Furthermore, because the three-dimensional crosslink structure formed has an alicyclic structure or an aliphatic structure as a main component, the temperature increase of the softening point of the resin is inhibited, so that a low-taper pattern shape can be obtained and mechanical characteristics of the cured film obtained can be improved. Hence, the (A2-5) acrylic resin is suitable for the cases where the cured film is put to uses in which mechanical characteristic is required, and the like.

It is preferable, from improvement of the sensitivity at the time of exposure and improvement of mechanical characteristics of the cured film, that the (A2-5) acrylic resin for use in the present invention contain a structural unit represented by general formula (61) and/or a structural unit represented by general formula (62).

[CHEM. 23]

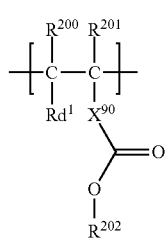

(61)

-continued

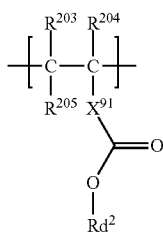
(62)

In general formulas (61) and (62), $Rd^1$ and $Rd^2$ each independently represent one of an alkyl group having a carbon number of 1 to 10, a cycloalkyl group having a carbon number of 4 to 15, and an aryl group having a carbon number of 6 to 15 which each have an ethylenic unsaturated double bond group. $R^{200}$ to $R^{205}$ each independently represent hydrogen, an alkyl group having a carbon number of 1 to 10, a cycloalkyl group having a carbon number of 4 to 10, or an aryl group having a carbon number of 6 to 15. $X^{90}$ and $X^{91}$ each independently represent a direct bond, an alkylene chain having a carbon number of 1 to 10, a cycloalkylene chain having a carbon number of 4 to 10, or an arylene chain having a carbon number of 6 to 15. In general formulas (61) and (62), it is preferable that $Rd^1$ and $Rd^2$ each independently be one of an alkyl group having a carbon number of 1 to 6, a cycloalkyl group having a carbon number of 4 to 10, and an aryl group having a carbon number of 6 to 10 which each have an ethylenic unsaturated double bond group. Furthermore, it is preferable that $R^{200}$ to $R^{205}$ each independently be hydrogen, an alkyl group having a carbon number of 1 to 6, a cycloalkyl group having a carbon number of 4 to 7, or an aryl group having a carbon number of 6 to 10. Furthermore, it is preferable that $X^{90}$ and $X^{91}$ each independently be a direct bond, an alkylene chain having a carbon number of 1 to 6, a cycloalkylene chain having a carbon number of 4 to 7, or an arylene chain having a carbon number of 6 to 10. The alkyl group, the cycloalkyl group, the aryl group, the alkylene chain, the cycloalkylene chain, and the arylene chain mentioned above may have a heteroatom and may be either an unsubstituted product or a substitution product.

It is preferable that the (A2-5) acrylic resin for use in the present invention be an (A2-5) acrylic resin obtained by radical copolymerization of a copolymerization component that has an acidic group or a different copolymerization component. It is preferable that the different copolymerization component be a copolymerization component having a fluorine atom, a copolymerization component having an aromatic group, or a copolymerization component having an alicyclic group.

<Structural Unit Originating from Copolymerization Component Having Acidic group>

It is preferable that the (A2-5) acrylic resin for use in the present invention contain a structural unit originating from a copolymerization component having an acidic group and the (A2-5) acrylic resin have an acidic group. As the (A2-5) acrylic resin has an acidic group, the pattern workability with an alkaline developer and the post-development resolution can be improved.

It is preferable that the acidic group be a group that exhibits an acidity below pH 6. As the group that exhibits an acidity below pH 6, for example, a carboxy group, a carboxylic anhydride group, a sulfonic groups, a phenolic hydroxyl group, or a hydroxy imide group can be cited. From the viewpoint of improvement of the pattern workability with an alkaline developer and improvement of the post-development resolution, it is preferable that the group be a carboxy group, a carboxylic anhydride group, or a phenolic hydroxyl group, and it is more preferable that the group be a carboxy group or a carboxylic anhydride group.

As the copolymerization component having an acidic group, for example, (meth)acrylic acid, (meth)acrylic anhydride, itaconic acid, itaconic anhydride, maleic acid, fumaric acid, mono(2-acryloyloxyethyl) succinate, mono(2-acryloxyethyl) phthalate, mono(2-acryloxyethyl) tetrahydrophthalate, 4-hydroxyphenyl (meth)acrylate, or 2-hydroxyphenyl (meth)acrylate can be cited. From the viewpoint of improvement of the pattern workability with an alkaline developer and improvement of the post-development resolution, it is preferable that the copolymerization component having an acidic group be (meth)acrylic acid, (meth)acrylic anhydride, itaconic acid, itaconic anhydride, maleic acid, fumaric acid, mono(2-acryloyloxyethyl) succinate, mono(2-acryloxyethyl) phthalate, or mono(2-acryloxyethyl) tetrahydrophthalate, and the copolymerization component be (meth)acrylic acid, (meth)acrylic anhydride, itaconic acid, itaconic anhydride, maleic acid, fumaric acid, and mono(2-acryloyloxyethyl) succinate are more preferable.

It is preferable that the acid equivalent of the (A2-5) acrylic resin for use in the present invention be 280 g/mol or greater, and it is more preferable that the acid equivalent thereof be 300 g/mol or greater, and it is even more preferable that the acid equivalent thereof be 400 g/mol or greater. When the acid equivalent thereof is within the range mentioned above, the film reduction at the time of alkaline development can be inhibited. On the other hand, it is preferable that the acid equivalent thereof be 1,400 g/mol or less, it is more preferable that the acid equivalent thereof be 1,100 g/mol or less, and it is even more preferable that the acid equivalent thereof be 950 g/mol or less. When the acid equivalent thereof is within the range mentioned above, the pattern workability with an alkaline developer and the post-development resolution can be improved. Furthermore, from the viewpoint of improvement of the pattern workability with an alkaline developer and improvement of the post-development resolution, it is more preferable that the acid equivalent thereof be a carboxylic acid equivalent.

It is preferable that the (A2-5) acrylic resin for use in the present invention be an (A2-5) acrylic resin that does not have an epoxy group, in the case where the (A2-5) acrylic resin has a carboxy group. When the (A2-5) acrylic resin has both a carboxy group and an epoxy group, there is possibility that during storage of a coating liquid of the resin composition, the carboxy group and the epoxy group may react. Therefore, this becomes a cause of decrease of the storage stability of the coating liquid of the resin composition. It is preferable that the (A2-5) acrylic resin that does not have an epoxy group be an (A2-5) acrylic resin obtained by radical copolymerization of a copolymerization component that has a carboxy group or a carboxylic anhydride group and a different copolymerization component that does not have an epoxy group.

<Structural Unit Originating from Copolymerization Component Having Fluorine Atom>

It is preferable that the (A2-5) acrylic resin for use in the present invention contain a structural unit originating from a copolymerization component that has a fluorine atom. As the (A2-5) acrylic resin contains a structural unit originating from a copolymerization component that has a fluorine atom, the transparency improves, so that the sensitivity at the time of exposure can be improved. Furthermore, the membrane surface can be provided with water repellency, so that infiltration through the membrane surface at the time of alkaline development can be inhibited.

As the copolymerization component having a fluorine atom, for example, trifluoromethyl (meth)acrylate, (2,2,2-trifluoro)ethyl (meth)acrylate, (3,3,3-trifluoro)propyl (meth)acrylate, trifluoromethoxypropyl (meth)acrylate, (6,6,6,5,5,4,4,3,3-nonafluoro)-n-hexyl (meth)acrylate, (1,2,3,4,5-pentafluoro)phenyl (meth)acrylate, or 3-(1,2,3,4,5-pentafluorophenyl)propyl (meth)acrylate can be cited.

It is preferable that the content ratio of the structural unit originating from a copolymerization component having a fluorine atom in the structural unit originating from the entire copolymerization components in the (A2-5) acrylic resin be 5 mol % or greater, and it is more preferable that the content ratio thereof be 10 mol % or greater, and it is even more preferable that the content ratio thereof be 15 mol % or greater. When the content ratio thereof is within the range mentioned above, the sensitivity at the time of exposure can be improved. On the other hand, it is preferable that the content ratio thereof be 60 mol % or less, and it is more preferable that the content ratio thereof be 50 mol % or less, and it is even more preferable that the content ratio thereof be 40 mol % or less. When the content ratio thereof is within the range mentioned above, mechanical characteristics of the cured film can be improved.

<Structural Unit Originating from Copolymerization Component Having Aromatic Group>

It is preferable that the (A2-5) acrylic resin for use in the present invention contain a structural unit originating from a copolymerization component that has an aromatic group. As the (A2-5) acrylic resin contains a structural unit originating from a copolymerization component having an aromatic group, the heat resistance of the aromatic group will improve the heat resistance of the cured film.

Furthermore, in the case where, as the (D) coloring agent described below, a (D1) pigment is particularly contained, as the (A2-5) acrylic resin contains a structural unit originating from a copolymerization component having an aromatic group, the steric hindrance of the aromatic group will improve the dispersion stability of the (D1) pigment. Furthermore, in the case where the (D1) pigment is a (D1-2) organic pigment, aromatic groups in the (A2-5) acrylic resin interact with aromatic groups of the (D1-2) organic pigment, so that the dispersion stability of the (D1-2) organic pigment can be improved.

As the copolymerization component having an aromatic group, for example, mono(2-acryloxyethyl) phthalate, 4-hydroxyphenyl (meth)acrylate, 2-hydroxyphenyl (meth)acrylate, phenyl (meth)acrylate, 4-tolyl (meth)acrylate, 4-styryl (meth)acrylate, 1-naphthyl (meth)acrylate, 2-naphthyl (meth)acrylate, 4-biphenyl (meth)acrylate, benzyl (meth)acrylate, phenylethyl (meth)acrylate, styrene, 4-methyl styrene, 2-methylstyrene, 3-methylstyrene, or α-methylstyrene can be cited. From the viewpoint of improvement of the heat resistance of the cured film, it is preferable that the copolymerization component having an aromatic group be mono (2-acryloxyethyl) phthalate, 4-hydroxyphenyl (meth)acrylate, 2-hydroxyphenyl (meth)acrylate, phenyl (meth)acrylate, 4-tolyl (meth)acrylate, 4-styryl (meth)acrylate, 1-naphthyl (meth)acrylate, 2-naphthyl (meth)acrylate, 4-biphenyl (meth)acrylate, styrene, 4-methyl styrene, 2-methylstyrene, 3-methylstyrene, or α-methylstyrene, and it is more preferable that the copolymerization component having an aromatic group be 1-naphthyl (meth)acrylate, 2-naphthyl (meth)acrylate, or styrene.

It is preferable that the content ratio of the structural unit originating from a copolymerization component having an aromatic group in the structural unit originating from the entire copolymerization components in the (A2-5) acrylic resin be 10 mol % or greater, and it is more preferable that the content ratio thereof be 20 mol % or greater, and it is even more preferable that the content ratio thereof be 30 mol % or greater. When the content ratio thereof is within the range mentioned above, the heat resistance of the cured film can be improved. On the other hand, it is preferable that the content ratio thereof be 80 mol % or less, and it is more preferable that the content ratio thereof be 75 mol % or less, and it is even more preferable that the content ratio thereof be 70 mol % or less. When the content ratio thereof is within the range mentioned above, the sensitivity at the time of exposure can be improved.

<Structural Unit Originating from Copolymerization Component Having Alicyclic Group>

It is preferable that the (A2-5) acrylic resin for use in the present invention contain a structural unit originating from a copolymerization component that has an alicyclic group. As the (A2-5) acrylic resin contains a structural unit originating from a copolymerization component having an alicyclic group, the heat resistance and transparency of the alicyclic group will improve the heat resistance and transparency of the cured film.

As the copolymerization component having an alicyclic group, for example, mono(2-acryloxyethyl) tetrahydrophthalate, cyclopentyl (meth)acrylate, cyclohexyl (meth)acrylate, cyclohexenyl (meth)acrylate, 4-methoxycyclohexyl (meth)acrylate, (2-isopropyloxycarbonyl) ethyl (meth)acrylate, (2-cyclopentyloxycarbonyl)ethyl (meth)acrylate, (2-cyclohexyloxycarbonyl)ethyl (meth)acrylate, (2-cyclohexenyloxycarbonyl)ethyl (meth)acrylate, [2-(4-methoxycyclohexyl)oxycarbonyl]ethyl (meth)acrylate, 2-norbornyl (meth)acrylate, isobornyl (meth)acrylate, tricyclodecanyl (meth)acrylate, tetracyclodecanyl (meth)acrylate, dicyclopentenyl (meth)acrylate, adamantyl (meth)acrylate, adamantylmethyl (meth)acrylate, or [(l-methyl) adamantyl] (meth)acrylate can be cited. From the viewpoint of improvement of the heat resistance of the cured film and improvement of the transparency thereof, it is preferable that the copolymerization component having an alicyclic group be mono(2-acryloxyethyl) tetrahydrophthalate, cyclopentyl (meth)acrylate, cyclohexyl (meth)acrylate, cyclohexenyl (meth)acrylate, 4-methoxycyclohexyl (meth)acrylate, 2-norbornyl (meth)acrylate, isobornyl (meth)acrylate, tricyclodecanyl (meth)acrylate, tetracyclodecanyl (meth)acrylate, dicyclopentenyl (meth)acrylate, adamantyl (meth)acrylate, adamantylmethyl (meth)acrylate, or [(1-methyl)adamantyl] (meth)acrylate, and it is more preferable that the copolymerization component having an alicyclic group be 2-norbornyl (meth)acrylate, isobornyl (meth)acrylate, tricyclodecanyl (meth)acrylate, tetracyclodecanyl (meth)acrylate, dicyclopentenyl (meth)acrylate, adamantyl (meth)acrylate, adamantylmethyl (meth)acrylate, or [(1-methyl)adamantyl] (meth)acrylate.

It is preferable that the content ratio of the structural unit originating from a copolymerization component having an alicyclic group in the structural unit originating from the entire copolymerization components in the (A2-5) acrylic resin be 5 mol % or greater, and it is more preferable that the content ratio thereof be 10 mol % or greater, and it is even more preferable that the content ratio thereof be 15 mol % or greater. When the content ratio thereof is within the range mentioned above, the heat resistance and transparency of the cured film can be improved. On the other hand, it is preferable that the content ratio thereof be 90 mol % or less, and it is more preferable that the content ratio thereof be 85 mol % or less, and it is even more preferable that the content ratio thereof be 75 mol % or less. When the content ratio thereof is within the range mentioned above, mechanical characteristics of the cured film can be improved.

It is preferable that the (A2-5) acrylic resin for use in the present invention be a resin obtained by ring-opening addition reaction of a resin obtained by radical copolymerization of a copolymerization component having an acidic group or a different copolymerization component, with an unsaturated compound that has an ethylenic unsaturated double bond group and an epoxy group which is represented by general formula (60).

As the unsaturated compound having an ethylenic unsaturated double bond group and an epoxy group which is represented by general formula (60), for example, glycidyl (meth)acrylate, α-ethylglycidyl (meth)acrylate, α-n-propylglycidyl (meth)acrylate, α-n-butylglycidyl (meth)acrylate, (meth)acrylate 3,4-epoxy-n-butyl, (meth)acrylate 3,4-epoxy heptyl, (α-ethyl-6,7-epoxy)heptyl (meth)acrylate, (3,4-epoxycyclohexyl)methyl (meth)acrylate, 2-(3,4-epoxycyclohexyl)ethyl (meth)acrylate, 2-vinyl acetic acid glycidyl, 2-vinylcyclohexane carboxylic acid glycidyl, 3-vinylcyclohexane carboxylic acid glycidyl, 4-vinylcyclohexane carboxylic acid glycidyl, 2-vinyl benzoic acid glycidyl, 3-vinyl benzoic acid glycidyl, 4-vinyl benzoic acid glycidyl, allyl glycidyl ether, vinyl glycidyl ether, 2-vinylbenzyl glycidyl ether, 3-vinylbenzyl glycidyl ether, 4-vinylbenzyl glycidyl ether, α-methyl-2-vinylbenzyl glycidyl ether, α-methyl-3-vinylbenzyl glycidyl ether, α-methyl-4-vinylbenzyl glycidyl ether, 2,3-bis(glycidyloxymethyl)styrene, 2,4-bis(glycidyloxymethyl)styrene, 2,5-bis(glycidyloxymethyl)styrene, 2,6-bis(glycidyloxymethyl)styrene, 2,3,4-tris(glycidyloxymethyl)styrene, 2,3,5-tris(glycidyloxymethyl)styrene, 2,3,6-tris(glycidyloxymethyl)styrene, 3,4,5-tris(glycidyloxymethyl)styrene, or 2,4,6-tris(glycidyloxymethylstyrene) can be cited.

As catalyst for use in the ring-opening addition reaction of the unsaturated compound having an ethylenic unsaturated double bond group and an epoxy group which is represented by general formula (60), for example, amine based catalysts, such as triethylamine, dimethylaniline, tetramethylethylenediamine, 2,4,6-tris(dimethylaminomethyl)phenol, dimethylbenzylamine, or tri-n-octyl-7-amine, quaternary ammonium salts, such as tetramethylammonium chloride, tetramethylammonium bromide, or tetramethylammonium fluoride, or alkyl ureas, such as tetramethylurea, alkyl guanidines, such as tetramethylguanidine, tin based catalysts, such as tin(II) bis(2-ethylhexanoate) or di-n-butyl tin(IV) dilaurate, titanium based catalysts, such as titanium(IV) tetrakis(2-ethylhexanoate), phosphorus based catalysts, such as triphenyl phosphine or triphenyl phosphine oxide, chromium based catalysts, such as chromium(III) tris(acetylacetonate), chromium(III) chloride, chromium(III) octenoate, or chromium (III) naphthenate, cobalt based catalysts, such as cobalt(II) octenoate, can be cited.

<Physical Property of (A2-5) Acrylic Resin>

It is preferable that the double-bond equivalent of the (A2-5) acrylic resin for use in the present invention be 150 g/mol or greater, it is more preferable that the double-bond equivalent thereof be 200 g/mol or greater, and it is even more preferable that the double-bond equivalent thereof be 250 g/mol or greater. When the double-bond equivalent thereof is within the range mentioned above, the adhesion with the base substrate can be improved. On the other hand, it is preferable that the double-bond equivalent thereof be 10,000 g/mol or less, and it is more preferable that the double-bond equivalent thereof be 5,000 g/mol or less, and it is even more preferable that the double-bond equivalent thereof be 2,000 g/mol or less. If the double-bond equivalent is within the range mentioned above, the sensitivity at the time of exposure can be improved.

It is preferable that the Mw of the (A2-5) acrylic resin for use in the present invention in terms of polystyrene measured by GPC be 1,000 or greater, and it is more preferable that the Mw thereof be 3,000 or greater, and it is even more preferable that the MW thereof be 5,000 or greater. When the Mw thereof is within the range mentioned above, the post-development resolution can be improved. On the other hand, it is preferable that the Mw thereof be 100,000 or less, and it is more preferable that the Mw thereof be 70,000 or less, and it is even more preferable that the Mw thereof be 50,000 or less. When the Mw thereof is within the range mentioned above, the leveling property at the time of coating application and the pattern workability with an alkaline developer can be improved.

<Synthesis Method for (A2-5) Acrylic Resin>

As the radical polymerization initiating agent for use in the radical copolymerization, for example, azo compounds, such as 2,2'-Azobis(isobutyronitrile), 2,2'-Azobis(2,4-dimethylvaleronitrile), or 2,2'-Azobis(4-methoxy-2,4-dimethylvaleronitrile), or organic peroxides, such as lauroyl peroxide, di-t-butyl peroxide, bis(4-t-butylcyclohexane-1-yl) peroxydicarbonate, t-butyl 2-ethylperoxyhexanoate, methyl ethyl ketone peroxide, benzoylperoxide, or cumene hydroperoxide can be cited.

As for the conditions for the radical copolymerization, it is preferable that, for example, in air or after thorough nitrogen replacement by bubbling, reduced-pressure degassing, or the like, a copolymerization component and a radical polymerization initiating agent be added into the reaction solvent and reacted at 60 to 110° C. for 30 to 500 minutes. In the case where a copolymerization component having a carboxylic anhydride group is used as the copolymerization component, it is preferable to add a theoretical amount of water and conduct reaction at 30 to 60° C. for 30 to 60 minutes. Furthermore, a chain transfer agent, such as a thiol compound, may be used as needed.

In the negative-type photosensitive resin composition of the present invention, it is preferable that the content ratio of the (A1) first resin in a total of 100 mass % of the (A1) first resin and the (A2) second resin be 25 mass % or greater, and it is more preferable that the content ratio thereof be 35 mass % or greater, and it is even more preferable that the content ratio thereof be 45 mass % or greater, and it is still more preferable that the content ratio thereof be 51 mass % or greater, and it is particularly preferable that the content ratio thereof be 60 mass % or greater. When the content ratio thereof is within the range mentioned above, the heat resistance of the cured film can be improved. On the other hand, it is preferable that the content ratio of the (A1) first resin be 90 mass % or less, and it is more preferable that the content ratio thereof be 85 mass % or less, and it is even more preferable that the content ratio thereof be 80 mass % or less, and it is particularly preferable that the content ratio thereof be 75 mass % or less. When the content ratio thereof is within the range mentioned above, a cured film having a low-taper pattern shape can be obtained.

When the content ratios of the (A1) first resin and the (A2) second resin in the negative-type photosensitive resin composition of the present invention are within the ranges mentioned above, the heat resistance of the cured film can be improved and a low-taper pattern shape can be obtained.

Therefore, the cured film obtained from the negative-type photosensitive resin composition of the present invention is suitable for uses that require a high heat resistance and a low-taper pattern shape, such as insulation layers of pixel-separating layers of organic EL displays, and the like. Particularly, in uses in which problems attributable to heat resistance and pattern shape, such as defect or declined property of an element resulting from degassing due to thermal decomposition, a break of an electrode wiring due to a high-taper pattern shape, etc., are assumed, the using of the cured film of the negative-type photosensitive resin composition of the present invention makes it possible to produce a highly reliable element with which the foregoing problems do not occur. Moreover, since the negative-type photosensitive resin composition of the present invention contains a (D) coloring agent described below, it becomes possible to prevent visualization of electrode wirings or reduce external light reflection, so that contrast in the image display can be improved.

<(B) Radical Polymerizable Compound>

It is preferable that the negative-type photosensitive resin composition of the present invention further contain a (B) radical polymerizable compound.

The (B) radical polymerizable compound refers to a compound that has in its molecule a plurality of ethylenic unsaturated double bond groups. As, at the time of exposure, radicals produced from a (C) photopolymerization initiator described later cause radical polymerization of the (B) radical polymerizable compound to progress so that the exposed portion of a film of the resin composition becomes insoluble to the alkaline developer, a negative-type pattern can be formed.

As the negative-type photosensitive resin composition contains the (B) radical polymerizable compound, the UV curing at the time of exposure is facilitated, so that the sensitivity at the time of exposure can be improved. Moreover, the crosslink density after thermosetting improves, so that the hardness of the cured film can be improved.

It is preferable that the (B) radical polymerizable compound be a compound having a (meth)acrylic group whose radical polymerization easily progresses. From the viewpoint of improvement of the sensitivity at the time of exposure and improvement of the hardness of the cured film, it is more preferable that the (B) radical polymerizable compound be a compound that has in its molecule two or more (meth)acrylic groups. From the viewpoint of improvement of the sensitivity at the time of exposure and improvement of the hardness of the cured film, it is preferable that the double-bond equivalent of the (B) radical polymerizable compound be 80 to 400 g/mol.

As the (B) radical polymerizable compound, for example, diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonane diol di(meth)acrylate, 1,10-decane diol di(meth)acrylate, dimethylol-tricyclodecane di(meth)acrylate, ethoxylated glycerol tri(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona(meth)acrylate, tetrapentaerythritol deca (meth)acrylate, pentapentaerythritol undeca(meth)acrylate, pentapentaerythritol deca(meth)acrylate, ethoxylated bisphenol A di(meth)acrylate, 2,2-bis[4-(3-(meth)acryloxy-2-hydroxypropoxy)phenyl]propane, 1,3,5-tris((meth)acryloxyethyl) isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxy propoxy)phenyl]fluorene, 9,9-bis(4-(meth)acryloxy phenyl)fluorene, their acid-modified products, their ethylene oxide-modified products, or their propylene oxide-modified products can be cited. From the viewpoint of improvement of the sensitivity at the time of exposure and improvement of the hardness of the cured film, it is preferable that the (B) radical polymerizable compound be trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxy propoxy)phenyl]fluorene, 9,9-bis(4-(meth)acryloxy phenyl)fluorene, their acid-modified products, their ethylene oxide-modified products, or their propylene oxide-modified products. From the viewpoint of improvement of the post-development resolution, it is more preferable that the (B) radical polymerizable compound be their acid-modified products or their ethylene oxide-modified products. Furthermore, from the viewpoint of improvement of the post-development resolution, it is also preferable that the (B) radical polymerizable compound be a compound obtained by reacting a compound obtained by ring-opening addition reaction of a compound having in its molecule two or more glycidoxy groups and an unsaturated carboxylic acid having an ethylenic unsaturated double bond group, with a polybasic carboxylic acid or a polybase carboxylic anhydride.

It is preferable that the content of the (B) radical polymerizable compound in the negative photosensitive resin composition of the present invention be 15 mass parts or greater in the case where the total of the (A1) first resin, the (A2) second resin, and the (B) radical polymerizable compound is assumed to be 100 mass parts, and it is more preferable that the content thereof be 20 mass parts or greater, and it is even more preferable that the content thereof be 25 mass parts or greater, and it is particularly preferable that the content thereof be 30 mass parts or greater. When the content thereof is within the range, the sensitivity at the time of exposure can be improved and a cured film having a low-taper pattern shape can be obtained. On the other hand, it is preferable that the content of the (B) radical polymerizable compound be 65 mass parts or less, and it is more preferable that the content thereof be 60 mass parts or less, and it is even more preferable that the content thereof be 55 mass parts or less, and it is particularly preferable that the content thereof be 50 mass parts or less. When the content is within the range mentioned above, the heat resistance of the cured film can be improved and a low-taper pattern shape thereof can be obtained.

<(C) Photopolymerization Initiator>

The negative-type photosensitive resin composition of the present invention further contains a (C) photopolymerization initiator.

The (C) photopolymerization initiator refers to a compound that, when exposed, undergoes bond cleavage and/or reaction to product radicals.

As the (C) photopolymerization initiator is contained, the radical polymerization of the (B) radical polymerizable compound described above progresses so that the exposed portion of the film of the resin composition becomes insoluble to the alkaline developer, a negative-type pattern can be formed. Furthermore, the UV curing at the time of exposure is facilitated, so that the sensitivity can be improved.

It is preferable that the (C) photopolymerization initiator be, for example, a benzyl ketal based photopolymerization initiator, an α-hydroxyketone based photopolymerization initiator, an α-amino ketone based photopolymerization initiator, an acyl phosphine oxide based photopolymerization initiator, an oxime ester based photopolymerization initiator, an acridine based photopolymerization initiator, a titanocene based photopolymerization initiator, a benzophenone based photopolymerization initiator, an acetophenone based photopolymerization initiator, an aromatic ketoester based photopolymerization initiator, or a benzoic acid ester based photopolymerization initiator. From the viewpoint of improvement of the sensitivity at the time of exposure, it is more preferable that the (C) photopolymerization initiator be an α-hydroxyketone based photopolymerization initiator, an α-amino ketone based photopolymerization initiator, an acyl phosphine oxide based photopolymerization initiator, an oxime ester based photopolymerization initiator, an acridine based photopolymerization initiator, or a benzophenone based photopolymerization initiator, and it is even more preferable that the (C) photopolymerization initiator be an α-amino ketone based photopolymerization initiator, an acyl phosphine oxide based photopolymerization initiator, or an oxime ester based photopolymerization initiator.

As the benzyl ketal based photopolymerization initiator, for example, 2,2-dimethoxy-1,2-diphenyl ethane-1-one can be cited.

As the α-hydroxyketone based photopolymerization initiator, for example, 1-(4-isopropyl phenyl)-2-hydroxy-2-methylpropane-1-one, 2-hydroxy-2-methyl-1-phenylpropane-1-one, 1-hydroxycyclohexyl phenyl ketone, 1-[4-(2-hydroxyethoxy)phenyl]-2-hydroxy-2-methylpropane-1-one, or 2-hydroxy-1-[4-[4-(2-hydroxy-2-methylpropionyl)benzyl]phenyl]-2-methylpropane-1-one can be cited.

As the α-amino ketone based photopolymerization initiator, for example, 2-methyl-1-[4-(methylthio) phenyl]-2-morpholino propane-1-one, 2-benzyl-2-dimethylamino-1-(4-morpholino phenyl)-butane-1-one, 2-dimethylamino-2-(4-methylbenzyl)-1-(4-morpholino phenyl)-butane-1-one, or 3,6-bis(2-methyl-2-morpholinopropionyl)-9-octyl-9H-carbazol can be cited.

As the acyl phosphine oxide based photopolymerization initiator, for example, 2,4,6-trimethylbenzoyl-diphenyl phosphine oxide, bis(2,4,6-trimethylbenzoyl)-phenyl phosphine oxide, or bis(2,6-dimethoxybenzoyl)-(2,4,4-trimethylpentyl)phosphine oxide can be cited.

As the oxime ester based photopolymerization initiator, for example, 1-phenylpropane-1,2-dione-2-(O-ethoxycarbonyl)oxime, 1-phenyl butane-1,2-dione-2-(O-methoxycarbonyl)oxime, 1,3-diphenylpropane-1,2,3-trione-2-(0-ethoxycarbonyl)oxime, 1-[4-(phenylthio) phenyl]octane-1,2-dione-2-(O-benzoyl)oxime, 1-[4-[4-(carboxyphenyl)thio]phenyl] propane-1,2-dione-2-(O-acetyl)oxime, 1-[9-ethyl-6-(2-methylbenzoyl)-9H-carbazol-3-yl]ethanone-1-(O-acetyl) oxime, 1-[9-ethyl-6-[2-methyl-4-[1-(2,2-dimethyl-1,3-dioxolane-4-yl)methyl oxy]benzoyl]-9H-carbazol-3-yl] ethanone-1-(O-acetyl)oxime, 1-(9-ethyl-6-nitro-9H-carbazol-3-yl)-1-[2-methyl-4-(1-methoxypropane-2-yloxy) phenyl]methanone-1-(O-acetyl)oxime can be cited.

As the acridine based photopolymerization initiator, for example, 1,7-bis(acridine-9-yl)-n-heptane can be cited.

As the titanocene based photopolymerization initiator, for example, bis($\eta^5$-2,4-cyclopentadiene-1-yl)-bis[2,6-difluoro)-3-(1H-pyrrole-1-yl)phenyl]titanium(IV) or bis($\eta^5$-3-methyl-2,4-cyclopentadiene-1-yl)-bis(2,6-difluorophenyl) titanium(IV) can be cited.

As the benzophenone based photopolymerization initiator, for example, benzophenone, 4,4'-bis(dimethylamino) benzophenone, 4,4'-bis(diethylamino) benzophenone, 4-phenyl benzophenone, 4,4-dichlorobenzophenone, 4-hydroxybenzophenone, alkylated benzophenone, 3,3',4,4'-tetrakis(t-butyl peroxycarbonyl)benzophenone, 4-methyl benzophenone, dibenzyl ketone, or fluorenone can be cited.

As the acetophenone based photopolymerization initiator, for example, 2,2-diethoxyacetophenone, 2,3-diethoxyacetophenone, 4-t-butyl dichloroacetophenone, benzalacetophenone, or 4-azidobenzalacetophenone can be cited.

As the aromatic ketoester based photopolymerization initiator, for example, 2-phenyl-2-oxymethyl acetate can be cited.

As the benzoic acid ester based photopolymerization initiator, for example, ethyl 4-dimethylaminobenzoate, (2-ethyl)hexyl 4-dimethylaminobenzoate, ethyl 4-diethylaminobenzate, or methyl 2-benzoylbenzoate can be cited.

It is preferable that the content of the (C) photopolymerization initiator in the negative photosensitive resin composition of the present invention be 0.1 mass part or greater in the case where a total amount of the (A1) first resin, the (A2) second resin, and the (B) radical polymerizable compound is assumed to be 100 mass parts, and it is more preferable that the content ratio thereof be 0.5 mass part or greater, and it is even more preferable that the content ratio thereof be 0.7 mass part or greater, and it is particularly preferable that the content ratio thereof be 1 mass part or greater. When the content ratio thereof be within the range mentioned above, the sensitivity at the time of exposure can be improved. On the other hand, it is preferable that the content of the (C) photopolymerization initiator be 25 mass parts or less, and it is more preferable that the content ratio thereof be 20 mass parts or less, and it is even more preferable that the content ratio thereof be 17 mass parts or less, and it is particularly preferable that the content ratio thereof be 15 mass parts or less. When the content thereof be within the range mentioned above, the post-development resolution can be improved and, at the same time, a cured film having a low-taper pattern shape can be obtained.

<(D) Coloring Agent>

The negative-type photosensitive resin composition of the present invention further contains a (D) coloring agent.

The (D) coloring agent is a compound that absorbs light of specific wavelength and, particularly, refers to a compound that creates color by absorbing light of a visible ray wavelength (380 to 780 nm).

By containing the (D) coloring agent, the film obtained from the resin composition can be colored, so that it is possible to provide a coloration property that causes light penetrating the film of the resin composition or light reflecting from the film of the resin composition to produce a desired color. Furthermore, it is possible to provide a light blocking property that eliminates the light of a wavelength that (D) coloring agent absorbs from light that penetrates the film of the resin composition or light that reflects from the film of the resin composition.

As the (D) coloring agent, compounds that absorb light of a visible ray wavelength and produce a color or white, red, orange, yellow, green, blue, or violet can be cited. By combining two or more colors of these coloring agents, it is possible to improve the color adjustment property that causes light that penetrates the film of a desired resin composition of the resin composition or light that reflects from the film of the resin composition to have a desired color coordinate.

As for the negative-type photosensitive resin composition of the present invention, it is preferable that the (D) coloring agent mentioned above contain a (D1) pigment and/or a (D2) dye described later. As for the negative-type photosensitive resin composition of the present invention, it is preferable that the (D) coloring agent contain a (Da) black coloring agent and/or a (Db) color agent other than black.

The (Da) black coloring agent refers to a compound that produces black color by absorb light of visible ray wavelengths.

By containing the (Da) black coloring agent, the film of the resin composition becomes black, so that the light blocking property that blocks light penetrating the film of the resin composition or light reflecting from the film of the resin composition can be improved. Therefore, the resin composition containing the (Da) black coloring agent is suitable for uses in which increased contrast achieved by inhibiting external light reflection is required, such as light-blocking films, including a black matrix of a color filter, a black column spacer of a liquid crystal display, a pixel-separating layer or a TFT planarization layer of an organic EL display, etc.

It is preferable, from the viewpoint of light blocking property, the (Da) black coloring agent be a compound that absorbs light of all the visible ray wavelengths and produce black color. Furthermore, a mixture of two or more colors of (D) coloring agents selected from coloring agents for white, red, orange, yellow, green, blue, or violet is also preferable. By combining two or more colors of these (D) coloring agents, it is possible to produce color of black in a pseudo manner and improve the light blocking property.

As for the negative-type photosensitive resin composition of the present invention, it is prefer that the (Da) black coloring agent contain one or more species selected from a (D1a) black pigment, a (D2a-1) black dye, and a (D2a-2) mixture of two or more color dyes which are described later. From the viewpoint of light blocking property, it is more preferable that the (Da) black coloring agent contain a (D1a) black pigment described below.

The (Db) color agent other than black refers to a compound that creates a color by absorbing light of a visible ray wavelength. That is, the (Db) color agent other than black is a coloring agent mentioned above that produces color of white, red, orange, yellow, green, blue, or violet, except black.

By containing the (Da) black coloring agent and the (Db) color agent other than black, the film of the resin composition can be provided with light blocking property, coloration property and/or color adjustment property.

As for the negative-type photosensitive resin composition of the present invention, it is preferable that the (Db) color agent other than black contain a (D1b) pigment other than black and/or a (D2b) dye other than black described later, and it is more preferable, from the viewpoint of light blocking property and heat resistance or weather resistance, that the (Db) color agent other than black contain a (D1b) pigment other than black described later.

In the negative-type photosensitive resin composition of the present invention, it is preferable that the content ratio of the (D) coloring agent in a total of 100 mass % of the (A1) first resin, the (A2) second resin, the (D) coloring agent, and a (E) dispersing agent described later be 15 mass % or greater, and it is more preferable that the content ratio thereof be 20 mass % or greater, and it is even more preferable that the content ratio thereof be 25 mass % or greater, and it is particularly preferable that the content ratio thereof be 30 mass % or greater. When the content ratio thereof is within the range mentioned above, the light blocking property, the coloration property, or the color adjustment property can be improved. On the other hand, it is preferable that the content ratio of the (D) coloring agent be 80 mass % or less, and it is more preferable that the content ratio thereof be 75 mass % or less, and it is even more preferable that the content ratio thereof be 70 mass % or less, and it is particularly preferable that the content ratio thereof be 65 mass % or less. When the content ratio thereof is within the range mentioned above, the sensitivity at the time of exposure can be improved. Furthermore, it is preferable that the content ratio of the (D) coloring agent in the entire solid content of the negative photosensitive resin composition of the present invention excluding the solvent be 5 mass % or greater, and it is more preferable that the content ratio thereof be 10 mass % or greater, and it is even more preferable that the content ratio thereof be 15 mass % or greater, and it is particularly preferable that the content ratio thereof be 20 mass % or greater. When the content ratio thereof is within the range mentioned above, the light blocking property, the coloration property, or the color adjustment property can be improved. On the other hand, it is preferable that the content ratio of the (D) coloring agent be 70 mass % or less, and it is more preferable that the content ratio thereof be 65 mass % or less, and it is even more preferable that the content ratio thereof be 60 mass % or less, and it is still even more preferable that the content ratio thereof be 55 mass % or less, and it is particularly preferable that the content ratio thereof be 50 mass % or less. When the content ratio thereof is within the range mentioned above, the sensitivity at the time of exposure can be improved.

<(D1) Pigment>

As for the negative-type photosensitive resin composition of the present invention, it is preferable that the (D) coloring agent contain a (D1) pigment. As for a mode in which the (D) coloring agent contains a (D1) pigment, it is preferable that the (D1) pigment be contained as the (Da) black coloring agent and/or the (Db) color agent other than black.

The (D1) pigment refers to a compound that colors an object by the (D1) pigment being physically adsorbed to a surface of the object or by the (D1) pigment and a surface of the object having interaction or the like, and generally is insoluble in solvents and the like. Furthermore, the coloration by the (D1) pigment is high in hiding power and does not easily fade in color due to ultraviolet ray or the like.

By containing the (D1) pigment, coloration to a color that is excellent in hiding power can be achieved, so that the light blocking property and weather resistance of the film of the resin composition can be improved.

It is preferable that the number average particle diameter of the (D1) pigment be 1 to 1,000 nm, and it is more preferable that the number average particle diameter thereof be 5 to 500 nm, and it is even more preferable that the number average particle diameter thereof be 10 to 200 nm. When the number average particle diameter of the (D1) pigment is within the range mentioned above, the light blocking property of the film of the resin composition and the dispersion stability of the (D1) pigment can be improved.

Note that the number average particle diameter of the (D1) pigment can be determined by measuring the laser scattering due to Brownian movement of the (D1) pigment in the solution (dynamic light scattering method) through the use of a submicron particle size distribution measurement apparatus (N4-PLUS, made by Beckman Coulter, Inc.) or a zeta potential/particle diameter/molecular weight measurement apparatus (Zeta Sizer Nano ZS, made by SYSMEX CORPORATION). Furthermore, the number average particle diameter of the (D1) pigment in the cured film obtained from the resin composition can be determined by measurement through the use of SEM and TEM. With the magnification factor set to 50,000 to 200,000 times, the number average particle diameter of the (D1) pigment is directly measured. In the case where the (D1) pigment is a true sphere, the diameter of the true sphere is measured and determined as the number average particle diameter. In the case where the (D1) pigment is not a true sphere, the longest diameter (hereinafter, "major axis diameter") and the longest diameter in directions orthogonal to the major axis diameter (hereinafter, "minor axis diameter") are measured, and a two-axis average diameter obtained by averaging the major axis diameter and the minor axis diameter is determined as the number average particle diameter.

As the (D1) pigment, for example, organic pigments or inorganic pigments can be cited.

By containing an organic pigment, the film of the resin composition can be provided with coloration property or color adjustment property. Moreover, since it is an organic substance, the transmission spectrum or absorption spectrum of the film of the resin composition can be adjusted by achieving transmission or blockage of light of a desired specific wavelength, or the like, through chemical structure change or functional transformation, so that the color adjustment property can be improved.

As the organic pigment, for example, phthalocyanine based pigments, anthraquinone based pigments, quinacridone based pigments, pyranthrone based pigments, dioxazine based pigments, thioindigo based pigments, diketopyrrolopyrrole based pigments, quinophthalone based pigments, threne based pigments, indoline based pigments, isoindoline based pigments, isoindolinone based pigments, benzofuranone based pigments, perylene based pigments, aniline based pigments, azo based pigments, azomethine based pigments, condensed azo based pigments, carbon black, metal complex based pigments, lake pigments, toner pigments, or fluorescence pigments can be cited. From the viewpoint of heat resistance, anthraquinone based pigments, quinacridone based pigments, pyranthrone based pigments, diketopyrrolopyrrole based pigments, benzofuranone based pigments, perylene based pigments, condensed azo based pigments, and carbon black are preferable.

As the phthalocyanine based pigment, for example, copper phthalocyanine based compounds, halogenated copper phthalocyanine based compounds, or metal-free phthalocyanine based compounds can be cited.

As the anthraquinone based pigment, for example, aminoanthraquinone based compounds, diaminoanthraquinone based compounds, anthrapyrimidine based compounds, flavanthrone based compounds, anthanthrone based compounds, indanthrone based compounds, pyranthrone based compounds, or violanthrone based compounds can be cited.

As the azo based pigment, for example, disazo based compounds or polyazo based compounds can be cited.

By containing the inorganic pigment contained, the film of the resin composition can be provided with coloration property or color adjustment property. Moreover, since it is an inorganic substance and excellent in heat resistance and weather resistance, the heat resistance and weather resistance of the film of the resin composition can be improved.

As the inorganic pigment, for example, titanium oxide, barium carbonate, zirconium oxide, zinc white, zinc sulfide, white lead, calcium carbonate, barium sulfate, white carbon, alumina white, silicon dioxide, kaolin clay, talc, bentonite, red oxide, molybdenum red, molybdenum orange, chromium vermilion, lead yellow, cadmium yellow, yellow iron oxide, titanium yellow, chromic oxide, viridian, titanium cobalt green, cobalt green, cobalt chromium green, victoria green, ultramarine, iron blue, cobalt blue, cerulean blue, cobalt silica blue, cobalt zinc silica blue, manganese violet, cobalt violet, graphite, silver tin alloy, or fine particles, oxides, composite oxides, sulfides, sulfate salts, nitrate salts, carbonate salts, nitrides, carbides, or oxynitrides of a metal, such as titanium, copper, iron, manganese, cobalt, chromium, nickel, zinc, calcium, or silver, can be cited.

As for the negative-type photosensitive resin composition of the present invention, it is preferable that the foregoing (D1) pigment contain a (D1a) black pigment or a (D1a) black pigment and a (D1b) pigment other than black which are described later.

It is preferable that the content ratio of the (D1) pigment in the entire solid content of the negative photosensitive resin composition of the present invention excluding the solvent be 5 mass % or greater, and it is more preferable that the content ratio thereof be 10 mass % or greater, and it is even more preferable that the content ratio thereof be 15 mass % or greater, and it is particularly preferable that the content ratio thereof be 20 mass % or greater. When the content ratio thereof is within the range mentioned above, the light blocking property, the coloration property, or the color adjustment property can be improved. On the other hand, it is preferable that the content ratio of the (D1) pigment be 70 mass % or less, and it is more preferable that the content ratio thereof be 65 mass % or less, and it is even more preferable that the content ratio thereof be 60 mass % or less, and it is still even more preferable that the content ratio thereof be 55 mass % or less, and it is particularly preferable that the content ratio thereof be 50 mass % or less. When the content ratio thereof is within the range mentioned above, the sensitivity at the time of exposure can be improved.

<(D1a) Black Pigment and (D2a) Pigment Other than Black>

As for the negative-type photosensitive resin composition of the present invention, it is preferable that the (D1) pigment contain a (D1a) black pigment, or a (D1a) black pigment and a (D1b) pigment other than black.

The (D1a) black pigment refers to a pigment that produces black color by absorbing light of visible ray wavelengths.

By containing the (D1a) black pigment, the film of the resin composition becomes black and the hiding power is excellent, so that the light blocking property of the film of the resin composition can be improved.

As for the negative-type photosensitive resin composition of the present invention, it is preferable that the foregoing (Da) black coloring agent be a (D1a) black pigment and this (D1a) black pigment be one or more species selected from a (D1a-1) black organic pigment, a (D1a-2) black inorganic pigment, and a (D1a-3) mixture of two or more coloring pigments that will be described later.

It is preferable that the content ratio of the (D1a) black pigment in the entire solid content of the negative photosensitive resin composition of the present invention excluding the solvent be 5 mass % or greater, and it is more preferable that the content ratio thereof be 10 mass % or greater, and it is even more preferable that the content ratio thereof be 15 mass % or greater. When the content ratio thereof is within the range mentioned above, the light blocking property can be improved. On the other hand, it is preferable that the content ratio of the (D1a) black pigment be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

The (D1b) pigment other than black refers to a pigment that produce color of violet, blue, green, yellow, orange, red, or white, except black, by absorbing light of visible ray wavelengths.

By containing the (D1b) pigment other than black, the film of the resin composition can be colored and can be provided with coloration property or color adjustment property. By combining two or more colors of (D1b) pigments other than black, the film of the resin composition can be adjusted in color to a desired color coordinate, so that the color adjustment property can be improved.

As the (D1b) pigment other than black, the below described pigments that produce color of white, red, orange, yellow, green, blue, or violet, except black, can be cited.

As for the negative-type photosensitive resin composition of the present invention, it is preferable that the foregoing (D1b) pigment other than black be an (D1b-1) organic pigment other than black and/or an (D1b-2) inorganic pigment other than black that will be described later.

It is preferable that the content ratio of the (D1b) pigment other than black in the entire solid content of the negative photosensitive resin composition of the present invention excluding the solvent be 5 mass % or greater, and it is more preferable that the content ratio thereof be 10 mass % or greater, and it is even more preferable that the content ratio thereof be 15 mass % or greater. When the content ratio thereof is within the range mentioned above, the coloration property or the color adjustment property can be improved. On the other hand, it is preferable that the content ratio of the (D1b) pigment other than black be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

<(D1a-1) Black Organic Pigment, (D1a-2) Black Inorganic Pigment, and (D1a-3) Mixture of Two or More Color Pigments>

As for the negative-type photosensitive resin composition of the present invention, it is preferable that the foregoing (D1a) black pigment be one or more species selected from a (D1a-1) black organic pigment, a (D1a-2) black inorganic pigment, a (D1a-3) mixture of two or more coloring pigments.

The (D1a-1) black organic pigment refers to an organic pigment that produces black color by absorbing light of visible ray wavelengths.

By containing the (D1a-1) black organic pigment, the film of the resin composition becomes black and the hiding power is excellent, so that the light blocking property of the film of the resin composition can be improved. Furthermore, since it is an organic substances, the transmission spectrum or absorption spectrum of the film of the resin composition can be adjusted by achieving transmission or blockage of light of a desired specific wavelength, or the like, through chemical structure change or functional transformation, so that the color adjustment property can be improved.

As the (D1a-1) black organic pigment, for example, anthraquinone based black pigments, benzofuranone based black pigments, perylene based black pigments, aniline based black pigments, azomethine based black pigments, or carbon black can be cited.

As the carbon black, for example, channel black, furnace black, thermal black, acetylene black, and lamp black can be cited. From the viewpoint of light blocking property, channel black is preferable.

It is preferable that the content ratio of the (D1a-1) black organic pigment in the entire solid content of the negative photosensitive resin composition of the present invention excluding the solvent be 5 mass % or greater, and it is more preferable that the content ratio thereof be 10 mass % or greater, and it is even more preferable that the content ratio thereof be 15 mass % or greater. When the content ratio thereof is within the range mentioned above, the light blocking property or the color adjustment property can be improved. On the other hand, it is preferable that the content ratio thereof be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

<Carbon Black Subjected to Surface Treatment>

As the carbon black, a carbon black subjected to a surface treatment is preferable. It is preferable that the surface treatment be a surface treatment that introduces acidic groups, a surface treatment by a silane coupling agent, or a coating treatment by a resin.

By performing the surface treatment that introduces acidic groups or the surface treatment by a silane coupling agent, the surface state of particles can be reformed, for example, acidification, hydrophilization, hydrophobization of surfaces of carbon black particles, etc. can be performed, so that the dispersion stability by a (E) dispersing agent described later and a resin contained in the resin composition can be improved.

An acidic group introduced into carbon black by the surface treatment that introduces acidic groups is a substituent that exhibits acidity in the Bronsted's definition. As concrete examples of the acidic group, a carboxy group, a sulfonic group, or a phosphate group can be cited.

The acidic group that is introduced into the carbon black may form a salt. As a cation that, together with an acidic group, forms a salt, various metal ions, nitrogen compound-containing cations, arylammonium ions, alkylammonium ions, or an ammonium ion can be cited. From the viewpoint of insulation property of the cured film, arylammonium ions, alkylammonium ions, or an ammonium ion are preferable.

As a method for the surface treatment that introduces acidic groups into the carbon black, for example, methods (1) to (5) as follows can be cited.

(1) A method in which sulfonic groups are introduced into the carbon black by a direct substitution method that uses concentrated sulfuric acid, fuming sulfuric acid, or chlorosulfonic acid or an indirect substitution method that uses a sulfite salt or a bisulfite salt.

(2) A method in which carbon black and an organic compound that has an amino group and an acidic group are diazo coupled.
(3) A method in which an organic compound having a halogen atom and an acidic group and a carbon black having a hydroxy group are reacted by the Williamson etherification method.
(4) A method in which an organic compound having a carbonyl halide group and an acidic group protected by a protecting group and a carbon black having a hydroxy group are reacted.
(5) A method in which a an organic compound having a carbonyl halide group and an acidic group protected by a protecting group and a carbon black are caused to undergo the Friedel-Crafts react and then the acidic group is deprotected.

From the viewpoint that the process of introducing an acidic group is easy and safe, the method of (2) is preferable. As the organic compound having an amino group and an acidic group which is used in the method of (2), for example, an organic compound in which an amino group and an acidic group are bonded to an aromatic group is preferable. As the organic compound in which an amino group and an acidic group are bonded to an aromatic group, known compounds, such as 4-aminobenzenesulfonic acid or 4-aminobenzoic acid, can be used.

It is preferable that the mole number of acidic groups introduced into the carbon black be 1 mmol or greater with respect to 100 g of the carbon black, and it is more preferable that the mole number thereof be 5 mmol or greater. When the mole number is within the range mentioned above, the dispersion stability of the carbon black can be improved. On the other hand, it is preferable that the mole number thereof be 200 mmol or less, and it is more preferable that the mole number thereof be 150 mmol or less. When the mole number thereof is within the range mentioned above, the dispersion stability of carbon black can be improved.

As the substituent introduced into carbon black by a surface treatment with a silane coupling agent that reforms the surface state of particles of the carbon black (hereinafter, "surface treatment organosilane"), for example, acidic groups, basic groups, hydrophilicity groups, or hydrophobicity groups can be cited. As the acidic groups, the basic group, the hydrophilicity group, or the hydrophobicity group, for example, alkylsilyl groups, arylsilyl groups, or alkylsilyl groups or arylsilyl groups having a hydroxy group, a carboxy group, or an amino group can be cited.

As the method for performing a surface treatment with a surface treatment organosilane, for example, a method in which a mixing process of a surface treatment organosilane and carbon black is cited. Furthermore, a reaction solvent, water, or a catalyst may be added as needed.

As the reaction solvent for use in the surface treatment with a surface treatment organosilane, for example, solvents similar to ones described later can be cited. It is preferable that the amount of the reaction solvent added be 10 to 1,000 mass parts in the case where the total amount of carbon black and the surface treatment organosilane is assumed to be 100 mass parts. It is preferable that the amount of water added be 0.5 to 2 mol with respect to 1 mol of hydrolyzable groups.

As the catalyst for use in the surface treatment with a surface treatment organosilane, acid catalysts or base catalysts are preferable. As the acid catalysts, for example, hydrochloric acid, nitric acid, sulfuric acid, hydrofluoric acid, phosphoric acid, acetic acid, trifluoroacetic acid, formic acid, polyvalent carboxylic acid, anhydrides thereof, or ion exchange resins thereof can be cited. As the base catalysts, for example, triethylamine, tri-n-propylamine, tri-n-butylamine, tri-n-pentylamine, tri-n-hexylamine, tri-n-heptylamine, tri-n-octylamine, diethylamine, triethanol amine, diethanol amine, sodium hydroxide, potassium hydroxide, or alkoxysilanes or ion exchange resins having amino groups can be cited. It is preferable that the amount of the catalyst added be 0.01 to 10 mass parts in the case where the amount of the carbon black and the surface treatment organosilane is assumed to be 100 mass parts.

It is preferable that the temperature of the surface treatment with a surface treatment organosilane be 20 to 250° C., and it is preferable that the temperature thereof be 40 to 200° C., and it is even more preferable that the temperature thereof be 60 to 180° C.

As the surface treatment organosilane, known ones, for example, methyltrimethoxysilane, methyltriethoxysilane, methyltrin-butoxysilane, methyltrichlorosilane, methyltriacetoxysilane, ethyltrimethoxysilane, n-propyltrimethoxysilane, n-hexyltrimethoxysilane, n-decyltrimethoxysilane, phenyltrimethoxysilane, 4-hydroxyphenyltrimethoxysilane, 3-aminopropyltrimethoxysilane, 4-aminophenyltrimethoxysilane, 3-trimethoxysilylpropylsuccinic anhydride, etc., can be used.

It is preferable that the content of the surface treatment organosilane be 0.01 mass part or greater in the case where the total amount of the carbon black and the surface treatment organosilane is assumed to be 100 mass parts, and it is more preferable that the content thereof be 0.05 mass part or greater. When the content thereof is within the range mentioned above, the dispersion stability of the carbon black can be improved. On the other hand, it is preferable that the content of the surface treatment organosilane be 20 mass parts or less, and it is more preferable that the content thereof be 15 mass parts or less. When the content thereof is within the range mentioned above, the dispersion stability of the carbon black can be improved.

As the carbon black, a carbon black subjected to a coating treatment with a resin is also preferable. By performing a coating treatment with a resin that coats the carbon black (hereinafter, "coating resin"), the surfaces of particles of carbon black are coated by an electrically insulative coating resin that is low in electroconductivity, so that the surface state of particles can be reformed and the light blocking property and insulation property of the cured film can be improved. Furthermore, due to reduction of leak electric current or the like, the reliability of displays or the like can be improved. Therefore, the carbon black subjected to a coating treatment with a resin is suitable for the cases where the cured film is put to uses that require insulation property, or the like.

As the coating resin, polyamide, polyamide-imide, epoxy resin, novolac resin, phenol resin, urea resin, melamine resin, polyurethane, diallyl phthalate resin, alkyl benzene resin, polystyrene, polycarbonate, polybutylene terephthalate, or denaturation polyphenylene oxide can be cited.

It is preferable that the content of the coating resin be 0.1 mass part or greater in the case where the total amount of the carbon black and the coating resin is assumed to be 100 mass parts, and it is more preferable that the content thereof be 0.5 mass part or greater. When the content thereof is within the range mentioned above, the light blocking property and insulation property of the cured film can be improved. On the other hand, it is preferable that the content of the coating resin be 40 mass parts or less, and it is more preferable that the content ratio thereof be 30 mass parts or less. When the content thereof is within the range mentioned above, the light blocking property and insulation property of the cured film can be improved.

It is preferable that the content ratio of the surface-treated carbon black in the entire solid content of the negative photosensitive resin composition of the present invention excluding the solvent be 5 mass % or greater, and it is more preferable that the content ratio thereof be 10 mass % or greater, and it is even more preferable that the content ratio thereof be 15 mass % or greater. When the content ratio thereof is within the range mentioned above, the light blocking property or the color adjustment property can be improved. On the other hand, it is preferable that the content ratio thereof be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

The (D1a-2) black inorganic pigment refers to an inorganic pigment that produces black color by absorbing light of visible ray wavelengths.

By containing the (D1a-2) black inorganic pigment, the film of the resin composition becomes black and is excellent in hiding power, so that the light blocking property of the film of the resin composition can be improved. Furthermore, since it is an inorganic substance and more excellent in heat resistance and weather resistance, the heat resistance and weather resistance of the film of the resin composition can be improved.

As the (D1a-2) black inorganic pigment, for example, graphite, silver tin alloy, fine particles, oxides, composite oxides, sulfides, sulfate salts, nitrate salts, carbonate salts, nitrides, carbides, or oxynitrides of a metal, such as titanium, copper, iron, manganese, cobalt, chromium, nickel, zinc, calcium, or silver, can be cited. From the viewpoint of improvement of the light blocking property, it is preferable that the (D1a-2) black inorganic pigment be fine particles of titanium or silver, oxides, composite oxides, sulfides, nitrides, carbides, or oxynitrides, and it is more preferable that the (D1a-2) black inorganic pigment be nitrides or oxynitrides of titanium.

As the black organic pigment or the black inorganic pigment, for example, Pigment Black 1, 6, 7, 12, 20, 31, or 32 can be cited. (The numerical values are each a color index (hereinafter, "CI" number.)

It is preferable that the content ratio of the (D1a-2) black inorganic pigment in the entire solid content of the negative photosensitive resin composition of the present invention excluding the solvent be 5 mass % or greater, and it is more preferable that the content ratio thereof be 10 mass % or greater, and it is even more preferable that the content ratio thereof be 15 mass % or greater. When the content ratio thereof is within the range mentioned above, the light blocking property, the heat resistance, and the weather resistance can be improved. On the other hand, it is preferable that the content ratio of the (D1a-2) black inorganic pigment be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

The (D1a-3) mixture of two or more color pigments refers to a pigment mixture that produces black color in a pseudo manner due to combination of two or more color pigments selected from white, red, orange, yellow, green, blue, and violet pigments.

By containing the (D1a-3) mixture of two or more color pigments, the film of the resin composition becomes black and is excellent in hiding power, so that the light blocking property of the film of the resin composition can be improved. Furthermore, since two or more color pigments are mixed, the transmission spectrum or absorption spectrum of the film of the resin composition can be adjusted by achieving transmission or blockage of light of a desired specific wavelength, or the like, so that the color adjustment property can be improved.

As the pigment that produces red color, for example, Pigment Red 9, 48, 97, 122, 123, 144, 149, 166, 168, 177, 179, 180, 192, 209, 215, 216, 217, 220, 223, 224, 226, 227, 228, 240, or 250 can be cited (the numerical values are each a CI number).

As the pigment that produces orange color, for example, Pigment Orange 12, 36, 38, 43, 51, 55, 59, 61, 64, 65, or 71 can be cited (the numerical values are each a CI number).

As the pigment that produces yellow color, for example, Pigment Yellow 12, 13, 17, 20, 24, 83, 86, 93, 95, 109, 110, 117, 125, 129, 137, 138, 139, 147, 148, 150, 153, 154, 166, 168, or 185 can be cited (the numerical values are each a CI number).

As the pigment that produces green color, for example, Pigment Green 7, 10, 36, or 58 can be cited (the numerical values are each a CI number).

As the pigment that produces blue color, for example, Pigment Blue 15, 15:3, 15:4, 15:6, 22, 60, or 64 can be cited (the numerical values are each a CI number).

As the pigment that creates violet color, for example, Pigment Violet 19, 23, 29, 30, 32, 37, 40, or 50 can be cited (the numerical values are each a CI number).

As the pigment that produces white color, for example, titanium oxide, barium carbonate, zirconium oxide, zinc white, zinc sulfide, white lead, calcium carbonate, barium sulfate, white carbon, alumina white, silicon dioxide, kaolin clay, talc, or bentonite can be cited.

It is preferable that the content ratio of the (D1a-3) mixture of two or more color pigments in the entire solid content of the negative photosensitive resin composition of the present invention excluding the solvent be 5 mass % or greater, and it is more preferable that the content ratio thereof be 10 mass % or greater, and it is even more preferable that the content ratio thereof be 15 mass % or greater. When the content ratio thereof is within the range mentioned above, the light blocking property or the color adjustment property can be improved. On the other hand, it is preferable that the content ratio thereof be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

<(D1b-1) Organic Pigment Other than Black and (D1b-2) Inorganic Pigment Other than Black>

As for the negative-type photosensitive resin composition of the present invention, it is preferable that the (D1b) pigment other than black be an (D1b-1) organic pigment other than black and/or an (D1b-2) inorganic pigment other than black.

The (D1b-1) organic pigment other than black refers to an organic pigment that produces color of white, red, orange, yellow, green, blue, or violet, except black, by absorbing light of visible ray wavelengths.

By containing the (D1b-1) organic pigment other than black, the film of the resin composition can be colored and can be provided with coloration property or color adjustment property. Furthermore, since it is an organic substance, the transmission spectrum or absorption spectrum of the film of the resin composition can be adjusted by achieving transmission or blockage of light of a desired specific wavelength, or the like, through chemical structure change or functional transformation, so that the color adjustment property can be improved. By combining two or more colors of (D1b-1) organic pigments other than black, the film of the resin composition can be adjusted in color to a desired color coordinate, so that the color adjustment property can be improved.

As the (D1b-1) organic pigment other than black, organic pigments that produce color of white, red, orange, yellow, green, blue, or violet, except black, can be cited.

As the (D1b-1) organic pigment other than black, for example, phthalocyanine based pigments, anthraquinone based pigments, quinacridone based pigments, pyranthrone based pigments, dioxazine based pigments, thioindigo based pigments, diketopyrrolopyrrole based pigments, quinophthalone based pigments, threne based pigments, indoline based pigments, isoindoline based pigments, isoindolinone based pigments, benzofuranone based pigments, perylene based pigments, aniline based pigments, azo based pigments, azomethine based pigments, metal complex based pigments, lake pigments, toner pigments, or fluorescence pigments can be cited.

It is preferable that the content ratio of the (D1b-1) organic pigment other than black in the entire solid content of the negative photosensitive resin composition of the present invention, excluding the solvent, be 5 mass % or greater, and it is more preferable that the content ratio thereof be 10 mass % or greater, and it is even more preferable that the content ratio thereof be 15 mass % or greater. When the content ratio thereof is within the range mentioned above, the coloration property or the color adjustment property can be improved. On the other hand, it is preferable that the content ratio thereof be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

The (D1b-2) inorganic pigment other than black refers to an inorganic pigment that produces color of white, red, orange, yellow, green, blue, or violet, except black, by absorbing light of visible ray wavelengths.

By containing the (D1b-2) inorganic pigment other than black, the film of the resin composition can be colored and can be provided with coloration property or color adjustment property. Furthermore, since it is an inorganic substance and more excellent in heat resistance and weather resistance, the heat resistance and weather resistance of the film of the resin composition can be improved. By combing of two or more colors of (D1b-2) inorganic pigments other than black, the film of the resin composition can be adjusted in color to a desired color coordinate, so that the color adjustment property can be improved.

By combining two or more colors of (D1b-2) inorganic pigments other than black, the film of the resin composition can be adjusted in color to a desired color coordinate, so that the color adjustment property can be improved.

As the (D1b-2) inorganic pigment other than black, inorganic pigments that produce color of white, red, orange, yellow, green, blue, or violet, except black, can be cited.

As the (D1b-2) inorganic pigment other than black, for example, titanium oxide, barium carbonate, zirconium oxide, zinc white, zinc sulfide, white lead, calcium carbonate, barium sulfate, white carbon, alumina white, silicon dioxide kaolin clay, talc, bentonite, red oxide, molybdenum red, molybdenum orange, chromium vermilion, lead yellow, cadmium yellow, yellow iron oxide, titanium yellow, chromic oxide, viridian, titanium cobalt green, cobalt green, cobalt chromium green, victoria green, ultramarine, iron blue, cobalt blue, cerulean blue, cobalt silica blue, cobalt zinc silica blue, manganese violet, or cobalt violet can be cited.

It is preferable that the content ratio of the (D1b-2) inorganic pigment other than black in the entire solid content of the negative photosensitive resin composition of the present invention, excluding the solvent, be 5 mass % or greater, and it is more preferable that the content ratio thereof be 10 mass % or greater, and it is even more preferable that the content ratio thereof be 15 mass % or greater. When the content ratio thereof is within the range mentioned above, the coloration property or color adjustment property, the heat resistance, and the weather resistance can be improved. On the other hand, it is preferable that the content ratio of the (D1b-2) inorganic pigment other than black be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

<(D1a-1a) Benzofuranone Based Black Pigment and (D1a-1b) Perylene Based Black Pigment>

As for the negative-type photosensitive resin composition of the present invention, it is preferable that the (D1a-1) black organic pigment be a (D1a-1a) benzofuranone based black pigment and/or a (D1a-1b) perylene based black pigment.

The (D1a-1a) benzofuranone based black pigment refers to a compound that has in its molecule a benzofuran-2(3H)-one structure or a benzofuran-3 (2H)-one structure and that produces black color by absorbing light of visible ray wavelengths.

By containing the (D1a-1a) benzofuranone based black pigment, the film of the resin composition becomes black and is excellent in hiding power, so that the light blocking property of the film of the resin composition can be improved. Furthermore, since it is an organic substance, the transmission spectrum or absorption spectrum of the film of the resin composition can be adjusted by achieving transmission or blockage of light of a desired specific wavelength, or the like, through chemical structure change or functional transformation, so that the color adjustment property can be improved. Particularly, because the transmittance at a wavelength in a near-infrared area (e.g., 700 nm or greater) can be improved, the film of the resin composition containing the (D1a-1a) benzofuranone based black pigment has light blocking property and is suitable for uses in which light of a wavelength in a near-infrared area is utilized.

As the (D1a-1a) benzofuranone based black pigment, benzofuranone compounds represented by any one of general formulas (63) to (68) are preferable.

[CHEM. 24]

(63)

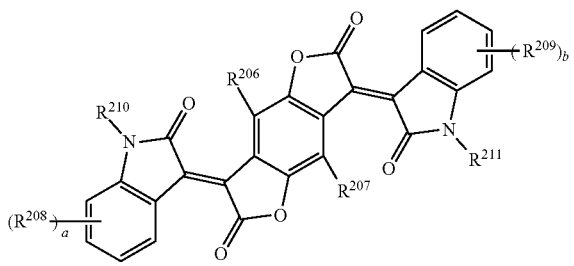

(64)

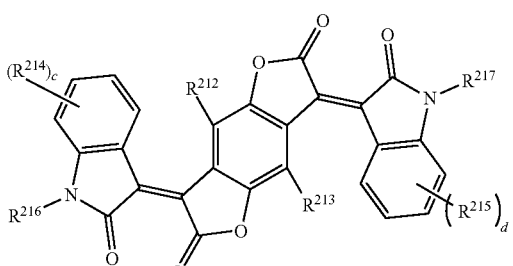

(65)

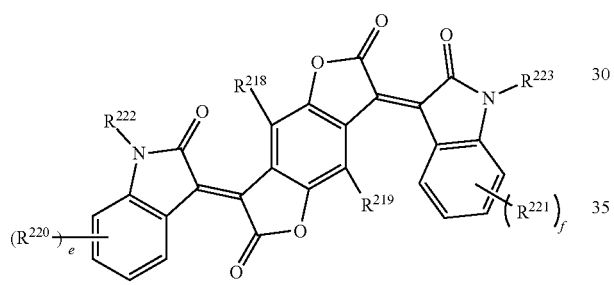

In general formulas (63) to (65), $R^{206}$, $R^{207}$, $R^{212}$, $R^{213}$, $R^{218}$, and $R^{219}$ each independently represent an alkyl group having a carbon number of 1 to 10 which has 1 to 20 hydrogens, halogen atoms, alkyl groups having a carbon number of 1 to 10, or fluorine atoms. $R^{208}$, $R^{209}$, $R^{214}$, $R^{215}$, $R^{220}$, and $R^{221}$ each independently represent hydrogen, a halogen atom, $R^{251}$, COOH, COOR$^{251}$, COO$^-$, CONH$_2$, CONHR$^{251}$, CONR$^{251}$R$^{252}$, CN, OH, OR$^{251}$, OCOR$^{251}$, OCONH$_2$, OCONHR$^{251}$, OCONR$^{251}$R$^{252}$, NO$_2$, NH$_2$, NHR$^{251}$, NR$^{251}$R$^{252}$, NHCOR$^{251}$, NR$^{251}$COR$^{252}$, N=CH$_2$, N=CHR$^{251}$, N=CR$^{251}$R$^{252}$, SH, SR$^{251}$, SOR$^{251}$, SO$_2$R$^{251}$, SO$_3$R$^{251}$, SO$_3$H, SO$_3^-$, SO$_2$NH$_2$, SO$_2$NHR$^{251}$ or SO$_2$NR$^{251}$R$^{252}$, and $R^{251}$ and $R^{252}$ each independently represent an alkyl group having a carbon number of 1 to 10, a cycloalkyl group having a carbon number of 4 to 10, an alkenyl group having a carbon number of 2 to 10, a cycloalkenyl group having a carbon number of 4 to 10, or an alkynyl group having a carbon number of 2 to 10. A plurality of $R^{208}$, $R^{209}$, $R^{214}$, $R^{215}$, $R^{220}$ or $R^{221}$ may form a ring by a direct bond, an oxygen atom bridge, a sulfur atom bridge, an NH bridge, or an NR$^{251}$ bridge. $R^{210}$, $R^{211}$, $R^{216}$, $R^{217}$, $R^{222}$, and $R^{223}$ each independently represent hydrogen, an alkyl group having a carbon number of 1 to 10, or an aryl group having a carbon number of 6 to 15. a, b, c, d, e, and f each independently represent an integer of 0 to 4. In general formulas (63) to (65), it is preferable that $R^{206}$, $R^{207}$, $R^{212}$, $R^{213}$, $R^{218}$, and $R^{219}$ each independently be an alkyl group having a carbon number of 1 to 6 which has 1 to 12 hydrogens, halogen atoms, alkyl groups having a carbon number of 1 to 6, or fluorine atoms. Furthermore, it is preferable that $R^{251}$ and $R^{252}$ each independently be an alkyl group having a carbon number of 1 to 6, a cycloalkyl group having a carbon number of 4 to 7, an alkenyl group having a carbon number of 2 to 6, a cycloalkenyl group having a carbon number of 4 to 7, or an alkynyl group having a carbon number of 2 to 6. Furthermore, it is preferable that $R^{210}$, $R^{211}$, $R^{216}$, $R^{217}$, $R^{222}$, and $R^{223}$ each independently be hydrogen, an alkyl group having a carbon number of 1 to 6, or an aryl group having a carbon number of 6 to 10. The alkyl group, the cycloalkyl group, the alkenyl group, the cycloalkenyl group, the alkynyl group, and the aryl group that are mentioned above may have a heteroatom and may be either an unsubstituted product or a substitution product.

[CHEM. 25]

(66)

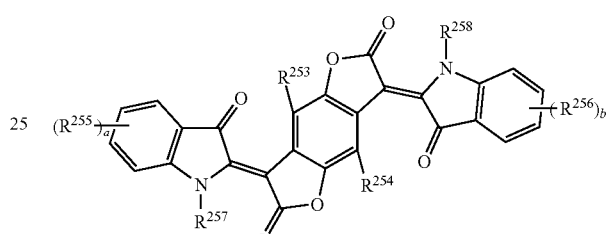

(67)

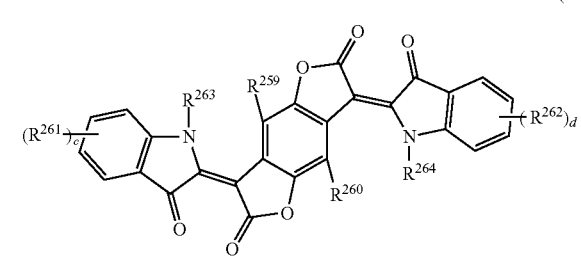

(68)

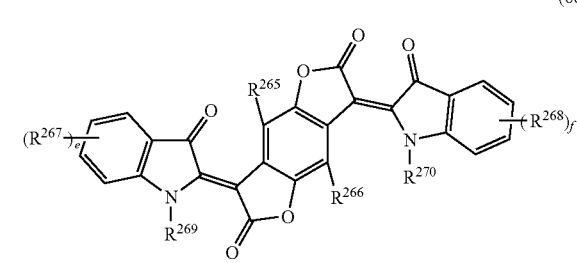

In general formulas (66) to (68), $R^{253}$, $R^{254}$, $R^{259}$, $R^{260}$, $R^{265}$, and $R^{266}$ each independently represent hydrogen, a halogen atom, an alkyl group having a carbon number of 1 to 10, or an alkyl group having a carbon number of 1 to 10 which has 1 to 20 fluorine atoms. $R^{255}$, $R^{256}$, $R^{261}$, $R^{262}$, $R^{267}$, and $R^{268}$ each independently represent hydrogen, halogen atom, $R^{271}$, COOH, COOR$^{271}$, COO$^-$, CONH$_2$, CONHR$^{271}$, CONR$^{271}$R$^{272}$, N, OH, OR$^{271}$, OCOR$^{271}$, OCONH$_2$, OCONHR$^{271}$, OCONR$^{271}$R$^{272}$, NO$_2$, NH$_2$, NHR$^{271}$, NR$^{271}$R$^{272}$, NHCOR$^{271}$, NR$^{271}$COR$^{272}$, N=CH$_2$, N=CHR$^{271}$, N=CR$^{271}$R$^{272}$, SH, SR$^{271}$, SOR$^{271}$, SO$_2$R$^{271}$, SO$_3$R$^{271}$, SO$_3$H, SO$_3^-$, SO$_2$NH$_2$, SO$_2$NHR$^{271}$ or SO$_2$NR$^{271}$R$^{272}$. $R^{271}$ and $R^{272}$ each independently represent an alkyl group having a carbon number of 1 to 10, a cycloalkyl group having a carbon number of 4 to 10, an alkenyl group having a carbon number of 2 to 10, a cycloalkenyl group having a carbon number of 4 to 10, or an alkynyl group having a carbon number of 2 to 10. A plurality of $R^{255}$, $R^{256}$, $R^{261}$, $R^{262}$, $R^{267}$ or $R^{268}$ may form a ring by a direct bond, an oxygen atom bridge, a sulfur atom bridge, an NH bridge, or an $NR^{271}$ bridge. $R^{257}$, $R^{258}$, $R^{263}$, $R^{264}$, $R^{269}$, and $R^{270}$ each independently represent hydrogen, an alkyl group having a carbon number of 1 to 10, or an aryl group having a carbon number of 6 to 15. a, b, c, d, e, and f each independently represent an integer of 0 to 4. In general formulas (66) to (68), it is preferable that $R^{253}$, $R^{254}$, $R^{259}$, $R^{260}$, $R^{265}$, and $R^{266}$ each independently be hydrogen, a halogen atom, an alkyl group having a carbon number of 1 to 6, or an alkyl group having a carbon number of 1 to 6 which has 1 to 12 fluorine atoms. Furthermore, it is preferable that $R^{271}$ and $R^{272}$ each independently be an alkyl group having a carbon number of 1 to 6, a cycloalkyl group having a carbon number of 4 to 7, an alkenyl group having a carbon number of 2 to 6, a cycloalkenyl group having a carbon number of 4 to 7, or an alkynyl group having a carbon number of 2 to 6. Furthermore, it is preferable that $R^{257}$, $R^{258}$, $R^{263}$, $R^{264}$, $R^{269}$, and $R^{270}$ each independently be hydrogen, an alkyl group having a carbon number of 1 to 6, or an aryl group having a carbon number of 6 to 10. The alkyl group, the cycloalkyl group, the alkenyl group, the cycloalkenyl group, the alkynyl group, and the aryl group which are mentioned above may have a heteroatom and may be either an unsubstituted product or a substitution product.

As the (D1a-1a) benzofuranone based black pigment, for example, "IRGAPHOR" (registered trademark) BLACK S0100CF (made by BASF), a black pigment mentioned in International Publication WO 2010-081624, or a black pigment mentioned in International Publication WO 2010-081756 can be cited.

It is preferable that the content ratio of the (D1a-1a) benzofuranone based black pigment in the entire solid content of the negative photosensitive resin composition of the present invention, excluding the solvent, be 5 mass % or greater, and it is more preferable that the content ratio thereof be 10 mass % or greater, and it is even more preferable that the content ratio thereof be 15 mass % or greater. When the content ratio thereof is within the range mentioned above, the light blocking property and the color adjustment property can be improved. On the other hand, it is preferable that the content ratio of the (D1a-1a) benzofuranone based black pigment be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

The (D1a-1b) perylene based black pigment refers to a compound that has in its molecule a perylene structure and that produces black color by absorbing light of visible ray wavelengths.

By containing the (D1a-1b) perylene based black pigment, the film of the resin composition becomes black and is excellent in hiding power, so that the light blocking property of the film of the resin composition can be improved. Furthermore, since it is an organic substance, the transmission spectrum or absorption spectrum of the film of the resin composition can be adjusted by achieving transmission or blockage of light of a desired specific wavelength, or the like, through chemical structure change or functional transformation, so that the color adjustment property can be improved. Particularly, the transmittance at a wavelength in a near-infrared area (e.g., 700 nm or greater) can be improved, the film of the resin composition containing the (D1a-1b) perylene based black pigment has light blocking property and is suitable for uses in which light of a wavelength in a near-infrared area is utilized.

As the (D1a-1b) perylene based black pigment, perylene compounds represented by any one of general formulas (69) to (71) are preferable.

[CHEM. 26]

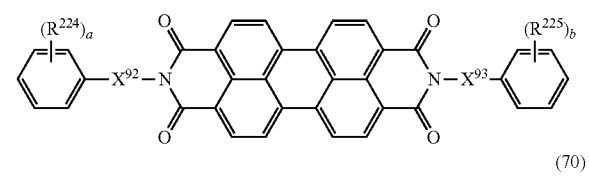

(69)

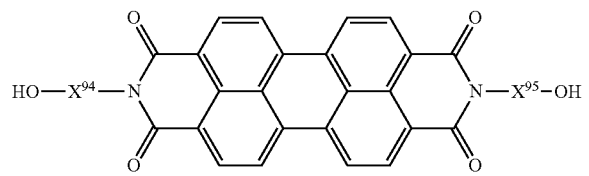

(70)

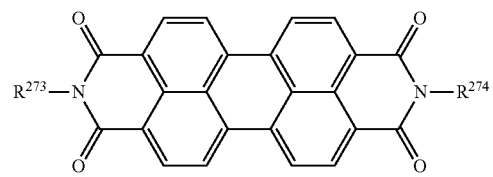

(71)

In general formulas (69) to (71), $X^{92}$, $X^{93}$, $X^{94}$, and $X^{95}$ each independently represent an alkylene chain having a carbon number of 1 to 10. $R^{224}$ and $R^{225}$ each independently represent hydrogen, a hydroxy group, an alkoxy group having a carbon number of 1 to 6, or an acyl group having a carbon number of 2 to 6. $R^{273}$ and $R^{274}$ each independently represent hydrogen or an alkyl group having a carbon number of 1 to 10. a and b each independently represent an integer of 0 to 5. In general formulas (69) to (71), it is preferable that $X^{92}$, $X^{93}$, $X^{94}$, and $X^{95}$ each independently be an alkylene chain having a carbon number of 1 to 6. Furthermore, it is preferable that $R^{224}$ and $R^{225}$ each independently be hydrogen, a hydroxy group, an alkoxy group having a carbon number of 1 to 4, or an acyl group having a carbon number of 2 to 4. It is preferable that $R^{273}$ and $R^{274}$ each independently be hydrogen or an alkyl group having a carbon number of 1 to 6. The alkylene chain, the alkoxy group, the acyl group, and the alkyl group which are mentioned above may have a heteroatom and may be either an unsubstituted product or a substitution product.

As the (D1a-1b) perylene based black pigment, for example, Pigment Black 21, 30, 31, 32, 33, or 34 can be cited (the numerical values are each a CI number).

Besides what have been mentioned above, "PALIOGEN" (registered trademark) BLACK S0084, K0084 of the same, L0086 of the same, K0086 of the same, EH0788 of the same, or FK4281 of the same (which are all made by BASF) can be cited.

It is preferable that the content ratio of the (D1a-1b) perylene based black pigment in the entire solid content of the negative photosensitive resin composition of the present invention, excluding the solvent, be 5 mass % or greater, and it is more preferable that the content ratio thereof be 10 mass % or greater, and it is even more preferable that the content ratio thereof be 15 mass % or greater. When the content ratio thereof is within the range mentioned above, the light blocking property and the color adjustment property can be improved. On the other hand, it is preferable that the content ratio of the (D1a-1b) perylene based black pigment be 70 mass % or less, and it is more preferable that the content ratio thereof be 65 mass % or less, and it is even more preferable that the content ratio thereof be 60 mass % or less. When the content ratio thereof is within the range mentioned above, the sensitivity at the time of exposure can be improved.

<(D2) Dye>

As for the negative-type photosensitive resin composition of the present invention, it is preferable that the foregoing (D) coloring agent contain a (D2) dye. As a mode in which the (D) coloring agent contains a (D2) dye, it is preferable that the (D2) dye be contained as the (Da) black coloring agent and/or the (Db) color agent other than black.

The (D2) dye refers to a compound that colors an object as a substituent, such as an ionic group or a hydroxy group, in the (D2) dye undergoes chemical adsorption, strong interaction, or the like with respect to a surface structure of the object, and, generally, is soluble to solvents. Furthermore, because, in the coloration by the (D2) dye, individual molecules thereof are adsorbed to an object, the power of coloration is high and the color development efficiency is high.

By containing the (D2) dye, coloration to a color that is excellent in coloration power can be achieved, so that the coloration property or color adjustment property of the film of the resin composition can be improved.

As the (D2) dye, for example, direct dyes, reactivity dyes, sulfur dyes, vat dyes, acidic dyes, metal-containing dyes, metal-containing acidic dyes, basic dyes, mordant dyes, acidic mordant dye, disperse dyes, cation dyes, or fluorescence whitening dyes can be cited.

As the (D2) dye, anthraquinone based dyes, azo based dyes, azine based dyes, phthalocyanine based dyes, methine based dyes, oxazine based dyes, quinoline based dyes, indigo based dyes, indigoid based dyes, carbonium based dyes, threne based dyes, perinone based dyes, perylene based dyes, triaryl methane based dyes, or xanthene based dyes can be cited. It is preferable, from the viewpoint of the solubility with respect to the solvent described later and the heat resistance, that the (D2) dye be an anthraquinone based dye, an azo based dye, an azine based dye, a methine based dye, a triaryl methane based dye, or a xanthene based dye.

By containing the (D2) dye, the film of the resin composition can be provided with coloration property or color adjustment property.

As for the negative-type photosensitive resin composition of the present invention, it is preferable that the (D2) dye contain a (D2a-1) black dye, a (D2a-2) mixture of two or more color dyes, and a (D2b) dye other than black which will be described later.

It is preferable that the content ratio of the (D2) dye in the entire solid content of the negative photosensitive resin composition of the present invention, excluding the solvent, be 0.01 mass % or greater, and it is more preferable that the content ratio thereof be 0.05 mass % or greater, and it is even more preferable that the content ratio thereof be 0.1 mass % or greater. When the content ratio is within the range mentioned above, the coloration property or the color adjustment property can be improved. On the other hand, it is preferable that the content ratio of the (D2) dye be 50 mass % or less, and it is more preferable that the content ratio thereof be 45 mass % or less, and it is even more preferable that the content ratio thereof be 40 mass % or less. When the content ratio is within the range mentioned above, the heat resistance of the cured film can be improved.

<(D2a-1) Black Dye, (D2a-2) Mixture of Two or More Color Dyes, and (D2b) Dye Other than Black>

As for the negative-type photosensitive resin composition of the present invention, it is preferable that the (D2) dye contain a (D2a-1) black dye, a (D2a-2) mixture of two or more color dyes, and a (D2b) dye other than black.

The (D2a-1) black dye refers to a dye that produces black color by absorbing light of visible ray wavelengths.

By containing the (D2a-1) black dye, the film of the resin composition becomes black and is excellent in coloration property, so that the light blocking property of the film of the resin composition can be improved.

As the (D2a-1) black dye, for example, Solvent Black 3, 5, 7, 22, 27, 29, or 34, Mordant Black 1, 11, or 17, Acid Black 2 or 52, or Direct Black 19 or 154 can be cited (the numerical values are each a CI number).

Besides what are mentioned above, "NUBIAN" (registered trademark) BLACK TH-807, TH-827 of the same, TH-827K of the same, TN-870 of the same, PC-0855 of the same, PC-5856 of the same, PC-5857 of the same, PC-5877 of the same, PC-8550 of the same, TN-873 of the same, TN-877 of the same, or AH-807 of the same, OIL BLACK HBB or 860 of the same, "VALIFAST" (registered trademark) BLACK 1807, 3904 of the same, 3810 of the same, 3820 of the same, 3830 of the same, 3840 of the same, 3866 of the same, or 3870 of the same, WATER BLACK 100-L, 191-L of the same, 256-L of the same, R-510 of the same, or 187-LM of the same (which are made by all ORIENT CHEMICAL INDUSTRIES CO., LTD.) can be cited.

It is preferable that the content ratio of the (D2a-1) black dye in the entire solid content of the negative photosensitive resin composition of the present invention, excluding the solvent, be 0.01 mass % or greater, and it is more preferable that the content ratio thereof be 0.05 mass % or greater, and it is even more preferable that the content ratio thereof be 0.1 mass % or greater. When the content ratio is within the range mentioned above, the light blocking property can be improved. On the other hand, it is preferable that the content ratio of the (D2a-1) black dye be 50 mass % or less, and it is more preferable that the content ratio thereof be 45 mass % or less, and it is even more preferable that the content ratio thereof be 40 mass % or less. When the content ratio is within the range mentioned above, the sensitivity at the time of exposure can be improved.

The (D2a-2) mixture of two or more color dyes refers to a dye mixture that produces black color in a pseudo manner by combining two or more color dyes selected from dyes of white, red, orange, yellow, green, blue, or violet.

By containing the (D2a-2) mixture of two or more color dyes, the film of the resin composition becomes black and is excellent in coloration property, so that the light blocking property of the film of the resin composition can be improved. Furthermore, since two or more color dyes are mixed, the transmission spectrum or absorption spectrum of the film of the resin composition can be adjusted by achieving transmission or blockage of light of a desired specific wavelength, or the like, so that the color adjustment property can be improved.

As the dye that produce red color, for example, Direct Red 2, 4, 9, 23, 26, 28, 31, 39, 62, 63, 72, 75, 76, 79, 80, 81, 83, 84, 89, 92, 95, 111, 173, 184, 207, 211, 212, 214, 218, 221, 223, 224, 225, 226, 227, 232, 233, 240, 241, 242, 243, or 247, Acid Red 35, 42, 51, 52, 57, 62, 80, 82, 111, 114, 118, 119, 127, 128, 131, 143, 145, 151, 154, 157, 158, 211, 249, 254, 257, 261, 263, 266, 289, 299, 301, 305, 319, 336, 337, 361, 396, or 397, Reactive Red 3, 13, 17, 19, 21, 22, 23, 24, 29, 35, 37, 40, 41, 43, 45, 49, or 55, or Basic Red 12, 13, 14, 15, 18, 22, 23, 24, 25, 27, 29, 35, 36, 38, 39, 45, or 46 can be cited (the numerical values are each a CI number).

As the dye that produces orange color, for example, Basic Orange 21 or 23 can be cited (the numerical values are each a CI number).

As the dye that produces yellow color, for example, Direct Yellow 8, 9, 11, 12, 27, 28, 29, 33, 35, 39, 41, 44, 50, 53, 58, 59, 68, 87, 93, 95, 96, 98, 100, 106, 108, 109, 110, 130, 142, 144, 161, or 163, Acid Yellow 17, 19, 23, 25, 39, 40, 42, 44, 49, 50, 61, 64, 76, 79, 110, 127, 135, 143, 151, 159, 169, 174, 190, 195, 196, 197, 199, 218, 219, 222, or 227, Reactive Yellow 2, 3, 13, 14, 15, 17, 18, 23, 24, 25, 26, 27, 29, 35, 37, 41, or 42, or Basic Yellow 1, 2, 4, 11, 13, 14, 15, 19, 21, 23, 24, 25, 28, 29, 32, 36, 39, or 40 can be cited (the numerical values are each a CI number).

As the dye that produces green color, for example, Acid Green 16 can be cited (the numerical values are each a CI number).

As the dye that produces blue color, for example, Acid Blue 9, 45, 80, 83, 90, or 185 can be cited (the numerical values are each a CI number).

As the dye that produces violet color, for example, Direct Violet 7, 9, 47, 48, 51, 66, 90, 93, 94, 95, 98, 100, or 101, Acid Violet 5, 9, 11, 34, 43, 47, 48, 51, 75, 90, 103, or 126, Reactive Violet 1, 3, 4, 5, 6, 7, 8, 9, 16, 17, 22, 23, 24, 26, 27, 33, or 34, or Basic Violet 1, 2, 3, 7, 10, 15, 16, 20, 21, 25, 27, 28, 35, 37, 39, 40, or 48 can be cited (the numerical values are each a CI number).

Besides what are mentioned above, "SUMILAN" (registered trademark) dye, "LANYL Dye" (registered trademark) (which are all made by Sumitomo Chemical Company, Limited), "ORASOL" (registered trademark) dye, "ORACET" (registered trademark) dye, "FILAMID" (registered trademark) dye, "IRGASPERSE" (registered trademark) dye (which are all made by Ciba Specialty Chemicals Inc.), "ZAPON" (registered trademark) dye, "NEOZAPON" (registered trademark) dye, "NEPTUNE" (registered trademark) dye, "ACIDOL" (registered trademark) dye (which are all made by BASF), "KAYASET" (registered trademark) dye, "KAYAKALAN" (registered trademark) dye (which are all made by Nippon Kayaku Co., Ltd.), "VALIFAST" (registered trademark) COLORS dye, "NUBIAN" (registered trademark) COLORS dye (made by ORIENT CHEMICAL INDUSTRIES CO., LTD.), "SAVINYL" (registered trademark) dye, "SANDOPLAST" (registered trademark) dye, "POLYSYNTHREN" (registered trademark) dye, "LANASYN" (registered trademark) dye (which are all made by Clariant (Japan) K.K.), "AIZEN" (registered trademark) "SPILON" (registered trademark) dye (made by Hodogaya Chemical Co., Ltd.), Functional Dyes (made by Yamada Kagaku Co., Ltd.) or, PLAST COLOR dye and OIL COLOR dye (which are all made by ARIMOTO CHEMICAL Co., Ltd.) can be cited.

It is preferable that the content ratio of the (D2a-2) mixture of two or more color dyes in the entire solid content of the negative photosensitive resin composition of the present invention, excluding the solvent, be 0.01 mass % or greater, and it is more preferable that the content ratio thereof be 0.05 mass % or greater, and it is even more preferable that the content ratio thereof be 0.1 mass % or greater. When the content ratio thereof is within the range mentioned above, the light blocking property and the color adjustment property can be improved. On the other hand, it is preferable that the content ratio of the (D2a-2) mixture of two or more color dyes be 50 mass % or less, and it is more preferable that the content ratio thereof be 45 mass % or less, and it is even more preferable that the content ratio thereof be 40 mass % or less. When the content ratio thereof is within the range mentioned above, the sensitivity at the time of exposure can be improved.

The (D2b) dye other than black refers to a dye that produces color of white, red, orange, yellow, green, blue, or violet, except black, by absorbing light of a visible ray wavelength.

By containing the (D2b) dye other than black, the film of the resin composition can be colored, so that it is possible to provide coloration property or color adjustment property. By combining two or more colors of (D2b) dyes other than black, the film of the resin composition can be adjusted in color to a desired color coordinate, so that the color adjustment property can be improved.

As the (D2b) dye other than black, aforementioned dyes that produce color of white, red, orange, yellow, green, blue, or violet, except black, can be cited.

It is preferable that the content ratio of the (D2b) dye other than black in the entire solid content of negative photosensitive resin composition of the present invention, excluding the solvent, be 0.01 mass % or greater, and it is more preferable that the content ratio thereof be 0.05 mass % or greater, and it is even more preferable that the content ratio thereof be 0.1 mass % or greater. When the content ratio thereof is within the range mentioned above, the coloration property or the color adjustment property can be improved. On the other hand, it is preferable that the content ratio of the (D2b) dye other than black be 50 mass % or less, and it is more preferable that the content ratio thereof be 45 mass % or less, and it is even more preferable that the content ratio thereof be 40 mass % or less. When the content ratio thereof is within the range mentioned above, the heat resistance of the cured film can be improved.

It is preferable that the optical density per 1 μm of film thickness of the cured film obtained by curing the negative-type photosensitive resin composition in the present invention be 0.3 or greater, and it is more preferable that that the optical density be 0.5 or greater, and it is even more preferable that the optical density be 0.7 or greater, and it is particularly preferable that the optical density be 1.0 or greater. When the optical density thereof is within the range mentioned above, the light blocking property can be improved by the cured film, so that in display apparatuses, such as organic EL displays or liquid crystal displays, it becomes possible to prevent visualization of electrode wirings or reduce external light reflection. Therefore, contrast in image display can be improved. Therefore, the cured film obtained as described above is suitable for uses that require contrast enhancement by inhibiting external light reflection, such as light-blocking films, including black matrixes of color filters, black column spacers of liquid crystal displays, or the like, pixel-separating layers of organic EL displays, TFT planarization layers, etc. On the other hand, it is preferable that the optical density per 1 μm of film thickness be 5.0 or less, and it is more preferable that the optical density be 4.0 or less, and it is even more preferable that the optical density be 3.0 or less. When the foregoing optical density is within the range mentioned above, the sensitivity at the time of exposure can be improved and a cured film having a low-taper pattern shape can be obtained. The optical density per 1 μm of film thickness of the cured film can be adjusted by the composition and content ratio of the (D) coloring agent described above.

<(E) Dispersing Agent>

It is preferable that the negative-type photosensitive resin composition of the present invention further contain a (E) dispersing agent.

The (E) dispersing agent refers to a compound that has a surface affinity group that interacts with a surface of the above-described (D1) pigment, a disperse dye, etc. and a dispersion stabilizing structure that improves the dispersion stability of the (D1) pigment or the disperse dye. As the dispersion stabilizing structure of the (E) dispersing agent, a polymer chain and/or a substituent that has electrostatic charge, etc. can be cited.

By containing the (E) dispersing agent, the resin composition can be improved in the dispersion stability of the (D1) pigment or a disperse dye in the case where the (D1) pigment or the disperse dye is contained in the resin composition, so that the post-development resolution can be improved. In particular, for example, in the case where the (D1) pigment is particles crushed to a number average particle diameter of 1 μm or less, the increased surface area of the particles of the (D1) pigment facilitates occurrence of aggregation of particles of the (D1) pigment. On the other hand, in the case where the (D1) pigment is contained, surfaces of the crushed (D1) pigment and surface affinity groups of the (E) dispersing agent interact and a dispersion stabilizing structure of the (E) dispersing agent brings about steric hindrance and/or electrostatic repulsion, so that aggregation of particles of the (D1) pigment can be inhibited and dispersion stability can be improved.

As the (E) dispersing agent having a surface affinity group, for example, a (E) dispersing agent that has an amine value alone, an (E) dispersing agent that has an amine value and an acid value, a (E) dispersing agent that has an acid value alone, or a (E) dispersing agent that does not have either an amine value or an acid value can be cited. From the view point of improvement of the dispersion stability of the particles of the (D1) pigment, an (E) dispersing agent that has an amine value alone and an (E) dispersing agent that has an amine value and an acid value are preferable.

It is also preferable that the (E) dispersing agent that has a surface affinity group have a structure in which an amino group and/or an acidic group that are surface affinity groups, together with an acid and/or a base, form a salt.

As the (E) dispersing agent that has an amine value alone, for example, "DISPERBYK" (registered trademark)-108, ditto-109, ditto-160, ditto-161, ditto-162, ditto-163, ditto-164, ditto-166, ditto-167, ditto-168, ditto-182, ditto-184, ditto-185, ditto-2000, ditto-2008, ditto-2009, ditto-2022, ditto-2050, ditto-2055, ditto-2150, ditto-2155, ditto-2163, ditto-2164, or ditto-2061, "BYK" (registered trademark)-9075, ditto-9077, ditto-LP-N6919, ditto-LP-N21116, or ditto-LP-N21324 (which are all made by BYK Japan KK), "EFKA" (registered trademark) 4015, ditto 4020, ditto 4046, ditto 4047, ditto 4050, ditto 4055, ditto 4060, ditto 4080, ditto 4300, ditto 4330, ditto 4340, ditto 4400, ditto 4401, ditto 4402, ditto 4403, or ditto 4800 (which are all made byBASF), "AJISPER" (registered trademark) PB711 (made by Ajinomoto Fine-Techno Co., Inc.), or "SOLSPERSE" (registered trademark) 13240, ditto 13940, ditto 20000, ditto 71000, or ditto 76500 (which are all made by Lubrizol) can be cited.

As the (E) dispersing agent that has an amine value and an acid value, for example, "ANTI-TERRA" (registered trademark)-U100 or ditto-204, "DISPERBYK" (registered trademark)-106, ditto-140, ditto-142, ditto-145, ditto-180, ditto-2001, ditto-2013, ditto-2020, ditto-2025, ditto-187 or ditto-191, "BYK" (registered trademark)-9076 (made by BYK Japan KK, "AJISPER" (registered trademark) PB821, ditto PB880, or ditto PB881 (which are all made by Ajinomoto Fine-Techno Co., Inc.), or "SOLSPERSE" (registered trademark) 9000, ditto 11200, ditto 13650, ditto 24000, ditto 32000, ditto 32500, ditto 32600, ditto 33000, ditto 34750, ditto 35100, ditto 35200, ditto 37500, ditto 39000, ditto 56000, or ditto 76500 (which are all made by Lubrizol) can be cited.

As the (E) dispersing agent that has an acid value alone, for example, "DISPERBYK" (registered trademark)-102, ditto-110, ditto-111, ditto-118, ditto-170, ditto-171, ditto-174, ditto-2060, or ditto-2096, "BYK" (registered trademark)-P104, ditto-P105, or ditto-220S (which are all made by BYK Japan KK), or "SOLSPERSE" (registered trademark) 3000, ditto 16000, ditto 17000, ditto 18000, ditto 21000, ditto 26000, ditto 28000, ditto 36000, ditto 36600, ditto 38500, ditto 41000, ditto 41090, ditto 53095, or ditto 55000 (which are all made by Lubrizol) can be cited.

As the (E) dispersing agent that does not either an amine value or an acid value, for example, "DISPERBYK" (registered trademark)-103, ditto-2152, ditto-2200 or ditto-192 (which are all made by BYK Japan KK) or "SOLSPERSE" (registered trademark) 27000, ditto 54000, or ditto X300 (which are all made by Lubrizol) can be cited.

It is preferable that the amine value of the (E) dispersing agent be 5 mgKOH/g or greater, and it is more preferable that the amine value thereof be 8 mgKOH/g or greater, and it is even more preferable that the amine value thereof be 10 mgKOH/g or greater. When the amine value thereof is within the range mentioned above, the dispersion stability of the (D1) pigment can be improved. On the other hand, it is preferable that the amine value thereof be 150 mgKOH/g or less, and it is more preferable that the amine value thereof be 120 mgKOH/g or less, and it is even more preferable that the amine value thereof be 100 mgKOH/g or less. When the amine value thereof is within the range mentioned above, the storage stability of the resin composition can be improved.

The amine value mentioned herein refers to a weight of potassium hydroxide equivalent to that of an acid that reacts with 1 g of the (E) dispersing agent, and the unit of the amine value is mgKOH/g. The amine value can be determined by neutralizing the (E) dispersing agent with 1 g of an acid and then performing titration with a potassium hydroxide aqueous solution. From the numerical value of the amine value, an amine equivalent (whose unit is g/mol) that is a resin weight per 1 mol of amino groups can be calculated, and the number of amino groups in the (E) dispersing agent can be determined.

It is preferable that the acid value of the (E) dispersing agent be 5 mgKOH/g or greater, and it is more preferable that the acid value thereof be 8 mgKOH/g or greater, and it is even more preferable that the acid value thereof be 10 mgKOH/g or greater. When the acid value thereof is within the range mentioned above, the dispersion stability of the (D1) pigment can be improved. On the other hand, it is preferable that the acid value thereof be 200 mgKOH/g or less, and it is more preferable that the acid value thereof be 170 mgKOH/g or less, and it is even more preferable that the acid value thereof be 150 mgKOH/g or less. When the acid value thereof is within the range mentioned above, the storage stability of the resin composition can be improved.

The acid value mentioned herein refers to a weight of potassium hydroxide that reacts with 1 g of the (E) dispersing agent, and the unit of the acid value is mgKOH/g. The acid value can be determined by titrating 1 g of the (E) dispersing agent with a potassium hydroxide aqueous solution. From the value of the acid value, an acid equivalent (whose unit is g/mol) that is a resin weight per 1 mol of acidic groups can be calculated, and the number of acidic groups in the (E) dispersing agent can be determined.

As the (E) dispersing agent that has a polymer chain, acrylic resin based dispersing agents, polyoxyalkylene ether based dispersing agents, polyester based dispersing agents, polyurethane based dispersing agents, polyol based dispersing agents, polyethylene imine based dispersing agents, or polyallylamine based dispersing agents can be cited. From the viewpoint of the pattern workability with an alkaline developer, it is preferable that the (E) dispersing agent that has a polymer chain be an acrylic resin based dispersing agent, a polyoxyalkylene ether based dispersing agent, a polyester based dispersing agent, a polyurethane based dispersing agent, or a polyol based dispersing agent.

In the case where the negative photosensitive resin composition of the present invention contains a disperse dye as the (D1) pigment and/or the (D2) dye, it is preferable that the content ratio of the (E) dispersing agent in the negative photosensitive resin composition of the present invention be 1 mass % or greater where a total of the (D1) pigment and/or a disperse dye and (E) dispersing agent is assumed to be 100 mass %, and it is more preferable that the content ratio thereof be 5 mass % or greater, and it is even more preferable that the content ratio thereof be 10 mass % or greater. When the content ratio thereof is within the range mentioned above, the dispersion stability of the (D1) pigment and/or the disperse dye can be improved, and the post-development resolution can be improved. On the other hand, it is preferable that the content ratio of the (E) dispersing agent be 60 mass % or less, and it is more preferable that the content ratio thereof be 55 mass % or less, and it is even more preferable that the content ratio thereof be 50 mass % or less. When the content ratio thereof is within the range mentioned above, the heat resistance of the cured film can be improved.

<Sensitivity Enhancing Agent>

It is preferable that the negative-type photosensitive resin composition of the present invention further contain a sensitivity enhancing agent.

The sensitivity enhancing agent refers to a compound capable of absorbing energy from exposure to produce exited-triplet electrons due to internal conversion and inter-system crossing so that energy transfer to the foregoing (C) photopolymerization initiator or the like can be caused.

By containing the sensitivity enhancing agent, the sensitivity at the time of exposure can be improved. This is speculated to be because the sensitivity enhancing agent can improve photoreaction efficiency by absorbing light of long wavelengths that the (C) photopolymerization initiator does not absorb and transferring its energy from the sensitivity enhancing agent to the (C) photopolymerization initiator and the like.

As the sensitivity enhancing agent, thioxanthone based sensitivity enhancing agents are preferable. As the thioxanthone based sensitivity enhancing agents, for example, thioxanthone, 2-methylthioxanthone, 2-chlorothioxanthone, 2-isopropyl thioxanthone, 2,4-dimethylthioxanthone, 2,4-diethylthioxanthone, or 2,4-dichlorothioxanthone can be cited.

It is preferable that the content of the sensitivity enhancing agent in the negative photosensitive resin composition of the present invention be 0.01 mass part or greater in the case where a total of the (A1) first resin, the (A2) second resin, and the (B) radical polymerizable compound is assumed to be 100 mass parts, and it is more preferable that the content thereof be 0.1 mass part or greater, and it is even more preferable that the content thereof be 0.5 mass part or greater, and it is particularly preferable that the content thereof be 1 mass part or greater. When the content thereof is within the range mentioned above, the sensitivity at the time of exposure can be improved. On the other hand, it is preferable that the content of the sensitivity enhancing agent be 15 mass parts or less, and it is more preferable that the content thereof be 13 mass parts or less, and it is even more preferable that the content thereof be 10 mass parts or less, and it is particularly preferable that the content thereof be 8 mass parts or less.

When the content thereof is within the range mentioned above, the post-development resolution can be improved and a cured film of a low-taper pattern shape can be obtained.

<Chain Transfer Agent>

It is preferable that the negative-type photosensitive resin composition of the present invention further contain a chain transfer agent.

The chain transfer agent refers to a compound capable of receiving radicals from a growing polymer end of a polymer chain obtained by radical polymerization at the time of exposure and causing transfer of radicals to another polymer chain.

By containing a chain transfer agent, the sensitivity at the time of exposure can be improved. This is speculated to be because radicals produced by exposure undergo radical transfer to other polymer chains due to the chain transfer agent so that radical crosslinking occurs to deep portions of the film. Particularly, for example, in the case where the resin composition contains a (Da) black coloring agent as the above-described (D) coloring agent, it is sometimes the case that light due to exposure is absorbed by the (Da) black coloring agent and therefore does not reach deep portions of the film. On the other hand, in the case where the resin composition contains a chain transfer agent, the radical transfer due to the chain transfer agent achieves radical crosslinking to deep portions of the film, so that the sensitivity at the time of exposure can be improved.

Furthermore, by containing a chain transfer agent, a cured film having a low-taper pattern shape can be obtained. This is speculated to be because the radical transfer by the chain transfer agent can provide a molecular weight control of polymer chains that are obtained by radical polymerization at the time of exposure. Specifically, by containing a chain transfer agent, the production of remarkably high molecular weight polymer chains due to excessive radical polymerization at the time of exposure is inhibited and therefore increase in the softening point of the obtained film is restrained. Therefore, it is considered that the pattern reflow property at the time of thermosetting improves so that a low-taper pattern shape is obtained.

As the chain transfer agent, thiol based chain transfer agents are preferable. As a thiol based chain transfer agent, for example, β-mercaptopropionic acid, methyl β-mercaptopropionate, ethyl β-mercaptopropionate, 2-ethylhexyl β-mercaptopropionate, n-octyl β-mercaptopropionate, methoxybutyl β-mercaptopropionate, stearyl β-mercaptopropionate, isononyl β-mercaptopropionate, β-mercaptobutanoic acid, methyl β-mercaptobutanoate, ethyl β-mercaptobutanoate, 2-ethylhexyl β-mercaptobutanoate, n-octyl β-mercaptobutanoate, methoxybutyl β-mercaptobutanoate, stearyl β-mercaptobutanoate, isononyl β-mercaptobutanoate, methyl thioglycolate, n-octyl thioglycolate, methoxybutyl thioglycolate, 1,4-bis(3-mercaptobutanoyloxy)butane, 1,4-bis(3-mercaptopropionyloxy)butane, 1,4-bis(thioglycoloyloxy)butane, ethylene glycol bis(thioglycolate), trimethylolethane tris(3-mercaptopropionate), trimethylolethane tris(3-mercaptobutyrate), trimethylolpropane tris(3-mercaptopropionate), trimethylolpropane tris(3-mercaptobutyrate), trimethylolpropane tris(thioglycolate), 1,3,5-tris[(3-mercaptopropionyloxy)ethyl]isocyanuric acid, 1,3,5-tris[(3-mercaptobutanoyloxy)ethyl]isocyanuric acid, pentaerythritol tetrakis(3-mercaptopropionate), pentaerythritol tetrakis(3-mercaptobutyrate), pentaerythritol tetrakis(thioglycolate), dipentaerythritol hexakis(3-mercaptopropionate), or dipentaerythritol hexakis(3-mercaptobutyrate) can be cited. From viewpoint of improvement in the sensitivity at the time of exposure and of the low-taper pattern shape, it is preferable that the thiol based chain transfer agent be 1,4-bis(3-mercaptobutanoyloxy)butane, 1,4-bis(3-mercaptopropionyloxy)butane, 1,4-bis(thioglycoloyloxy)butane, ethylene glycol bis(thioglycolate), trimethylolethane tris(3-mercaptopropionate), trimethylolethane tris(3-mercaptobutyrate), trimethylolpropane tris(3-mercaptopropionate), trimethylolpropane tris(3-mercaptobutyrate), trimethylolpropane tris(thioglycolate), 1,3,5-tris[(3-mercaptopropionyloxy)ethyl]isocyanuric acid, 1,3,5-tris[(3-mercaptobutanoyloxy)ethyl]isocyanuric acid, pentaerythritol tetrakis(3-mercaptopropionate), pentaerythritol tetrakis(3-mercaptobutyrate), pentaerythritol tetrakis(thioglycolate), dipentaerythritol hexakis(3-mercaptopropionate), or dipentaerythritol hexakis(3-mercaptobutyrate).

It is preferable that the content of the chain transfer agent in the negative photosensitive resin composition of the present invention be 0.01 mass part or greater in the case where a total of the (A1) first resin, the (A2) second resin, and the (B) radical polymerizable compound is assumed to be 100 mass parts, and it is more preferable that the content thereof be 0.1 mass part or greater, and it is even more preferable that the content thereof be 0.5 mass part or greater, and it is particularly preferable that the content thereof be 1 mass part or greater. When the content thereof is within the range mentioned above, the sensitivity at the time of exposure can be improved and a cured film having a low-taper pattern shape can be obtained. On the other hand, it is preferable that the content of the chain transfer agent be 15 mass parts or less, and it is more preferable that the content thereof be 13 mass parts or less, and it is even more preferable that the content thereof be 10 mass parts or less, and it is particularly preferable that the content thereof be 8 mass parts or less. When the content thereof is within the range mentioned above, the post-development resolution and the heat resistance of the cured film can be improved.

<Polymerization Inhibitor>

It is preferable that the negative-type photosensitive resin composition of the present invention further contain a polymerization inhibitor.

The polymerization inhibitor refers to a compound capable of stopping radical polymerization by trapping radicals produced at the time of exposure or radicals of growing polymer ends of polymer chains obtained by radical polymerization at the time of exposure and holding the radicals as stable radicals.

By containing an appropriate amount of a polymerization inhibitor, production of residue after development can be inhibited, so that the post-development resolution can be improved. This is speculated to be because the polymerization inhibitor traps an excess amount of radicals produced at the time of exposure or radicals at growing ends of high-molecular weight polymer chains, so that progress of excessive radical polymerization is inhibited.

As the polymerization inhibitor, phenol based polymerization inhibitors are preferable. As phenol based polymerization inhibitors, for example, 4-methoxyphenol, 1,4-hydroquinone, 1,4-benzoquinone, 2-t-butyl-4-methoxyphenol, 3-t-butyl-4-methoxyphenol, 4-t-butylcatechol, 2,6-di-t-butyl-4-methylphenol, 2,5-di-t-butyl-1,4-hydroquinone, 2,5-di-t-amyl-1,4-hydroquinone, or "IRGANOX" (registered trademark) 1010, ditto 1035, ditto 1076, ditto 1098, ditto 1135, ditto 1330, ditto 1726, ditto 1425, ditto 1520, ditto 245, ditto 259, ditto 3114, ditto 565, or ditto 295 (which are all made by BASF) can be cited.

It is preferable that the content of the polymerization inhibitor in the negative photosensitive resin composition of the present invention be 0.01 mass part or greater in the case where a total of the (A1) first resin, the (A2) second resin, and the (B) radical polymerizable compound is assumed to be 100 mass parts, and it is more preferable that the content thereof be 0.03 mass part or greater, and it is even more preferable that the content thereof be 0.05 mass part or greater, and it is particularly preferable that the content thereof be 0.1 mass part or greater. When the content thereof is within the range mentioned above, the post-development resolution and the heat resistance of the cured film can be improved. On the other hand, it is preferable that the content of the polymerization inhibitor be 10 mass parts or less, and it is more preferable that the content thereof be 8 mass parts or less, and it is even more preferable that the content thereof be 5 mass parts or less, and it is particularly preferable that the content thereof be 3 mass parts or less. When the content thereof is within the range mentioned above, the sensitivity at the time of exposure can be improved.

<Crosslinking Agent>

It is preferable that the negative-type photosensitive resin composition of the present invention further contain a crosslinking agent.

The crosslinking agent refers to a compound that has a crosslinkable group capable of binding to the resin.

By containing a crosslinking agent, the hardness and chemical resistance of the cured film can be improved. This is speculated to be because the crosslinking agent makes it possible to introduce a new crosslink structure to the cured film of the resin composition and therefore the crosslink density improves.

It is preferable that the crosslinking agent be a compound that has in its molecule two or more thermal crosslinkabilities such as alkoxy methyl groups, methylol groups, epoxy groups, or oxetanyl groups.

As the compound that has in its molecule two or more alkoxy methyl groups or methylol groups, for example, DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, or HMOM-TPHAP (which are all made by Honshu Chemical Industry Co., Ltd.), or "NIKALAC" (registered trademark) MX-290, ditto MX-280, ditto MX-270, ditto MX-279, ditto MW-100LM, ditto MW-30HM, ditto MW-390, or ditto MX-750LM (which are made by SANWA CHEMICAL CO., LTD.) can be cited.

As the compound that has in its molecule two or more epoxy groups, for example, "Epolite" (registered trademark) 40E, ditto 100E, ditto 200E, ditto 400E, ditto 70P, ditto 200P, ditto 400P, ditto 1500NP, ditto 80MF, ditto 4000, or ditto 3002 (which are all made by Kyoeisha Chemical Co., Ltd.), "Denacol" (registered trademark) EX-212L, ditto EX-214L, ditto EX-216L, ditto EX-321L, or ditto EX-850L (which are all made by Nagase ChemteX Corporation), "jER" (registered trademark) 828, ditto 1002, ditto 1750, ditto 1007, ditto YX8100-BH30, ditto E1256, ditto E4250, or ditto E4275 (which are all made by Mitsubishi Chemical Corporation), GAN, GOT, EPPN-502H, NC-3000, or NC-6000 (which are all made by Nippon Kayaku Co., Ltd.), "EPICLON" (registered trademark) EXA-9583, ditto HP4032, ditto N695, or ditto HP7200 (which are all made by DIC Corporation), "TECHMORE" (registered trademark) VG-3101L (made by Printec Corporation), "TEPIC" (registered trademark) S, ditto G, or ditto P (which are all made by Nissan Chemical Industries, Ltd.), or "Epotohto" (registered trademark) YH-434L (made by Tohto Kasei Co., Ltd.) can be cited.

As the compound that has in its molecule two or more oxetanyl groups, for example, "ETERNACOLL" (registered trademark) EHO, ditto OXBP, ditto OXTP, or ditto OXMA (which are all made by Ube Industries, Ltd.), or oxetanized phenol novolac can be cited.

It is preferable that the content of the crosslinking agent in the negative photosensitive resin composition of the present invention be 0.1 mass part or greater in the case where a total of the (A1) first resin, the (A2) second resin, and the (B) radical polymerizable compound is assumed to be 100 mass parts, and it is more preferable that the content thereof be 0.5 mass part or greater, and it is even more preferable that the content thereof be 1 mass part or greater. When the content thereof is within the range mentioned above, the hardness and chemical resistance of the cured film can be improved. On the other hand, it is preferable that the content of the crosslinking agent be 70 mass parts or less, and it is more preferable that the content thereof be 60 mass parts or less, and it is even more preferable that the content thereof be 50 mass parts or less. When the content thereof is within the range mentioned above, the hardness and chemical resistance of the cured film can be improved.

<Silane Coupling Agent>

It is preferable that the negative-type photosensitive resin composition of the present invention further contain a silane coupling agent.

The silane coupling agent refers to a compound that has a hydrolyzable silyl group or silanol group.

Containing a silane coupling agent increases the interaction at the interface between the cured film of the resin composition and a base substrate, so that the adhesion with the base substrate and the chemical resistance of the cured film can be improved.

As the silane coupling agent, trifunctional organosilanes, tetrafunctional organosilanes, or silicate compounds are preferable.

As the trifunctional organosilanes, for example, methyltrimethoxysilane, methyltriethoxysilane, methyltri-n-propoxysilane, ethyltrimethoxysilane, n-propyltrimethoxysilane, isopropyltrimethoxysilane, n-hexyltrimethoxysilane, n-decyltrimethoxysilane, cyclopentyltrimethoxysilane, cyclohexyltrimethoxysilane, vinyltrimethoxysilane, 3-methacryloxypropyltrimethoxysilane, 3-acryloxypropyltrimethoxysilane, phenyltrimethoxysilane, 4-tolyltrimethoxysilane, 4-hydroxyphenyltrimethoxysilane, 4-methoxyphenyltrimethoxysilane, 1-naphthyltrimethoxysilane, 2-naphthyltrimethoxysilane, 4-styryltrimethoxysilane, 3-glycidoxypropyltrimethoxysilane, 2-(3,4-epoxycyclohexyl)ethyltrimethoxysilane, 3-trimethoxysilylpropylsuccinic acid, 3-trimethoxysilylpropionic acid, 3-trimethoxysilylpropylsuccinic anhydride, trifluoromethyltrimethoxysilane, 3,3,3-trifluoropropyltrimethoxysilane, 3-[(3-ethyl-3-oxetanyl)methoxy]propyltrimethoxysilane, 3-aminopropyltrimethoxysilane, N-(2-aminoethyl)-3-aminopropyltrimethoxysilane, N-phenyl-3-aminopropyltrimethoxysilane, N-(vinyl benzyl)-2-aminoethyl-3-aminopropyltrimethoxysilane hydrochlorate salt, 3-(4-aminophenyl)propyltrimethoxysilane, 1-[4-(3-trimethoxysilylpropyl)phenyl]urea, 1-(3-trimethoxysilylpropyl)urea, 3-triethoxysilyl-N-(1,3-dimethylbutylidene) propylamine, 3-mercaptopropyltrimethoxysilane, 3-isocyanate propyltriethoxysilane, 1,3,5-tris(3-trimethoxysilylpropyl)isocyanuric acid, N-t-butyl-2-(3-trimethoxysilylpropyl) succinimide, or N-t-butyl-2-(3-triethoxysilylpropyl) succinimide can be cited.

As the tetrafunctional organosilanes or the silicate compounds, for example, organosilanes represented by general formula (72) can be cited.

[CHEM. 27]

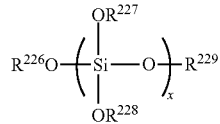

(72)

In general formula (72), $R^{226}$ to $R^{229}$ each independently represent hydrogen, an alkyl group, an acyl group, or an aryl group, and x represents an integer of 1 to 15. In general formula (72), it is preferable that $R^{226}$ to $R^{229}$ each independently be hydrogen, an alkyl group having a carbon number of 1 to 6, an acyl group having a carbon number of 2 to 6, or an aryl group having a carbon number of 6 to 15, and it is more preferable that $R^{226}$ to $R^{229}$ each independently be hydrogen, an alkyl group having a carbon number of 1 to 4, an acyl group having a carbon number of 2 to 4, or an aryl group having a carbon number of 6 to 10. The alkyl group, the acyl group, and the aryl group mentioned above may be either an unsubstituted product or a substitution product.

As the organosilane represented by general formula (72), for example, tetrafunctional organosilanes, such as tetramethoxysilane, tetraethoxysilane, tetra-n-propoxysilane, tetraisopropoxysilane, tetra-n-butoxysilane, or tetraacetoxysilane, and silicate compounds, such as Methyl Silicate 51 (made by FUSO CHEMICAL CO., LTD.), M Silicate 51, Silicate 40, or Silicate 45 (which are all made by TAMA CHEMICALS CO., LTD.), or Methyl Silicate 51, Methyl Silicate 53A, Ethyl Silicate 40, or Ethyl Silicate 48 (which are all made by COLCOAT CO., LTD.), can be cited.

It is preferable, from the viewpoint of improvement of the adhesion with the base substrate and the chemical resistance of the cured film, that the silane coupling agent be a trifunctional organosilane, such as vinyltrimethoxysilane, 3-methacryloxypropyltrimethoxysilane, 3-acryloxypropyltrimethoxysilane, 1-naphthyltrimethoxysilane, 2-naphthyltrimethoxysilane, 3-glycidoxypropyltrimethoxysilane, 2-(3, 4-epoxycyclohexyl)ethyltrimethoxysilane, 3-[(3-ethyl-3-oxetanyl)methoxy]propyltrimethoxysilane, 3-aminopropyltrimethoxysilane, N-phenyl-3-aminopropyltrimethoxysilane, 3-(4-aminophenyl)propyltrimethoxysilane, 1-[4-(3-trimethoxysilylpropyl)phenyl]urea, 1-(3-trimethoxysilylpropyl)urea, 3-triethoxysilyl-N-(1,3-dimethylbutylidene) propylamine, 3-isocyanate propyltriethoxysilane, 1,3,5-tris(3-trimethoxysilylpropyl) isocyanuric acid, N-t-butyl-2-(3-trimethoxysilylpropyl)succinimide, or N-t-butyl-2-(3-triethoxysilylpropyl)succinimide, a tetrafunctional organosilane, such as tetramethoxysilane, tetraethoxysilane, tetra-n-propoxysilane, tetraisopropoxysilane, tetra-n-butoxysilane, or tetraacetoxysilane, or a silicate compound, such as Methyl Silicate 51 (made by FUSO CHEMICAL CO., LTD.), M Silicate 51, Silicate 40, or Silicate 45 (which are all made by TAMA CHEMICALS CO., LTD.), or Methyl Silicate 51, Methyl Silicate 53A, Ethyl Silicate 40, or Ethyl Silicate 48 (which are all made by COLCOAT CO., LTD.).

It is preferable that the content of the silane coupling agent in the negative photosensitive resin composition of the present invention be 0.01 mass part or greater in the case where a total of the (A1) first resin, the (A2) second resin, and the (B) radical polymerizable compound is assumed to be 100 mass parts, and it is more preferable that the content thereof be 0.1 mass part or greater, and it is even more preferable that the content thereof be 0.5 mass part or greater, and it is particularly preferable that the content thereof be 1 mass part or greater. When the content thereof is within the range mentioned above the adhesion with the base substrate and the chemical resistance of the cured film can be improved. On the other hand, it is preferable that the content of the silane coupling agent be 15 mass parts or less, and it is more preferable that the content thereof be 13 mass parts or less, and it is even more preferable that the content thereof be 10 mass parts or less, and it is particularly preferable that the content thereof be 8 mass parts or less. When the content thereof is within the range mentioned above, the post-development resolution can be improved.

<Surfactant>

The negative-type photosensitive resin composition of the present invention may further contain a surfactant.

The surfactant refers to a compound that has a hydrophilic structure and a hydrophobic structure.

By containing an appropriate amount of a surfactant, the surface tension of the resin composition can be arbitrarily adjusted, and the leveling property at the time of coating application improves, so that the film thickness uniformity of the coating film can be improved.

As the surfactant, fluorine resin based surfactants, silicone based surfactants, polyoxyalkylene ether based surfactants, or acrylic resin based surfactants are preferable.

As the fluorine resin based surfactant, for example, 1,1,2,2-tetrafluorooctyl (1,1,2,2-tetrafluoropropyl)ether, 1,1,2,2-tetrafluorooctyl hexyl ether, octaethylene glycol bis(1,1,2,2-tetrafluorobutyl)ether, hexaethylene glycol (1,1,2,2,3,3-hexafluoropentyl)ether, octapropylene glycol bis(1,1,2,2-tetrafluorobutyl)ether, hexapropylene glycol bis(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-[3-(perfluorooctane sulfonamide) propyl]-N,N'-dimethyl-N-carboxy methylene ammonium betaine, perfluoroalkyl sulfonamide propyl trimethylammonium salt, perfluoroalkyl-N-ethylsulfonylglycine salt, or bis (N-perfluorooctylsulfonyl-N-ethyl aminoethyl) phosphate can be cited. Furthermore, compounds that have a fluoroalkyl group or a fluoroalkylene chain at one of the sites of an end, a main chain, and a side chain, such as monoperfluoroalkyl ethyl phosphoric acid ester, can be cited. As such compounds, for example, "MEGAFACE" (registered trademark) F-142D, ditto F-172, ditto F-173, ditto F-183, ditto F-444, ditto F-445, ditto F-470, ditto F-475, ditto F-477, ditto F-555, ditto F-558, or ditto F-559 (which are all made by DIC Corporation), "Eftop" (registered trademark) EF301, ditto 303, or ditto 352 (which are all made by Mitsubishi Materials Electronic Chemicals Co., Ltd.), "Fluorad" (registered trademark) FC-430 or ditto FC-431 (which are all made by Sumitomo 3M Limited), "Asahi-Guard" (registered trademark) AG710 (made by Asahi Glass Co., Ltd.), "SURFLON" (registered trademark) S-382, ditto SC-101, ditto SC-102, ditto SC-103, ditto SC-104, ditto SC-105, or ditto SC-106 (which are all made by AGC Seimi Chemical Co., Ltd.), BM-1000 or BM-1100 (which are all made by Yusho Co., Ltd.), or "FTERGENT" (registered trademark) 710FM or ditto 730LM (which are all made by NEOS COMPANY LIMITED) can be cited.

As the silicone based surfactant, for example, SH28PA, SH7PA, SH21PA, SH30PA, or ST94PA (which are all made by Dow Corning Toray Co., Ltd.), or "BYK" (registered trademark)-301, ditto-306, ditto-307, ditto-331, ditto-333, ditto-337, or ditto-345 (which are all made by BYK Japan KK) can be cited.

As the polyoxyalkylene ether based surfactant, "FTERGENT" (registered trademark) 212M, ditto 209F, ditto 208G, ditto 240G, ditto 212P, ditto 220P, ditto 228P, ditto NBX-15, ditto FTX-218, or ditto DFX-218 (which are all made by NEOS COMPANY LIMITED) can be cited.

As the acrylic resin based surfactant, "BYK" (registered trademark)-350, ditto-352, ditto-354, ditto-355, ditto-356, ditto-358N, ditto-361N, ditto-392, ditto-394, or ditto-399 (which are all made by BYK Japan KK) can be cited.

It is preferable that the content ratio of the surfactant in the negative photosensitive resin composition of the present invention be 0.001 mass % or greater of the entire negative-type photosensitive resin composition, and it is more preferable that the content ratio thereof be 0.005 mass % or greater, and it is even more preferable that the content ratio thereof be 0.01 mass % or greater. When the content ratio thereof is within the range mentioned above, the leveling property at the time of coating application can be improved. On the other hand, it is preferable that the content ratio of the surfactant be 1 mass % or less, and it is more preferable that the content ratio thereof be 0.5 mass % or less, and it is even more preferable that the content ratio thereof be 0.03 mass % or less. When the content ratio thereof is within the range mentioned above, the leveling property at the time of coating application can be improved.

<Solvent>

It is preferable that the negative-type photosensitive resin composition of the present invention further contain a solvent.

The solvent refers to a compound that is capable of dissolving various resins and various additives that are to be contained in the resin composition.

By containing a solvent, various resins and various additives that are to be contained in the resin composition can be homogeneously dissolved, so that the transmittance of the cured film can be improved. Furthermore, the viscosity of the resin composition can be arbitrarily adjusted, so that a film can be formed with a desired film thickness on a substrate. Moreover, the surface tension of the resin composition or the desiccation speed thereof at the time of coating application can be arbitrarily adjusted, so that the leveling property at the time of coating application and the film thickness uniformity of the coating film can be improved.

It is preferable, from the viewpoint of the solubility of various resins and various additives, that the solvent be a compound that has an alcoholic hydroxyl group, a compound that has a carbonyl group, a compound that has three or greater ether bonds. Moreover, a compound whose boiling point under atmospheric pressure is 110 to 250° C. is more preferable. Having a boiling point of 110° C. or greater, the solvent vaporizes appropriately at the time of coating application and thus promotes the drying of the coating film, so that coating unevenness can be inhibited and the film thickness uniformity can be improved. On the other hand, the solvent having a boiling point of 250° C. or less allows reduction of the amount of the solvent that remains in the coating film. Therefore, the amount of film shrinkage at the time of thermosetting can be reduced, so that the flatness of the cured film can be increased and the film thickness uniformity can be improved.

As the compound which has an alcoholic hydroxyl group and whose boiling point under atmospheric pressure is 110 to 250° C., for example, hydroxy acetone, 4-hydroxy-2-butanone, 3-hydroxy-3-methyl-2-butanone, 4-hydroxy-3-methyl-2-butanone, 5-hydroxy-2-pentanone, 4-hydroxy-2-pentanone, 4-hydroxy-4-methyl-2-pentanone (also called diacetone alcohol), methyl lactate, ethyl lactate, n-propyl lactate, n-butyl lactate, methyl 2-hydroxy-2-methylpropionate, methyl 2-hydroxy-3-methylbutanoate, ethylene glycol monomethyl ether, ethylene glycol monoethyl ether, ethylene glycol mono-n-propyl ether, ethylene glycol mono-n-butyl ether, propylene glycol monomethyl ether, propylene glycol monoethyl ether, propylene glycol mono-n-propyl ether, propylene glycol mono-n-butyl ether, propylene glycol mono-t-butyl ether, diethylene glycol monomethyl ether, diethylene glycol monoethyl ether, diethylene glycol mono-n-propyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, 3-methoxy-1-butanol, 3-methoxy-3-methyl-1-butanol, 1,3-butanediol, 1,4-butanediol, tetrahydrofurfuryl alcohol, n-butanol, or n-pentanol can be cited. From the viewpoint of the leveling property at the time of coating application, it is preferable that the compound which has an alcoholic hydroxyl group and whose boiling point under atmospheric pressure is 110 to 250° C. be diacetone alcohol, ethyl lactate, ethylene glycol monomethyl ether, propylene glycol monomethyl ether, diethylene glycol monomethyl ether, dipropylene glycol monomethyl ether, 3-methoxy-1-butanol, 3-methoxy-3-methyl-1-butanol, or tetrahydrofurfuryl alcohol.

As the compound which has a carbonyl group and whose boiling point under atmospheric pressure is 110 to 250° C., for example, n-butyl acetate, isobutyl acetate, 3-methoxymethyl propionate, methyl 3-ethoxypropionate, ethoxyethyl acetate, 3-methoxy-n-butyl acetate, 3-methyl-3-methoxy-n-butyl acetate, 3-methyl-3-methoxy-n-butyl propionate, ethylene glycol monomethyl ether acetate, ethylene glycol monoethyl ether acetate, ethylene glycol monobutyl ether acetate, propylene glycol monomethyl ether acetate, propylene glycol monoethyl ether acetate, propylene glycol monobutyl ether acetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, cyclohexanol acetate, propylene glycol diacetate, 1,3-butanediol diacetate, 1,4-butanediol diacetate, methyl n-butyl ketone, methyl isobutyl ketone, diisobutyl ketone, 2-heptanone, acetylacetone, cyclopentanone, cyclohexanone, cycloheptanone, γ-butyrolactone, γ-valerolactone, δ-valerolactone, propylene carbonate, N-methyl-2-pyrrolidone, N,N'-dimethylformamide, N,N'-dimethylacetamide, or 1,3-dimethyl-2-imidazolidinone can be cited. It is preferable, from the viewpoint of the leveling property at the time of coating application, that the compound which has a carbonyl group and whose boiling point under atmospheric pressure is 110 to 250° C. be 3-methoxy-n-butyl acetate, 3-methyl-3-n-butyl acetate, propylene glycol monomethyl ether acetate, dipropylene glycol monomethyl ether acetate, or γ-butyrolactone.

As the compound which has three or greater ether bonds and whose boiling point under atmospheric pressure is 110 to 250° C., for example, diethylene glycol dimethyl ether, diethylene glycol diethyl ether, diethylene glycol ethyl methyl ether, diethylene glycol di-n-propyl ether, dipropylene glycol dimethyl ether, dipropylene glycol diethyl ether, dipropylene glycol methyl-n-propyl ether, dipropylene glycol ethyl methyl ether, or dipropylene glycol di-n-propyl ether can be cited. It is preferable, from the viewpoint of the leveling property at the time of coating application, that the compound which has three or greater ether bonds and whose boiling point under atmospheric pressure is 110 to 250° C. be diethylene glycol dimethyl ether, diethylene glycol ethyl methyl ether, or dipropylene glycol dimethyl ether.

The content ratio of the solvent in the negative-type photosensitive resin composition of the present invention can be adjusted as appropriate according to the coating method or the like. For example, in the case where a coating film is formed by spin coating, it is common to set the content ratio thereof be within the range of 50 to 95 mass % of the entire negative-type photosensitive resin composition.

In the case where the (D1) pigment is contained as a (D) coloring agent, it is preferable that the solvent be a solvent that has a carbonyl group or an ester bond. By containing a solvent that has a carbonyl group or an ester bond, the dispersion stability of the (D1) pigment or a disperse dye can be improved. It is preferable, from the viewpoint of dispersion stability, that the solvent be a solvent that has an acetate bond. By containing a solvent that has an acetate bond, the dispersion stability of the (D1) pigment can be improved.

As the solvent that has an acetate bond, for example, n-butyl acetate, isobutyl acetate, 3-methoxy-n-butyl acetate, 3-methyl-3-methoxy-n-butyl acetate, ethylene glycol monomethyl ether acetate, ethylene glycol monoethyl ether acetate, ethylene glycol monobutyl ether acetate, propylene glycol monomethyl ether acetate, propylene glycol monoethyl ether acetate, propylene glycol monobutyl ether acetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, cyclohexanol acetate, propylene glycol diacetate, 1,3-butanediol diacetate, or 1,4-butanediol diacetate can be cited.

In the negative-type photosensitive resin composition of the present invention, it is preferable that the content ratio of the solvent that has a carbonyl group or an ester bond in the solvent be within the range of 30 to 100 mass %, and it is more preferable that the content ratio thereof be within the range of 50 to 100 mass %, and it is even more preferable that the content ratio thereof be within the range of 70 to 100 mass %. When the content ratio thereof is within the range mentioned above, the dispersion stability of the (D1) pigment can be improved.

<Other Additives>

The negative-type photosensitive resin composition of the present invention may further contain other resins or their precursors. As other resins or their precursors, for example, polyamide, polyamide-imide, epoxy resin, novolac resin, urea resin, polyurethane, or their precursors can be cited.

<Production Method for Negative-type Photosensitive Resin Composition of Present Invention>

A representative production method for the negative-type photosensitive resin composition of the present invention will be described. For example, in the case where the (D)

coloring agent contains a (D1) pigment, the (E) dispersing agent is added to a solution of the (A1) first resin and the (A2) second resin, and the (D1) pigment is dispersed in this mixture solution by using a dispersion machine so as to prepare a pigment dispersion liquid. Next, the (B) radical polymerizable compound, the (C) photopolymerization initiator, and other additives as well as an arbitrary solvent are added to the pigment dispersion liquid. Stirring is performed for 20 minutes to 3 hours to form a homogeneous solution. After stirring, the obtained solution is filtered to obtain a negative-type photosensitive resin composition of the present invention.

As the dispersion machine, for example, a ball mill, a bead mill, a sand grinder, a three-roll mill, or a high-speed impact mill can be cited. From the viewpoint of more efficient dispersion and finer dispersion, it is preferable that the dispersion machine be a bead mill. As the bead mill, for example, a co-ball mill, a basket mill, a pin mill, or a DYNO mill can be cited. As beads of the bead mill, for example, titania beads, zirconia beads, or zircon beads can be cited. It is preferable that the bead diameter of the bead mill be 0.01 to 6 mm, and it is more preferable that the bead diameter thereof be 0.015 to 5 mm, and it is even more preferable that the bead diameter thereof be 0.03 to 3 mm. In the case where the primary particle diameter of the (D1) pigment and the particle diameter of secondary particles formed by aggregation of primary particles of the (D1) pigment is several hundred nanometers or less, small beads of 0.015 to 0.1 mm are preferable. In this case, a bead mill that has a separator based on a centrifugal separation system which is capable of separating small beads and the pigment dispersion liquid is preferable. On the other hand, in the case where the (D1) pigment contains large particles of several hundred nanometers or greater, beads of 0.1 to 6 mm are preferable from the viewpoint of more efficient dispersion.

<Cured Film Obtained from Negative-Type Photosensitive Resin Composition of Present Invention and Process that Uses the Cured Film>

The cured film obtained from the negative-type photosensitive resin composition of the present invention can be suitably put to uses such as pixel-separating layers, color filters, and black matrixes of color filters of organic EL displays, black column spacers of liquid crystal displays, gate insulating films of semiconductors, interlayer insulating films of semiconductors, protection films for metal wiring, insulation films for metal wiring, or planarization film for TFTs.

<Cured Pattern of Low-Taper Pattern Shape>

The negative-type photosensitive resin composition of the present invention makes it possible to obtain a cured film that has a cured pattern of a low-taper pattern shape. It is preferable that the taper angle of an inclined side of a cross section of a cured pattern that the cured film has which is obtained from the negative-type photosensitive resin composition of the present invention be 1° or greater, and it is more preferable that the taper angle thereof be 50 or greater, and it is even more preferable that the taper angle thereof be 10° or greater, and it is yet more preferable that the taper angle thereof be 120 or greater, and it is particularly preferable that the taper angle thereof be 15° or greater. When the taper angle thereof is within the range mentioned above, light-emitting elements can be highly densely integrated and arranged, so that the resolution of display apparatuses can be improved. On the other hand, it is preferable that the taper angle of the inclined side of a cross section of the cured pattern of the cured film be 600 or less, and it is more preferable that the taper angle thereof be 55° or less, and it is even more preferable that the taper angle thereof be 500 or less, and it is yet more preferable that the taper angle thereof be 45° or less, and it is particularly preferable that the taper angle thereof be 400 or less. When the taper angle thereof is within the range mentioned above, wire breakage at the time of forming electrodes, such as transparent electrodes or reflector electrodes, can be prevented. Furthermore, electric field concentration at edge portions of electrodes can be inhibited, so that degradation of light-emitting elements can be inhibited.

<Production Process for Organic EL Display>

As a process that uses the negative-type photosensitive resin composition of the present invention, a process that uses a cured film of that composition as a pixel-separating layer that has light blocking property in an organic EL display is illustrated in FIG. 1 and will be described as an example. First, (1) thin-film transistors (hereinafter, "TFTs") 2 are formed on a glass substrate 1, and a photosensitive material for a TFT planarization film is formed into a film, which is then pattern-processed by photolithography and subsequently thermally cured to form a cured film for TFT planarization 3. Next, (2) an silver-palladium-copper alloy (hereinafter, "APC") is sputtered to form a film, which is pattern-processed by etching with photoresist to form an APC layer. Furthermore, as an upper layer on the APC layer, ITO is sputtered to form a film, which is then pattern-processed by etching with photoresist to form reflector electrodes 4 as first electrodes. After that, (3) the negative-type photosensitive resin composition of the present invention is applied and pre-baked to form a pre-baked film 5a. Subsequently, (4) a chemical active ray 7 is applied via a mask 6 that has a desired pattern. Next, (5) after development for pattern processing, bleaching exposure and intermediate bake are performed as needed so as to carry out thermal cure. Thus, a cured pattern 5b having a desired pattern is formed as a pixel-separating layer that has light blocking property. After that, (6) an EL light-emitting material is vapor deposition via a mask to form a film. Thus, an EL light-emitting layer 8 is formed. A magnesium-silver alloy (hereinafter, "MgAg") is vapor deposited to form a film, which is then pattern-processed by etching with photoresist to form transparent electrodes 9 as second electrodes. Next, (7) a photosensitive material for a planarization film is formed into a film, which is then pattern-processed by photolithography and then thermally cured to form a cured film for planarization 10. After that, a cover glass 11 is joined thereto to obtain a top emission type organic EL display that includes the negative-type photosensitive resin composition of the present invention as a pixel-separating layer that has light blocking property.

<Production Process for Liquid Crystal Display>

Figure 2:
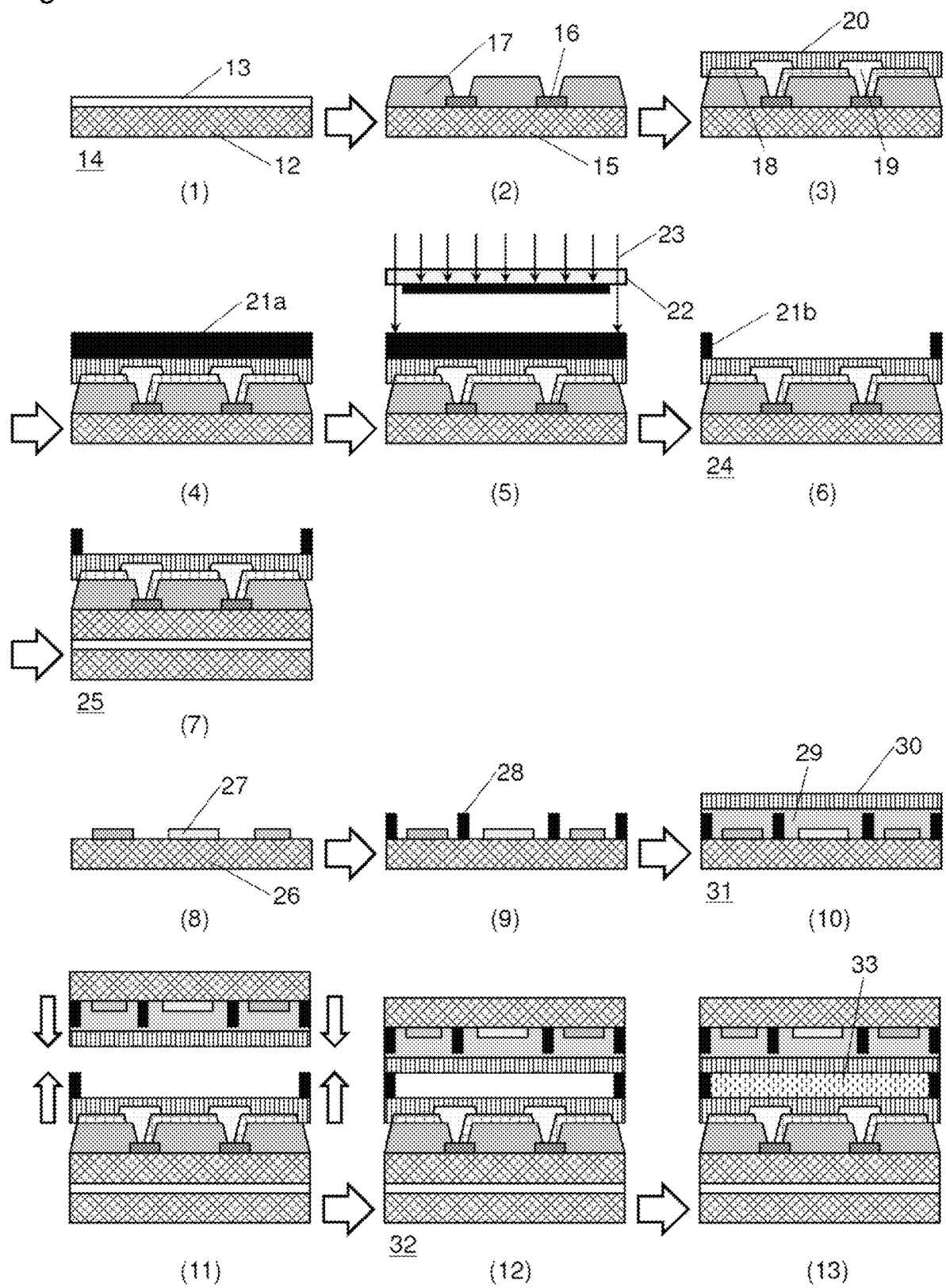
FIGS. 2(1) to (13) are processing diagrams exemplifying a production process of a liquid crystal display that uses a cured film of a negative-type photosensitive resin composition of the present invention.

As another process that uses the negative-type photosensitive resin composition of the present invention, a process that uses a cured film of the composition as a black column spacer (hereinafter, "BCS") and a black matrix (hereinafter, "BM") of a color filter of a liquid crystal display is illustrated in FIG. 2 and will be described as an example. First, (1) a backlight unit (hereinafter, "BLU") 13 is formed on a glass substrate 12 to obtain a glass substrate 14 that includes a BLU.

Furthermore, (2) TFTs 16 are formed on another glass substrate 15. A photosensitive material for a TFT planarization film is formed into a film, which is then pattern-processed by photolithography and subsequently thermally cured to form a cured film for TFT planarization 17. Next, (3) ITO is sputtered to form a film, which is then pattern-processed by etching with photoresist to form a transparent electrode 18. On top of it, a planarization film 19 and an alignment layer 20 are formed. After that, (4) the negative-type photosensitive resin composition of the present invention is applied and pre-baked to form a pre-baked film 21*a*. Subsequently, (5) a chemical active ray 23 is applied via a mask 22 that has a desired pattern. Next, (6) after development for pattern processing, bleaching exposure and intermediate bake are performed as needed so as to carry out thermal cure. Thus, a cured pattern 21*b* having a desired pattern is formed as a BCS that has light blocking property so as to obtain a glass substrate 24 that has a BCS. Subsequently, (7) the foregoing glass substrate 14 and this glass substrate 24 are joined to obtain a glass substrate 25 that has a BLU and a BCS.

Furthermore, (8) a color filter 27 of three colors of red, green, and blue is formed on another glass substrate 26. Next, (9) in substantially the same method as above, a cured pattern 28 having a desired pattern is formed as a BM that has light blocking property from the negative-type photosensitive resin composition of the present invention. After that, (10), a photosensitive material for planarization is formed into a film, which is then pattern-processed by photolithography and subsequently thermally cured to form a cured film for planarization 29, on which an alignment layer 30 is formed. Thus, a color filter substrate 31 is obtained. Subsequently, (11) the foregoing glass substrate 25 and this color filter substrate 31 are joined so that (12) a glass substrate 32 that has a BLU, a BCS, and a BM is obtained. Next, (13) a liquid crystal is injected to form a liquid crystal layer 33, so that a liquid crystal display that includes the negative-type photosensitive resin composition of the present invention as a BCS and a BM is obtained.

As described above, according to the production methods for an organic EL display and a liquid crystal display which uses the negative-type photosensitive resin composition of the present invention, it is possible to obtain a cured film having high heat resistance and light blocking property which has been pattern-processed and contains polyimide and/or polybenzo-oxazole, leading to improvement in the yield of production, improvement in the performance, and improvement in the reliability of organic EL displays and liquid crystal displays.

Furthermore, related-art processes that use a non-photosensitive coloration resin composition that contains polyamide acid as a polyimide precursor are very complicated and troublesome. For example, in the case where a cured pattern having light blocking property which has a desired pattern is to be obtained, first, a non-photosensitive coloration resin composition is formed into a film on a substrate. Next, a film of photoresist is formed on the film of the coloration resin composition. Furthermore, when pattern processing is performed by photolithography, the photoresist and the lower-layer coloration resin composition are simultaneously pattern-processed at the time of alkaline development. After that, the photoresist is removed and thermal curing is performed to obtain a cured pattern having light blocking property which has a desired pattern. That is, there is a need to use photoresist in order to pattern process the film of the coloration resin composition, so that the process has a great number of process steps. Furthermore, since the photoresist and the lower-layer coloration resin composition are simultaneous pattern-processed, it is also required that the dissolution speed of the photoresist and the coloration resin composition be controlled.

On the other hand, the processes that use the negative-type photosensitive resin composition of the present invention are excellent in that since the resin composition is photosensitive, pattern processing can be carried out directly by photolithography and therefore photoresist is not needed. Therefore, compared with the related-art processes, the number of steps can be reduced, so that improvement of productivity, process time reduction and take time reduction can be achieved.

The cured film obtained from the negative-type photosensitive resin composition of the present invention is suitable as insulation films in display apparatuses that include EL light-emitting layers, display apparatuses that include liquid crystal layers, and display apparatuses that include EL light-emitting layers and liquid crystal layers. As the display apparatuses, for example, organic EL displays or liquid crystal displays can be cited.

<Display Apparatuses that Use Cured Films Obtained from Negative-Type Photosensitive Resin Composition of Present Invention>

Furthermore, the negative-type photosensitive resin composition of the present invention makes it possible to obtain a pattern shape with high resolution and low taper and obtain a cured film excellent in high heat resistance. Therefore, the negative-type photosensitive resin composition of the present invention is suitable for uses in which high heat resistance and a low-taper pattern shape are required, such as insulation layers of pixel-separating layers and the like of organic EL displays, and the like. Particularly, in uses in which problems attributable to heat resistance and pattern shape, such as defect or declined property of an element resulting from degassing due to thermal decomposition, a break of an electrode wiring due to a high-taper pattern shape, etc., are assumed, the using of the cured film of the negative-type photosensitive resin composition of the present invention makes it possible to produce a highly reliable element with which the foregoing problems do not occur. Furthermore, since the cured film is excellent in light blocking property, it becomes possible to prevent visualization of electrode wirings or reduce external light reflection, so that contrast in image display can be improved. Therefore, by using the cured film obtained from the negative-type photosensitive resin composition of the present invention as a pixel-separating layer of an organic EL display, it is possible to improve contrast without a need to form a polarizing plate and a quarter-wavelength plate at the light extraction side of the light-emitting elements.

In the case of the related-art organic EL displays, in order to reduce external light reflection, a polarizing plate, a quarter-wavelength plate, an antireflection layer, etc. is formed at the light extraction side of the light-emitting elements. However, light output from the light-emitting elements is changed in phase by the quarter-wavelength plate and partially cut off by the polarizing plate, and only the polarized light transmitted therethrough is output to the outside, so that the luminance of the organic EL displays decreases.

On the other hand, according to the organic EL displays that use the cured film obtained from the negative-type photosensitive resin composition of the present invention, since neither a polarizing plate nor a quarter-wavelength plate is used, the luminance of organic EL displays can be improved.

In the case of organic EL displays that use the cured film obtained from the negative-type photosensitive resin composition of the present invention, since neither a polarizing plate nor a quarter-wavelength plate is included, light output from the light-emitting element is not changed in phase or partially cut off by a polarizing plate or a quarter-wavelength plate. In the case where a display apparatus that uses the cured film obtained from the composition does not include a liquid crystal layer, light output from this display apparatus is non-polarized light and output to the outside, with its phase remaining the same as that of light output from the light-emitting elements. On the other hand, in the case where a display apparatus that uses the cured film obtained from the composition includes a liquid crystal layer, light output from this display apparatus is polarized light output from the liquid crystal layer and light output from the light-emitting elements is output to the outside, with its phase remaining the same as the phase having been changed by the liquid crystal layer.

<Flexible Organic EL Display Using Cured Film Obtained from Negative-Type Photosensitive Resin Composition of Present Invention>

Figure 3:
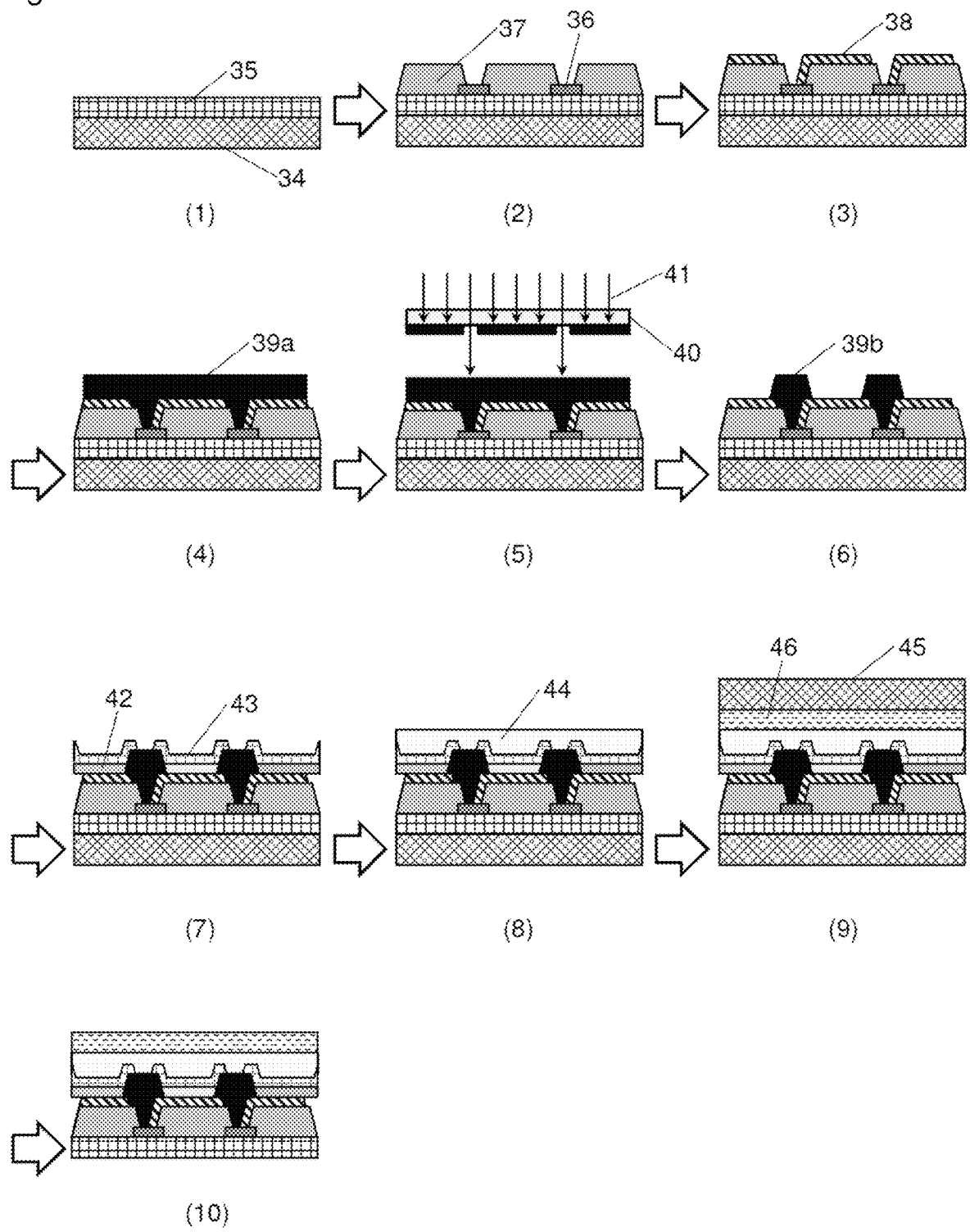
FIGS. 3(1) to (10) are processing diagrams exemplifying a production process of a flexible organic EL display that uses a cured film of a negative-type photosensitive resin composition of the present invention.

As a process that uses the negative-type photosensitive resin composition of the present invention, a process that uses a cured film of the composition as a pixel-separating layer having light blocking property in a flexible organic EL display is illustrated in FIG. 3 and will be described as an example. First, (1), a polyimide (hereinafter, "PI") film substrate 35 is tentatively fixed onto a glass substrate 34. Next, (2) oxide TFTs 36 are formed on the PI film substrate, and a photosensitive material for a TFT planarization film is formed into a film, which then is pattern-processed by photolithography and subsequently thermally cured to form a cured film for TFT planarization 37. After that, (3) APC is sputtered to form a film. Thus, an APC layer is formed. Furthermore, as an upper layer on the APC layer, ITO is sputtered to form a film, which is then pattern-processed by etching with photoresist to form reflector electrodes 38 as first electrodes. Next, (4) the negative-type photosensitive resin composition of the present invention is applied and pre-baked to form a pre-baked film 39a. Subsequently, (5) a chemical active ray 41 is applied via a mask 40 that has a desired pattern. After that, (6) after development for pattern processing, bleaching exposure and intermediate bake are performed as needed so as to carry out thermal cure. Thus, a cured pattern 39b having a desired pattern is formed as a pixel-separating layer that has flexibility and light blocking property. Next, (7) an EL light-emitting material is vapor deposited via a mask to form a film. Thus, an EL light-emitting layer 42 is formed. Then, MgAg is vapor deposited to form a film, which is then pattern-processed by etching with photoresist to form transparent electrodes 43 as second electrodes. After that, (8) a photosensitive material for planarization is formed into a film, which is then pattern-processed by photolithography and subsequently thermally cured to form a cured film for planarization 44. Next, (9) a polyethylene terephthalate (hereinafter, "PET") film substrate 46 that is tentatively fixed another glass substrate 45 is joined. After that, (10) the glass substrate 34 is detached from the PI film substrate 35 and the glass substrate 45 is detached from the PET film substrate 46, so that a top emission type flexible organic EL display that includes the negative-type photosensitive resin composition of the present invention as a pixel-separating layer that has flexibility and light blocking property is obtained.

As described above, according to the production methods for a flexible organic EL display which uses the negative-type photosensitive resin composition of the present invention, it is possible to obtain a cured film having high heat resistance and light blocking property which has been pattern-processed and contains polyimide and/or polybenzoxazole, leading to improvement in the yield of production, improvement in the performance, and improvement in the reliability of flexible organic EL displays.

Furthermore, the negative-type photosensitive resin composition of the present invention makes it possible to obtain high resolution and low taper pattern shape, so that a cured film having flexibility can be obtained. Therefore, the cured film can be provided as a stacked structure on a flexible substrate. Thus, the negative-type photosensitive resin composition of the present invention is suitable for uses in which flexibility and a low-taper pattern shape are required, such as insulation layers of pixel-separating layers and the like in flexible organic EL displays, and the like. Furthermore, the cured film has high heat resistance, so that, in uses in which problems attributable to heat resistance and pattern shape, such as defect or declined property of an element resulting from degassing due to thermal decomposition, a break of an electrode wiring due to a high-taper pattern shape, etc., are assumed, the using of the cured film of the negative-type photosensitive resin composition of the present invention makes it possible to produce a highly reliable element with which the foregoing problems do not occur.

It is preferable that the flexible substrate be a substrate containing carbon atoms as a main component. By containing carbon atoms as a main component, the substrate can be provided with flexibility. Furthermore, a main component of the cured film obtained from the negative-type photosensitive resin composition of the present invention is also carbon atoms, the interaction of the cured film with the flexible substrate that forms a base substrate can be increased, so that the adhesion thereof with the substrate can be improved. Furthermore, the flexibility of the cured film to follow the base substrate can be improved.

It is preferable that the ratio of the carbon atom content in the flexible substrate be 20 mass % or greater, and it is more preferable that the ratio thereof be 25 mass % or greater, and it is even more preferable that the ratio thereof be 30 mass % or greater. When the content ratio thereof is within the range mentioned above, the adhesion to the base substrate and the flexibility of the cured film can be improved. On the other hand, it is preferable that the content ratio thereof be 100 mass % or less, and it is more preferable that the content ratio thereof be 95 mass % or less, and it is even more preferable that the content ratio thereof be 90 mass % or less. When the content ratio is within the range mentioned above, the adhesion to the base substrate and the flexibility of the cured film can be improved.

The production method for a display apparatus which uses the negative-type photosensitive resin composition of the present invention include steps of (1) to (4) as follows:

(1) a step of forming a coating film of the negative-type photosensitive resin composition of the present invention on a substrate;

(2) a step of applying a chemical active ray to the resin composition via a photomask;

(3) a step of forming a pattern of the resin composition by development with an alkali solution; and (4) a step of heating the pattern so as to obtain a cured pattern of the resin composition.

<Step of Forming Coating Film>

The production method for a display apparatus which uses the negative-type photosensitive resin composition of the present invention includes (1) a step of forming a coating film of the negative-type photosensitive resin composition on a substrate.

As a method for forming a film of the negative-type photosensitive resin composition of the present invention, for example, a method in which the resin composition is applied onto a substrate or a method in which the resin composition is applied in a pattern on a substrate can be cited.

As the substrate, for example, a substrate in which an oxide of one or more species selected from indium, tin, zinc, aluminum, and gallium, a metal (molybdenum, silver, copper, aluminum, chromium, titanium, etc.), or CNT (carbon nano tube) has been formed as an electrode or a wiring on glass, or the like can be used.

As the oxide of one or more species selected from indium, tin, zinc, aluminum, and gallium, for example, indium tin oxide (ITO), indium oxide zinc (IZO), aluminum oxide zinc (AZO), indium gallium zinc oxide (IGZO), or zinc oxide (ZnO) can be cited.

<Method in which Negative-Type Photosensitive Resin Composition of Present Invention is Applied to Substrate>

As the method in which the negative-type photosensitive resin composition of the present invention is applied to a substrate, for example, micro gravure coating, spin coating, dip coating, curtain flow coating, roll coating, spraying coating, or slit coating can be cited. Although the coating film thickness varies depending on the coating method, the solid content concentration and viscosity of the resin composition, the resin composition is usually applied so that the film thickness subsequent to the application and the prebake is 0.1 to 30 μm.

It is preferable that after the negative-type photosensitive resin composition of the present invention is applied to a substrate, prebake be performed to form the film. The prebake may use an oven, a hot plate, infrared rays, a flash annealing apparatus, a laser annealing apparatus, etc. It is preferable that the prebake temperature be 50 to 150° C. It is preferable that the prebake time be 30 seconds to several hours. It is also permissible to perform prebake in multiple steps of two or more steps, such as prebake at 80° C. for 2 minutes and then prebake at 120° C. for 2 minutes.

<Method in which Negative-Type Photosensitive Resin Composition of Present Invention is Applied in Pattern Shape to Substrate>

As the method in which the negative-type photosensitive resin composition of the present invention is applied in a pattern shape to a substrate, for example, relief printing, intaglio printing, stencil printing, planographic printing, screen printing, ink jet printing, offset printing, or laser printing can be cited. Although the coating film thickness varies depending on the coating method, the solid content concentration or viscosity of the photosensitive resin composition of the present invention, etc., the resin composition is usually applied so that the film thickness subsequent to the application and the prebake is 0.1 to 30 μm.

It is preferable that after the negative-type photosensitive resin composition of the present invention is applied in a pattern shape to a substrate, prebake be performed to form a film. The prebake may use an oven, a hot plate, infrared rays, a flash annealing apparatus, a laser annealing apparatus, etc. It is preferable that the prebake temperature be 50 to 150° C. It is preferable that the prebake time be 30 seconds to several hours. It is also permissible to perform prebake in multiple steps of two or more steps, such as prebake at 80° C. for 2 minutes and then prebake at 120° C. for 2 minutes.

<Method in which Coating Film Formed on Substrate is Pattern-Processed>

As the method in which a coating film of the negative-type photosensitive resin composition of the present invention which has been formed as a film on a substrate is pattern-processed, for example, a method in which the coating film is directly pattern-processed by photolithography and a method in which the coating film is pattern-processed by etching can be cited. From the viewpoint of improvement in productivity due to reduction of the number of steps and reduction of the process time, a method in which the coating film is directly pattern-processed by photolithography is preferable.

<Step of Applying Chemical Active Rays Via Photomask>

The production method for a display apparatus which uses the negative-type photosensitive resin composition of the present invention includes (2) a step of applying chemical active rays to the resin composition via a photomask.

After the negative-type photosensitive resin composition of the present invention is applied to a substrate and formed as a film thereon by prebake, the film is exposed by using an exposure machine such as a stepper, a mirror projection mask aligner (MPA), or a parallel light mask aligner (PLA). The chemical active rays that are applied at the time of exposure, for example, ultraviolet rays, visible light rays, electron rays, X rays, KrF (248 nm wavelength) laser, ArF (193 nm wavelength) laser, etc. can be cited. It is preferable to use a j ray (313 nm wavelength), an i ray (365 nm wavelength), an h ray (405 nm wavelength), or a g ray (436 nm wavelength) of a mercury lamp. Furthermore, the amount of exposure is usually about 100 to 40,000 J/m$^2$ (10 to 4,000 mJ/cm$^2$) (values from an i-ray illuminometer), and exposure can be carried out via a photomask that has a desired pattern according to need.

After the exposure, post-exposure bake may be performed. By performing post-exposure bake, advantageous effects, such as improvement in post-development resolution or increase in the allowable range of development conditions, can be expected. The post-exposure bake can use an oven, a hot plate, infrared rays, a flash annealing apparatus, a laser annealing apparatus, etc. It is preferable that the post-exposure bake temperature be 50 to 180° C., and it is more preferable that the post-exposure bake temperature be 60 to 150° C. It is preferable that the post-exposure bake time be 10 seconds to several hours. When the post-exposure bake time is within the range mentioned above, reaction progresses favorably, so that the development time can sometimes be reduced.

<Step of Forming Pattern by Development with Alkali Solution>

The production method of a display apparatus that uses the negative-type photosensitive resin composition of the present invention includes (3) a step of forming a pattern of the resin composition by development with an alkali solution.

After the exposure, development is carried out by using an automatic development apparatus or the like. Since the negative-type photosensitive resin composition of the present invention has negative-type photosensitivity, unexposed portions, after development, are removed by the developing solution, so that a relief pattern can be obtained.

As the developing solution, an alkaline developer is commonly used. As the alkaline developer, for example, an organic alkali solution or an aqueous solution of a compound that exhibits alkalinity is preferable and, from the viewpoint of environmental aspects, an aqueous solution of a compound that exhibits alkalinity, that is, an alkali aqueous solution, is more preferable.

As the organic alkali solution or the compound that exhibits alkalinity, for example, 2-aminoethanol, 2-(dimethylamino)ethanol, 2-(diethylamino)ethanol, diethanol amine, methylamine, ethylamine, dimethylamine, diethylamine, triethylamine, (2-dimethylamino)ethyl acetate, (2-dimethylamino)ethyl (meth)acrylate, cyclohexylamine, ethylene diamine, hexamethylene diamine, ammonia, tetramethylammonium hydroxide, tetraethylammonium hydroxide, sodium hydroxide, potassium hydroxide, magnesium hydroxide, calcium hydroxide, barium hydroxide, sodium carbonate, or potassium carbonate can be cited.

As the developing solution, an organic solvent may be used. As the organic solvent, for example, the foregoing solvents, ethyl acetate, ethyl pyruvate, ethyl 3-methoxypropionate, ethyl 3-ethoxypropionate, N-methyl-2-pyrrolidone, dimethyl sulfoxide, or hexamethylphosphortriamide can be cited.

As the developing solution, a mixture solution containing both an organic solvent mentioned above and a poor solvent with respect to the negative-type photosensitive resin composition of the present invention may be used. As the poor solvent with respect to the negative-type photosensitive resin composition of the present invention, for example, water, methanol, ethanol, isopropyl alcohol, toluene, or xylene can be cited.

As the method for development, for example, methods in which a developing solution mentioned above is directly applied to the post-exposure film, or in which a developing solution mentioned above is radiated in the form of mist to the post-exposure film, or in which the post-exposure film is immersed in a developing solution mentioned above, or in which after being immersed in a developing solution mentioned above, the post-exposure film is irradiated with ultrasonic waves, etc. can be cited. It is preferable that the post-exposure film be kept in contact with the developing solution for 5 seconds to 10 minute.

After development, it is preferable that the obtained relief pattern be washed with a rinse liquid. As the rinse liquid, water is preferable in the case where an alkali aqueous solution is used as the developing solution.

As the rinse liquid, it is permissible to use, for example, an aqueous solution of alcohol, such as ethanol or isopropyl alcohol, an aqueous solution of ester, such as propylene glycol monomethyl ether acetate, or an aqueous solution of a compound that exhibits acidity, such as carbonic acid gas, hydrochloric acid, or acetic acid.

As the rinse liquid, an organic solvent may be used. From the viewpoint of affinity with the developing solution, it is preferable that the organic solvent be methanol, ethanol, isopropyl alcohol, ethyl acetate, ethyl lactate, ethylpyruvate, propylene glycol monomethyl ether, propylene glycol monomethyl ether acetate, methyl 3-methoxypropionate, ethyl 3-ethoxypropionate, or 2-heptanone.

After a pattern of the negative-type photosensitive resin composition of the present invention is obtained by photolithography, bleaching exposure may be performed. By performing bleaching exposure, the post-thermosetting pattern shape can be arbitrarily controlled. Furthermore, the transparency of the cured film can be improved.

The bleaching exposure can use an exposure machine such as a stepper, a mirror projection mask aligner (MPA), or a parallel light mask aligner (PLA). As the chemical active rays applied at the time of bleaching exposure, for example, ultraviolet rays, visible light rays, electron rays, X rays, KrF (248 nm wavelength) laser, ArF (193 nm wavelength) laser, etc. can be cited. It is preferable to use a j ray (313 nm wavelength), an i ray (365 nm wavelength), an h ray (405 nm wavelength), or a g ray (436 nm wavelength) of a mercury lamp. Furthermore, the amount of exposure is usually about 500 to 500,000 J/m$^2$ (50 to 50,000 mJ/cm$^2$) (values from an i-ray illuminometer). Exposure can be performed via a mask that has a desired pattern as needed.

After a pattern of the negative-type photosensitive resin composition of the present invention is obtained, intermediate bake may be performed. By performing intermediate bake, the post-thermosetting resolution will improve and the post-thermosetting pattern shape can be arbitrarily controlled. The intermediate bake can use an oven, a hot plate, infrared rays, a flash annealing apparatus, or a laser annealing apparatus. It is preferable that the intermediate bake temperature be 50 to 250° C., and it is more preferable that the intermediate bake temperature be 70 to 220° C. It is preferable that the intermediate bake time be 10 seconds to several hours. It is permissible to perform intermediate bake in multiple steps of two or more steps, such as intermediate bake at 100° C. for 5 minutes and then intermediate bake at 150° C. for 5 minutes.

<Step of Obtaining Cured Pattern by Heating Pattern>

The production method for a display apparatus that uses the negative-type photosensitive resin composition of the present invention includes (4) a step of obtaining a cured pattern of the resin composition by heating the pattern of the resin composition.

The heating of the pattern of the negative-type photosensitive resin composition of the present invention formed as a film on a substrate can use an oven, a hot plate, infrared rays, a flash annealing apparatus, a laser annealing apparatus, etc. By thermosetting the pattern of the negative-type photosensitive resin composition of the present invention by heating, the heat resistance of the cured film can be improved and a low-taper pattern shape can be obtained.

It is preferable that the temperature for thermosetting be 150° C. or greater, and it is more preferable that the temperature therefor be 200° C. or greater, and it is even more preferable that the temperature therefore be 250° C. or greater. When the thermosetting temperature is within the range mentioned above, the heat resistance of the cured film can be improved and the post-thermosetting pattern shape can be made more of low taper. On the other hand, from the viewpoint of takt time reduction, it is preferable that the temperature for thermosetting be 500° C. or less, and it is more preferable that the temperature therefor be 450° C. or less, and it is even more preferable that the temperature therefor be 400° C. or less.

It is preferable that the time for thermosetting be 1 minute or longer, and it is more preferable that the time therefor be 5 minutes or longer, and it is even more preferable that the time therefor be 10 minutes or longer, and it is particularly preferable that the time therefor be 30 minutes or longer. When the thermosetting time is within the range mentioned above, the post-thermosetting pattern shape can be made more of low taper. On the other hand, from the viewpoint of takt time reduction, it is preferable that the time for thermosetting be 300 minutes or shorter, and it is more preferable that the time therefor be 250 minutes or shorter, and it is even more preferable that the time therefor be 200 minutes or shorter, and it is particularly preferable that the time therefor be 150 minutes or shorter. It is permissible to perform thermosetting in multiple steps of two or more steps, such as thermosetting at 150° C. for 30 minutes and then thermosetting at 250° C. for 30 minute.

<Step of Pattern-Processing Transparent Electrode or Reflector Electrode>

The production method for a display apparatus that uses the negative-type photosensitive resin composition of the present invention may include a step of pattern-processing a transparent electrode and/or a step of pattern-processing a reflector electrode.

As the method for pattern-processing a transparent electrode and a reflector electrode, for example, a method in which pattern-processing is performed by etching can be cited.

After a transparent electrode or a reflector electrode is formed as a stacked structure on a substrate, photoresist is applied onto the electrode to form a film by substantially the same method as described above. It is preferable that after being applied, the photoresist film be prebaked by substantially the same method as described above.

By exposing and developing the photoresist in substantially the same method after applying and prebaking the photoresist on the transparent electrode or the reflector electrode, a pattern of the photoresist can be formed on the electrode by photolithography.

After development, it is preferable that the obtained pattern be heated for thermosetting. By thermosetting the pattern, the chemical resistance and dry etching resistance of the cured film of the photoresist will improve, so that the pattern of the photoresist can be suitably used as an etching mask. The heating of the pattern can use an oven, a hot plate, infrared rays, a flash annealing apparatus, a laser annealing apparatus, etc. It is preferable that the temperature for thermosetting be 70 to 200° C. It is preferable that the time for thermosetting be 30 seconds to several hours.

After the development and heating, the transparent electrode or the reflector electrode, which is a layer below the pattern, is pattern-processed by etching with the pattern of the photoresist used as an etching mask.

As the method for etching, for example, wet etching that uses an etching liquid or dry etching that uses an etching gas can be cited. As the etching liquid, it is preferable to use an etching liquid or an organic solvent that is acid or alkaline.

<Method for Pattern-Processing by Wet Etching>

As the acid etching liquid, a known etching liquid, such as a solution of a compound that exhibits acidity, for example, hydrofluoric acid, hydrochloric acid, sulfuric acid, nitric acid, phosphoric acid, phosphorous acid, acetic acid, oxalic acid, etc., can be used.

As the alkaline etching liquid, an organic alkali solution or an aqueous solution of a compound that exhibits alkalinity is preferable.

As the organic alkali solution or the compound that exhibits alkalinity, known such solutions or compounds, for example, 2-aminoethanol, 2-(diethylamino)ethanol, diethanol amine, triethylamine, ammonia, tetramethylammonium hydroxide, sodium hydroxide, potassium hydroxide, potassium carbonate, etc., can be used.

As the organic solvent, known organic solvents, for example, the foregoing solvents, diethylene glycol mono-n-butyl ether, ethyl 3-methoxypropionate, N-methyl-2-pyrrolidone, isopropyl alcohol, etc., can be used.

As the etching liquid, a mixture solution containing both an alkaline etching liquid and an organic solvent may be used.

As the method for wet etching, for example, methods in which the aforementioned etching liquid is directly applied to or the aforementioned etching liquid is radiated in the form of mist to a substrate in which a pattern of photoresist has been formed on a transparent electrode or a reflector electrode, or in which a substrate in which a pattern of photoresist has been formed on a transparent electrode or a reflector electrode is immersed in the aforementioned etching liquid, or in which a substrate in which a pattern of photoresist has been formed on a transparent electrode or a reflector electrode is immersed in the aforementioned etching liquid and then irradiated with ultrasonic waves can be cited.

After wet etching, it is preferable that the transparent electrode or reflector electrode pattern-processed by wet etching be washed with a rinse liquid.

As the rinse liquid, a known rinse liquid, for example, water, methanol, ethanol, isopropyl alcohol, ethyl lactate, etc., can be used. In the case where an acidic etching liquid or an aqueous solution of a compound that exhibits alkalinity is used as the etching liquid, it is preferable that the rinse liquid be one that contains water.

<Method for Pattern-Processing by Dry Etching>

As the etching gas, for example, fluoromethane, difluoromethane, trifluoromethane, tetrafluoromethane, chlorofluoromethane, chlorodifluoromethane, chlorotrifluoromethane, dichlorofluoromethane, dichlorodifluoromethane, trichlorofluoromethane, sulfur hexafluoride, xenon difluoride, oxygen, ozone, argon, or fluorine can be cited.

As the method for dry etching, for example, reactivity gas etching, in which a substrate in which a pattern of photoresist has been formed on a transparent electrode or a reflector electrode is exposed to the aforementioned etching gas, plasma etching, in which a substrate in which a pattern of photoresist has been formed on a transparent electrode or a reflector electrode is exposed to an etching gas ionized or radicalized by electromagnetic waves, reactive ion etching, in which a substrate in which a pattern of photoresist has been formed on a transparent electrode or a reflector electrode is subjected to collision with an etching gas ionized or radicalized by electromagnetic waves and accelerated by applying a bias, can be cited.

By removing the photoresist remaining on the transparent electrode or the reflector electrode after etching, a pattern of the transparent electrode or the reflector electrode can be obtained.

<Removal of Photoresist>

As the method for removing the photoresist, for example, removal with a resist stripping liquid or removal by ashing can be cited. As the resist stripping liquid, it is preferable that an organic solvent or a resist stripping liquid that is acid or alkaline be used, and known such solvents or liquids can be used. As the acidic resist stripping liquid, for example, an acidic solution or a mixture solution of an acidic solution and an oxidation agent can be cited, and known such liquids can be used. From the viewpoint of photoresist removing property, a mixture solution of an acidic solution and an oxidation agent is preferable.

As the gas for use for removal by ashing, a gas containing, as a component, one or more species selected from oxygen, ozone, argon, fluorine and chlorine can be cited. From the viewpoint of photoresist removing property, a gas containing oxygen or ozone as a component is preferable.

According to the negative-type photosensitive resin composition of the present invention, it becomes possible to prepare a coating liquid that makes it possible to obtain a high-resolution and low-taper pattern shape and makes it possible to obtain a cured film excellent in heat resistance and light blocking property and that can be subjected to alkaline development.

Furthermore, according to the negative-type photosensitive resin composition of the present invention, it becomes possible to obtain a cured film that can be suitably used for uses as a pixel-separating layer, a color filter, or a black matrix of a color filter in an organic EL display, a black column spacer in a liquid crystal display, a gate insulating film of a semiconductor, an interlayer insulating film of a semiconductor, a protection film for metal wiring, an insulation film for metal wiring, a planarization film for TFTs, etc. Particularly, because of being excellent in light blocking property, the cured film is suitable as a pixel-separating layer and a black matrix of a color filter that have light blocking property in an organic EL display or a black column spacer in a liquid crystal display. Moreover, it becomes possible to obtain an element and a display apparatus which include the foregoing cured film for the aforementioned use.

Furthermore, according to the production method for a display apparatus that uses the negative-type photosensitive resin composition of the present invention, it is possible to obtain a cured film having high heat resistance and light blocking property which has been pattern-processed and contains polyimide and/or polybenzo-oxazole, leading to improvement in the yield of the production of organic EL displays and performance improvement and reliability improvement thereof. Moreover, as compared with methods that use a related-art non-photosensitive coloration resin composition that contains polyamide acid as a polyimide precursor, the method of the present invention is excellent in that direct pattern-processing can be performed by photolithography without using photoresist. Therefore, in comparison with related-art processes, the number of steps can be reduced, so that improvement in productivity, reduction of the process time, reduction of the takt time becomes possible.

EXAMPLES

The present invention will be described more concretely hereinafter with reference to examples and comparative example. However, the present invention is not limited to scopes thereof. Incidentally, of the compounds used, those whose abbreviations are used will be named below.

4,4'-DAE: 4,4'-diaminodiphenyl ether
4-MOP: 4-methoxyphenol
6FDA: 2,2-(3,4-dicarboxyphenyl) hexafluoropropane dianhydride, 4,4'-hexafluoropropane-2,2-diyl-bis(1,2-phthalic anhydride)
6FDAc: 2,2-(3,4-dicarboxyphenyl)hexafluoropropane; 4,4'-hexafluoropropane-2,2-diyl-bis(1,2-phthalic acid)
AcrTMS: 3-acryloxypropyltrimethoxysilane
AIBN: 2,2'-Azobis(isobutyronitrile)
BAHF: 2,2-bis(3-amino-4-hydroxyphenyl)hexafluoropropane
BAPF: 9,9-bis(3-amino-4-hydroxyphenyl)fluorene
BFE: 1,2-bis(4-formyl phenyl)ethane
BGEF: 9,9-bis[4-(2-glycidoxyethoxy)phenyl]fluorene
BGPF: 9,9-bis(4-glycidoxyphenyl)fluorene
BHEF: 9,9-bis[4-(2-hydroxyethoxy)phenyl]fluorene
BHPF: 9,9-bis(4-hydroxyphenyl)fluorene
Bis-A-AF: 2,2-bis(4-aminophenyl)hexafluoropropane
Bk-S0084: "PALIOGEN" (registered trademark) BLACK S0084 (made by BASF; a perylene based black pigment having a primary particle diameter of 50 to 100 nm)
Bk-S0100CF: "IRGAPHOR" (registered trademark) BLACK S0100CF (made by BASF; a benzofuranone based black pigment having a primary particle diameter of 40 to 80 nm)
Bk-TH-807: "NUBIAN" (registered trademark) BLACK TH-807 (made by ORIENT CHEMICAL INDUSTRIES CO., LTD.; an azine based black dye)
BnMA: benzyl methacrylate
BSAA: 2,2'-bis[4-(3,4-dicarboxy phenoxy)phenyl]propane dianhydride
BZAc: benzoic acid
cyEpoTMS: 2-(3,4-epoxycyclohexyl)ethyltrimethoxysilane
DBA: dibenzylamine
D.BYK-167: "DISPERBYK" (registered trademark)-167 (made by BYK Chemie Japan Co., Ltd.; a dispersing agent having an amine value)
D.Y.201: CI Disperse Yellow 201
DETX-S: "KAYACURE" (registered trademark) DETX-S (made by Nippon Kayaku Co., Ltd.; 2,4-diethylthioxanthone)
DFA: N,N-dimethylformamide dimethyl acetal
DMeDMS: dimethyldimethoxysilane
DMF: N,N-dimethylformamide
DPHA: "KAYARAD" (registered trademark) DPHA (made by Nippon Kayaku Co., Ltd.; dipentaerythritol hexaacrylate)
ED-900: "JEFFAMINE" (registered trademark) ED-900 (made by HUNTSMAN; a diamine having an oxyalkylene structure)
GMA: glycidyl methacrylate
HCl: hydrochloric acid
HFHA: N,N'-bis[5,5'-hexafluoropropane-2,2-diyl-bis(2-hydroxyphenyl)]bis(3-aminobenzoic acid amide)
ICl: iodine monochloride
IGZO: indium gallium zinc oxide
ITO: indium tin oxide
KOH: potassium hydroxide
KI: potassium iodide
MAA: methacrylic acid
MAP: 3-aminophenol; meta-aminophenol
MBA: 3-methoxy-n-butyl acetate
MeTMS: methyltrimethoxysilane
MgAg: magnesium silver
MT-PE1: "Karenz MT"-PE1 (made by Showa Denko K.K.; pentaerythritol tetrakis(3-mercaptobutyrate))
NA: 5-norbornene-2,3-dicarboxylic anhydride; nadic anhydride
NapTMS: 1-naphthyltrimethoxysilane
$Na_2S_2O_3$: thiosodium sulfate
NCI-831: "ADEKA ARKLS" (registered trademark) NCI-831 (made by ADEKA Corporation; 1-(9-ethyl-6-nitro-9H-carbazol-3-yl)-1-[2-methyl-4-(1-methoxypropane-2-yloxy)phenyl]methanone-1-(O-acetyl) oxime)
NMP: N-methyl-2-pyrrolidone
ODPA: bis(3,4-dicarboxyphenyl)ether dianhydride; oxydiphthaldianhydride
ODPAc: bis(3,4-dicarboxyphenyl)ether; oxydiphthalic acid
P.B.15:6: CI Pigment Blue 15:6
P.R.254: CI Pigment Red 254
P.Y.139: CI Pigment Yellow 139
PA-5600: "NUBIAN" (registered trademark) BLUE PA-5600 (made by ORIENT CHEMICAL INDUSTRIES CO., LTD.; a blue dye)
PET: polyethylene terephthalate
PGDA: propylene glycol diacetate
PGMEA: propylene glycol monomethyl ether acetate
PHA: phthalic anhydride
PhTMS: phenyltrimethoxysilane
PI: polyimide
S-20000: "SOLSPERSE" (registered trademark) 20000 (made by Lubrizol; a polyether based dispersing agent)
SiDA: 1,3-bis(3-aminopropyl)tetramethyl disiloxane
S.B.63: CI Solvent Blue 63
S.R.18: CI Solvent Red 18
STR: styrene
TCDM: tricyclo[5.2.1.0$^{2,6}$]decane-8-yl methacrylate; dimethylol-tricyclodecane dimethacrylate TFEMA: (2,2,2-trifluoro)ethyl methacrylate
TFMB: 2,2'-bis(trifluoromethyl)-4,4'-diaminobiphenyl
TFPrTMS: 3,3,3-trifluoropropyltrimethoxysilane
THF: tetrahydrofuran
TMAH: tetramethylammonium hydroxide
TMOS: tetramethoxysilane
TMSSucA: 3-trimethoxysilylpropylsuccinic anhydride
TPK-1227: a carbon black subjected to a surface treatment in which a sulfonic group is introduced (made by CABOT)
TrisP-PA: 1,1-bis(4-hydroxyphenyl)-1-[4-[1-(4-hydroxyphenyl)-1-methyl ethyl]phenyl]ethane (made by Honshu Chemical Industry Co., Ltd.) WR-301: "ADEKA ARKLS" (registered trademark) WR-301 (made by ADEKA Corporation; a cardo based resin obtained by reacting a carboxylic anhydride with a resin obtained by ring-opening addition reaction of an unsaturated carboxylic acid and an aromatic compound having an epoxy group)

Synthesis Example (A)

18.31 g (0.05 mol) of BAHF, 17.4 g (0.3 mol) of propylene oxide, 100 mL of acetone were weighed and dissolved in a three-necked flask. Into this, a solution in which 20.41 g (0.11 mol) of 3-nitrobenzoyl chloride was dissolved in 10 mL of acetone was dropped. After the dropping, reaction was conducted at −15° C. for 4 hours followed by return to room temperature. A white solid precipitated was obtained by filtering and vacuum dried at 50° C. 30 g of the obtained solid was placed in a stainless autoclave of 300 mL, and dispersed in 250 mL of 2-methoxy ethanol. Then, 2 g of 5% palladium-carbon was added. Hydrogen was introduced into this via a balloon, and reaction was conducted at room temperature for 2 hours. After 2 hours, it was confirmed that the balloon did not shrink any further. The reaction was followed by filtration to remove a palladium compound that was a catalyst and then by distillation removal under reduced pressure to carry out concentration. Thus, a hydroxy group-containing diamine compound (HFHA) having the following structure was obtained.

[CHEM. 28]

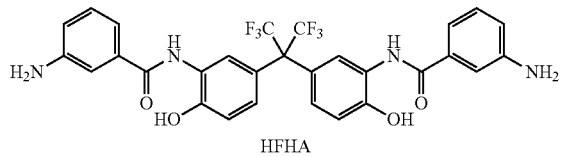

HFHA

Synthesis Example (B): Synthesis of Compound (QD-1)

Having Naphthoquinone Diazide Structure

In a dried nitrogen gas stream, 21.23 g (0.05 mol) of TrisP-PA and 37.62 g (0.14 mol) of 5-naphthoquinone diazide sulfonic acid chloride were weighed and dissolved in 450 g of 1,4-dioxane in a three-necked flask, and the temperature was adjusted to room temperature. A mixture solution of 50 g of 1,4-dioxane and 15.58 g (0.154 mol) of triethylamine was dropped into this while stirring was being performed so that the temperature in the system did not become 35° C. or greater. After the dropping, the mixture solution was stirred at 30° C. for 2 hours. After the stirring, the precipitated triethylamine salt was removed by filtration and then the filtrate was put into water and stirred. A precipitated solid precipitate was obtained by filtration. The obtained solid was dried by desiccation under reduced pressure to obtain a compound (QD-1) having a naphthoquinone diazide structure which was the following structure.

[CHEM. 29]

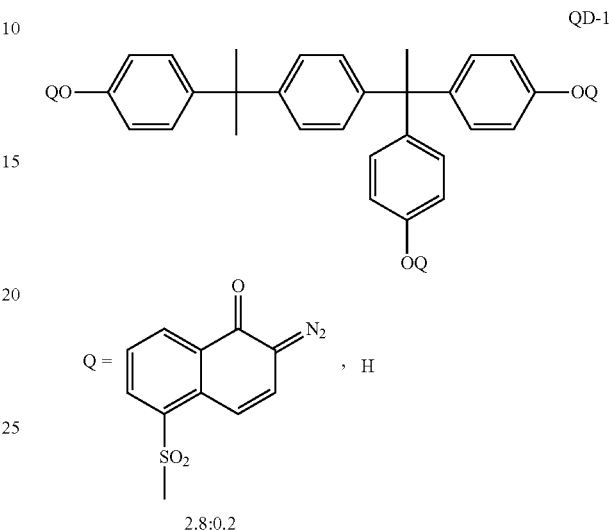

Synthesis Example 1: Synthesis of Polyimide (PI-1)

In a dried nitrogen gas stream, 31.13 g (0.085 mol, i.e., 77.3 mol % relative to the structural unit originating from the entire amines and their derivatives) of BAHF, 1.24 g (0.0050 mol, i.e., 4.5 mol % relative to the structural unit originating from the entire amines and their derivatives) of SiDA, 2.18 g (0.020 mol, i.e., 18.2 mol % relative to the structural unit originating from the entire amines and their derivatives) of MAP as an end-capping agent, and 150.00 g of NMP were weighed and dissolved in a three-necked flask. Into this, a solution in which 31.02 g (0.10 mol, i.e., 100 mol % relative to the structural unit originating from the entire carboxylic acids and their derivatives) of ODPA was dissolved in 50.00 g of NMP was added. Then, stirring was performed at 20° C. for 1 hour and then stirring was performed at 50° C. for 4 hours. After that, 15 g of xylene was added, and stirring was performed 150° C. for 5 hours while the azeotropy of water with xylene was allowed to occur. After the reaction ended, the reaction solution was put into 3L of water and precipitated solid precipitate was obtained by filtration. The obtained solid was washed with water three times and then dried for 24 hours by a vacuum dryer at 80° C. to obtain a polyimide (PI-1). The obtained polyimide (PI-1) had an Mw of 27,000 and an acid equivalent of 350 g/mol.

Synthesis Examples 2 to 11: Synthesis of Polyimides (PI-2) to (PI-11)

Using the species of monomers and their ratios mentioned in Table 1-1, polymerization was conducted in substantially the same manner as in Synthesis Example 1 to obtain polyimides (PI-2) to (PI-11).

Synthesis Example 12: Synthesis of Polybenzo-Oxazole (PBO-1)

34.79 g (0.095 mol, i.e., 95.0 mol % relative to the structural unit originating from the entire amines and their derivatives) of BAHF, 1.24 g (0.0050 mol, i.e., 5.0 mol % relative to the structural unit originating from the entire amines and their derivatives) of SiDA, and 75.00 g of NMP were weighed and dissolved in a 500-mL round-bottom flask equipped with a toluene-filled Dean-Stark water separator and a cooling pipe. Into this, a solution in which 19.06 g (0.080 mol, i.e., 66.7 mol % of the structural unit originating from the entire carboxylic acids and their derivatives) of BFE and 6.57 g (0.040 mol, 33.3 mol % relative to the structural unit originating from the entire carboxylic acids and their derivatives) of NA as an end-capping agent were dissolved in 25.00 g of NMP was added. Then, stirring was performed at 20° C. for 1 hour and subsequently stirring was performed at 50° C. for 1 hour. After that, in a nitrogen atmosphere, heating and stirring was performed at 200° C. or higher for 10 hours to conduct dehydration reaction. After the reaction ended, the reaction solution was put into 3L of water, and precipitated solid precipitate was obtained by filtration. The obtained solid was washed with water three times and dried by a vacuum dryer at 80° C. for 24 hours to obtain a polybenzo-oxazole (PBO-1). The obtained polybenzo-oxazole (PBO-1) had an Mw of 25,000 and an acid equivalent of 330 g/mol.

Synthesis Examples 13 and 14: Synthesis of Polybenzo-Oxazole (PBO-2) and Polybenzo-Oxazole (PBO-3)

Using the species of monomers and their ratios mentioned in Table 1-2, polymerization was conducted in substantially the same manner as in Synthesis Example 12 to obtain a polybenzo-oxazole (PBO-2) and a polybenzo-oxazole (PBO-3).

Synthesis Example 15: Synthesis of Polyimide Precursor (PIP-1)

In a dried nitrogen gas stream, 31.02 g (0.10 mol, i.e., 100 mol % relative to the structural unit originating from the entire carboxylic acids and their derivatives) of ODPA and 150 g of NMP were weighed and dissolved in a three-necked flask. Into this, a solution in which 25.64 g (0.070 mol, i.e., 56.0 mol % relative to the structural unit originating from the entire amines and their derivatives) of BAHF and 1.24 g (0.0050 mol, i.e., 4.0 mol % relative to the structural unit originating from the entire amines and their derivatives) of SiDA were dissolved in 50 g of NMP was added. Then, stirring was performed at 20° C. for 1 hour and subsequently stirring was performed at 50° C. for 2 hours. Next, as an end-capping agent, a solution in which 5.46 g (0.050 mol, i.e., 40.0 mol % relative to the structural unit originating from the entire amines and their derivatives) of MAP was dissolved in 15 g of NMP was added. Then, stirring was performed at 50° C. for 2 hours. After that, a solution in which 23.83 g (0.20 mol) of DFA was dissolved in 15 g of NMP was dropped over a period of 10 minutes. After the dropping ended, stirring was performed at 50° C. for 3 hours. After the reaction ended, the reaction solution was cooled to room temperature. Then, the reaction solution was put into 3 L of water, and precipitated solid precipitated was obtained by filtration. The obtained solid was washed with water three times and was dried by a vacuum dryer at 80° C. for 24 hours to obtain a polyimide precursor (PIP-1) The obtained polyimide precursor (PIP-1) had an Mw of 20,000 and an acid equivalent of 450 g/mol.

Synthesis Example 16 to 25: Synthesis of Polyimide Precursors (PIP-2) to (PIP-11)

Using the species of monomers and their ratios mentioned in Table 1-3, polymerization was conducted in substantially the same manner as in Synthesis Example 15 to obtain polyimide precursors (PIP-2) to (PIP-11).

Synthesis Example 26: Synthesis of Polybenzo-Oxazole Precursor (PBOP-1)

34.79 g (0.095 mol, i.e., 95.0 mol % relative to the structural unit originating from the entire amines and their derivatives) of BAHF, 1.24 g (0.0050 mol, i.e., 5.0 mol % relative to the structural unit originating from the entire amines and their derivatives) of SiDA, and 70.00 g of NMP were weighed and dissolved in a 500-mL round-bottom flask equipped with a toluene-filled Dean-Stark water separator and a cooling pipe. Into this, a solution in which 19.06 g (0.080 mol, i.e., 66.7 mol % relative to structural unit originating from the entire carboxylic acids and their derivatives) of BFE was dissolved in 20.00 g of NMP was added. Then, stirring was performed at 20° C. for 1 hour and subsequently stirring was performed at 50° C. for 2 hours. Next, as an end-capping agent, a solution in which 6.57 g (0.040 mol, i.e., 33.3 mol % relative to the structural unit originating from the entire carboxylic acids and their derivatives) of NA was dissolved in 10 g of NMP was added. Then, stirring was performed at 50° C. for 2 hours. After that, stirring was performed at 100° C. for 2 hours in a nitrogen atmosphere. After the reaction ended, the reaction solution was put into 3 L of water, and precipitated solid precipitate was obtained by filtration. The obtained solid was washed with water three times and then dried by a vacuum dryer at 80° C. for 24 hours to obtain a polybenzo-oxazole precursor (PBOP-1). The obtained polybenzo-oxazole precursor (PBOP-1) had an Mw of 20,000 and an acid equivalent of 330 g/mol.

Synthesis Examples 27 and 28: Synthesis of Polybenzo-Oxazole Precursor (PBOP-2) and Polybenzo-Oxazole Precursor (PBOP-3) Using the species of monomers and their ratios mentioned in Table 1-4, polymerization was conducted in substantially the same manner as in Synthesis Example 12 to obtain a polybenzo-oxazole precursor (PBOP-2) and a polybenzo-oxazole precursor (PBOP-3).

Synthesis Example 29: Synthesis of Polysiloxane Solution (PS-1)

A three-necked flask was charged with 28.95 g (42.5 mol %) of MeTMS, 49.57 g (50 mol %) of PhTMS, and 74.01 g of PGMEA. Air was caused to flow at 0.05 L/min in the flask, and the mixture solution, while being stirred, was heated to 40° C. in an oil bath. While the mixture solution was further being stirred, a phosphoric acid aqueous solution in which 0.442 g of phosphoric acid was dissolved in 27.71 g of water was dropped thereinto over 10 minutes. After the dropping ended, stirring was performed at 40° C. for 30 minutes to hydrolyze silane compounds. After the hydrolysis ended, a solution in which 9.84 g (7.5 mol %) of TMSSucA was dissolved in 8.22 g of PGMEA was added. After that, the bath temperature changed to 70° C. and stirring was performed for 1 hour. Subsequently, the bath temperature was raised up to 115° C. About 1 hour after the temperature rise started, the internal temperature of the solution reached 100° C. For 2 hours following that time, heating and stirring was performed (the internal temperature was 100 to 110° C.). The resin solution obtained by heating and stirring for 2 hours was cooled in an ice bath. Then, an anion exchange resin and a cation exchange resin were each added in an amount of 2 mass % relative to the resin solution, and stirring was performed for 12 hours. After the stirring, the anion exchange resin and the cation exchange resin were removed by filtration to obtain a polysiloxane solution (PS-1). The obtained polysiloxane had an Mw of 4,000 and a carboxylic acid equivalent of 910 g/mol.

Synthesis Example 30: Synthesis of Polysiloxane Solution (PS-2)

A three-necked flask was charged with 27.24 g (40 mol %) of MeTMS, 49.57 g (50 mol %) of PhTMS, 12.32 g (10 mol %) of cyEpoTMS, and 89.74 g of PGMEA. Nitrogen was caused to flow at 0.05 L/min in the flask, and the mixture solution, while being stirred, was heated to 40° C. in an oil bath. While the mixture solution was further being stirred, a phosphoric acid aqueous solution in which 0.267 g of phosphoric acid was dissolved in 27.93 g of water was dropped over a period of 10 minutes. After the dropping ended, stirring was performed at 40° C. for 30 minutes to hydrolyze silane compounds. After the hydrolysis ended, the bath temperature was changed to 70° C. and stirring was performed for 1 hour. Subsequently, the bath temperature was raised up to 115° C. About 2 hours after the temperature rise started, the internal temperature of the solution reached 100° C. For 2 hours following that time, heating and stirring was performed (the internal temperature was 100 to 110° C.). The resin solution obtained by heating and stirring for 2 hours was cooled in an ice bath. Then, an anion exchange resin and a cation exchange resin were each added in an amount of 2 mass % relative to the resin solution, and stirring was performed for 12 hours. After the stirring, the anion exchange resin and the cation exchange resin were removed by filtration to obtain a polysiloxane solution (PS-2). The obtained polysiloxane had an Mw of 4,200.

Synthesis Examples 31 to 34

Using the species of monomers and their ratios mentioned in Table 1-5, polymerization was conducted in substantially the same manner as in Synthesis Example 29 to obtain polysiloxane solutions (PS-3) to (PS-6).

Synthesis Example 35: Synthesis of Polysiloxane Solution (PS-7)

A three-necked flask was charged with 13.62 g (20 mol %) of MeTMS, 49.57 g (50 mol %) of PhTMS, 23.43 g (20 mol %) of AcrTMS, and 89.84 g of PGMEA. Nitrogen was caused to flow at 0.05 L/min in the flask, and the mixture solution, while being stirred, was heated to 40° C. in an oil bath. While the mixture solution was further being stirred, a phosphoric acid aqueous solution in which 0.499 g of phosphoric acid was dissolved in 27.93 g of water was added over a period of 10 minutes. After the addition ended, stirring was performed at 40° C. for 30 minutes to hydrolyze silane compounds. After the hydrolysis ended, a solution in which 13.12 g (10 mol %) of TMSSucA was dissolved in 9.98 g of PGMEA was added. After that, the bath temperature was changed to 70° C. and stirring was performed for 1 hour. Subsequently, the bath temperature was raised up to 115° C. About 1 hour after the temperature rise started, the internal temperature of the solution reached 100° C. For 2 hours following that time, heating and stirring was performed (the internal temperature was 100 to 110° C.). The resin solution obtained by heating and stirring for 2 hours was cooled in an ice bath. Then, an anion exchange resin and a cation exchange resin were each added in an amount of 2 mass % relative to the resin solution and stirring was performed for 12 hours. After the stirring, the anion exchange resin and the cation exchange resin were removed by filtration to obtain a polysiloxane solution (PS-7) The obtained polysiloxane had an Mw of 5,200, a carboxylic acid equivalent of 800 g/mol, and a double bond equivalent of 800 g/mol.

Synthesis Example 36

Using the ratios mentioned in Table 1-5, polymerization was conducted in substantially the same manner as in Synthesis Example 35 to obtain a polysiloxane solution (PS-8).

Synthesis Examples 37 to 39

Using the species of monomers and their ratios mentioned in Table 1-5, polymerization was conducted in substantially the same manner as in Synthesis Example 29 to obtain polysiloxane solutions (PS-9) to (PS-11).

Synthesis Example 40: Synthesis of Cardo Based Resin (CD-1)

35.04 g (0.10 mol) of BHPF and 40.31 g of MBA were weighed and dissolved in a three-necked flask. Into this, a solution in which 27.92 g (0.090 mol) of ODPA and, as an end-capping agent, 2.96 g (0.020 mol) of PHA were dissolved in 30.00 g of MBA was added, and then stirring was performed at 20° C. for 1 hour. After that, stirring was performed at 150° C. for 5 hours in a nitrogen atmosphere. After the reaction ended, a solution in which 14.22 g (0.10 mol) of GMA, 0.135 g (0.0010 mol) of DBA, and 0.037 g (0.0003 mol) of 4-MOP were dissolved in 10.00 g of MBA was added into the obtained solution, and stirring was performed at 90° C. for 4 hours to obtain a cardo based resin solution (CD-1). The obtained cardo based resin had an Mw of 4,000, a carboxylic acid equivalent of 800 g/mol, and a double bond equivalent of 800 g/mol.

Synthesis Example 41: Cardo Based Resin (CD-2)

Using the species of monomers and their ratios mentioned in Table 1-6, polymerization was conducted in substantially the same manner as in Synthesis Example 40 to obtain a cardo based resin solution (CD-2).

Synthesis Example 42: Synthesis of Cardo Based Resin (CD-3)

35.04 g (0.10 mol) of BHPF and 54.52 g of MBA were weighed and dissolved in a three-necked flask. Into this, a solution in which 28.43 g (0.20 mol) of GMA, 0.135 g (0.0010 mol) of DBA, and 0.037 g (0.0003 mol) of 4-MOP were dissolved in 10.00 g of MBA was added, and stirring was performed at 90° C. for 4 hours. After the reaction ended, a solution in which 27.92 g (0.090 mol) of ODPA and, as an end-capping agent, 2.96 g (0.020 mol) of PHA were dissolved in 30.00 g of MBA was added, and stirring was performed at 20° C. for 1 hour. After that, stirring was performed at 150° C. for 5 hours in a nitrogen atmosphere to obtain a cardo based resin solution (CD-3). The obtained cardo based resin had an Mw of 4,700, a carboxylic acid equivalent of 470 g/mol, and a double bond equivalent of 470 g/mol.

Synthesis Example 43: Synthesis of Cardo Based Resin (CD-4)

46.25 g (0.10 mol) of BGPF and 49.98 g of MBA were weighed and dissolved in a three-necked flask. Into this, a solution in which 31.16 g (0.090 mol) of ODPAc and, as an end-capping agent, 2.44 g (0.020 mol) of BZAc were dissolved in 30.00 g of MBA was added, and stirring was performed at 20° C. for 1 hour. After that, stirring was performed at 150° C. for 5 hours in a nitrogen atmosphere. After the reaction ended, a solution in which 9.95 g (0.07 mol) of GMA, 0.135 g (0.0010 mol) of DBA, and 0.037 g (0.0003 mol) of 4-MOP were dissolved in 10.00 g of MBA was added into the obtained solution, and stirring was performed at 90° C. for 4 hours to obtain a cardo based resin solution (CD-4). The obtained cardo based resin had an Mw of 5,500, a carboxylic acid equivalent of 1,000 g/mol, and a double bond equivalent of 1,580 g/mol.

Synthesis Example 44: Cardo Based Resin (CD-5)

Using the species of monomers and their ratios mentioned in Table 1-6, polymerization was conducted in substantially the same manner as in Synthesis Example 43 to obtain a cardo based resin solution (CD-5).

Synthesis Example 45: Synthesis of Cardo Based Resin (CD-6)

46.25 g (0.10 mol) of BGPF and 54.53 g of MBA were weighed and dissolved in a three-necked flask. Into this, a solution in which 17.22 g (0.20 mol) of MAA, 0.135 g (0.0010 mol) of DBA, and 0.037 g (0.0003 mol) of 4-MOP were dissolved in 10.00 g of MBA was added, and stirring was performed at 90° C. for 4 hours. After that, a solution in which 27.92 g (0.090 mol) of ODPA and, as an end-capping agent, 2.96 g (0.020 mol) of PHA were dissolved in 30.00 g of MBA was added, and stirring was performed at 20° C. for 1 hour. After that, stirring was performed at 150° C. for 5 hours in an nitrogen atmosphere to obtain a cardo based resin solution (CD-6). The obtained cardo based resin had an Mw of 4,700, a carboxylic acid equivalent of 470 g/mol, and a double bond equivalent of 470 g/mol.

Synthesis Example 46: Synthesis of Acrylic Resin Solution (AC-1)

A three-necked flask was charged with 0.821 g (1 mol %) of AIBN and 29.29 g of PGMEA. Next, 21.52 g (50 mol %) of MAA, 22.03 g (20 mol %) of TCDM, and 15.62 g (30 mol %) of STR were charged thereinto, and stirring was performed for a while at room temperature. After the inside of the flask was subjected to sufficient nitrogen substitution by bubbling, stirring was performed at 70° C. for 5 hours. Next, a solution in which 14.22 g (20 mol %) of GMA, 0.676 g (1 mol %) of DBA, and 0.186 g (0.3 mol %) of 4-MOP were dissolved in 59.47 g of PGMEA was added to the obtained solution, and stirring was performed at 90° C. for 4 hours to obtain an acrylic resin solution (AC-1). The obtained acrylic resin had an Mw of 15,000, a carboxylic acid equivalent of 490 g/mol, and a double bond equivalent of 730 g/mol.

Synthesis Examples 47 and 48: Synthesis of Acrylic Resin (AC-2) and Acrylic Resin (AC-3)

Using the species of monomers and their ratios mentioned in Table 1-7, polymerization was conducted in substantially the same manner as in Synthesis Example 46 to obtain an acrylic resin solution (AC-2) and an acrylic resin solution (AC-3).

Compositions of Synthesis Examples 1 to 48 are collectively indicated in Tables 1-1 to 1-7.

TABLE 1-1

| | | Monomer [mole ratio] | | | | | Structural unit originating from monomer having fluorine atom in structure unit originating from entire carboxylic acids derivatives [mol %] | Structural unit originating from monomer having fluorine atom in structure unit originating from entire amines derivatives [mol %] |
|---|---|---|---|---|---|---|---|---|
| | Polymer | Tetracarboxylic acid and its derivative | | Diamine and its derivative | | End-capping agent | | |
| Synthesis example 1 | Polyimide (PI-1) | ODPA (100) | — | BAHF (85) | — | SiDA (5) | MAP (20) | 0.0 | 77.3 |
| Synthesis example 2 | Polyimide (PI-2) | ODPA (100) | — | BAHF (35) | HFHA (50) | SiDA (5) | MAP (20) | 0.0 | 77.3 |
| Synthesis example 3 | Polyimide (PI-3) | ODPA (100) | — | BAHF (35) | Bis-A-AF (50) | SiDA (5) | MAP (20) | 0.0 | 77.3 |
| Synthesis example 4 | Polyimide (PI-4) | ODPA (100) | — | BAHF (35) | TFMB (50) | SiDA (5) | MAP (20) | 0.0 | 77.3 |
| Synthesis example 5 | Polyimide (PI-5) | ODPA (60) | 6FDA (40) | BAHF (85) | — | SiDA (5) | MAP (20) | 40.0 | 77.3 |
| Synthesis example 6 | Polyimide (PI-6) | ODPA (40) | 6FDA (60) | BAHF (85) | — | SiDA (5) | MAP (20) | 60.0 | 77.3 |
| Synthesis example 7 | Polyimide (PI-7) | — | 6FDA (100) | BAHF (85) | — | SiDA (5) | MAP (20) | 100.0 | 77.3 |
| Synthesis example 8 | Polyimide (PI-8) | ODPA (100) | — | BAHF (60) | 4,4'-DAE (25) | SiDA (5) | MAP (20) | 0.0 | 54.5 |

TABLE 1-1-continued

| | Polymer | Monomer [mole ratio] | | | | | Structural unit originating from monomer having fluorine atom in structure unit originating from entire carboxylic acids derivatives [mol %] | Structural unit originating from monomer having fluorine atom in structure unit originating from entire amines derivatives [mol %] |
|---|---|---|---|---|---|---|---|---|
| | | Tetracarboxylic acid and its derivative | | Diamine and its derivative | | End-capping agent | | |
| Synthesis example 9 | Polyimide (PI-9) | ODPA (100) | — | BAHF (60) | ED-900 (25) | SiDA (5) | MAP (20) | 0.0 | 54.5 |
| Synthesis example 10 | Polyimide (PI-10) | ODPA (100) | — | BAHF (40) | BAPF (45) | SiDA (5) | MAP (20) | 0.0 | 36.4 |
| Synthesis example 11 | Polyimide (PI-11) | ODPA (50) | BSAA (50) | BAHF (85) | — | SiDA (5) | MAP (20) | 0.0 | 77.3 |

TABLE 1-2

| | Polymer | Monomer [mole ratio] | | | | | Structural unit originating from monomer having fluorine atom in structure unit originating from entire carboxylic acids derivatives [mol %] | Structural unit originating from monomer having fluorine atom in structure unit originating from entire amines derivatives [mol %] |
|---|---|---|---|---|---|---|---|---|
| | | Dicarboxylic acid and its derivative Diformyl compound and its derivative | Bisaminophenol compound and its derivative Dihydroxy diamine and its derivative | | | End-capping agent | | |
| Synthesis example 12 | Polybenzo-oxazole (PBO-1) | BFE (80) | BAHF (95) | — | SiDA (5) | NA (40) | 0.0 | 95.0 |
| Synthesis example 13 | Polybenzo-oxazole (PBO-2) | BFE (80) | BAHF (60) | BAPF (35) | SiDA (5) | NA (40) | 0.0 | 60.0 |
| Synthesis example 14 | Polybenzo-oxazole (PBO-3) | BFE (80) | BAHF (40) | BAPF (55) | SiDA (5) | NA (40) | 0.0 | 40.0 |

TABLE 1-3

| | Polymer | Monomer [mole ratio] | | | | | Structural unit originating from monomer having fluorine atom in structure unit originating from entire carboxylic acids derivatives [mol %] | Structural unit originating from monomer having fluorine atom in structure unit originating from entire amines derivatives [mol %] |
|---|---|---|---|---|---|---|---|---|
| | | Tetracarboxylic acid and its derivative | | Diamine and its derivative | | End-capping agent | | |
| Synthesis example 15 | Polyimide precursor (PIP-1) | 6FDA (100) | — | BAHF (70) | — | SiDA (5) | MAP (50) | 100.0 | 56.0 |
| Synthesis example 16 | Polyimide precursor (PIP-2) | 6FDA (100) | — | BAHF (40) | HFHA (30) | SiDA (5) | MAP (50) | 100.0 | 56.0 |
| Synthesis example 17 | Polyimide precursor (PIP-3) | 6FDA (100) | — | BAHF (40) | Bis-A-AF (30) | SiDA (5) | MAP (50) | 100.0 | 56.0 |
| Synthesis example 18 | Polyimide precursor (PIP-4) | 6FDA (100) | — | BAHF (40) | TFMB (30) | SiDA (5) | MAP (50) | 100.0 | 56.0 |
| Synthesis example 19 | Polyimide precursor (PIP-5) | 6FDA (60) | ODPA (40) | BAHF (70) | — | SiDA (5) | MAP (50) | 60.0 | 56.0 |
| Synthesis example 20 | Polyimide precursor (PIP-6) | 6FDA (40) | ODPA (60) | BAHF (70) | — | SiDA (5) | MAP (50) | 40.0 | 56.0 |

TABLE 1-3-continued

| | Polymer | Monomer [mole ratio] | | | | | Structural unit originating from monomer having fluorine atom in structure unit originating from entire carboxylic acids derivatives [mol %] | Structural unit originating from monomer having fluorine atom in structure unit originating from entire amines derivatives [mol %] |
|---|---|---|---|---|---|---|---|---|
| | | Tetracarboxylic acid and its derivative | | Diamine and its derivative | | End-capping agent | | |
| Synthesis example 21 | Polyimide precursor (PIP-7) | 6FDA (100) | — | BAHF (85) | — | SiDA (5) | MAP (20) | 100.0 | 77.3 |
| Synthesis example 22 | Polyimide precursor (PIP-8) | 6FDA (100) | — | BAHF (60) | 4,4'-DAE (25) | SiDA (5) | MAP (20) | 100.0 | 54.5 |
| Synthesis example 23 | Polyimide precursor (PIP-9) | 6FDA (100) | — | BAHF (60) | ED-900 (25) | SiDA (5) | MAP (20) | 100.0 | 54.5 |
| Synthesis example 24 | Polyimide precursor (PIP-10) | 6FDA (100) | — | BAHF (40) | BAPF (45) | SiDA (5) | MAP (20) | 100.0 | 36.4 |
| Synthesis example 25 | Polyimide precursor (PIP-11) | 6FDA (70) | BSAA (30) | BAHF (85) | — | SiDA (5) | MAP (20) | 70.0 | 77.3 |

TABLE 1-4

| | Polymer | Monomer [mole ratio] | | | | | Structural unit originating from monomer having fluorine atom in structure unit originating from entire carboxylic acids derivatives [mol %] | Structural unit originating from monomer having fluorine atom in structure unit originating from entire amines derivatives [mol %] |
|---|---|---|---|---|---|---|---|---|
| | | Dicarboxylic acid and its derivative Diformyl compound and its derivative | | Bisaminophenol compound and its derivative Dihydroxy diamine and its derivative | | End-capping agent | | |
| Synthesis example 26 | Polybenzo-oxazole precursor (PBOP-1) | BFE (80) | | BAHF (95) | — | SiDA (5) | NA (40) | 0.0 | 95.0 |
| Synthesis example 27 | Polybenzo-oxazole precursor (PBOP-2) | BFE (80) | | BAHF (60) | BAPF (35) | SiDA (5) | NA (40) | 0.0 | 60.0 |
| Synthesis example 28 | Polybenzo-oxazole precursor (PBOP-3) | BFE (80) | | BAHF (40) | BAPF (55) | SiDA (5) | NA (40) | 0.0 | 40.0 |

TABLE 1-5

| | Polymer | Monomer [mol %] | | | | | | Structural unit originating from organosilane having fluorine atom in polysiloxane [mol %] | Structural unit originating from organosilane having aromatic group in polysiloxane [mol %] |
|---|---|---|---|---|---|---|---|---|---|
| | | Trifunctional organosilane | | | Tetra-functional organosilane Tetra-functional organosilane oligomer | Difunc-tional organosilane Mono-functional organosilane | | | |
| Synthesis example 29 | Polysiloxane solution (PS-1) | MeTMS (42.5) | PhTMS (50) | TMSSucA (7.5) | — | — | — | 0.0 | 50.0 |
| Synthesis example 30 | Polysiloxane solution (PS-2) | MeTMS (40) | PhTMS (50) | cyEpoTMS (10) | — | — | — | 0.0 | 50.0 |
| Synthesis example 31 | Polysiloxane solution (PS-3) | MeTMS (32.5) | PhTMS (50) | TMSSucA (7.5) | TMOS (10) | — | — | 0.0 | 50.0 |

TABLE 1-5-continued

| | | Monomer [mol %] | | | | | | Structural unit originating from organosilane having fluorine atom in polysiloxane [mol %] | Structural unit originating from organosilane having aromatic group in polysiloxane [mol %] |
|---|---|---|---|---|---|---|---|---|---|
| | Polymer | Trifunctional organosilane | | | Tetrafunctional organosilane Tetrafunctional organosilane oligomer | Difunctional organosilane Monofunctional organosilane | | | |
| Synthesis example 32 | Polysiloxane solution (PS-4) | MeTMS (32.5) | PhTMS (50) | TMSSucA (7.5) | — | — | DMeDMS (10) | 0.0 | 50.0 |
| Synthesis example 33 | Polysiloxane solution (PS-5) | MeTMS (32.5) | PhTMS (50) | TMSSucA (7.5) | TFPrTMS (10) | — | — | 10.0 | 50.0 |
| Synthesis example 34 | Polysiloxane solution (PS-6) | MeTMS (22.5) | PhTMS (50) | TMSSucA (7.5) | TFPrTMS (20) | — | — | 20.0 | 50.0 |
| Synthesis example 35 | Polysiloxane solution (PS-7) | MeTMS (20) | PhTMS (50) | TMSSucA (10) | AcrTMS (20) | — | — | 0.0 | 50.0 |
| Synthesis example 36 | Polysiloxane solution (PS-8) | MeTMS (10) | PhTMS (50) | TMSSucA (10) | AcrTMS (30) | — | — | 0.0 | 50.0 |
| Synthesis example 37 | Polysiloxane solution (PS-9) | MeTMS (17.5) | PhTMS (65) | TMSSucA (7.5) | — | TMOS (10) | — | 0.0 | 65.0 |
| Synthesis example 38 | Polysiloxane solution (PS-10) | MeTMS (47.5) | PhTMS (35) | TMSSucA (7.5) | — | TMOS (10) | — | 0.0 | 35.0 |
| Synthesis example 39 | Polysiloxane solution (PS-11) | MeTMS (40) | NapTMS (50) | TMSSucA (10) | — | — | — | 0.0 | 50.0 |

TABLE 1-6

| | Polymer | Monomer [mole ratio] | | | | | | Structural unit originating from monomer having fluorine atom in structure unit originating from entire carboxylic acids derivatives [mol %] | Structural unit originating from monomer having aromatic group in structure unit originating from entire carboxylic acids derivatives [mol %] |
|---|---|---|---|---|---|---|---|---|---|
| | | Compound having two or more aromatic groups and hydroxy group | Compound having two or more aromatic groups and epoxy group | Tetracarboxylic dianhydride Tetracarboxylic acid | End-capping agent | Unsaturated compound having ethylenic unsaturated double bond group and epoxy group | Unsaturated carboxylic acid having ethylenic unsaturated double bond group | | |
| Synthesis example 40 | Cardo based resin (CD-1) | BHPF (100) | — | ODPA (90) | PHA (20) | GMA (100) | — | 0.0 | 100.0 |
| Synthesis example 41 | Cardo based resin (CD-2) | BHEF (100) | — | 6FDA (90) | PHA (20) | GMA (100) | — | 81.8 | 100.0 |
| Synthesis example 42 | Cardo based resin (CD-3) | BHPF (100) | — | ODPA (90) | PHA (20) | GMA (200) | — | 0.0 | 100.0 |
| Synthesis example 43 | Cardo based resin (CD-4) | — | BGPF (100) | ODPAc (90) | BZAc (20) | GMA (70) | — | 0.0 | 100.0 |
| Synthesis example 44 | Cardo based resin (CD-5) | — | BGEF (100) | 6FDAc (90) | BZAc (20) | GMA (70) | — | 81.8 | 100.0 |
| Synthesis example 45 | Cardo based resin (CD-6) | — | BGPF (100) | ODPA (90) | PHA (20) | — | MAA (200) | 0.0 | 100.0 |

TABLE 1-7

| | Polymer | Monomer [mole ratio] | | | | | Structural unit originating from monomer having fluorine atom in structural unit originating from entire copolymerization components [mol %] | Structural unit originating from monomer having aromatic group in structural unit originating from entire copolymerization components [mol %] |
|---|---|---|---|---|---|---|---|---|
| | | Copolymerization component having acidic group | Copolymerization component having aromatic group | Copolymerization component having alicyclic group | Copolymerization component having aliphatic group | Unsaturated compound having ethylenic unsaturated double bond group and epoxy group | | |
| Synthesis example 46 | Acrylic resin solution (AC-1) | MAA (50) | STR (30) | TCDM (20) | — | GMA (20) | 0.0 | 30.0 |
| Synthesis example 47 | Acrylic resin solution (AC-2) | MAA (50) | BnMA (30) | TCDM (20) | — | GMA (20) | 0.0 | 30.0 |
| Synthesis example 48 | Acrylic resin solution (AC-3) | MAA (50) | STR (30) | — | TFEMA (20) | GMA (20) | 20.0 | 30.0 |

Preparation Example 1: Preparation of Pigment Dispersion Liquid (Bk-1)

184.0 g of a 30 mass % MBA solution of the polyimide (PI-1) obtained in Synthesis Example 1 as a resin, 653.2 g of MBA as a solvent, and 82.8 g of Bk-S0100CF as a coloring agent were weighed and mixed, and stirring was performed for 20 minutes using a high-speed dispersion machine (Homodisper Model 2.5, made by PRIMIX Corporation) to obtain a tentative dispersion liquid. An Ultra Apex Mill (UAM-015, made by KOTOBUKI KOGYOU CO., LTD) having a centrifugal separation separator filled 75% with a ø0.30-mm ground zirconia ball (YTZ, made by Tosoh Corporation) as ceramic beads for pigment dispersion was supplied with the obtained tentative dispersion liquid, which was thereby processed at a rotor peripheral speed of 7.0 m/s for 3 hours to obtain a pigment dispersion liquid (Bk-1) with a solid content concentration of 15 mass % and a coloring agent/resin=60/40 (weight ratio). The pigment in the obtained pigment dispersion liquid had a number average particle diameter of 120 nm.

Preparation Example 2: Preparation of Pigment Dispersion Liquid (Bk-2)

138.0 g of a 30-mass % MBA solution of the polyimide (PI-1) obtained in Synthesis Example 1 as a resin, 13.8 g of S-20000 as a dispersing agent, 685.4 g of MBA as a solvent, and 82.8 g of Bk-S0100CF as a coloring agent were weighed and mixed, and then stirred for 20 minutes by using a high-speed dispersion machine (Homodisper Model 2.5, made by PRIMIX Corporation) to obtain a tentative dispersion liquid. An Ultra Apex Mill (UAM-015, made by KOTOBUKI KOGYOU CO., LTD) having a centrifugal separation separator filled 75% with a ø0.30-mm ground zirconia ball (YTZ, made by Tosoh Corporation) as ceramic beads for pigment dispersion was supplied with the obtained tentative dispersion liquid, which was then processed at a rotor peripheral speed of 7.0 m/s for 3 hours to obtain a pigment dispersion liquid (Bk-2) with a solid content concentration of 15 mass % and a coloring agent/resin/dispersing agent=60/30/10 (weight ratio) The pigment in the obtained pigment dispersion liquid had a number average particle diameter of 100 nm.

Preparation Examples 3 to 16: Preparation of Pigment Dispersion Liquids (Bk-3) to (Bk-16)

Using the kinds of coloring agents, the kinds of (A1) first resins, the kinds of (A2) second resins, and the kinds of (E) dispersing agents, and their ratios mentioned in Table 2, pigment dispersion liquids (Bk-3) to (Bk-16) were obtained by performing pigmentation dispersion in substantially the same manner as in Preparation Example 2.

The compositions of Preparation Examples 1 to 16 are collectively indicated in Table 2.

TABLE 2

| | Dispersion liquid | Composition [mass %] | | | | | Number average particle diameter of pigment in pigment dispersion liquid [nm] |
|---|---|---|---|---|---|---|---|
| | | Coloration agent | | | (A1) First resin | (A2) Second resin | (E) Dispersing agent | |
| Preparation example 1 | Pigment dispersion liquid (Bk-1) | Bk-S0100CF (60) | — | — | Polyimide (PI-1) (40) | — | — | 120 |
| Preparation example 2 | Pigment dispersion liquid (Bk-2) | Bk-S0100CF (60) | — | — | Polyimide (PI-1) (30) | — | S-20000 (10) | 100 |
| Preparation example 3 | Pigment dispersion liquid (Bk-3) | Bk-S0100CF (60) | — | — | Polyimide (PI-7) (30) | — | S-20000 (10) | 100 |
| Preparation example 4 | Pigment dispersion liquid (Bk-4) | Bk-S0100CF (60) | — | — | Polyimide (PI-9) (30) | — | S-20000 (10) | 100 |

TABLE 2-continued

| Dispersion liquid | Coloration agent | | | (A1) First resin | (A2) Second resin | (E) Dispersing agent | Number average particle diameter of pigment in pigment dispersion liquid [nm] |
|---|---|---|---|---|---|---|---|
| Preparation example 5 — Pigment dispersion liquid (Bk-5) | Bk-S0100CF (60) | — | — | Polybenzo-oxazole (PBO-1) (30) | — | S-20000 (10) | 100 |
| Preparation example 6 — Pigment dispersion liquid (Bk-6) | Bk-S0100CF (60) | — | — | — | Polyimide precursor (PIP-1) (20) | S-20000 (20) | 110 |
| Preparation example 7 — Pigment dispersion liquid (Bk-7) | Bk-S0100CF (60) | — | — | — | Polybenzo-oxazole precursor (PBOP-1) (20) | S-20000 (20) | 100 |
| Preparation example 8 — Pigment dispersion liquid (Bk-8) | Bk-S0100CF (60) | — | — | — | Polysiloxane (PS-1) (20) | S-20000 (20) | 100 |
| Preparation example 9 — Pigment dispersion liquid (Bk-9) | Bk-S0100CF (60) | — | — | — | Cardo based resin (CD-1) (20) | S-20000 (20) | 110 |
| Preparation example 10 — Pigment dispersion liquid (Bk-10) | Bk-S0100CF (60) | — | — | — | acrylic resin (AC-1) (20) | S-20000 (20) | 110 |
| Preparation example 11 — Pigment dispersion liquid (Bk-11) | Bk-S0100CF (50) | P.B.15:6 (10) | — | Polyimide (PI-1) (30) | — | S-20000 (10) | 100 |
| Preparation example 12 — Pigment dispersion liquid (Bk-12) | Bk-S0084 (60) | — | — | Polyimide (PI-1) (20) | — | D.BYK-167 (20) | 120 |
| Preparation example 13 — Pigment dispersion liquid (Bk-13) | Bk-S0084 (60) | — | — | Polyimide (PI-7) (20) | — | D.BYK-167 (20) | 120 |
| Preparation example 14 — Pigment dispersion liquid (Bk-14) | TPK-1227 (60) | — | — | Polyimide (PI-1) (20) | — | D.BYK-167 (20) | 120 |
| Preparation example 15 — Pigment dispersion liquid (Bk-15) | P.R.254 (21) | P.Y.139 (9) | P.B.15:6 (30) | Polyimide (PI-1) (20) | — | D.BYK-167 (20) | 110 |
| Preparation example 16 — Pigment dispersion liquid (Bk-16) | P.V.23 (51) | P.Y.139 (9) | — | Polyimide (PI-1) (20) | — | D.BYK-167 (20) | 110 |

Evaluation methods in Examples and Comparative Examples will be indicated below.

(1) Weight-average Molecular Weight of Resin

Using a GPC analyzer apparatus (HLC-8220, made by Tosoh Corporation) and using THF or NMP as a fluid bed, the weight-average molecular weight in terms of polystyrene was measured and determined by a method near normal temperature on the basis of "JIS K7252-3(2008)".

(2) Alkali Dissolution Speed of Resin

A solution in which a resin was dissolved in γ-butyrolactone was applied onto an Si wafer by spin coating, using a spin coater (MS-A100, made by Mikasa Co., Ltd.) at an arbitrary rotation speed. Then, using a hot plate (SCW-636, made by DAINIPPON SCREEN MFG. CO., LTD.), prebake was performed at 120° C. for 4 minutes to create a prebaked film having a film thickness of 10.0 μm±0.5 μm.

The created prebaked film was developed with a 2.38-mass % TMAH aqueous solution for 60 seconds by using a small-size development apparatus for photolithography (AD-2000, made by TAKIZAWA CO., LTD.) and then rinsed with water for 30 seconds. After that, a film thickness reduction value was calculated as an alkali dissolution speed (whose unit is nm/min), according to the following expression.

Film thickness reduction value=pre-development film thickness value−post-development film thickness value (3) Acid Value, Acid Equivalent Using an automatic electric potential difference titration apparatus (AT-510, made by Kyoto Electronics Manufacturing Co., Ltd.) and using a 0.1 mol/L NaOH/ethanol solution as a titration reagent and xylene/DMF=1/1 (weight ratio) as a titration solvent, an acid value (whose unit is mgKOH/g) was measured and determined by an electric potential difference titration method on the basis of "JIS K2501(2003)". From the value of the measured acid value, an acid equivalent (whose unit is g/mol) and a carboxylic acid equivalent (whose unit is g/mol) were calculated.

(4) Amine Value, Amine Equivalent

Using an automatic electric potential difference titration apparatus (AT-510, made by Kyoto Electronics Manufacturing Co., Ltd.) and using a 0.1 mol/L HCl aqueous solution as a titration reagent and THF as a titration solvent, an amine value (whose unit is mgKOH/g) was measured and determined by an electric potential difference titration method on the basis of "JIS K2501(2003)". From the value of the measured amine value, an amine equivalent (whose unit is g/mol) was calculated.

(5) Double Bond Equivalent

Using an automatic electric potential difference titration apparatus (AT-510, made by Kyoto Electronics Manufacturing Co., Ltd.) and using an ICl solution (mixture solution of $ICl_3$=7.9 g, $I_2$=8.9 g, and AcOH (acetic acid)=1,000 mL) as an iodine supply source, a 100 g/L KI aqueous solution as an aqueous solution for trapping unreacted iodine, and a 0.1 mol/L $Na_2S_2O_3$ aqueous solution as a titration reagent, the iodine value of the resin was measured by a Wijs method on the basis of the method described in "Article 6: Iodine Value" of JIS K0070:1992 "Test Method for Acid Value, Saponification Value, Ester Value, Iodine Value, Hydroxyl Value, and Unsaponifiable Matter of Chemical Product". From the value of the measured iodine value (whose unit is gI/100 g), a double bond equivalent (whose unit is g/mol) was calculated.

(6) Content Ratios of Organosilane Units in Polysiloxane

Measurement of $^{29}$Si-NMR was performed and the percentage of an integrated value of Si originating from a specific organosilane unit with respect to the integrated value of the entire Si originating from organosilane was calculated to compute the content ratios thereof. Specimens (liquid) were injected into NMR sample pipes made of "Teflon" (registered trademark) having a diameter of 10 mm, for use in measurement. $^{29}$Si-NMR measurement conditions are indicated below.

Apparatus: a nuclear magnetic resonance apparatus (JNM-GX270, made by JEOL Ltd.)
Measurement method: a gated decoupling method
Measurement nuclear frequency: 53.6693 MHz ($^{29}$Si nucleus)
Spectrum width: 20000 Hz
Pulse width: 12 μs (45° pulse)
Pulse repetition time: 30.0 seconds
Solvent: acetone-d6
Reference matter: tetramethylsilane
Measurement temperature: 23° C.
Specimen rotation speed: 0.0 Hz (7) Number Average Particle Diameter of Pigment Using a zeta potential/particle diameter/molecular weight measurement apparatus (Zeta Sizer Nano ZS, made by SYSMEX CORPORATION) and using PGMEA as a diluting solvent, a pigment dispersion liquid was diluted to a concentration of $1.0 \times 10^{-5}$ to 40 vol %. The refractive index of the diluting solvent was set to the refractive index of the PGMEA and the refractive index of the measurement subject was set to 1.8. Then, laser light of 633 nm wavelength was applied to measure a number average particle diameter of the pigment in the pigment dispersion liquid.

(8) Pre-process of Substrate

A glass substrate with a film of ITO formed by sputtering (made by GEOMATEC Co., Ltd.; hereinafter, referred to as "ITO substrate") was used without performing a pre-process. An Si wafer (made by ELECTRONICS AND MATERIALS CORPORATION LIMITED) was subjected to a dehydration bake process by heating at 130° C. for 2 minutes through the use of a hot plate (HP-1SA, made by AS ONE Corporation) and then was used. A polyimide film, Kapton (registered trademark)-150EN-C(made by DU PONT-TORAY CO., LTD.; hereinafter, "PI film substrate") was used without performing a pre-process. A polyethylene terephthalate film, Lumirror (registered trademark) U34 (made by Toray Industries, Inc.; hereinafter, "PET film substrate") was used without performing a pre-process.

(9) Film Thickness Measurement

Using a surface roughness/contour shape measuring machine (SURFCOM 1400D, made by TOKYO SEIMITSU CO., LTD.), post-prebake, post-development, and post-thermosetting film thicknesses were measured, with the measurement magnification being 10,000 times, the measurement length being 1.0 mm, and the measurement speed being 0.30 mm/s.

(10) Sensitivity

In a method described below in Example 1, a both-surface alignment one-side surface exposure apparatus (Mask Aligner PEM-6M, made by Union Optical Co., Ltd.) was used to perform patterning exposure to an i ray (365 nm wavelength), an h ray (405 nm wavelength), and a g ray (436 nm wavelength) of a super high pressure mercury lamp, via a gray scale mask (MDRM MODEL 4000-5-FS, made by Opto-Line International) for sensitivity measurement. Then, development was performed by using a small-size development apparatus for photolithography (AD-2000, made by TAKIZAWA CO., LTD.), so that a post-development film of the composition was created.

Using an FPD inspection microscope (MX-61L, made by Olympus Corporation), the resolution pattern of the created post-development film was observed. An amount of exposure (value from an i-ray illuminometer) that forms a 20-μm line-and-space pattern with a 1-to-1 width was determined as the sensitivity.

(11) Resolution

In a method described below in Example 1, a both-surface alignment one-side surface exposure apparatus (Mask Aligner PEM-6M, made by Union Optical Co., Ltd.) was used to perform patterning exposure to an i ray (365 nm wavelength), an h ray (405 nm wavelength), and a g ray (436 nm wavelength) of a super high pressure mercury lamp, via a gray scale mask (MDRM MODEL 4000-5-FS, made by Opto-Line International) for sensitivity measurement. Then, development was performed by using a small-size development apparatus for photolithography (AD-2000, made by TAKIZAWA CO., LTD.). Then, using a High-Temperature Inert Gas Oven (INH-9CD-S, made by Koyo Thermo Systems Co., Ltd.), a cured film of the composition was created.

Using an FPD inspection microscope (MX-61L, made by Olympus Corporation), the resolution pattern of the created cured film was observed. A measure of the minimum pattern of line-and-space patterns obtained without residue was determined as a resolution.

(12) Cross Sectional Shape of Pattern

In a method described below in Example 1, a both-surface alignment one-side surface exposure apparatus (Mask Aligner PEM-6M, made by Union Optical Co., Ltd.) was used to perform patterning exposure to an i ray (365 nm wavelength), an h ray (405 nm wavelength), and a g ray (436 nm wavelength) of a super high pressure mercury lamp, via a gray scale mask (MDRM MODEL 4000-5-FS, made by Opto-Line International) for sensitivity measurement. Then, development was performed by using a small-size development apparatus for photolithography (AD-2000, made by TAKIZAWA CO., LTD.). Then, using a High-Temperature Inert Gas Oven (INH-9CD-S, made by Koyo Thermo Systems Co., Ltd.), a cured film of the composition was created.

An electric field emission type scanning electron microscope (S-4800, made by Hitachi High-Technologies Corporation) was used to observe a cross-section of a line-and-space pattern having a space measure width of 20 μm, among the resolution patterns of the created cured film, and measure the taper angle of the cross-section. Determination was made as indicated below, and A+, A, and B, in which the taper angle of the sectional surface was 600 or less, were considered as passing, and A+ and A, in which the taper angle of the sectional surface was 45° or less, were considered as good in pattern shape, and A+, in which the taper angle of the sectional surface was 300 or less, was considered as excellent in pattern shape.

A+: the taper angle of the sectional surface was 1 to 30°.
A: The taper angle of the sectional surface was 31 to 45°.
B: The taper angle of the sectional surface was 46 to 60°.
C: The taper angle of the sectional surface was 61 to 700°.
D: The taper angle of the sectional surface was 71 to 80°.
E: The taper angle of the sectional surface was 81 to 179°.

(13) Heat Resistance (High Temperature Weight Residue Ratio)

In a method described below in Example 1, using a High-Temperature Inert Gas Oven (INH-9CD-S, made by Koyo Thermo Systems Co., Ltd.), a cured film of the composition was created.

After being thermoset, the cured film created was scraped off from the substrate. Then, about 10 mg of the film was placed in an aluminum cell. Using a thermogravimetry apparatus (TGA-50, made by Shimadzu Corporation), this aluminum cell was subjected to thermogravimetric analysis by keeping the aluminum cell at 30° C. in a nitrogen atmosphere for 10 minutes, heating it to 150° C. at a temperature increase speed of 10° C./min, and then keeping it at 150° C. for 30 minutes, and further heating it to 500° C. at a temperature increase speed of 10° C./min. With respect to the weight subsequent to the heating at 150° C. for 30 minutes being 100 mass %, the weight residual ratio at 350° C. subsequent to further heating was denoted by ($M_a$) mass % and the weight residual ratio at 400° C. was denoted by ($M_b$) mass %, and a high temperature weight residue ratio difference (($M_a$)-($M_b$)) was calculated as an indicator of heat resistance.

Determination was made as indicated below, and A+, A, and B, in which the high temperature weight residue ratio difference was 25.0 mass % or less, were considered as passing, A+ and A, in which the high temperature weight residue ratio difference was 15.0% or less, were considered as good in heat resistance, and A+, in which the high temperature weight residue ratio difference was 5.0% or less, was considered as excellent in heat resistance.

A+: the high temperature weight residue ratio difference was 0 to 5.0%.
A: the high temperature weight residue ratio difference was 5.1 to 15.0%.
B: the high temperature weight residue ratio difference was 15.1 to 25.0%.
C: the high temperature weight residue ratio difference was 25.1 to 35.0%.
D: the high temperature weight residue ratio difference was 35.1 to 45.0%.
E: the high temperature weight residue ratio difference was 45.1 to 100%.

(14) Light Blocking Property (Optical Density (Hereinafter, "OD" Value)

In a method described below in Example 1, using a High-Temperature Inert Gas Oven (INH-9CD-S, made by Koyo Thermo Systems Co., Ltd.), a cured film of the composition was created. The film thickness of the cured film obtained was measured.

Using a transmission densitometer (X-Rite 361T(V), made by X-Rite company), the created cured film was subjected to measurement of incident light intensity (Is) and of transmitted light intensity (I). As an indicator of the light blocking property, an OD value was calculated by the following expression.

$OD$ value=$\log_{10}(I_0/I)$

(15) Light Emission Characteristics of Organic EL Display Apparatus (Manufacturing Method for Organic EL Display Apparatus)

Figure 4:
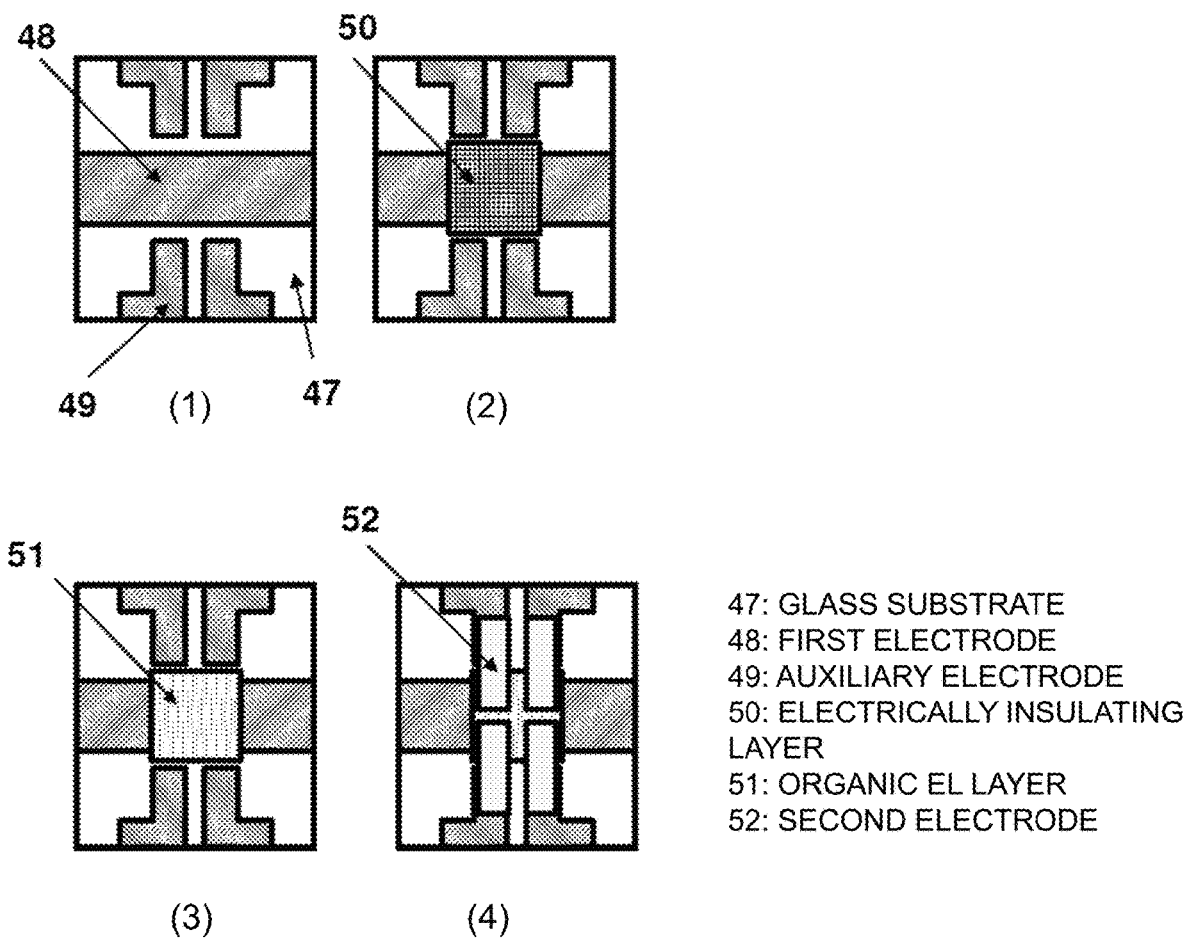
FIGS. 4(1) to (4) are schematic diagrams of an organic EL display apparatus used for light emission characteristic evaluation.

FIGS. 4(1) to (4) show schematic diagrams of a substrate used. First, an ITO transparent conductive coating of 10 nm is formed entirely over a non-alkali glass substrate 47 of 38×46 mm by sputtering, and etched to be a first electrode 48. A transparent electrode was thus formed. Furthermore, an auxiliary electrode 49 for extracting a second electrode was simultaneously formed (FIG. 4(1)). The obtained substrate was ultrasonically washed for 10 minutes with "Semicoclean" (registered trademark) 56 (made by Furuuchi Chemical Corporation) and washed with ultrapure water. Next, on this substrate, the negative-type photosensitive resin composition was applied and prebaked by a method described in Example 1. The composition was then subjected to patterning exposure via a photomask having a predetermined pattern, developed, and rinsed, and then was heated to be thermally cured. By the method described above, an electrically insulating layer 50 having a shape in which opening portions of 70 μm in width and 260 μm in length were arranged with a pitch of 155 μm in a width direction and a pitch of 465 μm in a length direction and in which the individual opening portions exposed the first electrodes was formed exclusively in a substrate effective area (FIG. 4(2)). Incidentally, the opening portions were to eventually become light-emitting pixels of organic EL display apparatuses. Furthermore, the substrate effective area was 16 mm squares, and the electrically insulating layer 50 was formed to have a thickness of about 1.0 μm.

Next, using the substrate with the first electrodes 48, the auxiliary electrodes 49, the electrically insulating layer 50 formed thereon, an organic EL display apparatus was manufactured. As a pre-process, a nitrogen plasma treatment was performed, followed by a formation of an organic EL layer 51 that included a light-emitting layer by a vacuum deposition (FIG. 4(3)). Incidentally, the degree of vacuum at the time of vapor deposition was 1×10$^{-3}$ Pa or less, and the substrate was rotated relative to a vapor deposition source during the vapor deposition. First, a compound (HT-1) was vapor deposited to 10 nm as a positive hole injection layer, and a compound (HT-2) was vapor deposited to 50 nm as a positive hole transportation layer. Next, on the light-emitting layer, a compound (GH-1) as a host material and a compound (GD-1) as a dopant material were vapor deposited to a thickness of 40 nm so that the dope concentration was 10%. After that, as electron transporting materials, a compound (ET-1) and a compound (LiQ) were stacked, with a volume ratio of 1:1, to a thickness of 40 nm. The structures of the compounds used for the organic EL layer are indicated below.

[CHEM. 30]

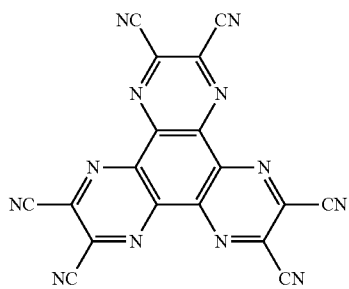

HT-1

HT-2

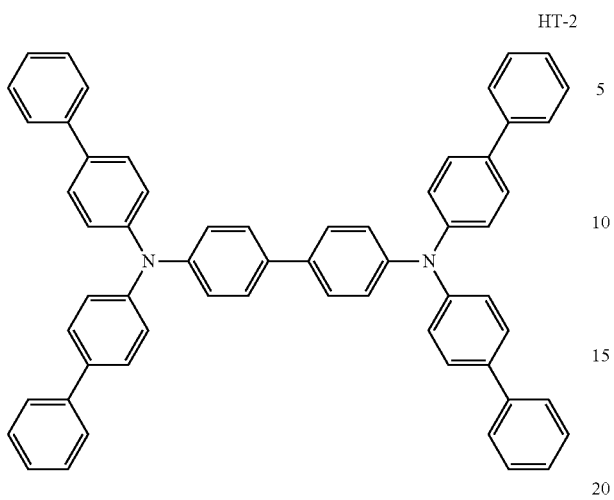

ET-1

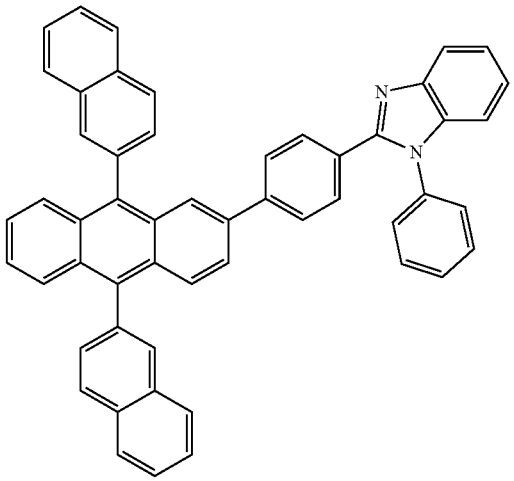

GD-1

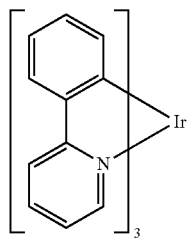

LiQ

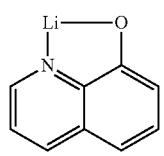

GH-1

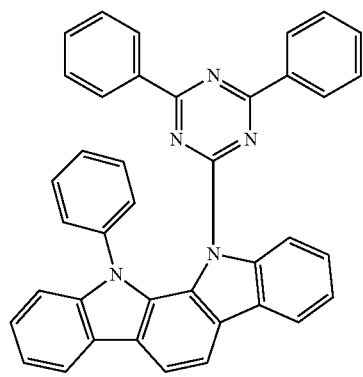

Next, a compound (LiQ) was vapor deposited to a 2 nm and then MgAg was vapor deposited, with a volume ratio of 10:1, to 100 nm to make second electrodes 52. A reflector electrode was thus formed (FIG. 4 (4)). After that, in a low-humidity nitrogen atmosphere, a cap-shaped glass sheet was adhered to achieve sealing by using an epoxy resin based adhesion agent. Thus, four bottom emission type organic EL display apparatuses of 5 mm squares were manufactured on one substrate. Incidentally, the film thicknesses mentioned herein are crystal oscillation type film thickness monitor-displayed values.

(Light Emission Characteristics Evaluation)

Organic EL display apparatuses manufactured by the foregoing method were caused to emit light by direct-current drive at 10 mA/cm$^2$ to observe for non-light-emitting regions and luminance unevenness. Organic EL display apparatuses manufactured were kept at 80° C. for 500 hours as a durability test. After the durability test, the organic EL display apparatuses were caused to emit light by direct-current drive at 10 mA/cm$^2$ to observe for change in light emission characteristics.

Example 1

Under a yellow lamp, 0.256 g of NCI-831 was weighed, 10.186 g of MBA was added, and dissolution was carried out by stirring. Next, 0.300 g of a 30 mass % MBA solution of the polyimide (PI-1) obtained in Synthesis Example 1, 2.275 g of a 30 mass % MBA solution of the polyimide precursor (PIP-1) obtained in Synthesis Example 15, and 1.422 g of a 80 mass % MBA solution of DPHA were added and stirring was performed to obtain a preparation liquid as a homogeneous solution. Next, 12.968 g of the pigment dispersion liquid (Bk-1) obtained in Preparation Example 1 was weighed. To this, 12.032 g of the preparation liquid obtained as described above was added, and stirring was performed to produce a homogeneous solution. After that, the obtained solution was filtered with a 00.45 m filter. Thus, a composition 1 was prepared.

The prepared composition 1 was applied onto an ITO substrate by spin coating at an arbitrary rotation speed, using a spin coater (MS-A100, made by Mikasa Co., Ltd.). Then, the composition 1 was prebaked at 100° C. for 120 seconds by using a hot plate (SCW-636, made by DAINIPPON SCREEN MFG. CO., LTD.) to manufacture a prebaked film having a film thickness of about 2.0 μm.

The manufactured prebaked film was subjected to patterning exposure to an i ray (365 nm wavelength), an h ray (405 nm wavelength), and a g ray (436 nm wavelength) of a super high pressure mercury lamp, by using a both-surface alignment one-side surface exposure apparatus (Mask Aligner PEM-6M, made by Union Optical Co., Ltd.), via a gray scale mask (MDRM MODEL 4000-5-FS, made by Opto-Line International) for sensitivity measurement. After the exposure, the prebaked film was developed for 60 seconds with a 2.38 mass % TMAH aqueous solution and then rinsed with water for 30 seconds by using a small-size development apparatus for photolithography (AD-2000, TAKIZAWA CO., LTD.).

After the development, the developed film was thermally cured at 230° C. by a High-Temperature Inert Gas Oven (INH-9CD-S, made by Koyo Thermo Systems Co., Ltd.) to create a cured film having a film thickness of about 1.6 μm. As for the thermal cure condition, thermal cure was performed at 230° C. for 60 minutes in a nitrogen atmosphere.

Examples 2 to 85 And Comparative Examples 1 to 5

In substantially the same manner as in Example 1, compositions 2 to 90 were prepared to each have composition indicated in Tables 3-1 to 12-1. Using the obtained compositions, films of the compositions were formed on substrates, and evaluated for photosensitive property and properties of the cured films, in substantially the same manner as in Example 1. Evaluation results thereof are collectively indicated in Tables 3-2 to 12-2.

TABLE 3-1

| | | | | Composition [mass parts] | | | |
|---|---|---|---|---|---|---|---|
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | (B) Radical polymerizable compound |
| Example 1 | 1 | Bk-1 | PI-1 (32.8) | PI-1 (3.2) | — | PIP-1 (24) | DPHA (40) |
| Example 2 | 2 | Bk-2 | PI-1 (26.3) | PI-1 (27.7) | — | PIP-1 (6) | DPHA (40) |
| Example 3 | 3 | Bk-2 | PI-1 (26.3) | PI-1 (24.7) | — | PIP-1 (9) | DPHA (40) |
| Example 4 | 4 | Bk-2 | PI-1 (26.3) | PI-1 (21.7) | — | PIP-1 (12) | DPHA (40) |
| Example 5 | 5 | Bk-2 | PI-1 (26.3) | PI-1 (15.7) | — | PIP-1 (18) | DPHA (40) |
| Example 6 | 6 | Bk-2 | PI-1 (26.3) | PI-1 (9.7) | — | PIP-1 (24) | DPHA (40) |
| Example 7 | 7 | Bk-2 | PI-1 (26.3) | PI-1 (3.7) | — | PIP-1 (30) | DPHA (40) |
| Example 8 | 8 | Bk-6 | — | PI-1 (24) | PIP-1 (19.2) | PIP-1 (16.8) | DPHA (40) |
| Example 9 | 9 | Bk-6 | — | PI-1 (21) | PIP-1 (19.2) | PIP-1 (19.8) | DPHA (40) |
| Example 10 | 10 | Bk-6 | — | PI-1 (18) | PIP-1 (19.2) | PIP-1 (22.8) | DPHA (40) |
| Example 11 | 11 | Bk-6 | — | PI-1 (15) | PIP-1 (19.2) | PIP-1 (25.8) | DPHA (40) |

| | Composition [mass parts] | | | | Content ratio of (A1) in total of (A1) and (A2) [mass %] | Content ratio of (B) in total of (A1), (A2) and (B) [mass %] | Ratio of coloring agent content in entire solid content [mass %] |
|---|---|---|---|---|---|---|---|
| | (C) Photopolymerization initiator | (D) Coloring agent originating from pigment dispersion liquid | (E) Dispersing agent originating from pigment dispersion liquid | Solvent | | | |
| Example 1 | NCI-831 (9) | Bk-S0100CF (49.3) | — | MBA | 60 | 40 | 31.1 |
| Example 2 | NCI-831 (9) | Bk-S0100CF (52.7) | S-20000 (8.8) | MBA | 90 | 40 | 30.9 |
| Example 3 | NCI-831 (9) | Bk-S0100CF (52.7) | S-20000 (8.8) | MBA | 85 | 40 | 30.9 |
| Example 4 | NCI-831 (9) | Bk-S0100CF (52.7) | S-20000 (8.8) | MBA | 80 | 40 | 30.9 |
| Example 5 | NCI-831 (9) | Bk-S0100CF (52.7) | S-20000 (8.8) | MBA | 70 | 40 | 30.9 |
| Example 6 | NCI-831 (9) | Bk-S0100CF (52.7) | S-20000 (8.8) | MBA | 60 | 40 | 30.9 |
| Example 7 | NCI-831 (9) | Bk-S0100CF (52.7) | S-20000 (8.8) | MBA | 50 | 40 | 30.9 |

TABLE 3-1-continued

| | | | | | | | |
|---|---|---|---|---|---|---|---|
| Example 8 | NCI-831 (9) | Bk-S0100CF (57.5) | S-20000 (19.2) | MBA | 40 | 40 | 31.0 |
| Example 9 | NCI-831 (9) | Bk-S0100CF (57.5) | S-20000 (19.2) | MBA | 35 | 40 | 31.0 |
| Example 10 | NCI-831 (9) | Bk-S0100CF (57.5) | S-20000 (19.2) | MBA | 30 | 40 | 31.0 |
| Example 11 | NCI-831 (9) | Bk-S0100CF (57.5) | S-20000 (19.2) | MBA | 25 | 40 | 31.0 |

TABLE 3-2

| | | Photosensitive property/properties of cured film | | | | | |
|---|---|---|---|---|---|---|---|
| | | | | Heat resistance high temperature | Light | Light emission characteristics of organic EL display apparatus | |
| | Composition | Sensitivity [mJ/cm$^2$] | Resolution [μm] | Pattern shape of cross section [°] | weight residue ratio difference [mass %] | blocking property OD value | Initial characteristics | Post-endurance test characteristics |
| Example 1 | 1 | 50 | 15 | 40 | 11.8 | 1.5 | Good | Good |
| Example 2 | 2 | 60 | 10 | 58 | 9.1 | 1.5 | Good | Good |
| Example 3 | 3 | 55 | 9 | 51 | 9.4 | 1.5 | Good | Good |
| Example 4 | 4 | 55 | 9 | 45 | 10.1 | 1.5 | Good | Good |
| Example 5 | 5 | 50 | 8 | 40 | 11.3 | 1.5 | Good | Good |
| Example 6 | 6 | 50 | 8 | 37 | 12.7 | 1.5 | Good | Good |
| Example 7 | 7 | 50 | 8 | 36 | 14.3 | 1.5 | Good | Good |
| Example 8 | 8 | 50 | 8 | 35 | 16.4 | 1.5 | Good | Good |
| Example 9 | 9 | 50 | 8 | 34 | 18.5 | 1.5 | Good | Good |
| Example 10 | 10 | 45 | 7 | 33 | 21.3 | 1.5 | Good | Good |
| Example 11 | 11 | 45 | 7 | 32 | 23.2 | 1.5 | Good | Good |

TABLE 4-1

| | | Composition [mass parts] | | | | | |
|---|---|---|---|---|---|---|---|
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | (B) Radical polymerizable compound |
| Example 12 | 12 | Bk-2 | PI-1 (26.3) | PI-1 (27.7) | — | PIP-1 (36) | DPHA (10) |
| Example 13 | 13 | Bk-2 | PI-1 (26.3) | PI-1 (24.7) | — | PIP-1 (34) | DPHA (15) |
| Example 14 | 14 | Bk-2 | PI-1 (26.3) | PI-1 (21.7) | — | PIP-1 (32) | DPHA (20) |
| Example 15 | 15 | Bk-2 | PI-1 (26.3) | PI-1 (18.7) | — | PIP-1 (30) | DPHA (25) |
| Example 16 | 16 | Bk-2 | PI-1 (26.3) | PI-1 (15.7) | — | PIP-1 (28) | DPHA (30) |
| Example 6 | 6 | Bk-2 | PI-1 (26.3) | PI-1 (9.7) | — | PIP-1 (24) | DPHA (40) |
| Example 17 | 17 | Bk-2 | PI-1 (26.3) | PI-1 (3.7) | — | PIP-1 (20) | DPHA (50) |
| Example 18 | 18 | Bk-2 | PI-1 (26.3) | PI-1 (0.7) | — | PIP-1 (18) | DPHA (55) |
| Example 19 | 19 | Bk-2 | PI-1 (26.3) | PI-1 (1.7) | — | PIP-1 (12) | DPHA (60) |
| Example 20 | 20 | Bk-2 | PI-1 (26.3) | PI-1 (1.7) | — | PIP-1 (7) | DPHA (65) |
| Example 21 | 21 | Bk-2 | PI-1 (26.3) | PI-1 (0.7) | — | PI-1 (3) | DPHA (70) |

TABLE 4-1-continued

| | Composition [mass parts] | | | | Content ratio of (A1) in total of (A1) and (A2) [mass %] | Content ratio of (B) in total of (A1), (A2) and (B) [mass %] | Ratio of coloring agent content in entire solid content [mass %] |
|---|---|---|---|---|---|---|---|
| | (C) Photopolymerization initiator | (D) Coloring agent originating from pigment dispersion liquid | (E) Dispersing agent originating from pigment dispersion liquid | Solvent | | | |
| Example 12 | NCI-831 (9) | Bk-S0100CF (52.7) | S-20000 (8.8) | MBA | 60 | 10 | 30.9 |
| Example 13 | NCI-831 (9) | Bk-S0100CF (52.7) | S-20000 (8.8) | MBA | 60 | 15 | 30.9 |
| Example 14 | NCI-831 (9) | Bk-S0100CF (52.7) | S-20000 (8.8) | MBA | 60 | 20 | 30.9 |
| Example 15 | NCI-831 (9) | Bk-S0100CF (52.7) | S-20000 (8.8) | MBA | 60 | 25 | 30.9 |
| Example 16 | NCI-831 (9) | Bk-S0100CF (52.7) | S-20000 (8.8) | MBA | 60 | 30 | 30.9 |
| Example 6 | NCI-831 (9) | Bk-S0100CF (52.7) | S-20000 (8.8) | MBA | 60 | 40 | 30.9 |
| Example 17 | NCI-831 (9) | Bk-S0100CF (52.7) | S-20000 (8.8) | MBA | 60 | 50 | 30.9 |
| Example 18 | NCI-831 (9) | Bk-S0100CF (52.7) | S-20000 (8.8) | MBA | 60 | 55 | 30.9 |
| Example 19 | NCI-831 (9) | Bk-S0100CF (52.7) | S-20000 (8.8) | MBA | 70 | 60 | 30.9 |
| Example 20 | NCI-831 (9) | Bk-S0100CF (52.7) | S-20000 (8.8) | MBA | 80 | 65 | 30.9 |
| Example 21 | NCI-831 (9) | Bk-S0100CF (52.7) | S-20000 (8.8) | MBA | 90 | 70 | 30.9 |

TABLE 4-2

| | | Photosensitive property/properties of cured film | | | | | |
|---|---|---|---|---|---|---|---|
| | | | | | Heat resistance high temperature | Light | Light emission characteristics of organic EL display apparatus |
| | Composition | Sensitivity [mJ/cm²] | Resolution [μm] | Pattern shape of cross section [°] | weight residue ratio difference [mass %] | blocking property OD value | Initial characteristics | Post-endurance test characteristics |
| Example 12 | 12 | 60 | 8 | 58 | 5.1 | 1.5 | Good | Good |
| Example 13 | 13 | 60 | 8 | 48 | 7.1 | 1.5 | Good | Good |
| Example 14 | 14 | 55 | 8 | 46 | 8.4 | 1.5 | Good | Good |
| Example 15 | 15 | 55 | 8 | 41 | 9.2 | 1.5 | Good | Good |
| Example 16 | 16 | 50 | 8 | 39 | 10.5 | 1.5 | Good | Good |
| Example 6 | 6 | 50 | 8 | 37 | 12.7 | 1.5 | Good | Good |
| Example 17 | 17 | 50 | 8 | 40 | 15.4 | 1.5 | Good | Good |
| Example 18 | 18 | 45 | 8 | 42 | 18.2 | 1.5 | Good | Good |
| Example 19 | 19 | 45 | 8 | 47 | 21.1 | 1.5 | Good | Good |
| Example 20 | 20 | 40 | 8 | 49 | 23.3 | 1.5 | Good | Good |
| Example 21 | 21 | 40 | 8 | 59 | 24.8 | 1-5 | Good | Good |

TABLE 5-1

| | Composition [mass parts] | | | | | |
|---|---|---|---|---|---|---|
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | (B) Radical polymerizable compound |
| Example 22 | 22 | Bk-2 | PI-1 (9.9) | PI-1 (20.1) | — | PIP-1 (30) | DPHA (40) |
| Example 23 | 23 | Bk-2 | PI-1 (19.4) | PI-1 (10.6) | — | PIP-1 (30) | DPHA (40) |
| Example 24 | 24 | Bk-2 | PI-1 (40.9) | PI-1 (1.1) | — | PIP-1 (18) | DPHA (40) |
| Example 25 | 25 | Bk-3 | PI-7 (26.3) | PI-7 (3.7) | — | PIP-1 (30) | DPHA (40) |

TABLE 5-1-continued

| | | | | | | | |
|---|---|---|---|---|---|---|---|
| Example 26 | 26 | Bk-4 | PI-9 (26.3) | PI-9 (3.7) | — | PIP-1 (30) | DPHA (40) |
| Example 27 | 27 | Bk-5 | PBO-1 (26.3) | PBO-1 (3.7) | — | PIP-1 (30) | DPHA (40) |
| Example 28 | 28 | Bk-6 | — | PI-1 (30) | PIP-1 (19.2) | PIP-1 (10.8) | DPHA (40) |
| Example 29 | 29 | Bk-7 | — | PI-1 (30) | PBOP-1 (19.2) | PBP-1 (10.8) | DPHA (40) |
| Example 30 | 30 | Bk-8 | — | PI-1 (30) | PS-1 (19.2) | PS-1 (10.8) | DPHA (40) |
| Example 31 | 31 | Bk-9 | — | PI-1 (30) | CD-1 (19.2) | CD-1 (10.8) | DPHA (40) |
| Example 32 | 32 | Bk-10 | — | PI-1 (30) | AC-1 (19.2) | AC-1 (10.8) | DPHA (40) |

| | Composition [mass parts] | | | | Content ratio of (A1) in total of (A1) and (A2) [mass %] | Content ratio of (B) in total of (A1), (A2) and (B) [mass %] | Ratio of coloring agent content in entire solid content [mass %] |
|---|---|---|---|---|---|---|---|
| | (C) Photopolymerization initiator | (D) Coloring agent originating from pigment dispersion liquid | (E) Dispersing agent originating from pigment dispersion liquid | Solvent | | | |
| Example 22 | NCI-831 (9) | Bk-S0100CF (19.8) | S-20000 (3.3) | MBA | 50 | 40 | 15.0 |
| Example 23 | NCI-831 (9) | Bk-S0100CF (38.9) | S-20000 (6.5) | MBA | 50 | 40 | 25.2 |
| Example 24 | NCI-831 (9) | Bk-S0100CF (81.8) | S-20000 (13.6) | MBA | 70 | 40 | 40.0 |
| Example 25 | NCI-831 (9) | Bk-S0100CF (52.7) | S-20000 (8.8) | MBA | 50 | 40 | 30.9 |
| Example 26 | NCI-831 (9) | Bk-S0100CF (52.7) | S-20000 (8.8) | MBA | 50 | 40 | 30.9 |
| Example 27 | NCI-831 (9) | Bk-S0100CF (52.7) | S-20000 (8.8) | MBA | 50 | 40 | 30.9 |
| Example 28 | NCI-831 (9) | Bk-S0100CF (57.5) | S-20000 (19.2) | MBA | 50 | 40 | 31.0 |
| Example 29 | NCI-831 (9) | Bk-S0100CF (57.5) | S-20000 (19.2) | MBA | 50 | 40 | 31.0 |
| Example 30 | NCI-831 (9) | Bk-S0100CF (57.5) | S-20000 (19.2) | MBA PGMEA | 50 | 40 | 31.0 |
| Example 31 | NCI-831 (9) | Bk-S0100CF (57.5) | S-20000 (19.2) | MBA | 50 | 40 | 31.0 |
| Example 32 | NCI-831 (9) | Bk-S0100CF (57.5) | S-20000 (19.2) | MBA PGMEA | 50 | 40 | 31.0 |

TABLE 5-2

| | | Photosensitive property/properties of cured film | | | | | Light emission characteristics of organic EL display apparatus | |
|---|---|---|---|---|---|---|---|---|
| | Composition | Sensitivity [mJ/cm$^2$] | Resolution [μm] | Pattern shape of cross section [°] | Heat resistance high temperature weight residue ratio difference [mass %] | Light blocking property OD value | Initial characteristics | Post-endurance test characteristics |
| Example 22 | 22 | 35 | 6 | 27 | 12.6 | 0.7 | Good | Good |
| Example 23 | 23 | 40 | 7 | 33 | 14.0 | 1.2 | Good | Good |
| Example 24 | 24 | 70 | 10 | 43 | 16.8 | 2.0 | Good | Good |
| Example 25 | 25 | 40 | 8 | 36 | 14.3 | 1.5 | Good | Good |
| Example 26 | 26 | 50 | 8 | 33 | 14.7 | 1.5 | Good | Good |
| Example 27 | 27 | 50 | 8 | 36 | 14.3 | 1.5 | Good | Good |
| Example 28 | 28 | 50 | 8 | 36 | 14.4 | 1.5 | Good | Good |
| Example 29 | 29 | 50 | 8 | 36 | 14.4 | 1.5 | Good | Good |
| Example 30 | 30 | 50 | 8 | 34 | 14.5 | 1.5 | Good | Good |
| Example 31 | 31 | 45 | 8 | 33 | 18.8 | 1.5 | Good | Good |
| Example 32 | 32 | 40 | 8 | 32 | 21.8 | 1.5 | Good | Good |

TABLE 6-1

| | | | Composition [mass parts] | | | | |
|---|---|---|---|---|---|---|---|
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | (B) Radical polymerizable compound |
| Example 33 | 33 | Bk-6 | — | PI-2 (30) | PIP-1 (19.2) | PIP-1 (10.8) | DPHA (40) |
| Example 34 | 34 | Bk-6 | — | PI-3 (30) | PIP-1 (19.2) | PIP-1 (10.8) | DPHA (40) |
| Example 35 | 35 | Bk-6 | — | PI-4 (30) | PIP-1 (19.2) | PIP-1 (10.8) | DPHA (40) |
| Example 36 | 36 | Bk-6 | — | PI-5 (30) | PIP-1 (19.2) | PIP-1 (10.8) | DPHA (40) |
| Example 37 | 37 | Bk-6 | — | PI-6 (30) | PIP-1 (19.2) | PIP-1 (10.8) | DPHA (40) |
| Example 38 | 38 | Bk-6 | — | PI-8 (30) | PIP-1 (19.2) | PIP-1 (10.8) | DPHA (40) |
| Example 39 | 39 | Bk-6 | — | PI-10 (30) | PIP-1 (19.2) | PIP-1 (10.8) | DPHA (40) |
| Example 40 | 40 | Bk-6 | — | PI-11 (30) | PIP-1 (19.2) | PIP-1 (10.8) | DPHA (40) |
| Example 41 | 41 | Bk-6 | — | PBO-2 (30) | PIP-1 (19.2) | PIP-1 (10.8) | DPHA (40) |
| Example 42 | 42 | Bk-6 | — | PBO-3 (30) | PIP-1 (19.2) | PIP-1 (10.8) | DPHA (40) |

| | | Composition [mass parts] | | | Content ratio of (A1) in total of (A1) and (A2) [mass %] | Content ratio of (B) in total of (A1), (A2) and (B) [mass %] | Ratio of coloring agent content in entire solid content [mass %] |
|---|---|---|---|---|---|---|---|
| | (C) Photopolymerization initiator | (D) Coloring agent originating from pigment dispersion liquid | (E) Dispersing agent originating from pigment dispersion liquid | Solvent | | | |
| Example 33 | NCI-831 (9) | Bk-S0100CF (57.5) | S-20000 (19.2) | MBA | 50 | 40 | 31.0 |
| Example 34 | NCI-831 (9) | Bk-S0100CF (57.5) | S-20000 (19.2) | MBA | 50 | 40 | 31.0 |
| Example 35 | NCI-831 (9) | Bk-S0100CF (57.5) | S-20000 (19.2) | MBA | 50 | 40 | 31.0 |
| Example 36 | NCI-831 (9) | Bk-S0100CF (57.5) | S-20000 (19.2) | MBA | 50 | 40 | 31.0 |
| Example 37 | NCI-831 (9) | Bk-S0100CF (57.5) | S-20000 (19.2) | MBA | 50 | 40 | 31.0 |
| Example 38 | NCI-831 (9) | Bk-S0100CF (57.5) | S-20000 (19.2) | MBA | 50 | 40 | 31.0 |
| Example 39 | NCI-831 (9) | Bk-S0100CF (57.5) | S-20000 (19.2) | MBA | 50 | 40 | 31.0 |
| Example 40 | NCI-831 (9) | Bk-S0100CF (57.5) | S-20000 (19.2) | MBA | 50 | 40 | 31.0 |
| Example 41 | NCI-831 (9) | Bk-S0100CF (57.5) | S-20000 (19.2) | MBA | 50 | 40 | 31.0 |
| Example 42 | NCI-831 (9) | Bk-S0100CF (57.5) | S-20000 (19.2) | MBA | 50 | 40 | 31.0 |

TABLE 6-2

| | | Photosensitive property/properties of cured film | | | | | Light emission characteristics of organic EL display apparatus | |
|---|---|---|---|---|---|---|---|---|
| | Composition | Sensitivity [mJ/cm$^2$] | Resolution [μm] | Pattern shape of cross section [°] | Heat resistance high temperature weight residue ratio difference [mass %] | Light blocking property OD value | Initial characteristics | Post-endurance test characteristics |
| Example 33 | 33 | 50 | 8 | 36 | 14.2 | 1.5 | Good | Good |
| Example 34 | 34 | 50 | 8 | 36 | 14.3 | 1.5 | Good | Good |
| Example 35 | 35 | 50 | 8 | 36 | 14.4 | 1.5 | Good | Good |
| Example 36 | 36 | 45 | 8 | 36 | 14.3 | 1.5 | Good | Good |
| Example 37 | 37 | 45 | 8 | 36 | 14.4 | 1.5 | Good | Good |
| Example 38 | 38 | 55 | 8 | 36 | 14.5 | 1.5 | Good | Good |

TABLE 6-2-continued

| | | | | Photosensitive property/properties of cured film | | | Light emission characteristics of organic EL display apparatus | |
| --- | --- | --- | --- | --- | --- | --- | --- | --- |
| | | | | | Heat resistance high temperature | Light | | |
| | Composition | Sensitivity [mJ/cm²] | Resolution [µm] | Pattern shape of cross section [°] | weight residue ratio difference [mass %] | blocking property OD value | Initial characteristics | Post-endurance test characteristics |
| Example 39 | 39 | 50 | 8 | 36 | 13.3 | 1.5 | Good | Good |
| Example 40 | 40 | 50 | 8 | 34 | 14.4 | 1.5 | Good | Good |
| Example 41 | 41 | 55 | 8 | 36 | 13.5 | 1.5 | Good | Good |
| Example 42 | 42 | 55 | 8 | 36 | 13.2 | 1.5 | Good | Good |

TABLE 7-1

| | | Composition [mass parts] | | | | | |
| --- | --- | --- | --- | --- | --- | --- | --- |
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | (B) Radical polymerizable compound |
| Example 43 | 43 | Bk-2 | PI-1 (26.3) | PI-1 (3.7) | — | PIP-2 (30) | DPHA (40) |
| Example 44 | 44 | Bk-2 | PI-1 (26.3) | PI-1 (3.7) | — | PIP-3 (30) | DPHA (40) |
| Example 45 | 45 | Bk-2 | PI-1 (26.3) | PI-1 (3.7) | — | PIP-4 (30) | DPHA (40) |
| Example 46 | 46 | Bk-2 | PI-1 (26.3) | PI-1 (3.7) | — | PIP-5 (30) | DPHA (40) |
| Example 47 | 47 | Bk-2 | PI-1 (26.3) | PI-1 (3.7) | — | PIP-6 (30) | DPHA (40) |
| Example 48 | 48 | Bk-2 | PI-1 (26.3) | PI-1 (3.7) | — | PIP-7 (30) | DPHA (40) |
| Example 49 | 49 | Bk-2 | PI-1 (26.3) | PI-1 (3.7) | — | PIP-8 (30) | DPHA (40) |
| Example 50 | 50 | Bk-2 | PI-1 (26.3) | PI-1 (3.7) | — | PIP-9 (30) | DPHA (40) |
| Example 51 | 51 | Bk-2 | PI-1 (26.3) | PI-1 (3.7) | — | PIP-10 (30) | DPHA (40) |
| Example 52 | 52 | Bk-2 | PI-1 (26.3) | PI-1 (3.7) | — | PIP-11 (30) | DPHA (40) |
| Example 53 | 53 | Bk-2 | PI-1 (26.3) | PI-1 (3.7) | — | PBOP-2 (10.8) | DPHA (40) |
| Example 54 | 54 | Bk-2 | PI-1 (26.3) | PI-1 (3.7) | — | PBOP-3 (10.8) | DPHA (40) |

| | Composition [mass parts] | | | | Content ratio of (A1) in total of (A1) and (A2) [mass %] | Content ratio of (B) in total of (A1), (A2) and (B) [mass %] | Ratio of coloring agent content in entire solid content [mass %] |
| --- | --- | --- | --- | --- | --- | --- | --- |
| | (C) Photopolymerization initiator | (D) Coloring agent originating from pigment dispersion liquid | (E) Dispersing agent originating from pigment dispersion liquid | Solvent | | | |
| Example 43 | NCI-831 (9) | Bk-S0100CF (52.7) | S-20000 (8.8) | MBA | 50 | 40 | 30.9 |
| Example 44 | NCI-831 (9) | Bk-S0100CF (52.7) | S-20000 (8.8) | MBA | 50 | 40 | 30.9 |
| Example 45 | NCI-831 (9) | Bk-S0100CF (52.7) | S-20000 (8.8) | MBA | 50 | 40 | 30.9 |
| Example 46 | NCI-831 (9) | Bk-S0100CF (52.7) | S-20000 (8.8) | MBA | 50 | 40 | 30.9 |
| Example 47 | NCI-831 (9) | Bk-S0100CF (52.7) | S-20000 (8.8) | MBA | 50 | 40 | 30.9 |
| Example 48 | NCI-831 (9) | Bk-S0100CF (52.7) | S-20000 (8.8) | MBA | 50 | 40 | 30.9 |
| Example 49 | NCI-831 (9) | Bk-S0100CF (52.7) | S-20000 (8.8) | MBA | 50 | 40 | 30.9 |
| Example 50 | NCI-831 (9) | Bk-S0100CF (52.7) | S-20000 (8.8) | MBA | 50 | 40 | 30.9 |
| Example 51 | NCI-831 (9) | Bk-S0100CF (52.7) | S-20000 (8.8) | MBA | 50 | 40 | 30.9 |

TABLE 7-1-continued

| | | | | | | | |
|---|---|---|---|---|---|---|---|
| Example 52 | NCI-831 (9) | Bk-S0100CF (52.7) | S-20000 (8.8) | MBA | 50 | 40 | 30.9 |
| Example 53 | NCI-831 (9) | Bk-S0100CF (52.7) | S-20000 (8.8) | MBA | 50 | 40 | 30.9 |
| Example 54 | NCI-831 (9) | Bk-S0100CF (52.7) | S-20000 (8.8) | MBA | 50 | 40 | 30.9 |

TABLE 7-2

| | | | Photosensitive property/properties of cured film | | | | Light emission characteristics of organic EL display apparatus | |
|---|---|---|---|---|---|---|---|---|
| | Composition | Sensitivity [mJ/cm$^2$] | Resolution [μm] | Pattern shape of cross section [°] | Heat resistance high temperature weight residue ratio difference [mass %] | Light blocking property OD value | Initial characteristics | Post-endurance test characteristics |
| Example 43 | 43 | 50 | 8 | 36 | 14.2 | 1.5 | Good | Good |
| Example 44 | 44 | 50 | 8 | 36 | 14.3 | 1.5 | Good | Good |
| Example 45 | 45 | 50 | 8 | 36 | 14.4 | 1.5 | Good | Good |
| Example 46 | 46 | 55 | 8 | 36 | 14.3 | 1.5 | Good | Good |
| Example 47 | 47 | 55 | 8 | 36 | 14.4 | 1.5 | Good | Good |
| Example 48 | 48 | 50 | 8 | 36 | 14.0 | 1.5 | Good | Good |
| Example 49 | 49 | 55 | 8 | 36 | 14.1 | 1.5 | Good | Good |
| Example 50 | 50 | 55 | 8 | 33 | 14.3 | 1.5 | Good | Good |
| Example 51 | 51 | 55 | 8 | 36 | 12.9 | 1.5 | Good | Good |
| Example 52 | 52 | 55 | 8 | 34 | 14.1 | 1.5 | Good | Good |
| Example 53 | 53 | 55 | 8 | 36 | 13.5 | 1.5 | Good | Good |
| Example 54 | 54 | 55 | 8 | 36 | 13.2 | 1.5 | Good | Good |

TABLE 8-1

| | | | Composition [mass parts] | | | | |
|---|---|---|---|---|---|---|---|
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | (B) Radical polymerizable compound |
| Example 55 | 55 | Bk-2 | PI-1 (26.3) | PI-1 (3.7) | — | PS-2 (10.8) | DPHA (40) |
| Example 56 | 56 | Bk-2 | PI-1 (26.3) | PI-1 (3.7) | — | PS-3 (10.8) | DPHA (40) |
| Example 57 | 57 | Bk-2 | PI-1 (26.3) | PI-1 (3.7) | — | PS-4 (10.8) | DPHA (40) |
| Example 58 | 58 | Bk-2 | PI-1 (26.3) | PI-1 (3.7) | — | PS-5 (10.8) | DPHA (40) |
| Example 59 | 59 | Bk-2 | PI-1 (26.3) | PI-1 (3.7) | — | PS-6 (10.8) | DPHA (40) |
| Example 60 | 60 | Bk-2 | PI-1 (26.3) | PI-1 (3.7) | — | PS-7 (10.8) | DPHA (40) |
| Example 61 | 61 | Bk-2 | PI-1 (26.3) | PI-1 (3.7) | — | PS-8 (10.8) | DPHA (40) |
| Example 62 | 62 | Bk-2 | PI-1 (26.3) | PI-1 (3.7) | — | PS-9 (10.8) | DPHA (40) |
| Example 63 | 63 | Bk-2 | PI-1 (26.3) | PI-1 (3.7) | — | PS-10 (10.8) | DPHA (40) |
| Example 64 | 64 | Bk-2 | PI-1 (26.3) | PI-1 (3.7) | — | PS-11 (10.8) | DPHA (40) |

TABLE 8-1-continued

| | | Composition [mass parts] | | | Content ratio of (A1) in total of (A1) and (A2) [mass %] | Content ratio of (B) in total of (A1), (A2) and (B) [mass %] | Ratio of coloring agent content in entire solid content [mass %] |
|---|---|---|---|---|---|---|---|
| | (C) Photopoly- merization initiator | (D) Coloring agent originating from pigment dispersion liquid | (E) Dispersing agent originating from pigment dispersion liquid | Solvent | | | |
| Example 55 | NCI-831 (9) | Bk-S0100CF (52.7) | S-20000 (8.8) | MBA PGMEA | 50 | 40 | 30.9 |
| Example 56 | NCI-831 (9) | Bk-S0100CF (52.7) | S-20000 (8.8) | MBA PGMEA | 50 | 40 | 30.9 |
| Example 57 | NCI-831 (9) | Bk-S0100CF (52.7) | S-20000 (8.8) | MBA PGMEA | 50 | 40 | 30.9 |
| Example 58 | NCI-831 (9) | Bk-S0100CF (52.7) | S-20000 (8.8) | MBA PGMEA | 50 | 40 | 30.9 |
| Example 59 | NCI-831 (9) | Bk-S0100CF (52.7) | S-20000 (8.8) | MBA PGMEA | 50 | 40 | 30.9 |
| Example 60 | NCI-831 (9) | Bk-S0100CF (52.7) | S-20000 (8.8) | MBA PGMEA | 50 | 40 | 30.9 |
| Example 61 | NCI-831 (9) | Bk-S0100CF (52.7) | S-20000 (8.8) | MBA PGMEA | 50 | 40 | 30.9 |
| Example 62 | NCI-831 (9) | Bk-S0100CF (52.7) | S-20000 (8.8) | MBA PGMEA | 50 | 40 | 30.9 |
| Example 63 | NCI-831 (9) | Bk-S0100CF (52.7) | S-20000 (8.8) | MBA PGMEA | 50 | 40 | 30.9 |
| Example 64 | NCI-831 (9) | Bk-S0100CF (52.7) | S-20000 (8.8) | MBA PGMEA | 50 | 40 | 30.9 |

TABLE 8-2

| | | Photosensitive property/properties of cured film | | | | Light emission characteristics of organic EL display apparatus | |
|---|---|---|---|---|---|---|---|
| | | | | Heat resistance high temperature | Light | | |
| | Composition | Sensitivity [mJ/cm$^2$] | Resolution [μm] | Pattern shape of cross section [°] | weight residue ratio difference [mass %] | blocking property OD value | Initial characteristics | Post-endurance test characteristics |
| Example 55 | 55 | 50 | 9 | 34 | 14.6 | 1.5 | Good | Good |
| Example 56 | 56 | 50 | 8 | 36 | 13.6 | 1.5 | Good | Good |
| Example 57 | 57 | 50 | 8 | 33 | 15.1 | 1.5 | Good | Good |
| Example 58 | 58 | 45 | 8 | 34 | 14.6 | 1.5 | Good | Good |
| Example 59 | 59 | 45 | 8 | 34 | 14.6 | 1.5 | Good | Good |
| Example 60 | 60 | 40 | 8 | 38 | 14.8 | 1.5 | Good | Good |
| Example 61 | 61 | 35 | 8 | 42 | 14.9 | 1.5 | Good | Good |
| Example 62 | 62 | 50 | 7 | 33 | 13.1 | 1.5 | Good | Good |
| Example 63 | 63 | 45 | 9 | 36 | 13.9 | 1.5 | Good | Good |
| Example 64 | 64 | 50 | 7 | 33 | 12.8 | 1.5 | Good | Good |

TABLE 9-1

| | | Composition [mass parts] | | | | | |
|---|---|---|---|---|---|---|---|
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | (B) Radical polymerizable compound |
| Example 65 | 65 | Bk-2 | PI-1 (26.3) | PI-1 (3.7) | — | CD-2 (10.8) | DPHA (40) |
| Example 66 | 66 | Bk-2 | PI-1 (26.3) | PI-1 (3.7) | — | CD-3 (10.8) | DPHA (40) |
| Example 67 | 67 | Bk-2 | PI-1 (26.3) | PI-1 (3.7) | — | CD-4 (10.8) | DPHA (40) |
| Example 68 | 68 | Bk-2 | PI-1 (26.3) | PI-1 (3.7) | — | CD-5 (10.8) | DPHA (40) |

TABLE 9-1-continued

| | Composition | | | | | | |
|---|---|---|---|---|---|---|---|
| Example 69 | 69 | Bk-2 | PI-1 (26.3) | PI-1 (3.7) | — | CD-6 (10.8) | DPHA (40) |
| Example 70 | 70 | Bk-2 | PI-1 (26.3) | PI-1 (3.7) | — | WR-301 (10.8) | DPHA (40) |
| Example 71 | 71 | Bk-2 | PI-1 (26.3) | PI-1 (3.7) | — | AC-2 (10.8) | DPHA (40) |
| Example 72 | 72 | Bk-2 | PI-1 (26.3) | PI-1 (3.7) | — | AC-3 (10.8) | DPHA (40) |

| | Composition [mass parts] | | | | Content ratio of (A1) in total of (A1) and (A2) [mass %] | Content ratio of (B) in total of (A1), (A2) and (B) [mass %] | Ratio of coloring agent content in entire solid content [mass %] |
|---|---|---|---|---|---|---|---|
| | (C) Photopoly-merization initiator | (D) Coloring agent originating from pigment dispersion liquid | (E) Dispersing agent originating from pigment dispersion liquid | Solvent | | | |
| Example 65 | NCI-831 (9) | Bk-S0100CF (52.7) | S-20000 (8.8) | MBA | 50 | 40 | 30.9 |
| Example 66 | NCI-831 (9) | Bk-S0100CF (52.7) | S-20000 (8.8) | MBA | 50 | 40 | 30.9 |
| Example 67 | NCI-831 (9) | Bk-S0100CF (52.7) | S-20000 (8.8) | MBA | 50 | 40 | 30.9 |
| Example 68 | NCI-831 (9) | Bk-S0100CF (52.7) | S-20000 (8.8) | MBA | 50 | 40 | 30.9 |
| Example 69 | NCI-831 (9) | Bk-S0100CF (52.7) | S-20000 (8.8) | MBA | 50 | 40 | 30.9 |
| Example 70 | NCI-831 (9) | Bk-S0100CF (52.7) | S-20000 (8.8) | MBA | 50 | 40 | 30.9 |
| Example 71 | NCI-831 (9) | Bk-S0100CF (52.7) | S-20000 (8.8) | MBA PGMEA | 50 | 40 | 30.9 |
| Example 72 | NCI-831 (9) | Bk-S0100CF (52.7) | S-20000 (8.8) | MBA PGMEA | 50 | 40 | 30.9 |

TABLE 9-2

| | | Photosensitive property/properties of cured film | | | | Light emission characteristics of organic EL display apparatus | |
|---|---|---|---|---|---|---|---|
| | Composition | Sensitivity [mJ/cm²] | Resolution [µm] | Pattern shape of cross section [°] | Heat resistance high temperature weight residue ratio difference [mass %] | Light blocking property OD value | Initial characteristics | Post-endurance test characteristics |
| Example 65 | 65 | 40 | 8 | 33 | 18.9 | 1.5 | Good | Good |
| Example 66 | 66 | 45 | 8 | 33 | 18.9 | 1.5 | Good | Good |
| Example 67 | 67 | 45 | 8 | 33 | 18.8 | 1.5 | Good | Good |
| Example 68 | 68 | 40 | 8 | 33 | 18.9 | 1.5 | Good | Good |
| Example 69 | 69 | 45 | 8 | 33 | 18.9 | 1.5 | Good | Good |
| Example 70 | 70 | 45 | 8 | 33 | 18.9 | 1.5 | Good | Good |
| Example 71 | 71 | 40 | 8 | 32 | 22.4 | 1.5 | Good | Good |
| Example 72 | 72 | 35 | 8 | 32 | 22.8 | 1.5 | Good | Good |

TABLE 10-1

| | Composition | Pigment dispersion liquid | (A1) First resin originating from pigment dispersion liquid | (A1) First resin originating from prepared liquid to be added to pigment dispersion liquid | (A2) Second resin originating from prepared liquid to be added to pigment dispersion liquid | (B) Radical polymerizable compound | (C) Photopoly-merization initiator |
|---|---|---|---|---|---|---|---|
| Example 73 | 73 | Bk-11 | PI-1 (26.3) | PI-1 (3.7) | PIP-1 (30) | DPHA (40) | NCI-831 (9) |
| Example 74 | 74 | Bk-12 | PI-1 (19.2) | PI-1 (10.8) | PIP-1 (30) | DPHA (40) | NCI-831 (9) |
| Example 75 | 75 | Bk-13 | PI-7 (19.2) | PI-7 (10.8) | PIP-1 (30) | DPHA (40) | NCI-831 (9) |
| Example 76 | 76 | Bk-14 | PI-1 (19.2) | PI-1 (10.8) | PIP-1 (30) | DPHA (40) | NCI-831 (9) |

TABLE 10-1-continued

| | | | | | | | |
|---|---|---|---|---|---|---|---|
| Example 77 | 77 | Bk-15 | PI-1 (19.2) | PI-1 (10.8) | PIP-1 (30) | DPHA (40) | NCI-831 (9) |
| Example 78 | 78 | Bk-16 | PI-1 (19.2) | PI-1 (10.8) | PIP-1 (30) | DPHA (40) | NCI-831 (9) |
| Example 79 | 79 | Bk-2 | PI-1 (26.3) | PI-1 (3.7) | PIP-1 (30) | DPHA (40) | NCI-831 (9) |
| Example 80 | 80 | Bk-2 | PI-1 (26.3) | PI-1 (3.7) | PIP-1 (30) | DPHA (40) | NCI-831 (9) |
| Example 81 | 81 | Bk-2 | PI-1 (26.3) | PI-1 (3.7) | PIP-1 (30) | DPHA (40) | NCI-831 (9) |
| Example 82 | 82 | Bk-2 | PI-1 (26.3) | PI-1 (3.7) | PIP-1 (30) | DPHA (40) | NCI-831 (9) |
| Example 83 | 83 | Bk-2 | PI-1 (26.3) | PI-1 (3.7) | PIP-1 (30) | DPHA (40) | NCI-831 (9) |

| | Composition [mass parts] | | | | | | |
|---|---|---|---|---|---|---|---|
| | (D) Coloring agent originating from pigment dispersion liquid | (E) Dispersing agent originating from pigment dispersion liquid | (D) Coloring agent/sensitizing agent/chain transfer agent originating from prepared liquid to be added to pigment dispersion liquid | Solvent | Content ratio of (A1) in total of (A1) and (A2) [mass %] | Content ratio of (B) in total of (A1), (A2) and (B) [mass %] | Ratio of coloring agent content in entire solid content [mass %] |
| Example 73 | Bk-S0100CF (43.9) P.B.15:6 (8.8) | S-20000 (8.8) | — | MBA | 50 | 40 | 30.9 |
| Example 74 | Bk-S0084 (57.5) | D.BYK-167 (19.2) | — | MBA | 50 | 40 | 31.0 |
| Example 75 | Bk-S0084 (57.5) | D.BYK-167 (19.2) | — | MBA | 50 | 40 | 31.0 |
| Example 76 | TPK-1227 (57.5) | D.BYK-167 (19.2) | — | MBA | 50 | 40 | 31.0 |
| Example 77 | P.R.254 (20.1) P.Y.139 (8.6) P.B.15:6 (28.8) | D.BYK-167 (19.2) | — | MBA | 50 | 40 | 31.0 |
| Example 78 | P.V.23 (48.9) P.Y.139 (8.6) | D.BYK-167 (19.2) | — | MBA | 50 | 40 | 31.0 |
| Example 79 | Bk-S0100CF (52.7) | S-20000 (8.8) | PA-5600 (1) | MBA | 50 | 40 | 30.7 |
| Example 80 | Bk-S0100CF (52.7) | S-20000 (8.8) | DETX-S (1) | MBA | 50 | 40 | 30.7 |
| Example 81 | Bk-S0100CF (52.7) | S-20000 (8.8) | MT-PE1 (1) | MBA | 50 | 40 | 30.7 |
| Example 82 | Bk-S0100CF (52.7) | S-20000 (8.8) | — | MBA PGMEA | 50 | 40 | 30.9 |
| Example 83 | Bk-S0100CF (52.7) | S-20000 (8.8) | — | MBA PGDA | 50 | 40 | 30.9 |

TABLE 10-2

| | | | | | Photosensitive property/properties of cured film | | | |
|---|---|---|---|---|---|---|---|---|
| | | | | | Heat resistance high temperature | Light | Light emission characteristics of organic EL display apparatus | |
| | Composition | Sensitivity [mJ/cm²] | Resolution [μm] | Pattern shape of cross section [°] | weight residue ratio difference [mass %] | blocking property OD value | Initial characteristics | Post-endurance test characteristics |
| Example 73 | 73 | 50 | 8 | 36 | 14.5 | 1.4 | Good | Good |
| Example 74 | 74 | 50 | 8 | 36 | 14.1 | 1.4 | Good | Good |
| Example 75 | 75 | 40 | 8 | 36 | 14.1 | 1.4 | Good | Good |
| Example 76 | 76 | 60 | 8 | 36 | 13.7 | 1.7 | Good | Good |
| Example 77 | 77 | 50 | 8 | 36 | 15.1 | 1.5 | Good | Good |
| Example 78 | 78 | 50 | 8 | 35 | 15.3 | 1.5 | Good | Good |
| Example 79 | 79 | 50 | 8 | 36 | 14.5 | 1.5 | Good | Good |

TABLE 10-2-continued

| | | Photosensitive property/properties of cured film | | | | Light emission characteristics of organic EL display apparatus | |
|---|---|---|---|---|---|---|---|
| | Composition | Sensitivity [mJ/cm²] | Resolution [μm] | Pattern shape of cross section [°] | Heat resistance high temperature weight residue ratio difference [mass %] | Light blocking property OD value | Initial characteristics | Post-endurance test characteristics |

| | Composition | Sensitivity [mJ/cm²] | Resolution [μm] | Pattern shape of cross section [°] | weight residue ratio difference [mass %] | blocking property OD value | Initial characteristics | Post-endurance test characteristics |
|---|---|---|---|---|---|---|---|---|
| Example 80 | 80 | 40 | 8 | 34 | 14.5 | 1.5 | Good | Good |
| Example 81 | 81 | 40 | 8 | 32 | 14.6 | 1.5 | Good | Good |
| Example 82 | 82 | 50 | 8 | 36 | 14.2 | 1.5 | Good | Good |
| Example 83 | 83 | 50 | 8 | 36 | 14.4 | 1.5 | Good | Good |

TABLE 11-1

| | | Composition [mass parts] | | | | | |
|---|---|---|---|---|---|---|---|
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | (B) Radical polymerizable compound |
| Example 84 | 84 | — | — | PI-1 (30) | — | PIP-1 (30) | DPHA (40) |
| Example 85 | 85 | — | — | PI-1 (30) | — | PIP-1 (30) | DPHA (40) |

| | (C) Photopolymerization initiator | (D) Coloring agent originating from prepared liquid to be added to pigment dispersion liquid | Solvent | Content ratio of (A1) in total of (A1) and (A2) [mass %] | Content ratio of (B) in total of (A1), (A2) and (B) [mass %] | Ratio of coloring agent content in entire solid content [mass %] |
|---|---|---|---|---|---|---|
| Example 84 | NCI-831 (9) | Bk-TH-807 (15) | MBA | 50 | 40 | 12.1 |
| Example 85 | NCI-831 (9) | S.R.18 (2.1) D.Y.201 (2.1) S.B.63 (10.8) | MBA | 50 | 40 | 12.1 |

TABLE 11-2

| | Composition | Sensitivity [mJ/cm²] | Resolution [μm] | Pattern shape of cross section [°] | Heat resistance high temperature weight residue ratio difference [mass %] | Light blocking property OD value | Initial characteristics | Post-endurance test characteristics |
|---|---|---|---|---|---|---|---|---|
| Example 84 | 84 | 35 | 8 | 36 | 13.6 | 0.3 | Good | Good |
| Example 85 | 85 | 35 | 8 | 36 | 13.6 | 0.3 | Good | Good |

TABLE 12-1

| | | | Composition [mass parts] | | | | |
|---|---|---|---|---|---|---|---|
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | (B) Radical polymerizable compound |
| Comparative Example 1 | 86 | Bk-2 | PI-1 (26.3) | PI-1 (33.7) | — | — | DPHA (40) |
| Comparative Example 2 | 87 | Bk-6 | — | PI-1 (12) | PIP-1 (19.2) | PIP-1 (28.8) | DPHA (40) |
| Comparative Example 3 | 88 | Bk-9 | — | — | CD-1 (19.2) | CD-1 (40.8) | DPHA (40) |
| Comparative Example 4 | 89 | Bk-10 | — | — | AC-1 (19.2) | AC-1 (40.8) | DPHA (40) |

| | Composition [mass parts] | | | | Content ratio of (A1) in total of (A1) and (A2) [mass %] | Content ratio of (B) in total of (A1), (A2) and (B) [mass %] | Ratio of coloring agent content in entire solid content [mass %] |
|---|---|---|---|---|---|---|---|
| | (C) Photopolymerization initiator | (D) Coloring agent originating from pigment dispersion liquid | (E) Dispersing agent originating from pigment dispersion liquid | Solvent | | | |
| Comparative Example 1 | NCI-831 (9) | Bk-S0100CF (52.7) | S-20000 (8.8) | MBA | 100 | 40 | 30.9 |
| Comparative Example 2 | NCI-831 (9) | Bk-S0100CF (57.5) | S-20000 (19.2) | MBA | 20 | 40 | 31.0 |
| Comparative Example 3 | NCI-831 (9) | Bk-S0100CF (57.5) | S-20000 (19.2) | MBA | 0 | 40 | 31.0 |
| Comparative Example 4 | NCI-831 (9) | Bk-S0100CF (57.5) | S-20000 (19.2) | MBA PGMEA | 0 | 40 | 31.0 |

| | | | Composition [mass parts] | | | | |
|---|---|---|---|---|---|---|---|
| | Composition | Pigment dispersion liquid | (A1) First resin originating from pigment dispersion liquid | (A1) First resin originating from prepared liquid to be added to pigment dispersion liquid | (A2) Second resin originating from pigment dispersion liquid | (A2) Second resin originating from prepared liquid to be added to pigment dispersion liquid | Dissolution accellerating agent |
| Comparative Example 5 | 90 | Bk-2 | PI-1 (30) | PI-1 (20) | — | PIP-1 (50) | TrisP-PA (10) |

| | Composition [mass parts] | | | | Content ratio of (A1) in total of (A1) and (A2) [mass %] | Content ratio of (B) in total of (A1), (A2) and (B) [mass %] | Ratio of coloring agent content in entire solid content [mass %] |
|---|---|---|---|---|---|---|---|
| | Compound having naphthoquinone diazide structure | (D) Coloring agent originating from pigment dispersion liquid | (E) Dispersing agent originating from pigment dispersion liquid | Solvent | | | |
| Comparative Example 5 | QD-1 (20) | Bk-S0100CF (60) | S-20000 (10) | MBA | 50 | 0 | 30.8 |

TABLE 12-2

| | | Photosensitive property/properties of cured film | | | | | Light emission characteristics of organic EL display apparatus | |
|---|---|---|---|---|---|---|---|---|
| | Composition | Sensitivity [mJ/cm$^2$] | Resolution [μm] | Pattern shape of cross section [°] | Heat resistance high temperature weight residue ratio difference [mass %] | Light blocking property OD value | Initial characteristics | Post-endurance test characteristics |
| Comparative Example 1 | 86 | 60 | 10 | 80 | 8.2 | 1.5 | With luminance unevenness | With luminance unevenness |
| Comparative Example 2 | 87 | 40 | 6 | 31 | 26.1 | 1.5 | Good | Good |
| Comparative Example 3 | 88 | 45 | 8 | 33 | 30.8 | 1.5 | Good | Light emitting area reduced to 50% |

TABLE 12-2-continued

| | | | | Photosensitive property/properties of cured film | | | |
|---|---|---|---|---|---|---|---|
| | | | | Heat resistance high temperature | Light | Light emission characteristics of organic EL display apparatus | |
| Composition | Sensitivity [mJ/cm²] | Resolution [μm] | Pattern shape of cross section [°] | weight residue ratio difference [mass %] | blocking property OD value | Initial characteristics | Post-endurance test characteristics |
| Comparative Example 4 | 89 | 40 | 8 | 32 | 41.3 | 1.5 | Good | Light emitting area reduced to 30% |
| Comparative Example 5 | 90 | 800 | 10 | 30 | 5.0 | 1.5 | Good | Good |

Example 86

(Production Method for Organic EL Display Apparatus that does not Include Polarizing Layer)

Figure 5:
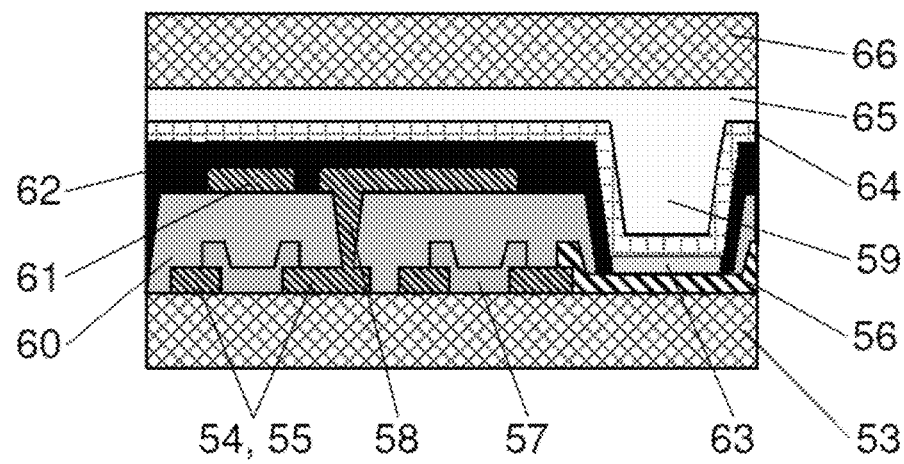
FIG. 5 is a schematic diagram exemplifying an organic EL display that does not include a polarizing layer.

An outline of an organic EL display apparatus to be manufactured is illustrated in FIG. 5. First, a stacked film of chromium and gold was formed on a non-alkali glass substrate 53 of 38×46 mm by an electronic beam vapor deposition method and then etched to form source electrodes 54 and drain electrodes 55. Next, a film of APC (silver/palladium/copper=98.07/0.87/1.06 (weight ratio)) was formed to 100 nm by sputtering and then was pattern-processed by etching to form an APC layer. Furthermore, as an upper layer on the APC layer, ITO was sputtered to form a film of 10 nm, which was then etched to form reflector electrodes 56 as first electrodes. After the electrode surfaces were washed with an oxygen plasma, a film of amorphous IGZO was formed by a sputtering method and etched to form an oxide semiconductor layer 57 between the source and drain electrodes. Next, a film of a positive-type photosensitive polysiloxane based material (SP-P2301, made by Toray Industries, Inc.) was formed by a spin coating method, and then via holes 58 and pixel regions 59 were formed as openings by photolithography. Then, thermal cure was carried out to form a gate insulating layer 60. After that, a film of gold was formed by an electronic beam vapor deposition method and etched to form gate electrodes 61. Thus, an oxide TFT array was made.

In the method described above in Example 1, the composition 6 was applied onto the oxide TFT array and then prebaked to form a film, which was then subjected to patterning exposure via a photomask having a predetermined pattern, and then to development and rinsing, so that the pixel regions were formed as openings. After that, thermal cure was performed to form a TFT protective layer/pixel-separating layer 62 that had light blocking property. By the foregoing method, a pixel-separating layer having a shape in which opening portions of 70 μm in width and 260 μm in length were arranged with a pitch of 155 μm in a width direction and a pitch of 465 μm in a length direction and in which the individual opening portions exposed the reflector electrodes was formed exclusively in the substrate effective area. Incidentally, the opening portions were to eventually become light-emitting pixels of organic EL display apparatuses. Furthermore, the substrate effective area was 16 mm squares, and the pixel-separating layer was formed to have a thickness of about 1.0 μm.

Next, by the method described above in (15), an organic EL light-emitting layer 63 was formed by using a compound (HT-1) for a positive hole injection layer, a compound (HT-2) for a positive hole transportation layer, a compound (GH-1) for a host material, a compound (GD-1) for a dopant material, and a compound (ET-1) and a compound (LiQ) for electron transporting materials. After that, by a vapor deposition method, a film of MgAg was formed to 10 nm at a volume ratio of 10:1. The film was etched to form a transparent electrode 64 as a second electrode. Next, in a low-humidity nitrogen atmosphere, a sealing film 65 was formed by using an organic EL seal material (STRUCT-BOND (registered trademark) XMF-T, made by Mitsui Chemicals, Inc.) Furthermore, a non-alkali glass substrate 66 was pasted onto the sealing film to manufacture, on the single substrate, four top emission type organic EL display apparatuses of 5 mm squares having no polarizing layer. Incidentally, the film thickness mentioned herein refers to a crystal oscillation type film thickness monitor-displayed value.

(Light Emission Characteristics Evaluation)

The organic EL display apparatuses manufactured by the foregoing method were caused to emit light by direct-current drive at 10 mA/cm² to measure luminances (Y') in the case where the pixel-separating layer portions were irradiated with external light and luminances ($Y_0$) in the case where the pixel-separating layer portions were not irradiated with external light. As an indicator of the reduction in external light reflection, a contrast was calculated by the following expression.

Contrast=$Y_0$/Y'

Determination was made as indicated below, and A+, A, and B, in which the contrast was 0.80 or greater, were considered as passing, and A+ and A, in which the contrast was 0.90 or greater, were considered as good in external light reflection reducing effect, and A+, in which the contrast was 0.95 or greater, was considered as excellent in external light reflection reducing effect. It was confirmed that as for the organic EL display apparatuses manufactured by the foregoing method, the contrast was 0.90 and reduction of external light reflection was possible.

A+: the contrast was 0.95 to 1.00.
A: the contrast was 0.90 to 0.94.
B: the contrast was 0.80 to 0.89.
C: the contrast was 0.70 to 0.79.
D: the contrast was 0.50 to 0.69.
E: the contrast was 0.01 to 0.49.

Example 87

(Production Method for Flexible Organic EL Display Apparatus that does not have Polarizing Layer)

Figure 6:
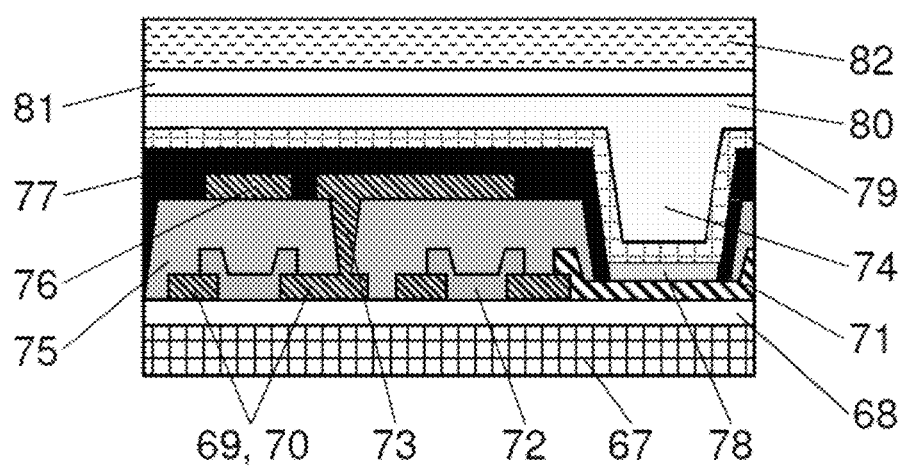
FIG. 6 is a schematic diagram exemplifying a flexible organic EL display that does not include a polarizing layer.

An outline of an organic EL display apparatus to be manufactured is illustrated in FIG. 6. First, a PI film substrate 67 was tentatively fixed to a non-alkali glass substrate of 38×46 mm with a sticky layer, and was subjected to a dehydration bake at 130° C. for 120 seconds by using a hot plate (SCW-636, made by DAINIPPON SCREEN MFG. CO., LTD.). Next, an $SiO_2$ film 68 was formed as a gas barrier layer on the PI film substrate 67 by a CVD method. A stacked film of chromium and gold was formed on the gas barrier layer by an electronic beam vapor deposition method, and was etched to form source electrodes 69 and drain electrodes 70. Next, a film of APC (silver/palladium/copper=98.07/0.87/1.06 (weight ratio)) was formed to 100 nm by sputtering and then pattern-processed by etching to form an APC layer. Furthermore, as an upper layer on the APC layer, ITO was sputtered to form a film, which was then etched to form reflector electrodes 71 as first electrodes. After the electrode surfaces were washed with an oxygen plasma, a film of amorphous IGZO was formed by a sputtering method and etched to form an oxide semiconductor layer 72 between the source and drain electrodes. Next, a film of a positive-type photosensitive polysiloxane based material (SP-P2301, made by Toray Industries, Inc.) was formed by a spin coating method, and then via holes 73 and pixel regions 74 were formed as openings by photolithography. Then, thermal cure was carried out to form a gate insulating layer 75. After that, a film of gold was formed by an electronic beam vapor deposition method and etched to form gate electrodes 76. Thus, an oxide TFT array was made.

In the method described above in Example 1, the composition 24 was applied onto the oxide TFT array and then prebaked to form a film, which was then subjected to patterning exposure via a photomask having a predetermined pattern, and then to development and rinsing, so that the pixel regions were formed as openings. After that, thermal cure was performed to form a TFT protective layer/pixel-separating layer 77 that had light blocking property. By the foregoing method, a pixel-separating layer having a shape in which opening portions of 70 μm in width and 260 μm in length were arranged with a pitch of 155 μm in a width direction and a pitch of 465 μm in a length direction and in which the individual opening portions exposed the reflector electrodes was formed exclusively in the substrate effective area. Incidentally, the opening portions were to eventually become light-emitting pixels of organic EL display apparatuses. Furthermore, the substrate effective area was 16 mm squares, and the pixel-separating layer was formed to have a thickness of about 1.0 μm.

Next, by the method described above in (15), an organic EL light-emitting layer 78 was formed by using a compound (HT-1) for a positive hole injection layer, a compound (HT-2) for a positive hole transportation layer, a compound (GH-1) for a host material, a compound (GD-1) for a dopant material, and a compound (ET-1) and a compound (LiQ) for electron transporting materials.

After that, by a vapor deposition method, a film of MgAg was formed to 10 nm at a volume ratio of 10:1. The film was etched to form a transparent electrode 79 as a second electrode. Next, in a low-humidity nitrogen atmosphere, a sealing film 80 was formed by using an organic EL seal material (STRUCTBOND (registered trademark) XMF-T, made by Mitsui Chemicals, Inc.). Furthermore, after a PET film substrate 82 with an $SiO_2$ film 81 formed thereon as a gas barrier layer was pasted onto the sealing film, the non-alkali glass substrate was detached from the PI film substrate 67 to manufacture, on the single substrate, four top emission type flexible organic EL display apparatuses of 5 mm squares having no polarizing layer. Incidentally, the film thickness mentioned herein refers to a crystal oscillation type film thickness monitor-displayed value.

(Light Emission Characteristics Evaluation)

The organic EL display apparatuses manufactured by the foregoing method were caused to emit light by direct-current drive at 10 mA/cm² to measure luminances (Y') in the case where the pixel-separating layer portions were irradiated with external light and luminances ($Y_0$) in the case where the pixel-separating layer portions were not irradiated with external light. As an indicator of the reduction in external light reflection, a contrast was calculated by the following expression.

$$Contrast=Y_0/Y'$$

Determination was made as indicated below, and A+, A, and B, in which the contrast was 0.80 or greater, were considered as passing, and A+ and A, in which the contrast was 0.90 or greater, were considered as good in external light reflection reducing effect, and A+, in which the contrast was 0.95 or greater, was considered as excellent in external light reflection reducing effect. It was confirmed that as for the organic EL display apparatuses manufactured by the foregoing method, the contrast was 0.90 and reduction of external light reflection was possible.

A+: the contrast was 0.95 to 1.00.
A: the contrast was 0.90 to 0.94.
B: the contrast was 0.80 to 0.89.
C: the contrast was 0.70 to 0.79.
D: the contrast was 0.50 to 0.69.
E: the contrast was 0.01 to 0.49.

(Flexibility Evaluation)

The organic EL display apparatuses manufactured by the foregoing method were caused to emit light by direct-current drive at 10 mA/cm². Each organic EL display apparatus was kept in a state for 60 seconds in which the apparatus, while being caused to emit light, was curved in a letter "U" shape, with the PET film surface, which was the display surface, being the outer side, and it was confirmed that each apparatus produced no abnormal light emission and had flexibility.

EXPLANATION OF NUMERALS

1: Glass substrate
2: TFT
3: Cured film for TFT planarization
4: Reflector electrode
5a: Prebaked film
5b: Cured pattern
6: Mask
7: Chemical active ray
8: EL light-emitting layer
9: Transparent electrode
10: Cured film for planarization
11: Cover glass
12: Glass substrate
13: BLU
14: Glass substrate having BLU
15: Glass substrate
16: TFT
17: Cured film for TFT planarization
18: Transparent electrode
19: Planarization film
20: Alignment layer
21a: Prebaked film
21b: Cured pattern
22: Mask 23: Chemical active ray
24: Glass substrate having BCS
25: Glass substrate having BLU and BCS
26: Glass substrate
27: Color filter
28: Cured pattern
29: Cured film for planarization
30: Alignment layer
31: Color filter substrate
32: Glass substrate having BLU, BCS, and BM
33: Liquid crystal layer
34: Glass substrate
35: PI film substrate
36: Oxide TFT
37: Cured film for TFT planarization
38: Reflector electrode
39a: Prebaked film
39b: Cured pattern
40: Mask
41: Chemical active ray
42: EL light-emitting layer
43: Transparent electrode
44: Cured film for planarization
45: Glass substrate
46: PET film substrate
47: Non-alkali glass substrate
48: First electrode
49: Auxiliary electrode
50: Electrically insulating layer
51: Organic EL layer
52: Second electrode
53: Non-alkali glass substrate
54: Source electrode
55: Drain electrode
56: Reflector electrode
57: Oxide semiconductor layer
58: Via hole
59: Pixel region
60: Gate insulating layer
61: Gate electrode
62: TFT protective layer/pixel-separating layer
63: Organic EL light-emitting layer
64: Transparent electrode
65: Sealing film
66: Non-alkali glass substrate
67: PI film substrate
68: $SiO_2$: film
69: Source electrode
70: Drain electrode
71: Reflector electrode
72: Oxide semiconductor layer
73: Via hole
74: Pixel region
75: Gate insulating layer
76: Gate electrode
77: TFT protective layer/pixel-separating layer
78: Organic EL light-emitting layer
79: Transparent electrode
80: Sealing film
81: $SiO_2$ film
82: PET film substrate

The invention claimed is:

1. A negative-type photosensitive resin composition, comprising:
an (A1) first resin, an (A2) second resin, a (B) radical polymerizable compound, a (C) photopolymerization initiator, and a (D1) pigment as a (D) coloring agent, wherein
the (A1) first resin is an (A1-1) polyimide and/or an (A1-2) polybenzo-oxazole,
the (A2) second resin is one or more species selected from an (A2-1) polyimide precursor, an (A2-2) polybenzo-oxazole precursor, an (A2-3) polysiloxane, an (A2-4) cardo based resin, and an (A2-5) acrylic resin,
the (A2-1) polyimide precursor contains a structural unit represented by the following general formula (3),
the (A1) first resin content ratio in a total of 100 mass % of the (A1) first resin and the (A2) second resin is within a range of 25 to 90 mass %, and
the (D1) pigment content ratio in the entire solid content of the negative photosensitive resin composition is within a range of 5 to 70 mass %,
wherein general formula (3) follows,

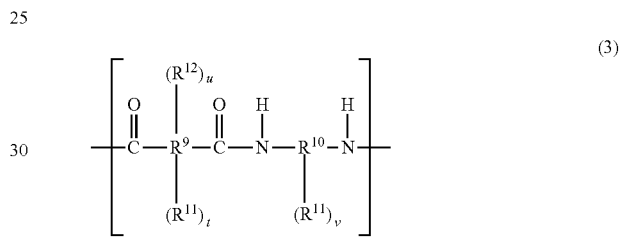

wherein
$R^9$ represents an organic group which may include a halogen and/or alkoxy substituent having a valence of 4 to 10,
$R^{10}$ represents an organic group which may include a halogen and/or alkoxy substituent having a valence of 2 to 10,
$R^{11}$ represents a substituent represented by general formula (5) or general formula (6) below,
$R^{12}$ represents a phenolic hydroxyl group, a sulfonic group, or a mercapto group,
$R^{13}$ represents a phenolic hydroxyl group, a sulfonic group, a mercapto group, or a substituent represented by general formula (5) or general formula (6) below,
t represents an integer of 2 to 8, u represents an integer of 0 to 6, and v represents an integer of 0 to 8, and $2 \le t+u \le 8$,
wherein general formulas (5) and (6) follow,

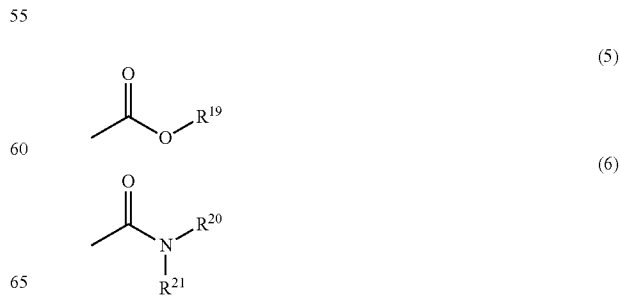

in general formula (5),

R$^{19}$ represents an alkyl group having a carbon number of 1 to 10, an acyl group having a carbon number of 2 to 6, or an aryl group having a carbon number of 6 to 15, and in general formula (6), R$^{20}$ and R$^{21}$ each independently represents hydrogen, an alkyl group having a carbon number of 1 to 10, an acyl group having a carbon number of 2 to 6, or an aryl group having a carbon number of 6 to 15, wherein the one or more species selected from the (A1-1) polyimide, the (A1-2) polybenzo-oxazole, the (A2-1) polyimide precursor, and the (A2-2) polybenzo-oxazole precursor contain a structural unit originating from an amine having an oxyalkylene structure and/or a structural unit originating from an amine derivative having an oxyalkylene structure.

2. A negative-type photosensitive resin composition, comprising:

an (A1) first resin, an (A2) second resin, a (B) radical polymerizable compound, a (C) photopolymerization initiator, and a (D1) pigment as a (D) coloring agent, wherein the (A1) first resin is an (A1-1) polyimide and/or an (A1-2) polybenzo-oxazole, the (A2) second resin is one or more species selected from an (A2-2) polybenzo-oxazole precursor, an (A2-3) polysiloxane, an (A2-4) cardo based resin, and an (A2-5) acrylic resin, the (A1) first resin content ratio in a total of 100 mass % of the (A1) first resin and the (A2) second resin is within a range of 25 to 90 mass %, and the (D1) pigment content ratio in the entire solid content of the negative photosensitive resin composition is within a range of 5 to 70 mass %.

3. The negative-type photosensitive resin composition according to claim 2, wherein the negative-type photosensitive resin composition further contains a (E) dispersing agent.

4. The negative-type photosensitive resin composition according to claim 3, wherein the negative-type photosensitive resin composition further contains a solvent having a carbonyl group or an ester bond, a content ratio of the solvent having a carbonyl group or an ester bond in a total of all solvents is within the range of 50 to 100 mass %, and the solvent having a carbonyl group or an ester bond is a solvent that has an acetate bond.

5. The negative-type photosensitive resin composition according to claim 2, wherein the (D1) pigment contains a (D1a-1a) benzofuranone based black pigment.

\* \* \* \* \*